US008581274B2

(12) United States Patent
Horie

(10) Patent No.: US 8,581,274 B2
(45) Date of Patent: Nov. 12, 2013

(54) INTEGRATED SEMICONDUCTOR LIGHT-EMITTING DEVICE AND ITS MANUFACTURING METHOD

(75) Inventor: Hideyoshi Horie, Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 898 days.

(21) Appl. No.: 12/299,250

(22) PCT Filed: Apr. 30, 2007

(86) PCT No.: PCT/JP2007/059275

§ 371 (c)(1),
(2), (4) Date: Oct. 31, 2008

(87) PCT Pub. No.: WO2007/126093

PCT Pub. Date: Nov. 8, 2007

(65) Prior Publication Data

US 2010/0320488 A1    Dec. 23, 2010

(30) Foreign Application Priority Data

May 1, 2006    (JP) .................................. 2006-128018
May 1, 2006    (JP) .................................. 2006-128021
May 1, 2006    (JP) .................................. 2006-128024
May 1, 2006    (JP) .................................. 2006-128025

(51) Int. Cl.
*H01L 29/205*    (2006.01)

(52) U.S. Cl.
USPC ..................................... 257/91; 257/E33.005

(58) Field of Classification Search
USPC ................ 257/91, 88, 98, E33.005, E33.056; 438/27, 28, 29, 33
See application file for complete search history.

(56) References Cited

U.S. PATENT DOCUMENTS 5,370,769 A *    12/1994    Kadomura et al. ........... 438/695
2001/0028062 A1*    10/2001    Uemura et al. .................. 257/79

(Continued)

FOREIGN PATENT DOCUMENTS

JP    1 115174    5/1989
JP    08 274376    10/1996

(Continued)

OTHER PUBLICATIONS

U.S. Appl. No. 12/278,798, filed Aug. 8, 2008, Horie.

(Continued)

*Primary Examiner* — Vongsavanh Sengdara
(74) *Attorney, Agent, or Firm* — Oblon, Spivak, McClelland, Maier & Neustadt, L.L.P.

(57) ABSTRACT

An integrated compound semiconductor light-emitting-device capable of emitting light as a large-area plane light source. The light-emitting-device includes plural light-emitting-units formed over a substrate, the light-emitting-units having a compound semiconductor thin-film crystal layer, first and second-conductivity-type-side electrodes, a main light-extraction direction is the side of the substrate, and the first and the second-conductivity-type-side electrodes are formed on the opposite side to the light-extraction direction. The light-emitting-units are electrically separated from each other by a light-emitting-unit separation-trench. An optical coupling layer is formed between the substrate and the first-conductivity-type semiconductor layer. The optical coupling layer is common to the plurality of light-emitting-units, and capable of optical coupling of the plurality of light-emitting-units and distributing a light to the entire light-emitting-device.

11 Claims, 73 Drawing Sheets

(56) References Cited

U.S. PATENT DOCUMENTS

| | | |
|---|---|---|
| 2002/0125492 A1* | 9/2002 | Shakuda .................. 257/94 |
| 2002/0159705 A1* | 10/2002 | Naniwae .................. 385/49 |
| 2002/0185648 A1* | 12/2002 | Furukawa et al. ............ 257/79 |
| 2002/0190260 A1 | 12/2002 | Shen et al. |
| 2005/0095768 A1* | 5/2005 | Tsuda et al. .............. 438/200 |
| 2005/0201439 A1 | 9/2005 | Horie |
| 2005/0213625 A1 | 9/2005 | Horie |

FOREIGN PATENT DOCUMENTS

| | | |
|---|---|---|
| JP | 10 242507 | 9/1998 |
| JP | 11 150303 | 6/1999 |
| JP | 2001 156331 | 6/2001 |
| JP | 2002 26384 | 1/2002 |
| JP | 2003 023179 | 1/2003 |
| JP | 2003 115611 | 4/2003 |
| JP | 2004 006893 | 1/2004 |
| JP | 2005 347647 | 12/2005 |

OTHER PUBLICATIONS

U.S. Appl. No. 12/299,253, filed Oct. 31, 2008, Horie.
U.S. Appl. No. 12/299,318, filed Nov. 3, 2008, Horie.

* cited by examiner

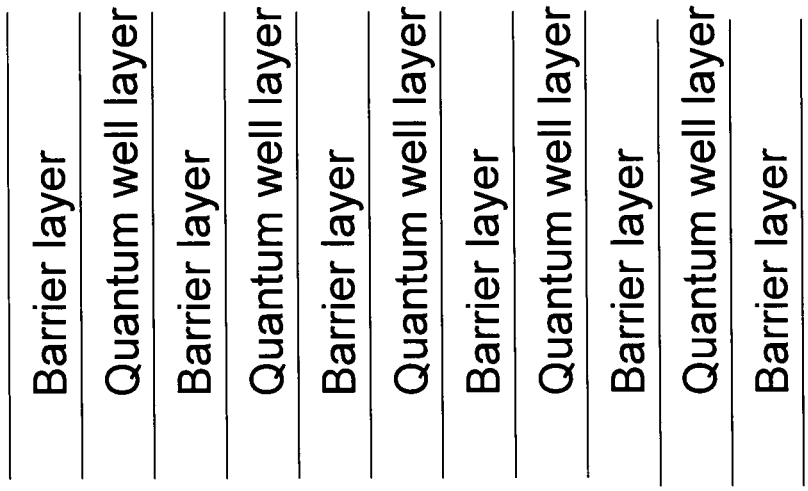
FIG. 1-5 Active layer structure

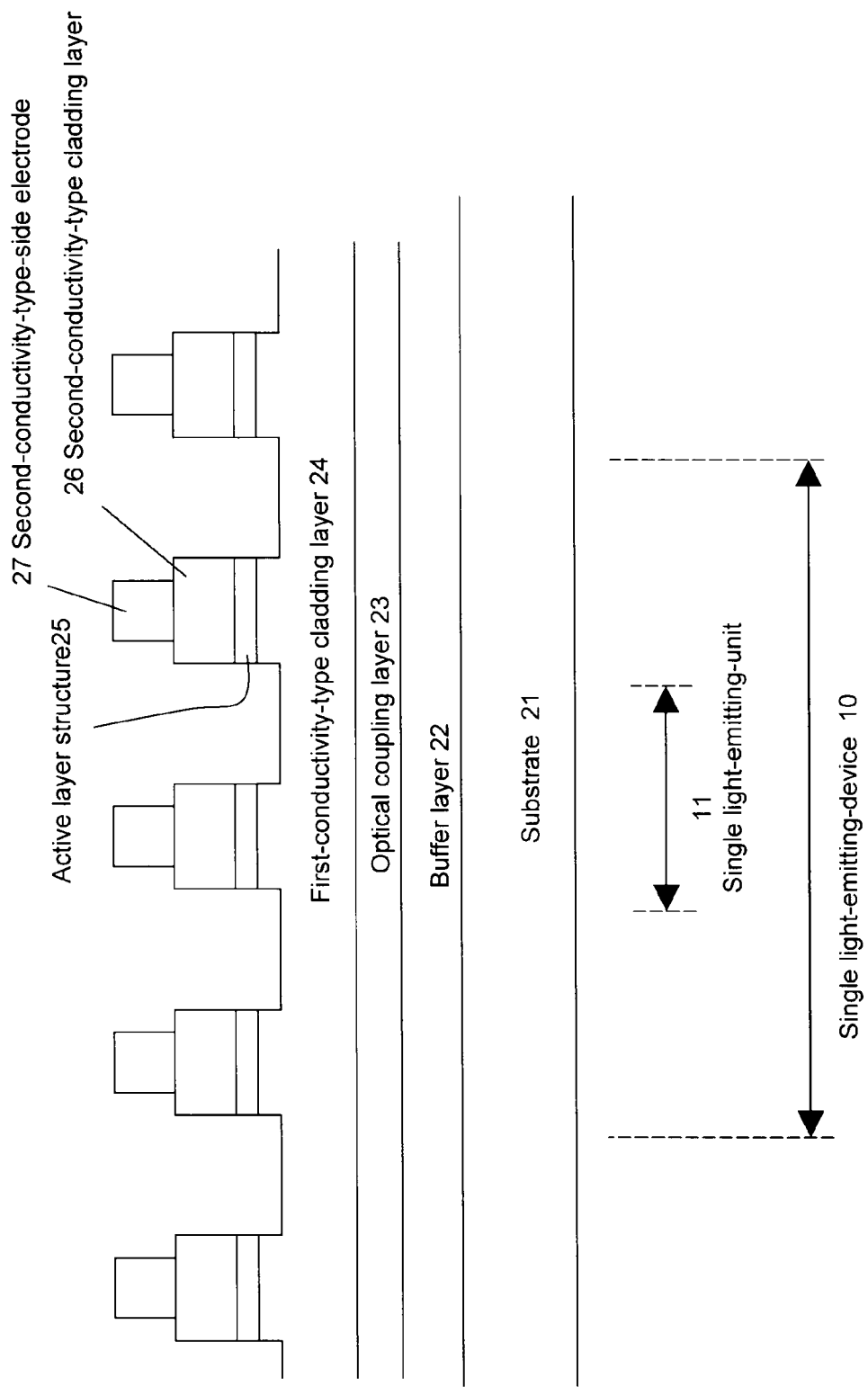

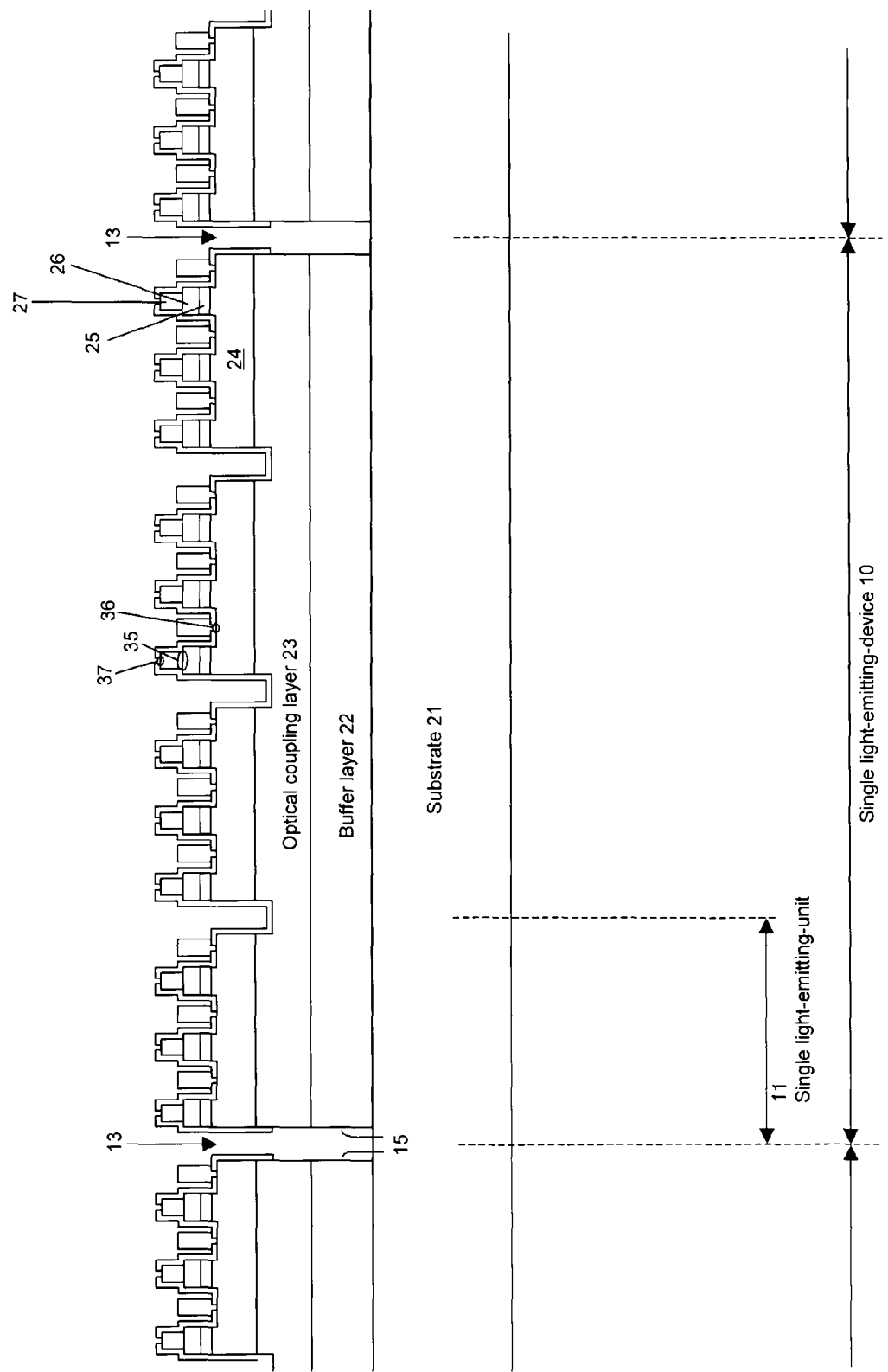

INTEGRATED SEMICONDUCTOR LIGHT-EMITTING DEVICE AND ITS MANUFACTURING METHOD

TECHNICAL FIELD

The present invention relates to a compound semiconductor light-emitting-device, particularly a light-emitting diode (LED) having a GaN material. As used herein, the term "light-emitting diode" or "LED" encompasses light-emitting elements in general which include a laser diode and a superluminescent diode and the like.

BACKGROUND ART

Electron devices and light-emitting-devices having a Group III-V compound semiconductor are well-known. In particular, there have been practically used as a light-emitting-device an AlGaAs or AlGaInP material formed on a GaAs substrate for red luminescence and a GaAsP material formed on a GaP substrate for orange or yellow luminescence. An infrared light-emitting-device using an InGaAsP material on an InP substrate is also known.

As the types of these devices, a light-emitting diode utilizing spontaneous emissive light (light-emitting diode: LED), a laser diode having an optical feedback function for deriving an induced emissive light (laser diode: LD) and a semiconductor laser are known. These devices have been used as, for example, a display device, a communication device, a light-source device for high-density optical recording, a device for high-precision optical processing and a medical device.

Since 1990s, as results of attempts for research and development of an $In_xAl_yGa_{(1-x-y)}N$ Group III-V compound semiconductor ($0 \leq x \leq 1, 0 \leq y \leq 1, 0 \leq x+y \leq 1$) containing nitrogen as a Group V element, the emission efficiency of the devices using the same has been significantly improved, and blue and green LEDs with high efficiency have been realized. Subsequent research and development have led to LEDs with high efficiency even in the ultraviolet region and recently blue LEDs have been marketed.

By integrating a phosphor with an ultraviolet or blue LED as an excitation light source, a white LED can be obtained. Since a white LED may be utilized as a next-generation lighting device, improvement in output and efficiency in an ultraviolet or blue LED to be an excitation light source has considerably higher industrial significance. At present, intense attempts are made for improving efficiency and output in a blue or ultraviolet in the light of applications in LED lighting.

For improving an output in an element, that is, improvement of the total radiation flux, increase of an element size and ensuring resistance to a large input power are essential. In addition, a common LED is a point light source. If adequately enlarged, the element exhibits light-emitting properties as a plane light source, which becomes particularly suitable for illumination applications.

However, an element having geometrical similarity with simply enlarged area of a common small LED does not exhibit uniform emission intensity over the whole element in general. Thus, it may be conceivable that a plurality of elements are aligned on a substrate. For example, Japanese Laid-open Patent Publication No. 1999-150303 (Patent Reference 1), Japanese Laid-open Patent Publication No. 2001-156331 (Patent Reference 2), Japanese Laid-open Patent Publication No. 2002-26384 (Patent Reference 3) and Japanese Laid-open Patent Publication No. 2003-115611 (Patent Reference 4) have described that a plurality of LEDs are formed over one substrate.

Japanese Laid-open Patent Publication No. 1999-150303 (Patent Reference 1) has disclosed an integrated light-emitting component where a plurality of LEDs are connected in series over a substrate. In this reference, in order to separate a part having a pair of pn junction, i.e. a single light-emitting-unit, completely electrically, a GaN layer is etched using an Ni mask until the insulative substrate is exposed (see, paragraph 0027). Therefore, each light-emitting-unit is just a separate LED formed on the same substrate. As shown in FIG. 6 of this Patent Reference 1, a separation trench separating light-emitting-units does not emit light and thus the configuration is a simple alignment of light-emitting elements and is not a surface light source having higher uniformity of emission intensity. In such a configuration, deterioration of one light-emitting-unit in the integrated elements leads to extreme reduction in an emission intensity only in that area. In terms of the manufacturing process, in a process where a GaN material is dry etched using a metal mask such as Ni, controlling an etching shape is not satisfactory because the metal mask is not necessarily adequately resistant and thus the selection ratio in dry etching of GaN material is insufficient.

Japanese Laid-open Patent Publication No. 2001-156331 (Patent Reference 2) has also described an integrated device where a plurality of light-emitting-units are formed over one substrate. However, in this reference, the light-emitting-units having a pair of pn junction are also mutually completely separated by a separation trench, and therefore they are separate LEDs formed on the same substrate, as shown in FIG. 2. Therefore, the separation trench (a method for forming it is not disclosed) separating the light-emitting-units does not emit a light, so that emission intensity uniformity cannot be ensured over the whole surface light source. In such a configuration, deterioration of one light-emitting-unit in the integrated elements leads to extreme reduction in an emission intensity only in that area.

Japanese Laid-open Patent Publication No. 2002-26384 (Patent Reference 3) has disclosed a process for LED integration for the purpose of providing an integrated nitride semiconductor light-emitting element with a large area and a higher light-emission efficiency. However, as described in FIGS. 2 and 3 and paragraph 0038 in the reference, a separation trench between a light-emitting-unit and another light-emitting-unit is formed by etching a semiconductor layer until the etching reaches a sapphire substrate by RIE using $SiO_2$ as a mask. Since the separation trench separating the light-emitting-units does not emit a light, emission intensity uniformity cannot be ensured over the whole surface light source similar to Patent References 1 and 2. Furthermore, deterioration of one light-emitting-unit in the integrated elements leads to extreme reduction in an emission intensity only in that area. In addition, since $SiO_2$ is used as an etching mask (an oxide mask or a nitride mask is not necessarily resistant) in the process for forming the separation trench, a selection ratio in etching GaN material is insufficient and shape controlling during etching is difficult.

Japanese Laid-open Patent Publication No. 2003-115611 (Patent Reference 4) has disclosed a light-emitting-device in which LEDs are integrated for using as a plane light-emitting light source or display. This reference describes two types of devices, in one of which light-emitting-units having a pair of pn junction are mutually electrically separated (Claim 4, FIG. 10(b) and so on). Separation between them is formed by dicing (FIG. 10). In this type, as in the above three references, emission intensity is reduced in a separation trench between light-emitting-units so that uniformity cannot be ensured over the whole surface light source. Likewise, deterioration in one light-emitting-unit leads to extreme reduction in an emission intensity only in that adjacent area. The second type device described in this reference is a device where light-emitting-units having a pair of pn junction are mutually electrically connected (see, Claim 5, FIG. 10(a) and so on). In this type, an n-type semiconductor layer is common to the whole light-emitting-device (FIG. 10(a)). In such a case, current flows not only into the nearest p-side electrode from an n-side electrode but also into all the p-side electrodes from one n-side electrode, so that current injection efficiency is not high as the whole light-emitting-device. Furthermore, since all the p-side electrodes are electrically connected to all the n-side electrodes, deterioration in one part leads to deterioration in the whole device. Therefore, this type device is essentially unsuitable to increase an area for providing a plane light source.

Patent Reference 1: Japanese Laid-open Patent Publication No. 1999-150303
Patent Reference 2: Japanese Laid-open Patent Publication No. 2001-156331
Patent Reference 3: Japanese Laid-open Patent Publication No. 2002-26384
Patent Reference 4: Japanese Laid-open Patent Publication No. 2003-115611

DISCLOSURE OF THE INVENTION

Subject to be Solved by the Invention

An objective of the present invention is to provide an integrated compound semiconductor light-emitting-device capable of emitting light as a large-area plane light source, exhibiting excellent in-plane uniformity in an emission intensity. Another objective is to provide a device in which even when deterioration in emission intensity varies from one light-emitting-unit to the other to some extent, higher in-plane uniformity can be ensured and maintained.

Means to Solve the Subject

The present invention relates to an integrated compound semiconductor light-emitting-device comprising a substrate transparent to an emission wavelength and a plurality of light-emitting-units formed over the substrate, wherein the light-emitting-unit comprises a compound semiconductor thin-film crystal layer having a first-conductivity-type semiconductor layer containing a first-conductivity-type cladding layer, an active layer structure and a second-conductivity-type semiconductor layer containing a second-conductivity-type cladding layer; a second-conductivity-type-side electrode; and a first-conductivity-type-side electrode on the substrate;

a main light-extraction direction is the side of the substrate, and the first-conductivity-type-side electrode and the second-conductivity-type-side electrode are formed on the opposite side to the main light-extraction direction;

the light-emitting-units are electrically separated each other by a light-emitting-unit separation-trench formed between adjacent light-emitting-units; and the light-emitting-device comprises an optical coupling layer formed between the substrate and the first-conductivity-type semiconductor layer; the optical coupling layer being common to the plurality of light-emitting-units, and capable of optical coupling of the plurality of light-emitting-units and distributing a light emitted from one light-emitting-unit to the other light-emitting-units.

Further, the present invention relates to an integrated compound semiconductor light-emitting-device, comprising a substrate transparent to an emission wavelength and a plurality of light-emitting-units formed on the substrate, wherein the light-emitting-unit comprises a compound semiconductor thin-film crystal layer having a first-conductivity-type semiconductor layer containing a first-conductivity-type cladding layer, an active layer structure and a second-conductivity-type semiconductor layer containing a second-conductivity-type cladding layer; a second-conductivity-type-side electrode; and a first-conductivity-type-side electrode on the substrate;

a main light-extraction direction is the side of the substrate, and the first-conductivity-type-side electrode and the second-conductivity-type-side electrode are formed on the opposite side to the main light-extraction direction;

the light-emitting-units are electrically separated each other by a light-emitting-unit separation-trench formed between adjacent light-emitting-units;

the light-emitting-unit comprises a plurality of light-emitting-point comprising the active layer structure, the second-conductivity-type semiconductor layer and the second-conductivity-type-side electrode; and at least one first-conductivity-type-side electrode; wherein the first-conductivity-type semiconductor layer provides electrical connection in the single light-emitting-unit; and the light-emitting-device comprises an optical coupling layer formed between the substrate and the first-conductivity-type semiconductor layer; the optical coupling layer being common to the plurality of light-emitting-units, and capable of optical coupling of the plurality of light-emitting-units and distributing a light emitted from one light-emitting-unit to the other light-emitting-units.

Further, the present invention relates to an integrated compound semiconductor light-emitting-device, comprising a plurality of light-emitting-units, wherein the light-emitting-unit comprises a compound semiconductor thin-film crystal layer having a first-conductivity-type semiconductor layer containing a first-conductivity-type cladding layer, an active layer structure and a second-conductivity-type semiconductor layer containing a second-conductivity-type cladding layer; a second-conductivity-type-side electrode; and a first-conductivity-type-side electrode;

a main light-extraction direction is the side of the first-conductivity-type semiconductor layer in relation to the active layer structure, and the first-conductivity-type-side electrode and the second-conductivity-type-side electrode are formed on the opposite side to the main light-extraction direction;

the light-emitting-units are electrically separated each other by a light-emitting-unit separation-trench formed between adjacent light-emitting-units; and the light-emitting-device comprises:
an optical coupling layer formed at the main light-extraction direction side of the first-conductivity-type semiconductor layer; the optical coupling layer being common to the plurality of light-emitting-units, and capable of optical coupling of the plurality of light-emitting-units and distributing a light emitted from one light-emitting-unit to the other light-emitting-units; and
a buffer layer formed at the main light-extraction direction side of the optical coupling layer.

Further, the present invention relates to an integrated compound semiconductor light-emitting-device, comprising a plurality of light-emitting-units, wherein the light-emitting-unit comprises a compound semiconductor thin-film crystal layer having a first-conductivity-type semiconductor layer containing a first-conductivity-type cladding layer, an active layer structure and a second-conductivity-type semiconductor layer containing a second-conductivity-type cladding layer; a second-conductivity-type-side electrode; and a first-conductivity-type-side electrode;

a main light-extraction direction is the side of the first-conductivity-type semiconductor layer in relation to the active layer structure, and the first-conductivity-type-side electrode and the second-conductivity-type-side electrode are formed on the opposite side to the main light-extraction direction;

the light-emitting-units are electrically separated each other by a light-emitting-unit separation-trench formed between adjacent light-emitting-units;

the light-emitting-unit comprises a plurality of light-emitting-point comprising the active layer structure, the second-conductivity-type semiconductor layer and the second-conductivity-type-side electrode; and at least one first-conductivity-type-side electrode; wherein the first-conductivity-type semiconductor layer provides electrical connection in the single light-emitting-unit; and the light-emitting-device comprises:

an optical coupling layer formed at the main light-extraction direction side of the first-conductivity-type semiconductor layer; the optical coupling layer being common to the plurality of light-emitting-units, and capable of optical coupling of the plurality of light-emitting-units and distributing a light emitted from one light-emitting-unit to the other light-emitting-units; and a buffer layer formed at the main light-extraction direction side of the optical coupling layer.

The present invention also relates to a process for manufacturing these light-emitting-devices.

Effect of the Invention

According to the present invention, there can be provided an integrated compound semiconductor light-emitting-device capable of emitting light as a large-area plane light source, exhibiting excellent in-plane uniformity in emission intensity. Furthermore, there can be provided a device wherein even when deterioration in emission intensity varies from one light-emitting-unit to the other to some extent, higher in-plane uniformity can be ensured and maintained.

In particular, according to the present invention, blue or ultraviolet plane-like emission with relatively higher uniformity in emission intensity can be realized even when an area of a light-emitting-device is more than several cm². Furthermore, the present invention also relates to a flip-chip type light-emitting-device where light is extracted from the substrate side and both p- and n-side electrodes are disposed on the opposite side to the light-extraction side, whereby adequate heat dissipation and a higher light-extraction efficiency can be ensured because an element can be mounted by fusion-bonding a p-side and an n-side electrodes on a highly heat-dissipative submount having a meal interconnection using a solder without using a metal wire for current introduction.

In the present invention, light-emitting-units are electrically separated each other while being optically combined via an optical coupling layer, so that a light emitted from a quantum well layer in one light-emitting-unit is distributed in the other light-emitting-unit. Thus, in the light-emitting-device according to the present invention, light is emitted from the area between light-emitting-units where a luminance is reduced in a conventional configuration, so that surface emission with relatively higher uniformity can be achieved. Furthermore, even when emission intensity varies or deterioration in emission intensity varies to some extent between light-emitting-units, higher in-plane uniformity in emission intensity is ensured. Furthermore, even if one light-emitting-unit does not emit light due to some defect, emission intensity is ensured to some extent directly over the defective light-emitting-unit, resulting in good surface uniformity.

BRIEF DESCRIPTION OF THE DRAWINGS

FIG. 1-2 shows an example of a structure before completion of a light-emitting-device disclosed in Section A.

FIG. 1-3 shows an example of a light-emitting-device disclosed in Section A.

FIG. 1-4 shows an example of a structure before completion of a light-emitting-device disclosed in Section A.

FIG. 1-5 schematically shows an active layer structure.

FIG. 1-6 is a process cross-sectional view illustrating an embodiment of a manufacturing process disclosed in Section A.

FIG. 1-7 is a process cross-sectional view illustrating an embodiment of a manufacturing process disclosed in Section A.

FIG. 1-8 is a process cross-sectional view illustrating an embodiment of a manufacturing process disclosed in Section A.

FIG. 1-9 is a process cross-sectional view illustrating an embodiment of a manufacturing process disclosed in Section A.

FIG. 1-10 is a process cross-sectional view illustrating an embodiment of a manufacturing process disclosed in Section A.

FIG. 1-11 is a process cross-sectional view illustrating an embodiment of a manufacturing process disclosed in Section A.

FIG. 1-12 is a process cross-sectional view illustrating an embodiment of a manufacturing process disclosed in Section A.

FIG. 1-13 is a process cross-sectional view illustrating an embodiment of a manufacturing process disclosed in Section A.

FIG. 1-14 is a process cross-sectional view illustrating an embodiment of a manufacturing process disclosed in Section A.

FIG. 1-15 shows a light-emitting-device manufacture in Example A-1.

FIG. 1-16 shows a light-emitting-device manufacture in Example A-2.

FIG. 1-17 shows an example of a light-emitting-device disclosed in Section A.

FIG. 1-18 shows an example of a light-emitting-device disclosed in Section A.

FIG. 1-19 shows an example of a light-emitting-device disclosed in Section A.

FIG. 1-20 shows an example of a light-emitting-device disclosed in Section A.

FIG. 1-21 is a process cross-sectional view illustrating an embodiment of a manufacturing process disclosed in Section A.

FIG. 2-1 shows an example of a light-emitting-device disclosed in Section B.

FIG. 2-2 shows an example of a structure before completion of a light-emitting-device disclosed in Section B.

FIG. 2-3 shows an example of a light-emitting-device disclosed in Section B.

FIG. 2-4 shows an example of a structure before completion of a light-emitting-device disclosed in Section B.

FIG. 2-6 is a process cross-sectional view illustrating an embodiment of a manufacturing process disclosed in Section B.

FIG. 2-7 is a process cross-sectional view illustrating an embodiment of a manufacturing process disclosed in Section B.

FIG. 2-8 is a process cross-sectional view illustrating an embodiment of a manufacturing process disclosed in Section B.

FIG. 2-9 is a process cross-sectional view illustrating an embodiment of a manufacturing process disclosed in Section B.

FIG. 2-10 is a process cross-sectional view illustrating an embodiment of a manufacturing process disclosed in Section B.

FIG. 2-11 is a process cross-sectional view illustrating an embodiment of a manufacturing process disclosed in Section B.

FIG. 2-12 is a process cross-sectional view illustrating an embodiment of a manufacturing process disclosed in Section B.

FIG. 2-13 is a process cross-sectional view illustrating an embodiment of a manufacturing process disclosed in Section B.

FIG. 2-14 is a process cross-sectional view illustrating an embodiment of a manufacturing process disclosed in Section B.

FIG. 2-15 shows a light-emitting-device manufacture in Example B-1.

FIG. 2-16 shows a light-emitting-device manufacture in Example B-2.

FIG. 2-17 shows an example of a light-emitting-device disclosed in Section B.

FIG. 2-18 shows an example of a light-emitting-device disclosed in Section B.

FIG. 2-19 shows an example of a light-emitting-device disclosed in Section B.

FIG. 2-20 shows an example of a light-emitting-device disclosed in Section B.

FIG. 2-21 is a process cross-sectional view illustrating an embodiment of a manufacturing process disclosed in Section B.

FIG. 3-1 shows an example of a light-emitting-device disclosed in Section C.

FIG. 3-2 shows an example of a structure before completion of a light-emitting-device disclosed in Section C.

FIG. 3-4 is a process cross-sectional view illustrating an embodiment of a manufacturing process disclosed in Section C.

FIG. 3-5 is a process cross-sectional view illustrating an embodiment of a manufacturing process disclosed in Section C.

FIG. 3-6 is a process cross-sectional view illustrating an embodiment of a manufacturing process disclosed in Section C.

FIG. 3-7 is a process cross-sectional view illustrating an embodiment of a manufacturing process disclosed in Section C.

FIG. 3-8 is a process cross-sectional view illustrating an embodiment of a manufacturing process disclosed in Section C.

FIG. 3-9 is a process cross-sectional view illustrating an embodiment of a manufacturing process disclosed in Section C.

FIG. 3-10 is a process cross-sectional view illustrating an embodiment of a manufacturing process disclosed in Section C.

FIG. 3-11 shows a light-emitting-device manufacture in Example C-1.

FIG. 3-12 shows a light-emitting-device manufacture in Example C-2.

FIG. 3-13 shows an example of a light-emitting-device disclosed in Section C.

FIG. 3-14 shows an example of a light-emitting-device disclosed in Section C.

FIG. 3-15 shows an example of a light-emitting-device disclosed in Section C.

FIG. 3-16 shows an example of a light-emitting-device disclosed in Section C.

FIG. 3-17 is a process cross-sectional view illustrating an embodiment of a manufacturing process disclosed in Section C.

FIG. 4-1 shows an example of a light-emitting-device disclosed in Section D.

FIG. 4-2 shows an example of a structure before completion of a light-emitting-device disclosed in Section D.

FIG. 4-4 is a process cross-sectional view illustrating an embodiment of a manufacturing process disclosed in Section D.

FIG. 4-5 is a process cross-sectional view illustrating an embodiment of a manufacturing process disclosed in Section D.

FIG. 4-6 is a process cross-sectional view illustrating an embodiment of a manufacturing process disclosed in Section D.

FIG. 4-7 is a process cross-sectional view illustrating an embodiment of a manufacturing process disclosed in Section D.

FIG. 4-8 is a process cross-sectional view illustrating an embodiment of a manufacturing process disclosed in Section D.

FIG. 4-9 is a process cross-sectional view illustrating an embodiment of a manufacturing process disclosed in Section D.

FIG. 4-10 is a process cross-sectional view illustrating an embodiment of a manufacturing process disclosed in Section D.

FIG. 4-11 shows a light-emitting-device manufacture in Example D-1.

FIG. 4-12 shows a light-emitting-device manufacture in Example D-2.

FIG. 4-13 shows an example of a light-emitting-device disclosed in Section D.

FIG. 4-14 shows an example of a light-emitting-device disclosed in Section D.

FIG. 4-15 shows an example of a light-emitting-device disclosed in Section D.

FIG. 4-16 shows an example of a light-emitting-device disclosed in Section D.

FIG. 4-17 is a process cross-sectional view illustrating an embodiment of a manufacturing process disclosed in Section D.

Figure 1:
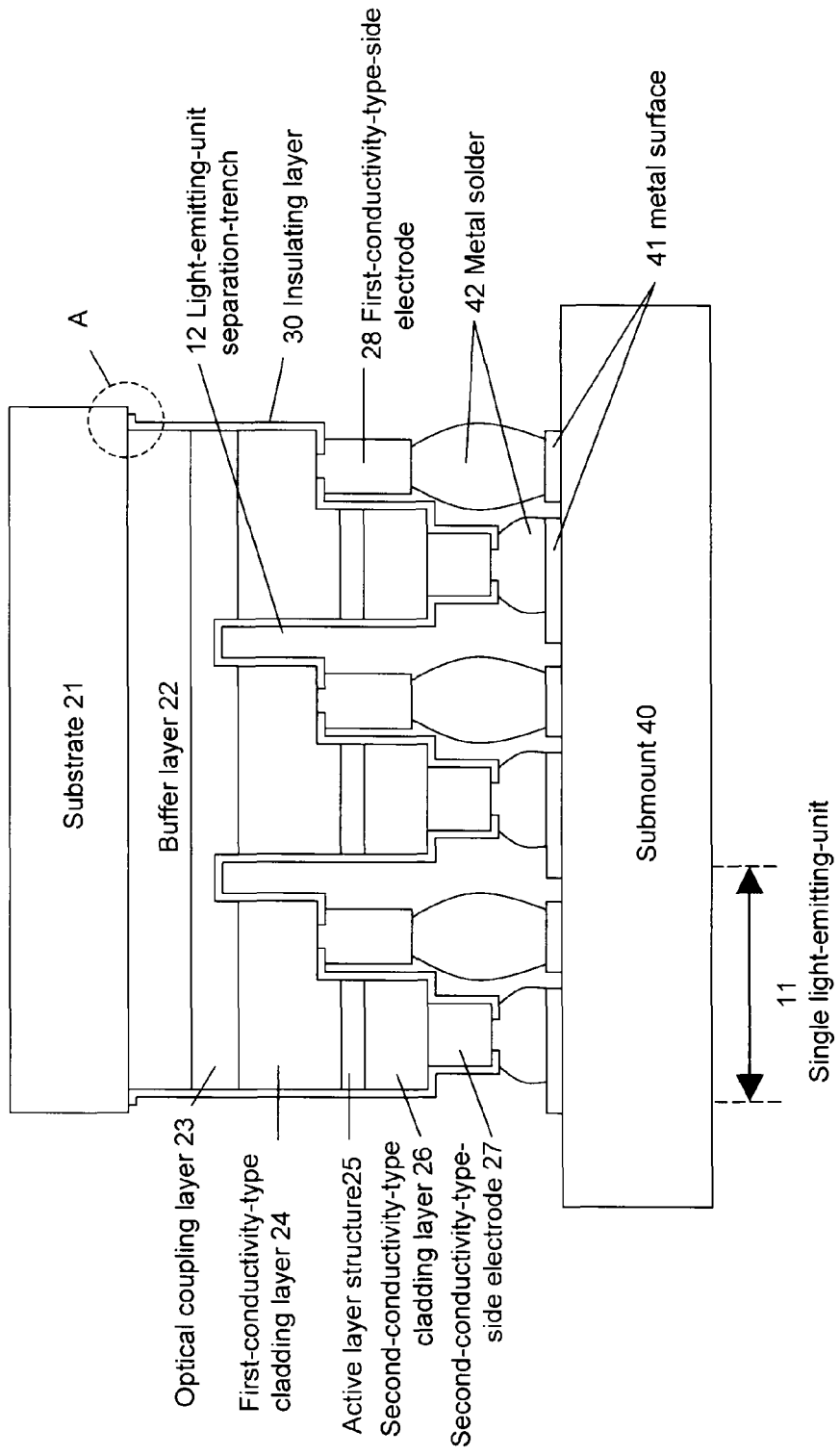
FIG. 1-1 shows an example of a light-emitting-device disclosed in Section A.

In the drawings, the symbols have the following meanings;
10: light-emitting-device
11: light-emitting-unit 12: light-emitting-unit separation-trench
13: light-emitting-device separation-trench,
14: scribe region,
15: region without an insulating layer (i.e. region where an insulating layer is not formed),
17: light-emitting-point,
21: substrate,
22: buffer layer,
22a: first buffer layer,
22b: second buffer layer,
23: optical coupling layer,
24: first-conductivity-type cladding layer,
24a: first-conductivity-type first cladding layer,
24b: first-conductivity-type second cladding layer,
24c: first-conductivity-type (n-type) contact layer,
25: active layer structure,
26: second-conductivity-type cladding layer,
26a: second-conductivity-type first cladding layer,
26b: second-conductivity-type second cladding layer,
26c: second-conductivity-type (p-type) contact layer,
27: second-conductivity-type-side electrode,
28: first-conductivity-type-side electrode,
30: insulating layer,
35: second current injection region,
36: first current injection region,
37: exposed surface of a second-conductivity-type-side electrode,
40: submount (in Section A and B), support (in Section C and D),
41: metal surface,
42: metal solder,
45: low-reflecting optical film,
51: first etching mask ($SiN_x$ and so on),
52: second and/or third etching mask (metal fluoride mask),

BEST MODE FOR CARRYING OUT THE INVENTION

In the present application, the term, "stacked" or "overlap" may refer to, in addition to the state that materials are directly in contact with each other, the state that even when being not in contact with each other, one material spatially overlaps the other material when one is projected to the other, as long as it does not depart from the gist of the invention. The term, "over or on . . . (under . . . )" may also refer to, in addition to the state that materials are directly in contact with each other and one is placed on (under) the other, the state that even when being not in contact with each other, one is placed over (below) the other, as long as it does not depart from the gist of the invention. Furthermore, the term, "after . . . (before or prior to . . . )" may be applied to not only the case where one event occurs immediately after (before) another event, but also the case where a third event intervenes between one event and another subsequent (preceding) event. The term, "contact" may refer to, in addition to the case where "materials are directly in contact with each other", the case where "materials are indirectly in contact with each other via a third member without being not directly in contact with each other" or where "a part where materials are directly in contact with each other and a part where they are indirectly in contact with each other via a third member are mixed", as long as it fits the gist of the present invention.

Furthermore, in the present invention, the term, "thin-film crystal growth" may refer to formation of a thin-film layer, an amorphous layer, a microcrystal, a polycrystal, a single crystal or a stacked structure of these in a crystal growth apparatus by, for example, MOCVD (Metal Organic Chemical Vapor Deposition), MBE (Molecular Beam Epitaxy), plasma assisted MBE, PLD (Pulsed Laser Deposition), PED (Pulsed Electron Deposition), VPE (Vapor Phase Epitaxy) or LPE (Liquid Phase Epitaxy), including, for example, a subsequent carrier activating process of a thin-film layer such as heating and plasma treatment.

There will be described the present invention dividing it Sections A to D. In the description for each Section, the term "the present invention", may refer to, in addition to the invention related to a structure or process generally described in the Section, the invention related to a structure or process described in any other Section. However, when it is obvious that the term refers to the invention related to the structure or process described in the Section and is inconsistent with the invention of the other Sections, the term exclusively refers to the invention related to the structure or process described in the Section.

<<Section A>>

The invention disclosed in Section A relates to the followings.

[1] An integrated compound semiconductor light-emitting-device, comprising a substrate transparent to an emission wavelength and a plurality of light-emitting-units formed on the substrate, wherein the light-emitting-unit comprises a compound semiconductor thin-film crystal layer having a first-conductivity-type semiconductor layer containing a first-conductivity-type cladding layer, an active layer structure and a second-conductivity-type semiconductor layer containing a second-conductivity-type cladding layer; a second-conductivity-type-side electrode; and a first-conductivity-type-side electrode on the substrate;

a main light-extraction direction is the side of the substrate, and the first-conductivity-type-side electrode and the second-conductivity-type-side electrode are formed on the opposite side to the main light-extraction direction;

the light-emitting-units are electrically separated each other by a light-emitting-unit separation-trench formed between adjacent light-emitting-units; and the light-emitting-device comprises an optical coupling layer formed between the substrate and the first-conductivity-type semiconductor layer; the optical coupling layer being common to the plurality of light-emitting-units, and capable of optical coupling of the plurality of light-emitting-units and distributing a light emitted from one light-emitting-unit to the other light-emitting-units.

[2] The light-emitting-device as described in [1], wherein the optical coupling layer is a layer formed between the substrate and the first-conductivity-type cladding layer as a part of the thin-film crystal layer so as to be common to the plurality of light-emitting-units.

[3] The light-emitting-device as described in [1] or [2], wherein when an average refractive index of the substrate is $n_{sb}$ and an average refractive index of the optical coupling layer is $n_{oc}$ and an average refractive index of the first-conductivity-type semiconductor layer is $n_1$, each at an emission wavelength, the relation:

$$n_{sb} < n_{oc} \text{ and } n_1 < n_{oc}$$

is satisfied.

[4] The light-emitting-device as described in any of [1] to [3], wherein when an emission wavelength of the light-emitting-device is $\lambda$ (nm), an average refractive index of the substrate is $n_{sb}$ and an average refractive index of the optical coupling layer is $n_{oc}$, each at an emission wavelength, and a physical thickness of the optical coupling layer is $t_{oc}$ (nm) and where a relative refractive index difference $\Delta_{(oc-sb)}$ between the optical coupling layer and the substrate is defined as:

$$\Delta_{(oc-sb)} \equiv ((n_{oc})^2 - (n_{sb})^2)/(2 \times (n_{oc})^2),$$

$t_{oc}$ is selected such that the relation:

$$(\sqrt{(2 \times \Delta_{(oc-sb)})} \times n_{oc} \times \pi \times t_{oc})/\lambda \geq \pi/2$$

is satisfied.

[5] The light-emitting-device as described in any of [1] to [4], wherein when an emission wavelength of the light-emitting-device is $\lambda$ (nm), an average refractive index of the optical coupling layer is $n_{oc}$ and an average refractive index of the first-conductivity-type semiconductor layer is $n_1$, each at an emission wavelength, and a physical thickness of the optical coupling layer is $t_{oc}$ (nm) and a relative refractive index difference $\Delta_{(oc-1)}$ between the optical coupling layer and the first-conductivity-type semiconductor layer is defined as $$\Delta_{(oc-1)} \equiv ((n_{oc})^2 - (n_1)^2)/(2 \times (n_{oc})^2),$$

$t_{oc}$ is selected such that the relation:

$$(\sqrt{(2 \times \Delta_{(oc-1)})} \times n_{oc} \times \pi \times t_{oc})/\lambda \geq \pi/2$$

is satisfied.

[6] The light-emitting-device as described in any of [1] to [5], wherein an overall specific resistance of the optical coupling layer $\rho_{oc}(\Omega \cdot cm)$ satisfies the relation:

$$0.5 \leq \rho_{oc}.$$

[7] The light-emitting-device as described in any of [1] to [6], wherein the optical coupling layer has a stacked structure consisting of multiple layers.

[8] The light-emitting-device as described in any of [1] to [7], wherein the plurality of light-emitting-units are formed by forming the light-emitting-unit separation-trench by removing the thin-film crystal layer from the surface to the boundary of the optical coupling layer or to an inside portion of the optical coupling layer between the adjacent light-emitting-units.

[9] The light-emitting-device as described in any of [1] to [8], wherein the width of the light-emitting-unit separation-trench is 2 to 300 μm.

[10] The light-emitting-device as described in any of [1] to [9], further comprising a buffer layer in contact with the substrate.

[11] The light-emitting-device as described in any of [1] to [10], wherein the light-emitting-device has been divided from a scribe region in a light-emitting-device separation-trench formed between a plurality of light-emitting-devices; the light-emitting-device separation-trench being formed to the intermediate portion of the optical coupling layer.

[12] The light-emitting-device as described in [10], wherein the light-emitting-device has been divided from a scribe region in a light-emitting-device separation-trench formed between a plurality of light-emitting-devices; the light-emitting-device separation-trench being formed to the intermediate portion of the buffer layer.

[13] The light-emitting-device as described in any of [1] to [10], wherein the light-emitting-device has been divided from a scribe region in a light-emitting-device separation-trench formed between a plurality of light-emitting-devices; the light-emitting-device separation-trench being formed so as to reach the substrate.

[14] The light-emitting-device as described in any of [1] to [10], wherein the light-emitting-device has been divided from a scribe region in a light-emitting-device separation-trench formed between a plurality of light-emitting-devices; the light-emitting-device separation-trench being formed so as to remove a portion of the substrate.

The light-emitting-device as described in any of [1] to [14], comprising an insulating layer which is:

covering a bottom surface and a sidewall in the light-emitting-unit separation-trench, covering at least a sidewall surface of the first-conductivity-type semiconductor layer, the active layer structure and the second-conductivity-type semiconductor layer among layers exposed as sidewall surface of the light-emitting-device, in contact with a part of the first-conductivity-type-side electrode at the side of the main light-extraction direction, and covering a part of the second-conductivity-type-side electrode on the side opposite to the main light-extraction direction.

[16] The light-emitting-device as described in [15], wherein the insulating layer covers whole sidewall of the layers exposed to the sidewall in the light-emitting-device separation-trench.

[17] The light-emitting-device as described in [16], wherein, as the scribe region, a region which is not covered by the insulating layer is formed on the trench bottom surface in the light-emitting-device separation-trench.

[18] The light-emitting-device as described in [15], wherein insulating layer is not formed on the trench bottom surface in the light-emitting-device separation-trench and is not formed on the sidewall, at least from the trench bottom side up to a part of non-conductive layers, among the sidewall of the layers exposed as sidewall of the light-emitting-device separation-trench.

[19] The light-emitting-device as described in any of [1] to [18], wherein the thin-film crystal layer is made of a Group III-V compound semiconductor containing nitrogen as a Group V atom.

[20] The light-emitting-device as described in any of [1] to [19], wherein the active layer structure consists of quantum well layer and barrier layer and when B is the number of the barrier layer and W is the number of the quantum well layer, B and W satisfy the relation:

$$B = W + 1.$$

[21] The light-emitting-device as described in any of [1] to [20], wherein the substrate is selected from the group consisting of sapphire, SiC, GaN, $LiGaO_2$, ZnO, $ScAlMgO_4$, $NdGaO_3$ and MgO.

[22] The light-emitting-device as described in any of [1] to [18], wherein the insulating layer is a dielectric multilayer film consisting of multiple layers.

[23] The light-emitting-device as described in any of [15] to [18] and [22], wherein when R2 is a reflectance of reflection by the optical coupling layer, of a light having an emission wavelength of the light-emitting-device vertically incoming from the first-conductivity-type semiconductor layer side to the optical coupling layer, R12 is a reflectance of reflection by the insulating layer, of a light having an emission wavelength of the light-emitting-device vertically incoming from the second-conductivity-type semiconductor layer side to the insulating layer, R11 is a reflectance of reflection by the insulating layer, of a light having an emission wavelength of the light-emitting-device vertically incoming from the first-conductivity-type semiconductor layer side to the insulating layer and R1q is a reflectance of reflection by the insulating layer, of a light having an emission wavelength of the light-emitting-device vertically incoming from the active layer structure side to the insulating layer, the insulating layer is configured such that all of the conditions:

$$R2<R12 \quad \text{(Relation 1)}$$

$$R2<R11 \quad \text{(Relation 2)}$$

$$R2<R1q \quad \text{(Relation 3)}$$

are satisfied.

[24] The light-emitting-device as described in any of [1] to [23], wherein the surface of the light-extraction side of the substrate is not flat.

[25] The light-emitting-device as described in any of [1] to [24], wherein when R3 is a reflectance of reflection by the substrate, of a light having an emission wavelength of the light-emitting-device vertically incoming from the optical coupling layer to the substrate side and R4 is a reflectance of reflection by an interface with a space, of a light having an emission wavelength of the light-emitting-device vertically incoming from the substrate to the space of the light-extraction side, a low-reflecting optical film is formed in the light-extraction side of the substrate such that the relation:

$$R4<R3$$

is satisfied.

[26] The light-emitting-device as described in any of [1] to [25], wherein the first-conductivity-type is n-type and the second-conductivity-type is p-type.

[27] The light-emitting-device as described in any of [1] to [26], wherein the first-conductivity-type-side electrode and the second-conductivity-type-side electrode are bonded to a submount having a metal layer via a solder.

[28] A process for manufacturing an integrated compound semiconductor light-emitting-device having a plurality of light-emitting-units on a substrate, the process comprising:

a step of depositing an optical coupling layer on a substrate transparent to an emission wavelength;

a step of depositing a thin-film crystal layer having at least a first-conductivity-type semiconductor layer containing a first-conductivity-type cladding layer, an active layer structure and a second-conductivity-type semiconductor layer containing a second-conductivity-type cladding layer;

a step of forming a second-conductivity-type-side electrode on the surface of the second-conductivity-type semiconductor layer;

a first etching step of exposing a part of the first-conductivity-type semiconductor layer;

a step of forming a first-conductivity-type-side electrode on the surface of the first-conductivity-type semiconductor layer exposed by the first etching step;

a second etching step of removing the thin-film crystal layer from the surface to the boundary of the optical coupling layer or from the surface to an inside portion of the optical coupling layer for forming a light-emitting-unit separation-trench to separate electrically the light-emitting-unit each other; and a third etching step of removing at least the first-conductivity-type semiconductor layer, the active layer structure and the second-conductivity-type semiconductor layer for forming a light-emitting-device separation-trench to separate into a plurality of light-emitting-devices.

[29] The process as described in [28], wherein the optical coupling layer is formed as a part of the thin-film crystal layer before forming the first-conductivity-type semiconductor layer.

[30] The process as described in [28] or [29], wherein when an average refractive index of the substrate is $n_{sb}$ and an average refractive index of the optical coupling layer is $n_{oc}$, each at an emission wavelength, the relation:

$$n_{sb}<n_{oc}$$

is satisfied.

[31] The process as described in any of [28] to [30], wherein when an emission wavelength of the light-emitting-device is λ (nm), an average refractive index of the substrate is fish and an average refractive index of the optical coupling layer is $n_{oc}$, each at an emission wavelength, and a physical thickness of the optical coupling layer is $t_{oc}$ (nm) and where a relative refractive index difference $\Delta_{(oc-sb)}$ between the optical coupling layer and the substrate is defined as:

$$\Delta_{(oc-sb)} \equiv ((n_{oc})^2 - (n_{sb})^2)/(2 \times (n_{oc})^2),$$

$t_{oc}$ is selected such that the relation:

$$(\sqrt{(2 \times \Delta_{(oc-sb)})} \times n_{oc} \times \pi \times t_{oc})/\lambda \geq \pi/2$$

is satisfied.

[32] The process as described in any of [28] to [31], wherein when an emission wavelength of the light-emitting-device is λ (nm), an average refractive index of the optical coupling layer at an emission wavelength is $n_{oc}$, an average refractive index of the first-conductivity-type semiconductor layer at an emission wavelength is $n_1$ and a physical thickness of the optical coupling layer is $t_{oc}$ (nm) and a relative refractive index difference $\Delta_{(oc-1)}$ between the optical coupling layer and the first-conductivity-type semiconductor layer is defined as $$\Delta_{(oc-1)} \equiv ((n_{oc})^2 - (n_1)^2)/(2 \times (n_{oc})^2),$$

$t_{oc}$ is selected such that the relation:

$$(\sqrt{(2 \times \Delta_{(oc-1)})} \times n_{oc} \times \pi \times t_{oc})/\lambda \geq \pi/2$$

is satisfied.

[33] The process as described in any of [28] to [32], wherein an overall specific resistance of the optical coupling layer $\rho_{oc}$(Ω·cm) satisfies the relation:

$$0.5 \leq \rho_{oc}.$$

[34] The process as described in any of [28] to [33], wherein the optical coupling layer is formed as a stacked structure consisting of multiple layers.

[35] The process as described in any of [28] to [34], comprising a step of forming a buffer layer on the substrate before the step of forming the optical coupling layer.

[36] The process as described in any of [28] to [35], wherein the third etching step is performed simultaneously or separately with the second etching step and is performed to remove the thin-film crystal layer from the surface to the boundary of the optical coupling layer or from the surface to an inside portion of the optical coupling layer.

[37] The process as described in [35], wherein the third etching step is performed to remove the thin-film crystal layer from the surface to an inside portion of the buffer layer.

[38] The process as described in any of [28] to [35], wherein the third etching step is performed so as to reach the substrate surface.

[39] The process as described in any of [28] to [35], wherein the third etching step is performed so as to remove a portion of the substrate.

[40] The process as described in any of [28] to [39], wherein the second etching step and the third etching step are performed by dry etching process using gas selected from the group consisting of $Cl_2$, $BCl_3$, $SiCl_4$, $CCl_4$ and combination of two or more of these.

[41] The process as described in [40], wherein a patterned metal-fluoride layer is used as an etching mask.

[42] The process as described in [41], wherein the metal-fluoride layer is selected from the group consisting of $SrF_2$, $AlF_3$, $MgF_2$, $BaF_2$, $CaF_2$ and combination of two or more of these.

[43] The process as described in any of [28] to [42], wherein the step of forming a second-conductivity-type-side electrode, the first etching step and the step of forming a first-conductivity-type-side electrode are carried out in this order, and wherein, the process further comprises a step of forming an insulating layer before the step of forming a first-conductivity-type-side electrode.

[44] The process as described in [43], wherein the step of forming an insulating layer is carried out after the first to third etching steps.

[45] The process as described in any of [28] to [35], wherein the step of forming a second-conductivity-type-side electrode, the first etching step and the step of forming a first-conductivity-type-side electrode are carried out in this order, and the third etching step is performed to the depth, from the surface, until removing a portion of the optical coupling layer, until removing a portion of the buffer layer, provided the buffer layer is present, or until reaching the substrate, whereby forming the light-emitting-device separation-trench, and wherein, the process further comprises:

a step of forming a insulating layer after the first to third etching steps and before the step of forming a first-conductivity-type-side electrode; and a step of forming a scribe region by removing a portion of the insulating layer deposited on the trench bottom surface in the light-emitting-device separation-trench.

[46] The process as described in any of [28] to [35], wherein the step of forming a second-conductivity-type-side electrode, the first etching step and the step of forming a first-conductivity-type-side electrode are carried out in this order, and the third etching step is performed to the depth, from the surface, until removing a portion of the optical coupling layer, until removing a portion of the buffer layer, provided the buffer layer is present, or until reaching the substrate, whereby forming the light-emitting-device separation-trench, and wherein, the process further comprises:

a step of forming a insulating layer after the first to third etching steps and before the step of forming a first-conductivity-type-side electrode; and a step of removing whole of the insulating layer deposited on the trench bottom surface in the light-emitting-device separation-trench and a portion of the insulating layer formed on the sidewall of the light-emitting-device separation-trench near the trench bottom.

[47] The process as described in [45], wherein the second etching step and the third etching step are performed simultaneously and are performed to the depth, from the surface, until reaching the boundary of the optical coupling layer or until removing a portion of the optical coupling layer, whereby forming the light-emitting-device separation-trench.

[48] The process as described in [46], wherein the second etching step and the third etching step are performed simultaneously and are performed to the depth, from the surface, until reaching the boundary of the optical coupling layer or until removing a portion of the optical coupling layer, whereby forming the light-emitting-device separation-trench.

[49] The process as described in any of [28] to [48], further comprising:

a step of separating into a plurality of light-emitting-devices, and a step of bonding the first-conductivity-type-side electrode and the second-conductivity-type-side electrode to a metal layer on the submount.

[50] The process as described in [49], wherein the bonding is performed via a solder.

According to the invention disclosed in this Section, there can be provided an integrated compound semiconductor light-emitting-device capable of emitting light as a large-area plane light source, exhibiting excellent in-plane uniformity in emission intensity. Furthermore, there can be provided a device wherein even when deterioration in emission intensity varies from one light-emitting-unit to the other to some extent, higher in-plane uniformity can be ensured and maintained.

In particular, blue or ultraviolet plane-like emission with relatively higher uniformity in emission intensity can be realized even when an area of a light-emitting-device is more than several $cm^2$. Furthermore, the present invention also relates to a flip-chip type light-emitting-device where light is extracted from the substrate side and both p- and n-side electrodes are disposed on the opposite side to the light-extraction side, whereby adequate heat dissipation and a higher light-extraction efficiency can be ensured because an element can be mounted by fusion-bonding a p-side and an n-side electrodes on a highly heat-dissipative submount having a meal interconnection using a solder without using a metal wire for current introduction.

In the invention disclosed in this Section, light-emitting-units are electrically separated each other while being optically combined via an optical coupling layer, so that a light emitted from a quantum well layer in one light-emitting-unit is distributed in the other light-emitting-unit. Thus, in the light-emitting-device according to the present invention, light is emitted from the area between light-emitting-units where a luminance is reduced in a conventional configuration, so that surface emission with relatively higher uniformity can be achieved. Furthermore, even when emission intensity varies or deterioration in emission intensity varies to some extent between light-emitting-units, higher in-plane uniformity in emission intensity is ensured because of the presence of the optical coupling layer. Furthermore, even if one light-emitting-unit does not emit light due to some defect, emission intensity is ensured to some extent directly over the defective light-emitting-unit, resulting in good surface uniformity.

Description of Embodiments of the Invention in Section A

Hereinafter, the present invention of this Section will be explained in more details.

Figures 1, 2:
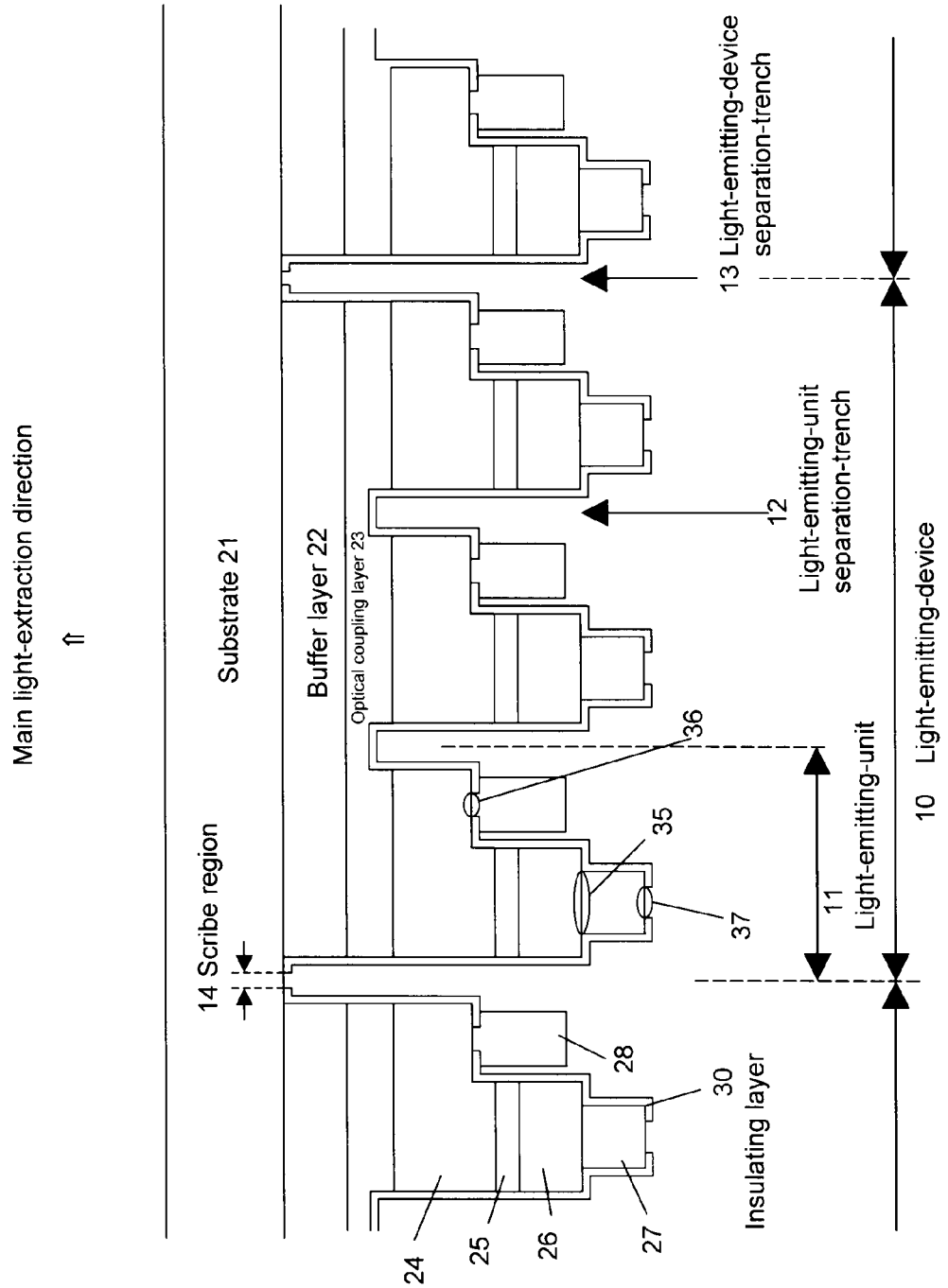

FIG. 1-1 shows an example of an integrated compound semiconductor light-emitting-device (hereinafter, simply referred to as a "light-emitting-device") of the invention disclosed in this Section. Furthermore, the structure of the light-emitting-device in FIG. 1-1 will be detailed with reference to FIG. 1-2 showing a shape in the course of the manufacturing. Although there is shown an example where one light-emitting-device 10 is constituted from three light-emitting-units 11 as shown in FIGS. 1-1 and 1-2, there are no particular restrictions to the number of integrated units and the number of units can be appropriately varied in one substrate provided. For example, the number of integrated units may be two, or alternatively more than 500 units may be integrated. Here, preferably the number is 25 to 200 units. In addition, two-dimensional arrangement may be also preferred.

In the invention disclosed in this Section, one light-emitting-unit has, as shown in the figure, at least, a compound semiconductor thin-film crystal layer containing a first-conductivity-type semiconductor layer including a first-conductivity-type cladding layer 24, a second-conductivity-type semiconductor layer including a second-conductivity-type cladding layer 26 and an active layer structure 25 sandwiched between the first and the second-conductivity-type semiconductor layers; a second-conductivity-type-side electrode 27; and a first-conductivity-type-side electrode 28, on a substrate 21. As shown in the figure, a light-emitting-unit separation-trench 12 defines the light-emitting-unit 11 within the integrated compound semiconductor light-emitting-device 10, while the substrate 21 and the optical coupling layer 23 are common to the light-emitting-units. Furthermore, a buffer layer 22, which is initially formed on the substrate, is also common to the light-emitting-units.

In this example, on a part of the second-conductivity-type cladding layer 26, the second-conductivity-type-side electrode 27 is disposed and the part where the second-conductivity-type cladding layer 26 and the second-conductivity-type-side electrode 27 are in contact with each other is a second current injection region 35. In this configuration, parts of the second-conductivity-type cladding layer and the active layer structure, and a part of the first-conductivity-type cladding layer are removed. The first-conductivity-type-side electrode 28 is disposed in contact with the first-conductivity-type cladding layer 24 exposed in the removed part, so that the second-conductivity-type-side electrode 27 and the first-conductivity-type-side electrode 28 are disposed on the same side in relation to the substrate.

In the invention disclosed in this Section, the light-emitting-units 11 are electrically separated each other by a light-emitting-unit separation-trench 12. That is, the light-emitting-unit separation-trench 12 divides highly conductive layers in the thin-film crystal layer, and thus there is substantially no electric connection between light-emitting-units. In the invention disclosed in this Section, one light-emitting-unit has one light-emitting-point (an independent light-emitting part).

On the other hand, in the present invention, the optical coupling layer 23 is commonly present between the light-emitting-units, which creates the state that the light-emitting-units are optically connected. In other words, a light emitted from one light-emitting-unit reaches the other units through moderate diffusion and radiation (leak) in the optical coupling layer and also reaches the other light-emitting-units without being localized in one light-emitting-unit. Thus, it is necessary that the light-emitting-unit separation-trench 12 reaches the interface of the optical coupling layer or, as shown in FIG. 1-1, reaches the intermediate portion of the optical coupling layer on the condition that the layer is not divided. Although details will be described later, the optical coupling layer is substantially insulative and made of a material having a relatively higher refractive index for achieving appropriate waveguide function within the layer.

In the present invention, a width of the light-emitting-unit separation-trench is preferably 2 to 300 μm, more preferably 5 to 50 μm, most preferably 8 to 15 μm. A smaller width of the light-emitting-unit separation-trench, together with the optical coupling layer, improves uniformity in surface emission.

FIG. 1-2 shows a part of the other light-emitting-device adjacent to the central light-emitting-device 10 over the same substrate, where the individual light-emitting-devices 10 are separated by a light-emitting-device separation-trench 13. In a scribe region 14 in the light-emitting-device separation-trench 13, the individual light-emitting-devices are separated by scribing and breaking. To the metal surface 41 on the submount 40 are connected a second-conductivity-type-side electrode 27 and a first-conductivity-type-side electrode 28 via a metal solder 42 to provide a light-emitting-device as shown in FIG. 1-1.

The light-emitting-device separation-trench is formed, in this example, by removing the thin-film crystal layer so as to reach the substrate, which is one of preferable embodiments. Alternatively, an embodiment where the light-emitting-device separation-trench is formed to the intermediate portion of the combined layer of the optical coupling layer and the buffer layer is preferable. Or an embodiment where the trench is formed by partly removing the substrate may be possible. In any of these, an insulating layer can be easily formed on the sidewall of a highly conductive layer near the active layer structure side in relation to the optical coupling layer. In any of these, the individual light-emitting-devices are separated by dividing in the scribe region within the light-emitting-device separation-trench.

In the light-emitting-device of the invention disclosed in this Section, the insulating layer 30 covers most of the exposed area including the surfaces and the sidewalls of the thin-film crystal layers 22 to 26, and several embodiments are possible for the shape of the insulating layer on the sidewall of the light-emitting-device of FIG. 1-1, that is, in the light-emitting-device separation-trench 13 in the state of FIG. 1-2 before the light-emitting-devices are separated. In any embodiment, it is preferable that before separating the light-emitting-devices, there is a part without an insulating layer within the light-emitting-device separation-trench 13 defining the light-emitting-devices. Furthermore, the light-emitting-devices are preferably separated from the part without an insulating film. As a result, in a preferred configuration of the light-emitting-device of the present invention, the insulating layer covering the sidewall does not reach the edge of the light-emitting-device. There will be described a specific example of a preferable insulating layer.

In an embodiment of the invention disclosed in this Section, as shown in FIG. 1-2, the insulating layer 30 does not cover the whole surface of the inside of the light-emitting-device separation-trench 13, but there is formed the scribe region 14 without the insulating layer 30 in a part in contact with the substrate surface (that it, the trench bottom surface). It is preferable because a thin-film crystal layer is not damaged during inter-device separation and an insulating layer is not detached. In a resulting light-emitting-device, as shown in part A (dotted line circle) in FIG. 1-1, the insulating layer 30 does not reach the edge of the substrate. In a device having this configuration, detachment of an insulating layer is reliably prevented and as a result, even if running around of a solder in the sidewall of the light-emitting-unit occurs, the functions of the light-emitting-device are not deteriorated, resulting in a highly reliable device.

In another embodiment of the invention disclosed in this Section, as shown in FIG. 1-4, there is a part without an insulating layer 15 where an insulating layer 30 is not formed on the substrate (that is the trench bottom) and the trench sidewall near the substrate. This structure is also preferable because detachment of an insulating layer is eliminated during inter-device separation. In the resulting light-emitting-device, as shown in part B (dotted line circle) in FIG. 1-3, there is a part without an insulating layer 15 where the insulating layer 30 does not reach the substrate surface. Although the whole sidewall of the buffer layer 22 and a part of the sidewall of the optical coupling layer 23 are exposed in this figure, the sidewall of the optical coupling layer can be covered while a part of the buffer layer is exposed. The exposed part is preferably an undoped layer which is not doped. Preferably, the optical coupling layer is also covered by an insulating layer. In a device having such a configuration, detachment of an insulating layer is reliably prevented and when a highly insulative material is exposed, a highly reliable device comparable to the light-emitting-device having the configuration of FIG. 1-1 can be provided. Furthermore, when the light-emitting-device separation-trench is formed by etching into the portion of the substrate, only the substrate part may be exposed as the trench sidewall while the buffer layer is covered by an insulating layer.

When the light-emitting-device separation-trench is formed to the intermediate portion of the combined layer of the optical coupling layer and the buffer layer, a light-emitting-device having the following configuration is provided. First, when the light-emitting-device separation-trench is formed to the intermediate portion of the optical coupling layer 23, as shown in FIGS. 1-17 and 1-18, the optical coupling layer 23 and the buffer layer 22 extend to the edge of the light-emitting-device, the whole sidewall of the buffer layer is exposed, the optical coupling layer has a step based on the bottom of the light-emitting-device separation-trench, the sidewall of the optical coupling layer has a part which is not covered by an insulating layer in accordance with the sidewall of the buffer layer and a sidewall part receded from the edge of the light-emitting-device (the sidewall of the light-emitting-device separation-trench). In FIGS. 1-17 and 1-18, the edge of the optical coupling layer 23 and of the buffer layer 22 is identical to the edge face of the substrate, but it may be inside or outside of the substrate 21 depending on a separation method. In the example in FIG. 1-17, the insulating layer 30 covers the bottom and the sidewall of the separation trench from a position in the trench bottom distant from the edge of the optical coupling layer 23 as shown in part C (dotted line circle) in FIG. 1-17. This corresponds to a configuration where formation of the light-emitting-device separation-trench is stopped in the intermediate portion of the optical coupling layer 23 in FIGS. 1-1 and 1-2. The example in FIG. 1-18 corresponds to a configuration where formation of the light-emitting-device separation-trench is stopped in the intermediate portion of the optical coupling layer 23 in FIGS. 1-3 and 1-4, and as shown in part D (dotted line circle) in FIG. 1-18, there is a part which is not covered by an insulating layer, in the main light-extraction direction side of the sidewall inside of the edge of the light-emitting-device (the sidewall of the light-emitting-device separation-trench).

Next, when the light-emitting-device separation-trench is formed to the intermediate portion of the buffer layer 22, as shown in FIGS. 1-19 and 1-20, the buffer layer 22 extend to the edge of the light-emitting-device, the buffer layer has a step based on the bottom of the light-emitting-device separation-trench, the sidewall of the buffer layer has a part which is not covered by an insulating layer (the edge of the device) and a sidewall part receded from the edge of the light-emitting-device (the sidewall of the light-emitting-device separation-trench). Again, in FIGS. 1-19 and 1-20, the edge of the buffer layer 22 is in line with the edge face of the substrate, but it may be inside or outside of the substrate 21 depending on a separation method. In the example in FIG. 1-19, the insulating layer 30 covers the bottom and the sidewall of the separation trench, from a position in the trench bottom distant from the edge of the buffer layer 22, and also covers the sidewall of the optical coupling layer 23 (the sidewall of the light-emitting-device separation-trench) as shown in part E (dotted line circle) in FIG. 1-19. This corresponds to a configuration where formation of the light-emitting-device separation-trench is stopped in the intermediate portion of the buffer layer 22 in FIGS. 1-1 and 1-2. The example in FIG. 1-20 corresponds to a configuration where formation of the light-emitting-device separation-trench is stopped in the intermediate portion of the buffer layer 22 in FIGS. 1-3 and 1-4, and as shown in part F (dotted line circle) in FIG. 1-20, there is a part which is not covered by an insulating layer, in the main light-extraction direction side of the sidewall inside of the edge of the light-emitting-device (the sidewall of the light-emitting-device separation-trench).

Figures 1, 2, 3:
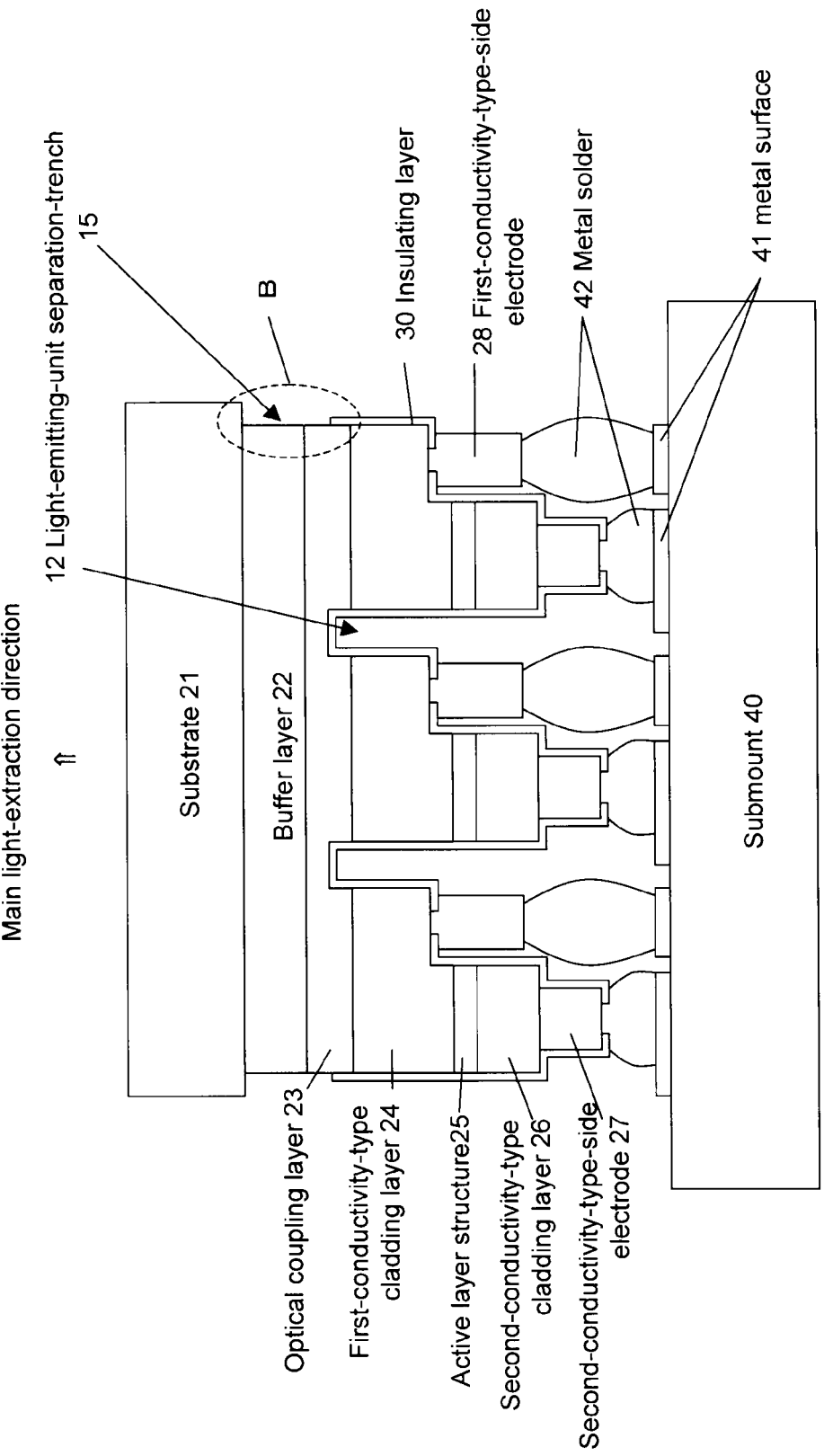

As in these examples, even when the light-emitting-device separation-trench is formed to the intermediate portion of the combined layer of the optical coupling layer and the buffer layer, a device having a configuration where an insulating layer covering the sidewall does not reach the edge of the light-emitting-device ensures prevention of detachment of the insulating layer, and by forming the exposed layer from a highly insulative material, there can be provided a highly reliable device comparable to the light-emitting-device having the configuration in FIGS. 1-1 and 1-3.

Furthermore, for the light-emitting-device of the invention disclosed in this Section, it is preferable that the insulating layer 30 is in contact with a part of the first-conductivity-type-side electrode 28 at the side of the main light-extraction direction as shown in FIG. 1-1, that is, there is a part intervened by an insulating layer in the periphery of the contact area between the first-conductivity-type-side electrode 28 and the first-conductivity-type semiconductor layer (the first-conductivity-type cladding layer 24 in the figure); and covers a part of the second-conductivity-type-side electrode 27 on the opposite side of the main light-extraction direction, that is, there is not an insulating layer between the second-conductivity-type-side electrode 27 and the second-conductivity-type semiconductor layer (the second-conductivity-type cladding layer 26 in the figure) and the insulating layer covers a periphery portion of the second-conductivity-type-side electrode 27. This configuration means that the insulating layer 30 is formed after the second-conductivity-type-side electrode 27 is formed; and after the insulating layer 30 is formed, the first-conductivity-type-side electrode 28 is formed. A manufacturing process with this sequence leads to less damage to a second-conductivity-type semiconductor layer such as the second-conductivity-type cladding layer 26 and to the first-conductivity-type-side electrode, resulting in a light-emitting-device with a high efficiency as described later. In other words, the fact having such a configuration means that the light-emitting-device exhibits high efficiency.

Furthermore, although the second-conductivity-type-side electrode 27 has the same size as the second current injection region 35, the exposed surface 37 in the second-conductivity-type-side electrode (the exposed part in the second-conductivity-type-side electrode) preferably has a smaller size than the second current injection region 35. Furthermore, in a part of the insulating layer 30 covering the surface of the first-conductivity-type cladding layer 24, there is formed an opening for contact of the first-conductivity-type-side electrode 28 with the first-conductivity-type cladding layer 24, which becomes a first current injection region 36. It is preferable that the first-conductivity-type-side electrode 28 has an area larger than that of the first current injection region.

It is also preferable that the second-conductivity-type-side electrode and the first-conductivity-type-side electrode are not spatially overlapped.

There will be further detailed the materials and the structures constituting a device.

Substrate

There are no particular restrictions to a material for the substrate 21 as long as it is substantially optically transparent to an emission wavelength of the device. The term "substantially transparent" means that the substrate does not absorb the light in the emission wavelength or if any, a light output is not decreased by 50% or more by absorption by the substrate.

The substrate is preferably an electrically insulative substrate. It is because even if a solder material adheres to the periphery of the substrate during flip-chip mounting, it does not affect current injection into a light-emitting-device. Specific examples of such a material is preferably selected from sapphire, SiC, GaN, LiGaO$_2$, ZnO, ScAlMgO$_4$, NdGaO$_3$ and MgO, particularly preferably sapphire, GaN and ZnO substrates for growing a thin-film crystal of an InAlGaN light-emitting material or an InAlBGaN material on the substrate. In particular, when a GaN substrate is used, its Si doping concentration is preferably a Si concentration of $3 \times 10^{17}$ cm$^{-3}$ or less for an undoped substrate, more preferably $1 \times 10^{17}$ cm$^{-3}$ or less in the light of electric resistance and crystallinity.

A substrate used in the invention disclosed in this Section may be, in addition to a just-substrate completely defined by a so-called plane index, a so-called off-substrate (miss oriented substrate) in the light of controlling crystallinity during thin-film crystal growth. An off-substrate is widely used as a substrate because it is effective for promoting favorable crystal growth in a step flow mode and thus effective for improving device morphology. For example, when a c+ plane substrate of sapphire is used as a substrate for crystal growth of an InAlGaN material, it is preferable to use a plane inclined to an m+ direction by about 0.2°. An off-substrate having a small inclination of about 0.1 to 0.2° is generally used, but in an InAlGaN material formed on sapphire, a relatively larger off-angle is possible for canceling an electric field due to piezoelectric effect to a quantum well layer as a light-emitting-point within an active layer structure.

A substrate may be pretreated by chemical etching or heating for manufacturing an integrated compound semiconductor light-emitting-device utilizing crystal growth technique such as MOCVD and MBE. Alternatively, a substrate may be deliberately processed to have irregularity in relation to a buffer layer described later to prevent penetrating dislocation generated in an interface between a thin-film crystal layer and the substrate from being introduced near an active layer of a light-emitting-device or a light-emitting-unit described later.

In the invention disclosed in this Section, for confining a light in an optical coupling layer described later and guiding a part of it to distribute within the layer, it is desirable that the substrate has a refractive index at an emission wavelength of an integrated compound semiconductor light-emitting-device which is relatively smaller than an average refractive index of an optical coupling layer.

In one embodiment of the invention disclosed in this Section, a thickness of the substrate is generally about 250 to 700 μm in an initial stage of device preparation so as to ensure mechanical strength during crystal growth in a semiconductor light-emitting-device and a device manufacturing process. After growing a thin-film crystal layer, it is desirable that for facilitating separation into individual devices, the substrate is appropriately thinned by a polishing step in the course of the process and finally has a thickness of about 100 μm or less in a device. The thickness is generally 30 μm or more.

In another embodiment of the invention disclosed in this Section, a thickness of the substrate may be larger than a conventional thickness, and may be about 350 μm, furthermore about 400 μm or 500 μm.

In order to confine and wave-guide a light in the optical coupling layer described later, the substrate may be selected so as to be a lower-refractive-index layer relative to the waveguide; and in this case, a physical thickness of the substrate is preferably more than $4\lambda/n_{sb}$, wherein an emission wavelength of a light-emitting-device is λ (nm) and an average refractive index of a substrate is $n_{sb}$.

It is further desirable that a so-called low reflecting coating layer or low-reflecting optical film is formed on a plane in a main light-extraction direction of the substrate. It lowers reflection due to a refractive index difference in a substrate-air interface and output and device efficiency can be improved. Here, when R3 is a reflectance of reflection by the substrate, of a light having an emission wavelength of the light-emitting-device vertically incoming from the optical coupling layer to the substrate side and R4 is a reflectance of reflection by an interface with a space, of a light having an emission wavelength of the light-emitting-device vertically incoming from the substrate to the space of the light-extraction side, it is preferable that a low-reflecting optical film is formed in the light-extraction side of the substrate such that R4 of the reflectance of reflection of the emission wavelength of the device satisfies the relation:

$$R4 < R3.$$

For example, when the substrate is sapphire, the low reflecting coating film is preferably, for example, MgF$_2$. It is because a refractive index of the low reflecting coating film is preferably near $\sqrt{n_s}$ in relation to a refractive index $n_s$ of the substrate at an emission wavelength, and because MgF$_2$ has a refractive index near a square root of a refractive index of sapphire.

In the invention disclosed in this part, it is also preferable that a plane in a main light-extraction direction of the substrate is an irregular or crude surface. It allows for extracting light generated within a quantum well layer with a high efficiency, which is desirable in the light of improving a device output and efficiency. When an emission wavelength of a device is λ (nm), its surface crudeness is preferably such that an average roughness Ra (nm) satisfy the relation:

$$\lambda/5 \text{ (nm)} < Ra \text{ (nm)} < 10 \times \lambda \text{ (nm)}$$

more preferably, the relation:

$$\lambda/2 \text{ (nm)} < Ra \text{ (nm)} < 2 \times \lambda \text{ (nm)}.$$

Buffer Layer

A buffer layer 22 is formed mainly for facilitating thin-film crystal growth, for example, for preventing dislocation, alleviating imperfection in a substrate crystal and reducing various mutual mismatches between a substrate crystal and a desired thin-film crystal growth layer in growing a thin-film crystal on a substrate.

A buffer layer is particularly important since when a material such as an InAlGaN material, an InAlBGaN material, an InGaN material, an AlGaN material and a GaN material is grown on a foreign substrate by thin-film crystal growth, which is a desirable embodiment in the invention disclosed in this Section, matching of a lattice constant with a substrate is not necessarily ensured. For example, when a thin-film crystal growth layer including an optical coupling layer and thereafter is grown by organic metal vapor deposition (MOVPE), a low temperature growth AlN layer at about 600° C. may be used as a buffer layer, or a low temperature growth GaN layer formed at about 500° C. may be used. A material such as AlN, GaN, AlGaN, InAlGaN and InAlBGaN grown at a high temperature of about 800° C. to 1000° C. may be used. These layers are generally as thin as about 5 to 40 nm.

A buffer layer 22 needs not necessarily to be a single layer, and on a GaN buffer layer grown at a low temperature, a GaN layer may be grown at a temperature of about 1000° C. to several μm without doping for further improving crystallinity. In practice, it is common to form such a thick film buffer layer with a thickness of about 0.5 to 7 μm. In the invention disclosed in this Section, the buffer layer preferably does not contain a doped layer because the buffer layer is present in common to light-emitting-units in a compound semiconductor light-emitting-device. However, in case that a doped layer is contained in the buffer layer in consideration of crystallinity and the like, it is necessary that a undoped layer is formed after the growth of the doped layer so that the electrical insulation between the light-emitting-units is completely attained. Alternatively, buffer layer may be formed by stacking doped layer(s) and undoped layer(s) therein.

A buffer layer may be formed by epitaxial lateral overgrowth (ELO) as a kind of so-called microchannel epitaxy, which may allow for significant reduction of penetrating dislocation generated between a substrate such as sapphire and an InAlGaN material. Furthermore, when a processed substrate whose surface is made irregular, dislocation can be partly diminished during epitaxial lateral overgrowth, and it is preferable to apply such a combination of a substrate and a buffer layer to the invention disclosed in this Section. Furthermore, such a configuration is preferable because the irregularity formed in the surface of the substrate improves light-extraction efficiency.

In the invention disclosed in this Section, a buffer layer may be integrated with an optical coupling layer described later to effect optical coupling between the light-emitting-units because the buffer layer is a layer common to the light-emitting-units. In this case, it is necessary not to deteriorate the electrical insulation between the light-emitting-units. Further, a part or the whole of the buffer layer may also act as an optical coupling layer.

In addition, the buffer layer may constitute an exposed portion in a light-emitting-device separation-trench. Specifically, when undoped portion is exposed, insulation failure due to, for example, solder during device assembly can be prevented.

Optical Coupling Layer

An optical coupling layer in the invention disclosed in this Section is a layer to effect the optical coupling between light-emitting-units constituting a light-emitting-device and that not to deteriorate the electrical insulation between the light-emitting-units contained in the integrated semiconductor light-emitting-device.

The optical coupling layer 23 is preferably formed in a compound semiconductor layer and as shown in the drawings such as FIGS. 1-1 and 2, it is formed between a buffer layer and a first-conductivity-type semiconductor layer (a first-conductivity-type cladding layer in figures). There are no particular restrictions to a deposition method, but the layer is preferably formed by thin-film crystal growth together with the other thin-film crystal layers for conveniently preparing an integrated semiconductor light-emitting-device.

In the invention disclosed in this Section, a refractive index of the optical coupling layer is preferably selected such that at least, light is confined within the layer, that is, the distribution density of the light is high to some degree. Thus, it is preferable that an average refractive index of optical coupling layer ($n_{oc}$) is larger than an average refractive index of the substrate ($n_{sb}$) and an average refractive index of a first-conductivity-type cladding layer. Particularly preferably, it is larger than an average refractive index of the first-conductivity-type semiconductor layer ($n_1$) present between an optical coupling layer and an active layer structure. It is equal to or larger than an average refractive index of a buffer layer ($n_{bf}$), particularly preferably more than an average refractive index of a buffer layer. It is particularly preferable that a material constituting the optical coupling layer is transparent to a light emitted from a quantum well layer. When a light-emitting-device is based on an InAlGaN type Group III-V nitride, it is also desirable that it contains In or Al in such an amount that a light emitted from the active layer structure is not absorbed, and particularly preferably, In is contained in consideration of improving a refractive index.

An optical coupling layer does not have to be a single layer, but may have a multilayer configuration. For a multilayer configuration, it may be a plurality of layers such as AlGaN, InGaN, InAlGaN and GaN or a superlattice structure.

Here, an average refractive index (nav) of each layer is a quotient of the sum of products of a refractive index (nx) of each of n materials constituting the layer and a physical thickness (tx) of the material by the whole thickness, which is calculated by the following equation:

$$nav=(n1\times t1+n2\times t2+\ldots+nn\times tn)/(t1+t2+\ldots+tn).$$

Further, an optical coupling layer may, depending on its structure, cause effects such as light scattering, multiple reflection and thin-film interference. In this case, these effects can further improve the uniformity at light-extraction face of the light-emitting-device as a whole.

As an example of an optical coupling layer, for example, a single layer of undoped GaN may be used as the optical coupling layer when an active layer structure has a quantum well layer with a composition of $In_aGa_{1-a}N$ and an emission wavelength of 460 nm, a first-conductivity-type cladding layer is n-GaN, a buffer layer is undoped GaN and a substrate is sapphire. Generally, there is a tendency that the higher a carrier concentration is, the smaller a refractive index of a semiconductor material at a transparent wavelength to the material is.

Further, a single layer of undoped GaN may be used as the optical coupling layer when an active layer structure has a quantum well layer with a composition of $In_aGa_{1-a}N$ and an emission wavelength of 460 nm, a first-conductivity-type cladding layer consists of an n-GaN and an n-AlGaN layers, a buffer layer is a stacked structure of an undoped GaN and a Si-doped GaN and a substrate is sapphire. Generally, there is a tendency that the higher a carrier concentration is, the smaller a refractive index of a semiconductor material at a transparent wavelength to the material is.

Further, an optical coupling layer may be a multilayer structure having a thick film of undoped GaN which contains $In_bGa_{1-b}N$ having a composition transparent to an emission wavelength and having a desired thickness in a desired number when an active layer structure has a quantum well layer having a composition of $In_aGa_{1-a}N$ and an emission wavelength of 460 nm, a first-conductivity-type cladding layer consists of an n-GaN and an n-AlGaN layers, a buffer layer is a stacked structure of undoped GaN and Si-doped GaN and a substrate is Si-doped GaN. Generally, there is a tendency that the higher a carrier concentration is, the smaller a refractive index of a semiconductor material at a transparent wavelength to the material is.

In these structures, it may be also desirable that an optical coupling layer contains a material such as $In_bGa_{1-b}N$ and $In_cAl_dGa_{1-c-d}N$. The appropriate selection of the composition parameters b, c and d, thickness and so on provides a layer which is transparent at a wavelength of 460 nm and has a refractive index larger than that of n-GaN which may be contained in a first-conductivity-type semiconductor layer, of undoped GaN which may be contained in a buffer layer, of sapphire which may be contained in a substrate, so that it may be used as an optical coupling layer. These materials can be used in the form of single layer or in multiple layers formed of these materials and undoped GaN layers.

Furthermore, it is also preferable that the optical coupling layer has a superlattice quantum well structure consisting of an InGaN layer and a GaN layer in which an In composition and a InGaN layer thickness are adjusted so as not to absorb the emission wavelength of a compound semiconductor light-emitting-device.

It is also important that a thickness of the optical coupling layer is selected such that it acts as a multimode optical waveguide receiving part of a light emitted from each light-emitting-unit and distributing the light therethrough to the other light-emitting-units.

When a physical thickness of the optical coupling layer is $t_{oc}$ (nm), an emission wavelength of the light-emitting-device is $\lambda$ (nm), an average refractive index of the optical coupling layer is $n_{oc}$, an average refractive index of the first-conductivity-type semiconductor layer is $n_1$, and an average refractive index of the substrate is $n_{sb}$, a relative refractive index difference $\Delta_{(oc-1)}$ between the optical coupling layer and the first-conductivity-type semiconductor layer is defined as:

$$\Delta_{(oc-1)} \equiv ((n_{oc})^2 - (n_1)^2)/(2 \times (n_{oc})^2).$$

A relative refractive index difference $\Delta_{(oc-sb)}$ between the optical coupling layer and the substrate is defined as:

$$\Delta_{(oc-sb)} \equiv ((n_{oc})^2 - (n_{sb})^2)/(2 \times (n_{oc})^2).$$

Regarding the optical coupling layer as a symmetric slab waveguide sandwiched by average refractive indices of the first-conductivity-type semiconductor layer, the condition for the waveguide to be a multimode is that a normalized frequency is $\pi/2$ or more, and thus it is desirable that $t_{oc}$ is selected such that the relationship:

$$(\sqrt{(2 \times \Delta_{(oc-1)})} \times n_{oc} \times \pi \times t_{oc})/\lambda \geq \pi/2$$

is satisfied. At the same time, assuming that the optical coupling layer is a symmetric slab waveguide sandwiched by average refractive indices of the substrate, the condition for the waveguide to be a multimode is that a normalized frequency is $\pi/2$ or more, and thus it is desirable that $t_{oc}$ is selected such that the relationship:

$$(\sqrt{(2 \times \Delta_{(oc-sb)})} \times n_{oc} \times \pi \times t_{oc})/\lambda \geq \pi/2$$

is also satisfied.

Specifically, for example, assuming that an average refractive index of the optical coupling layer is 2.50 and an average refractive index of the substrate is 1.70, each at a wavelength of 460 nm, the above relationship is satisfied when a thickness of the optical coupling layer is about 0.13 μm or more. Furthermore, for example, assuming that an average refractive index of the optical coupling layer is 2.50 and an average refractive index of the first-conductivity-type semiconductor layer is 2.499, each at a wavelength of 460 nm, the above relationship is satisfied when a thickness of the optical coupling layer is about 3.3 μm or more.

Confinement of light achieved as above improves the optical coupling between the light-emitting-units, which then facilitates the uniform emission of light from the integrated compound semiconductor light-emitting-device. In addition, because of the presence of the optical coupling layer even in the place of light-emitting-unit separation-trench between light-emitting-units, relatively uniform light emission from the proximity to the light-emitting-unit separation-trench is achieved.

If a light is extremely confined in the optical coupling layer, luminescence uniformity in an integrated compound semiconductor light-emitting-device is improved but light-extraction becomes difficult, and it is, therefore, preferable that a thickness, a material, a structure, a configuration, a refractive index and so on of the optical coupling layer are appropriately selected such that wave guide is attained while it is leaky to some extent. Particularly, in terms of its thickness, it is not desirable that a thickness of the optical coupling layer is extremely large, leading to excessive light confinement in the waveguide; for example, its upper limit is preferably 30 μm or less, more preferably 10 μm or less, most preferably 5 μm or less.

Furthermore, since the optical coupling layer is present common to the light-emitting-units, it is essential that its material is selected so as not to deteriorate electric insulation between light-emitting-units. If all light-emitting-units are connected electrically in the light-emitting-device, the degradation in a single light-emitting-unit (a pair of pn junction) not only leads to the decrease in luminescence in the degraded light-emitting-unit, but also affects as the occurrence of change in current injection rout in the entirety of integrated compound semiconductor light-emitting-device. Therefore, the degradation in a light-emitting-unit shows up in a large scale as a fluctuation in properties of a light-emitting-device. In the present invention, the material of the optical coupling layer is very preferably selected so as to ensure the electrical insulation between the light-emitting-units. If electrically insulated, the degradation in a light-emitting-unit, if happened during driving it, is limited to the problem of the degradation in a single light-emitting-unit. Further, since the adjacent light-emitting-units are coupled optically, light emission from the proximity of the light-emitting-unit which has degraded is expected to some extent, and an extreme decrease in the emission intensity is also avoided. Therefore, the plane uniformity of the light intensity is relatively easily maintained including the degraded portion.

The optical coupling layer is insulative to the extent that changes such as degradation in a light-emitting-unit do not incur the influence in the other units. For example, a specific resistance $\rho_{oc}$ (Ω·cm) of the whole layer is preferably 0.5 (Ω·cm) or higher. It is more preferably 1.0 (Ω·cm) or higher, further preferably 1.5 (Ω·cm) or higher, most preferably 5 (Ω·cm) or higher. For a higher specific resistance, the optical coupling layer is preferably undoped. In addition, for example, when the optical coupling layer consists of multiple layers, a doped layer may be contained without problems if it is sandwiched between undoped layers and the light-emitting-units are not mutually electrically connected. In this case, it is required that a layer adjacent to the first-conductivity-type semiconductor layer (for example, a first-conductivity-type cladding layer) has the above specific resistance. Since generally in a wavelength region transparent to the material in a semiconductor, an undoped layer has a higher refractive index than that of a layer having many carriers deliberately doped even for the same material, an undoped layer is preferable in view of not only optical properties but also electric properties.

In the invention disclosed in this part, while the optical coupling layer couples light-emitting-units optically and distributes and spreads light, the above buffer layer is for reduce various mismatches in crystal growth on a substrate, so that their functions are different. However, the single layer may have two functions at the same time. When the optical coupling layer or the buffer layer consists of multiple layers, some layers may have two functions. Furthermore, when a growing method or conditions are different even in the same composition, the layer may have only one function.

As described above, in the invention disclosed in this Section, light-emitting-unit separation-trench is present between light-emitting-units and this separation trench is formed so as to divide at least a first-conductivity-type cladding layer. Cladding layers and the like are generally doped for injecting carriers into a pn junction in a light-emitting-unit. Therefore, the cladding layer needs to be separated between the light-emitting-units in the invention disclosed in this Section in order to ensure the electrical insulation. Accordingly, it is sufficient that the light-emitting-unit separation-trench reaches the interface of the optical coupling layer. However, the separation trench is generally formed to the intermediate portion of the optical coupling layer for easiness of forming.

Further, a sidewall of the thin-film crystal layer exposed in the light-emitting-unit separation-trench is preferably covered by an insulating layer. This is because short circuit and the like can be prevented at sidewall of the thin-film crystal layer due to a solder when the light-emitting-device is flip-chip mounted on a submount and the like First-Conductivity-Type Semiconductor Layer and First-Conductivity-Type Cladding Layer In a typical embodiment of the invention disclosed in this Section, a first-conductivity-type cladding layer 24 divided between light-emitting-units is present in contact with an optical coupling layer 23 as shown in FIG. 1-1. The first-conductivity-type cladding layer 24 cooperates with a second-conductivity-type cladding layer 26 described later to efficiently inject carriers into an active layer structure 25 described later and to prevent overflow from the active layer structure, for light emission in a quantum well layer with a high efficiency. It also contributes to confinement of light near the active layer structure, for light emission in a quantum well layer with a high efficiency. The first-conductivity-type semiconductor layer includes, in addition to the layer having the above cladding function, a first-conductivity-type doped layer for improving the performance of the device such as a contact layer, or because of manufacturing process. In the broad sense, the whole first-conductivity-type semiconductor layer may be regarded as a first-conductivity-type cladding layer, where a contact layer and so on can be regarded as a part of the first-conductivity-type cladding layer.

Generally, it is preferable that the first-conductivity-type cladding layer is made of a material having a smaller refractive index than an average refractive index of an active layer structure described later and having a larger band gap than an average band gap of the active layer structure described later. Furthermore, the first-conductivity-type cladding layer is generally made of a material belonging to a type I band lineup in the relation to the active layer structure, particularly a barrier layer. Based on such a guideline, the first-conductivity-type cladding layer material can be appropriately selected, considering a substrate, a buffer layer, an active layer structure and so on provided or prepared for achieving a desired emission wavelength.

For example, when a substrate is C+ plane sapphire, a buffer layer is GaN grown at a low temperature, and an optical coupling layer is GaN grown at a high temperature, the first-conductivity-type cladding layer may be made of a GaN material, an AlGaN material, an AlGaInN material, an InAlBGaN material or a multilayer structure of these. In the invention disclosed in this Section, it is preferable that the average refractive index of the optical coupling layer ($n_{oc}$) is larger than the average refractive index of the substrate ($n_{sb}$) and the average refractive index of the first-conductivity-type cladding layer. In particular, it is preferably larger than the average refractive index of the first-conductivity-type semiconductor layer ($n_1$) which is present between the optical coupling layer and the active layer structure. Furthermore, it is equal to or larger than the average refractive index of the buffer layer ($n_{bf}$) and in particular, it is preferably larger than the average refractive index of the buffer layer.

A carrier concentration of the first-conductivity-type cladding layer is, as a lower limit, preferably $1 \times 10^{17}$ cm$^{-3}$ or more, more preferably $5 \times 10^{17}$ cm$^{-3}$ or more, most preferably $1 \times 10^{18}$ cm$^{-3}$ or more. It is, as an upper limit, preferably $5 \times 10^{19}$ cm$^{-3}$ or less, more preferably $1 \times 10^{19}$ cm$^{-3}$ or less, most preferably $7 \times 10^{18}$ cm$^{-3}$ or less. Here, when the first-conductivity-type is n-type, a dopant is most preferably Si.

A structure of the first-conductivity-type cladding layer is shown as a single-layered first-conductivity-type cladding layer in the example of FIG. 1-1, but the first-conductivity-type cladding layer may consist of two or more layers. Here, it may be made of, for example, a GaN material and an AlGaN material, an InAlGaN material or an InAlBGaN material. The whole first-conductivity-type cladding layer may be a super-lattice structure as a stacked structure of different materials. Furthermore, within the first-conductivity-type cladding layer, the above carrier concentration may be varied.

In the part contacting with the first-conductivity-type-side electrode in the first-conductivity-type cladding layer, the carrier concentration may be deliberately increased to reduce a contact resistance with the electrode.

In a preferred structure, a part of the first-conductivity-type cladding layer is etched, and the exposed sidewall and the etched part in the first-conductivity-type cladding layer are completely covered by an insulating layer, except a first current injection region for contact with a first-conductivity-type-side electrode described later.

In addition to the first-conductivity-type cladding layer, a further different layer may be, if necessary, present as a first-conductivity-type semiconductor layer. For example, there may be formed a contact layer for facilitating injection of carriers into a junction with an electrode. Alternatively, these layers may be formed as multiple layers different in a composition and formation conditions.

Active Layer Structure

There is formed the active layer structure 25 on the first-conductivity-type cladding layer 24. An active layer structure means a structure which contains a quantum well layer where the recombination of electrons and holes (or holes and electrons) injected from the above first-conductivity-type cladding layer and a second-conductivity-type cladding layer described later, respectively takes place to emit a light and a barrier layer adjacent to the quantum well layer or between the quantum well layer and a cladding layer. Here, for achieving improvement in an output and efficiency as the objectives of the present invention, it is desirable that the equation B=W+1 is satisfied where W is the number of quantum well layers in the active layer structure and B is the number of barrier layers. That is, it is desirable for improving an output that the overall layer relationship between the cladding layer and the active layer structure is "the first-conductivity-type cladding layer, the active layer structure, second-conductivity-type cladding layer" and an active layer structure is configured such as "a barrier layer, a quantum well layer and a barrier layer" or "a barrier layer, a quantum well layer, a barrier layer, a quantum well layer and a barrier layer". FIG. 1-5 schematically shows a stacked structure of five quantum well layers and six barrier layers.

Here, the quantum well layer has a film thickness as small as about a de Broglie wavelength for inducing a quantum size effect to improve a luminous efficiency. Thus, for improving an output, it is desirable to form, instead of forming a single quantum well layer, a plurality of quantum well layers, which are separated to form an active layer structure. Here, a layer controlling binding between the quantum well layers and separating them is a barrier layer. Furthermore, it is desirable that a barrier layer is present for separation between a cladding layer and a quantum well layer. For example, when a cladding layer is made of AlGaN and a quantum well layer is made of InGaN, there is preferably formed a barrier layer made of GaN between them. This is also desirable in terms of thin-film crystal growth because adjustment becomes easier when an optimal temperature for crystal growth is different. When a cladding layer is made of InAlGaN having the largest band gap and a quantum well layer is made of InAlGaN having the smallest band gap, a barrier layer may be made of InAlGaN having an intermediate band gap. Furthermore, a band gap difference between a cladding layer and a quantum well layer is generally larger than a band gap difference between a barrier layer and a quantum well layer; and considering an efficiency of injection of carriers into a quantum well layer, it is desirable that the quantum well layer is not directly adjacent to the cladding layer.

It is preferable that a quantum well layer is not deliberately doped. On the other hand, it is desirable that a barrier layer is doped to reduce a resistance of the overall system. In particular, it is desirable that a barrier layer is doped with an n-type dopant, particularly Si. Mg as a p-type dopant easily diffuses in a device and it is thus important to minimize Mg diffusion during high output operation. Thus, Si is effective and it is desirable that the barrier layer is Si-doped. It is, however, desirable that the interface between the quantum well layer and the barrier layer is undoped.

It is preferable that an active layer structure sidewall in one device is covered by an insulating layer 30 as shown in FIG. 1-1. It is advantageous in that in flip-bonding of a device manufactured, short circuit due to a solder in a sidewall in an active layer structure is avoided.

In the invention disclosed in this Section, it is preferable that the light emitted from a quantum well layer in each light-emitting-unit has substantially same light emission spectrum. This is necessary for the compound semiconductor light-emitting-device to attain a plane light source and uniform light emission.

Second-Conductivity-Type Semiconductor Layer and Second-Conductivity-Type Cladding Layer The second-conductivity-type cladding layer 26 cooperates with the first-conductivity-type cladding layer 24 described above to efficiently inject carriers into the active layer structure 25 described above and to prevent overflow from the active layer structure, for light emission in a quantum well layer with a high efficiency. It also contributes to confinement of light near the active layer structure, for light emission in a quantum well layer with a high efficiency. The second-conductivity-type semiconductor layer includes, in addition to the layer having the above cladding function, a second-conductivity-type doped layer for improving the performance of the device such as a contact layer or because of manufacturing process. In the broad sense, the whole second-conductivity-type semiconductor layer may be regarded as a second-conductivity-type cladding layer, where a contact layer and so on can be regarded as a part of the second-conductivity-type cladding layer.

Generally, it is preferable that the second-conductivity-type cladding layer is made of a material having a smaller refractive index than an average refractive index of an active layer structure described above and having a larger band gap than an average band gap of the active layer structure described above. Furthermore, the second-conductivity-type cladding layer is generally made of a material belonging to a type I band lineup in relation to the active layer structure, particularly a barrier layer. Based on such a guideline, the second-conductivity-type cladding layer material can be appropriately selected, considering a substrate, a buffer layer, an active layer structure and so on provided or prepared for achieving a desired emission wavelength. For example, when a substrate is C+ plane sapphire and a buffer layer is made of GaN, the second-conductivity-type cladding layer may be made of a GaN material, an AlGaN material, an AlGaInN material, an AlGaBInN material or the like. It may be a stacked structure of the above materials. Furthermore, the first-conductivity-type cladding layer and the second-conductivity-type cladding layer may be made of the same material.

A carrier concentration of the second-conductivity-type cladding layer is, as a lower limit of, preferably $1 \times 10^{17}$ cm$^{-3}$ or more, more preferably $4 \times 10^{17}$ cm$^{-3}$ or more, further preferably $5 \times 10^{17}$ cm$^{-3}$ or more, most preferably $7 \times 10^{17}$ cm$^{-3}$ or more. It is, as an upper limit, preferably $7 \times 10^{18}$ cm$^{-3}$ or less, more preferably $3 \times 10^{18}$ cm$^3$ or less, most preferably $2 \times 10^{18}$ cm$^3$ or less. Here, when the second-conductivity-type is p-type, a dopant is most preferably Mg.

A structure of the second-conductivity-type cladding layer is shown as a single layer in the example of FIG. 1-1, but the second-conductivity-type cladding layer may consist of two or more layers. Here, it may be made of, for example, a GaN material and an AlGaN material. The whole second-conductivity-type cladding layer may be a superlattice structure as a stacked structure of different materials. Furthermore, within the second-conductivity-type cladding layer, the above carrier concentration may be varied.

Generally, in a GaN material, when an n-type dopant is Si and a p-type dopant is Mg, p-type GaN, p-type AlGaN and p-type AlInGaN are inferior to n-type GaN, n-type AlGaN and n-type AlInGaN, respectively, in crystallinity. Thus, in manufacturing a device, it is desirable that a p-type cladding layer with inferior crystallinity is formed after crystal growth of an active layer structure, and in this regard, it is desirable that the first-conductivity-type is n-type while the second-conductivity-type is p-type.

A thickness of the p-type cladding layer with inferior crystallinity (this corresponds to a second-conductivity-type cladding layer in an preferred embodiment) is preferably thinner to some extent. In the invention disclosed in this Section where flip chip bonding is conducted, a substrate side becomes a main light-extraction direction, so that it is not necessary to consider light extraction from the side of a second-conductivity-type-side electrode described later, allowing a thick film electrode with a large area to be formed. Thus, unlike in conducting face-up mounting, it is not necessary to expect current diffusion in a lateral direction in the second-conductivity-type-side cladding layer, and it is thus also advantageous in the light of a device structure that the second-conductivity-type-side cladding layer is thinner to some extent. However, since an extremely thin layer lead to reduction in a carrier injection efficiency, there is an optimal value. A thickness of the second-conductivity-type-side cladding layer can be appropriately selected, but is preferably 0.05 μm to 0.3 μm, most preferably 0.1 μm to 0.2 μm.

In the part contacting with the second-conductivity-type-side electrode in the second-conductivity-type cladding layer, its carrier concentration may be deliberately increased to reduce a contact resistance with the electrode.

It is desirable that the exposed sidewall in the second-conductivity-type cladding layer is completely covered by an insulating layer, except a second current injection region for contact with a second-conductivity-type-side electrode described later.

Furthermore, in addition to the second-conductivity-type cladding layer, a further different layer may be, if necessary, present as a second-conductivity-type semiconductor layer. For example, there may be formed a contact layer for facilitating injection of carriers into a part contacting with an electrode. Alternatively, these layers may be formed as multiple layers different in a composition and preparation conditions.

Without departing from the scope of the present invention, a layer which does not belong to the above category may be, if necessary, formed as a thin-film crystal layer.

Second-Conductivity-Type-Side Electrode

A second-conductivity-type-side electrode achieves good ohmic contact with a second-conductivity-type nitride compound semiconductor, acts as a good reflection mirror in an emission wavelength band in flip-chip mounting, and has good adhesion to a submount by a solder material in flip-chip mounting. For this end, a material can be appropriately selected and the second-conductivity-type-side electrode may be either single-layered or multi-layered. Generally, for achieving a plurality of required purposes to an electrode, a plurality of layer configurations are preferred.

When the second-conductivity-type is p-type and a portion of the second-conductivity-type-side cladding layer that faces to the second-conductivity-type-side electrode is formed of GaN, a material for the second-conductivity-type-side electrode preferably comprises an element selected from Ni, Pt, Pd, Mo or Au. In particular, the first layer, which faces to the p-side cladding layer, of the second-conductivity-type-side electrode is preferably Ni and the surface of the opposite side to the p-side cladding layer side of the second-conductivity-type-side electrode is preferably Au. This is because Ni has a work function with a large absolute value which is favorable for a p-type material and Au is preferable as the outermost surface material in the light of tolerance to process damage described later and a mounting sequence.

The second-conductivity-type-side electrode can contact with any of the thin-film crystal layers as long as second-conductivity-type carriers can be injected, and for example, when a second-conductivity-type-side contact layer is formed, the electrode is formed in contact with the layer.

First-Conductivity-Type-Side Electrode

A first-conductivity-type-side electrode achieves good ohmic contact with a first-conductivity-type nitride compound semiconductor, acts as a good reflection mirror in an emission wavelength band in flip-chip mounting and has good adhesion to a submount by a solder material in flip-chip mounting, and for this end, a material can be appropriately selected. The first-conductivity-type-side electrode may be either single-layered or multi-layered. Generally, for achieving a plurality of required purposes to an electrode, a plurality of layer configurations are preferred.

When the first-conductivity-type is n-type, an n-side electrode is preferably made of a material comprising any of Ti, Al and Mo or material comprising all of these. This is because these metals have a work function with a small absolute value. In the opposite side of the main light-extraction direction of n-side electrode, Al is generally exposed.

In the invention disclosed in this Section, it is preferred that the first-conductivity-type-side electrode is formed so as to have the larger area than the first current injection region, and that the first-conductivity-type-side electrode and the second-conductivity-type-side electrode do not spatially overlap at all. This is important for ensuring an adequate area to ensure adequate adhesiveness to a submount during flip-chip mounting a light-emitting-device by soldering while ensuring an adequate distance for preventing unintended short circuit due to, for example, a solder material between the second-conductivity-type-side electrode and first-conductivity-type-side electrode.

Here, it is desirable that the narrowest width of a part where the first-conductivity-type-side electrode is in contact with an insulating layer is 15 μm or more. This is because a margin is needed in a process for forming the first-conductivity-type-side electrode preferably by a photolithographic process and a lift-off process.

The first-conductivity-type-side electrode can contact with any of the thin-film crystal layers as long as first-conductivity-type carriers can be injected, and for example, when a first-conductivity-type-side contact layer is formed, the electrode is formed in contact with this layer.

Insulating Layer

An insulating layer 30 is formed for preventing unintended short circuit due to running around of material for mounting, such as solder or conductive paste, "between the second-conductivity-type-side electrode and the first-conductivity-type-side electrode", "to the sidewall of a thin-film crystal layer such as an active layer structure" and "any place between light-emitting-units" during flip-chip mounting. A material for an insulating layer may be appropriately selected as long as it ensures electric insulation. The material is, for example, preferably selected from single layer oxides, nitrides and fluorides; specifically, $SiO_x$, $AlO_x$, $TiO_x$, $TaO_x$, $HfO_x$, $ZrO_x$, $SiN_x$, $AlN_x$, $AlF_x$, $BaF_x$, $CaF_x$, $SrF_x$, $MgF_x$ and so on. These can stably ensure insulation for a long period.

The insulating layer 30 can be a multilayer film of insulating materials. This is a dielectric multilayer film, so that it can also act as a so-called highly reflective coating having a relatively higher optical reflectance to a light generated within a light-emitting-device by appropriately adjusting a refractive index of the dielectric material in the insulating layer. For example, when a center value of a device emission wavelength is $\lambda$, higher reflectiveness can be achieved by, for example, stacking $SiO_x$ and $TiO_x$ with each optical thickness of $\lambda/4n$ (here, n is a refractive index of each material at a wavelength $\lambda$). Such a configuration is very desirable because when flip chip bonding of a device is conducted, a light-extraction efficiency to a main extraction direction side can be improved and improvement in a device output and efficiency and prevention of unintended short circuit due to, for example, a solder material can be achieved at the same time.

Specifically, when R2 is a reflectance of reflection by an optical coupling layer, of a light having an emission wavelength of the light-emitting-device vertically incoming from the first-conductivity-type semiconductor layer side containing the first-conductivity-type cladding layer to the optical coupling layer, R12 is a reflectance of reflection by the insulating layer, of a light having an emission wavelength of the light-emitting-device vertically incoming from the second-conductivity-type semiconductor layer side containing the second-conductivity-type cladding layer to the insulating layer, R11 is a reflectance of reflection by the insulating layer, of a light having an emission wavelength of the light-emitting-device vertically incoming from the first-conductivity-type semiconductor layer side containing the first-conductivity-type cladding layer to the insulating layer and R1q is a reflectance of reflection by the insulating layer, of a light having an emission wavelength of the light-emitting-device vertically incoming from the active layer structure side containing a quantum well layer to the insulating layer, it is preferable that the insulating layer is configured such that at least one, particularly all of the conditions:

$$R2 < R12 \quad \text{(Relation 1)}$$

$$R2 < R11 \quad \text{(Relation 2)}$$

$$R2 < R1q \quad \text{(Relation 3)}$$

are satisfied.

These are desirable ranges for allowing an insulating layer formed by a dielectric multilayer film to efficiently function as an optical reflection mirror. It is desirable in the light of stability of the materials and refractive index ranges that the dielectric film contains a fluoride; specifically, containing any of $AlF_x$, $BaF_x$, $CaF_x$, $SrF_x$ and $MgF_x$.

Submount

A submount 40 has a metal layer and performs functions of current injection into a flip-chip mounted device and heat dissipation. A base material of the submount is preferably a metal, AlN, SiC, diamond, BN or CuW. These materials are desirable because they exhibit good heat dissipation properties and can efficiently prevent the problem of heat generation which is inevitable in a high-output light-emitting-device. Furthermore, $Al_2O_3$, Si, glasses and so on are also preferable because they are inexpensive and can be used as a base material for a submount in a wide variety of applications. when a base material for the submount is selected from metals, its periphery is preferably covered by, for example, a dielectric material which is etching resistant. A metal base material is preferably a material having a higher reflectance at an emission wavelength of the light-emitting-device, preferably Al, Ag and so on. When it is covered by a dielectric material, $SiN_x$, $SiO_2$ and so on formed by any of various CVD processes are preferred.

A light-emitting-device is bonded to a metal layer on a submount via any of various solder materials and paste materials. For adequately ensuring heat dissipation properties for high output operation and highly efficient light emission, bonding via a metal solder is particularly preferable. Examples of a metal solder include In, InAg, PbSn, SnAg, AuSn, AuGe and AuSi. These solders are stable and can be appropriately selected in the light of the environmental conditions such as a working temperature.

In an integrated compound semiconductor light-emitting-device of the invention disclosed in this Section, the light-emitting-units in a single light-emitting-device can be connected in parallel, in series or in combination of these by varying metal wiring on the submount.

Manufacturing Process for a Light-Emitting-Device Disclosed in Section A

Next, there will be described a process for manufacturing an integrated compound semiconductor light-emitting-device according to the invention disclosed in this Section.

In an embodiment of a manufacturing process disclosed in this Section, as shown in FIG. 1-6, first a substrate 21 is provided and over the surface are sequentially deposited a buffer layer 22, an optical coupling layer 23, a first-conductivity-type cladding layer 24, an active layer structure 25 and a second-conductivity-type cladding layer 26 by thin-film crystal growth. For formation of these thin-film crystal layers, MOCVD is preferably employed. However, it is possible to use MBE, PLD, PED processes and the like for forming all or some of the thin-film crystal layers. A configuration of these layers can be appropriately changed, depending on, for example, an application of the device. After forming thin-film crystal layers, a variety of processings are allowed. As used herein, the term "thin-film crystal growth" includes heat-treatment after growing a thin-film crystal layer.

For providing the configuration shown in FIGS. 1-1 and 1-2 after growing thin-film crystal layers in the invention disclosed in this Section, it is preferable that a second-conductivity-type-side electrode 27 is formed as shown in FIG. 1-6. That is, it is preferable that scheduled formation of the second-conductivity-type-side electrode 27 in the second current injection region 35 is conducted before formation of an insulating layer 30, formation of a first current injection region 36 and formation of a first-conductivity-type-side electrode 28. This is because when the second-conductivity-type is p-type as a desirable embodiment, formation of a p-side electrode after processing the exposed surface of the p-type cladding layer by various processes leads to reduction of a hole concentration in the p-GaN cladding layer with a relatively lower activation rate among GaN materials, due to process damage. For example, if the step of forming an insulating layer by p-CVD is conducted before forming the second-conductivity-type-side electrode, plasma damage remains in its surface. Thus, in the present invention, it is desirable that after thin-film crystal growth, formation of the second-conductivity-type-side electrode is conducted before any of the other process steps (for example, a first etching step, a second etching step, a third etching step or the step of forming an insulating layer, the step of forming an exposed part in a second-conductivity-type-side electrode, the step of forming a first current injection region and the step of forming a first-conductivity-type-side electrode as described later).

In the invention disclosed in this Section, when the second-conductivity-type is p-type and when the exposed surface is a relatively stable metal such as Au (in a typical example, the surface of the second-conductivity-type-side electrode is expected to be Au as described above), the surface is not likely process-damaged through the subsequent processes. In this respect, it is again desirable in the present invention that after thin-film crystal growth, formation of the second-conductivity-type-side electrode is conducted before any other process step.

In the present invention, when a layer in which the second-conductivity-type-side electrode is formed is the second-conductivity-type contact layer, process damage to the second-conductivity-type semiconductor layer can be reduced in the same manner.

The second-conductivity-type-side electrode 27 can be formed by applying a variety of deposition processes such as sputtering and vacuum evaporation, and a desired shape can be obtained by appropriately applying, for example, a lift-off process using photolithography technique or site-selective evaporation using, for example, a metal mask.

After forming the second-conductivity-type-side electrode 27, a part of the first-conductivity-type cladding layer 24 is exposed as shown in FIG. 1-7. In this step, it is preferable to remove the second-conductivity-type cladding layer 26, the active layer structure 25 and further a part of the first-conductivity-type cladding layer 24 by etching (a first etching step). The first etching step is conducted for the purpose of exposing a semiconductor layer into which a first-conductivity-type-side electrode described later injects first-conductivity-type carriers, and therefore, when a thin-film crystal layer contains another layer, for example, a cladding layer consists of two layers or contains a contact layer, the layer including the additional layer may be etched.

The first etching step does not require very high etching precision and thus can be a known dry etching technique by plasma etching using, for example, $Cl_2$ and using a etching mask of a nitride such as $SiN_x$ or an oxide such as $SiO_x$. It is, however, also preferable that dry etching can be conducted using a metal fluoride mask as detailed in a second etching step and a third etching step described later. It is particularly preferable to conduct etching by plasma excited dry etching using a gas such as $Cl_2$, $SiCl_4$, $BCl_3$ and $SiCl_4$ and using an etching mask containing a metal-fluoride layer selected from the group consisting of $SrF_2$, $AlF_3$, $MgF_2$, $BaF_2$, $CaF_2$ and combinations of these. Furthermore, the optimal dry etching is ICP type dry etching capable of generating high density plasma.

Here, the second-conductivity-type-side electrode 27 receives process history of the formation of a $SiN_x$ mask formed by, for example, plasma CVD or the step of removing the $SiN_x$ mask after the first etching step. However, when a stable metal such as Au is formed over the surface, the second-conductivity-type-side electrode is less process-damaged.

Then, as shown in FIG. 1-8, a light-emitting-unit separation-trench 12 is formed by a second etching step. In the second etching step, the GaN material must be etched to more depth compared with the first etching step. The sum of a layer depth etched by the first etching step is generally about 0.5 µm. Whereas, in the second etching step, the whole first-conductivity-type cladding layer 24 and a part of the optical coupling layer 23 must be etched. Therefore, the depth is generally 1 µm or more, for example, in the range of 1 to 5 µm, or in the range of 3 µm or more, for example 3 to 7 µm. In some cases it is in the range of 3 to 10 µm, or furthermore more than 10 µm.

Generally, a metal mask, a nitride mask such as $SiN_x$ and an oxide mask such as $SiO_x$ have a selectivity ratio to a GaN material, in terms of tolerance to etching by $Cl_2$ plasma, of about 5. In conducting the second etching step where a GaN material with a large film thickness must be etched, a relatively thicker $SiN_x$ film is necessary. For example, etching a GaN material with a thickness of 4 µm by a second dry-etching process requires a $SiN_x$ mask with a thickness of 0.8 µm. However, with a $SiN_x$ mask with such a thickness, the $SiN_x$ mask is also etched during the dry etching, and not only its thickness in a longitudinal direction but also its shape in a horizontal direction are changed, so that a desired GaN material part cannot be selectively etched.

Thus, when forming the light-emitting-unit separation-trench in the second etching step, dry etching using a mask including a metal-fluoride layer is preferred. A material constituting the metal-fluoride layer is preferably $MgF_2$, $CaF_2$, $SrF_2$, $BaF_2$ or $AlF_3$, most preferably $SrF_2$ in the light of balance between dry etching tolerance and wet-etching properties.

A metal fluoride film must be sufficiently tolerant to dry etching in the first, the second etching steps and the third etching steps while being easily etched by etching for patterning (preferably, wet etching) to give a patterning shape with good linearity particularly in the sidewall. Deposition of a metal-fluoride layer at a temperature of 150° C. or higher gives a dense film having good adhesiveness to a base layer, and the film after patterned by etching shows good linearity in a mask sidewall. A deposition temperature is preferably 250° C. or higher, further preferably 300° C. or higher, most preferably 350° C. or higher. Particularly, a metal-fluoride layer deposited at 350° C. or higher exhibits good adhesiveness to any type of base layer and gives a fine film which is highly tolerant to dry etching and exhibits quite higher linearity in its sidewall in terms of a patterning shape, ensuring controllability to a width of the opening, and thus it is the most preferable as an etching mask.

Thus, although deposition at a high temperature is preferable for providing an etching mask exhibiting good adhesiveness to a base layer, giving a fine film, being highly tolerant to dry etching and exhibiting very high linearity in its sidewall and very high controllability of a width of the opening in terms of a patterning shape, a too high deposition temperature gives a film having excessive tolerance to wet etching using, for example, hydrochloric acid preferably used for patterning a metal fluoride, and thus the film cannot be easily removed. Particularly, as described later, when a mask such as $SrF_2$ is exposed to plasma such as chlorine plasma during dry etching of a semiconductor layer, an etching rate in a later process for removing the mask layer tends to be reduced in comparison with that before exposure to plasma such as chlorine plasma. Therefore, deposition of a metal fluoride at an excessively higher temperature is undesirable in the light of its patterning and final removal.

First, in a metal fluoride before being exposed to plasma in dry etching of a semiconductor layer, a layer deposited at a lower temperature has a larger etching rate to an etchant such as hydrochloric acid, resulting in a higher etching rate and a layer deposited at a higher temperature has a smaller etching rate, resulting in a lower etching rate. When deposition temperature becomes 300° C. or higher, the etching rate decreases noticeably in comparison with a film deposited at a temperature of about 250° C., and a temperature of about 350° C. to 450° C. is within a very favorable etching rate range. A deposition temperature of higher than 480° C., however, leads to an excessively smaller absolute etching rate value, so that patterning of the metal fluoride takes a too longer time and patterning may be difficult under the conditions where a resist mask layer and so on are not detached. Furthermore, in a metal fluoride after being exposed to plasma in dry etching of a semiconductor layer, a wet-etching rate by, for example, hydrochloric acid in a removal step tends to decrease and growth at an excessively high temperature makes it difficult to remove the metal fluoride.

From such a viewpoint, a deposition temperature of a metal-fluoride layer is preferably 480° C. or lower, further preferably 470° C. or lower, particularly preferably 460° C. or lower.

Using a mask patterned considering the above (the mask may be a multilayer with $SiN_x$ or $SiO_2$ such that the metal-fluoride layer becomes a surface layer), dry etching is conducted. A gas species for the dry etching may be preferably selected from $Cl_2$, $BCl_3$, $SiCl_4$, $CCl_4$ and combinations of these. In the dry etching, a selectivity ratio of the $SrF_2$ mask to a GaN material is over 100, so that a thick GaN film can be easily and precisely etched. Furthermore, the optimal dry etching technique is ICP type dry etching capable of generating high-density plasma.

After the above etching, when the used unnecessary metal-fluoride layer mask is removed by an etchant such as hydrochloric acid, a multilayer mask with $SiN_x$, $SiO_2$ or the like may be formed such that the metal-fluoride layer becomes a surface layer if a material susceptible to an acid is present under the metal fluoride mask, for example, if an electrode material is susceptible to an acid. In such a case, $SiN_x$ or $SiO_2$ may be present in the whole region under the metal fluoride mask or alternatively, as shown, for example, in FIG. 1-21, a mask 51 such as $SiN_x$ and $SiO_2$ is not necessarily present in the whole region of the metal fluoride mask layer 52 but can be at least formed over a material susceptible to an acid.

By such a second etching step, the light-emitting-unit separation-trench is formed as shown in FIG. 1-8.

Then, as shown in FIG. 1-9, a light-emitting-device separation-trench 13 is formed by a third etching step. In the third etching step, the thickness of the GaN material to be etched is extremely deep compared with even the second etching step because whole buffer layer and the optical coupling layer must be etched, and is sometimes 5 to 10 μm, and in some cases more than 10 μm. Therefore, as explained for the second etching step, dry etching using a mask including a metal-fluoride layer is preferred. The preferred condition and the like (including a stacked layer mask and the like) are as described for the second etching step.

It is necessary that the light-emitting-device separation-trench is formed such that it interrupts at least the first-conductivity-type cladding layer. In a preferred embodiment disclosed in this Section, as shown in FIG. 1-9, the light-emitting-device separation-trench 13 is formed such that it reaches the substrate 21. Here, when diamond scribing is conducted from the side where the thin-film crystal layers have been formed in the steps of scribing and breaking for device separation, detachment of a GaN material on the sapphire substrate can be inhibited. Furthermore, it is advantageous that when laser scribing is conducted, thin-film crystal layers are not damaged. Furthermore, it is also preferable that the light-emitting-device separation-trench is formed by conducting etching into a part of the sapphire substrate (same for other substrates such as GaN).

Alternatively, a configuration where the light-emitting-device separation-trench does not reach the substrate is also preferable. For example, when the light-emitting-device separation-trench is formed to the intermediate portion of the combination of the optical coupling layer and the buffer layer, an insulating layer can be formed on the sidewall of the first-conductivity-type cladding layer, to maintain insulation to a running-around solder (see FIGS. 1-17 to 1-20 for a configuration after completion of the light-emitting-device). In this case, a layer exposed from the sidewall without being covered by the insulating layer is preferably highly insulative. In an embodiment where the light-emitting-device separation-trench is formed to the intermediate portion of the optical coupling layer, the second etching step and the third etching step can be carried out simultaneously, which enables simplifying a manufacturing process.

Regarding the first etching step and the second etching step and the third etching step, any of step can be carried out before or after the other step. It is also preferable for simplifying a process that the first etching step is first conducted and then without removing the etching mask, the second etching step and/or a third etching step is conducted. As shown in FIG. 1-21, first, a first etching mask 51 is formed from a material resistant to an acid such as $SiN_x$ and $SiO_2$ (preferably $SiN_x$) and etching is conducted such that a first-conductivity-type cladding layer 24 appears, and without removing the mask 51, a metal-fluoride layer is formed as a second and/or a third etching mask 52. Then, preferably, after conducting the second etching step and/or the third etching step, the mask 52 is removed by an acid and then the mask 51 is removed as appropriate. The first etching mask 51 may be allowed to present after the completion of the both etching even when the second etching step and the third etching step is carried out separately.

When the narrowest width between the light-emitting-device separation-trenches formed is $2L_{WSPT1}$, $L_{WSPT1}$ is preferably 20 μm or more, for example 30 μm or more for device separation by breaking. For separation by dicing, $L_{WSPT1}$ is preferably 300 μm or more. Since an excessively large width is not correspondingly effective, $L_{WSPT1}$ is generally 2000 μm or less. These are needed for ensuring a margin for a device manufacturing process and a scribe region.

After the third etching step, an insulating layer 30 is formed as shown in FIG. 1-10. The insulating layer may be appropriately made of any material as long as electric insulation can be ensured, as detailed above. Deposition can be conducted by any known method such as plasma CVD.

Next, as shown in FIG. 1-11, a predetermined part in the insulating layer 30 is removed, to form a second-conductivity-type-side electrode exposed part 37 where the insulating layer on the second-conductivity-type-side electrode 27 is removed, a first current injection region 36 where the insulating layer on the first-conductivity-type cladding layer is removed, and a scribe region 14 where the insulating layer within the light-emitting-device separation-trench 13 is removed. Removal of the insulating layer 30 on the second-conductivity-type-side electrode 27 is preferably conducted such that the periphery of the second-conductivity-type-side electrode is covered by the insulating layer. That is, the surface area of the second-conductivity-type-side electrode exposed part is preferably smaller than the area of the second current injection region. Here, for ensuring a margin for a device manufacturing process, particularly a photolithography step or preventing unintended short circuit from occurring due to a solder material, $L_{2w}$ is preferably 15 μm or more, wherein $L_{2w}$ is the narrowest width in the part where the second-conductivity-type-side electrode is partly covered by the insulating layer. More preferably, it is 30 μm or more, and most preferably, it is 100 μm or more. In particular, covering the wide area of the second-conductivity-type-side electrode by the insulating layer allows for reducing unintended short circuit due to a metal solder material, with an another part such as the first-conductivity-type-side electrode. In addition, $L_{2w}$ is generally 2000 μm or less, and preferably 750 μm or less.

For removing the insulating layer, an etching procedure such as dry etching and wet etching may be selected, depending on a material selected. For example, when the insulating layer is a single layer of $SiN_x$, dry etching using a gas such as $SF_6$ or wet etching using a hydrofluoric acid etchant can be employed. When the insulating layer is a dielectric multilayer film made of $SiO_x$ and $TiO_x$, the multilayer film in a desired part can be removed by Ar-ion milling.

The second-conductivity-type-side electrode exposed part 37, the first current injection region 36 and the scribe region 14 can be separately formed. But they are, in general, simultaneously formed by etching. When the width of scribe region 14 is $2L_{ws}$ (FIG. 1-2), $2L_{ws}$ is preferably 30 μm or more. Since an excessively large width is not correspondingly effective, $2L_{ws}$ is generally 300 μm or less and is preferably 200 μm or less.

In another embodiment (corresponds to FIGS. 1-3 and 1-4) disclosed in this Section, a part without an insulating layer 15 is formed by etching the insulating film on the sidewall near the substrate in the light-emitting-device separation-trench as shown in FIG. 1-12. The following process may be used as a formation process for removing a part of the insulating film. First, a resist mask having an opening whose area is equal to or slightly smaller than the area of the light-emitting-device separation-trench 13 is formed by photolithography, and then, wet etching is conducted using an etchant capable of etching an insulating layer, to initiate removal of the insulating layer on the substrate surface within the light-emitting-device separation-trench. If the etching is further continued, side etching proceeds to remove the insulating layer covering the substrate side of the trench sidewall by the wet etchant and thus to give a shape as shown in FIG. 1-12 wherein an insulating layer of the sidewall is not present in the portion of the substrate side. In the case that the insulating layer is removed as this case, the exposed sidewall without an insulating layer is preferably sidewall of undoped layer. This is because it prevents unintended electric short circuit from occurring even if a solder for bonding to a submount attaches to the sidewall during flip-chip mounting.

In the invention disclosed in this Section, either embodiment of FIG. 1-11 or FIG. 1-12 can prevent unintended electric short circuit during flip-chip mounting. Generally, such an embodiment is sufficient that forms a scribe region 14 where the insulating layer is not present on the substrate surface as shown in FIG. 1-11. When the light-emitting-device separation-trench is formed to the intermediate portion of the combination of the optical coupling layer and the buffer layer, the same process can be employed, except the insulating film is deposited not on the substrate surface but on the trench bottom surface in the above process.

Then, a first-conductivity-type-side electrode 28 is formed as shown in FIGS. 1-13 and 1-14. FIGS. 1-13 and 1-14 correspond to structures after first-conductivity-type-side electrode 28 is formed in the structures in FIGS. 1-11 and 1-12, respectively. An electrode material preferably comprises, as described above, a material selected from Ti, Al, Ag and Mo or all of them as a constituent device when the first-conductivity-type is n-type. Generally, Al is exposed in a direction opposite to a main light-extraction direction of the n-side electrode.

For a film formation of the electrode material, there is used a variety of deposition processes such as sputtering and vacuum evaporation, and a desired electrode shape can be obtained by appropriately applying, for example, a lift-off process using photolithography technique or site-selective evaporation using, for example, a metal mask. Considering a process margin to some extent, when $L_{1w}$ is the narrowest width in the part of the first-conductivity-type-side electrode in contact with the insulating layer, $L_{1w}$ is preferably 7 μm or more, particularly preferably 9 μm or more. Furthermore, $L_{1w}$ is generally 500 μm or less, preferably 100 μm or less. In general, when it is 5 μm or more, a process margin by a photolithography process and a liftoff procedure can be ensured.

The first-conductivity-type-side electrode is formed in this example such that a part thereof contacts with the first-conductivity-type cladding layer, but can be formed to contact with, in case formed, a first-conductivity-type-side contact layer.

In a manufacturing process of the invention disclosed in this Section, the first-conductivity-type-side electrode is formed in the final step of forming a stacked structure, which is advantageous in the light of reducing process damage. When the first-conductivity-type is n-type, Al is formed on the surface of the electrode material of the n-side electrode in a preferred embodiment. Here, if the n-side electrode is formed before formation of an insulating layer as the second-conductivity-type-side electrode, the n-side electrode surface, that is, Al metal receives a history of the etching process of the insulating layer. Etching of the insulating layer is conveniently conducted by wet etching using a hydrofluoric acid etchant as described above, but Al is less tolerant to various etchants including hydrofluoric acid, so that when effectively conducting such a process, the electrode itself is damaged. Furthermore, even if dry etching is employed, Al is relatively reactive, so that damages including oxidation may be introduced. Therefore, in the present invention, it is effective in reducing damage to the electrode that the first-conductivity-type-side electrode is formed after forming the insulating layer and after removing a predetermined unnecessary part in the insulating layer.

Thus, after forming the structure shown in FIG. 1-13 (FIG. 1-2) and FIG. 1-14 (FIG. 1-4), the substrate is scratched by diamond scribing or the substrate material is partly ablated by laser scribing using the light-emitting-device separation-trench for separating individual integrated compound semiconductor light-emitting-devices.

In case that there is no thin-film crystal layer in the light-emitting-device separation-trench in the step of inter-device separation (this corresponds to the structures in FIGS. 1-13 and 1-14), no process damage is introduced in the thin-film crystal layer. Furthermore, in case that there is no insulating layers in the scribe region as shown in FIGS. 1-13 and 1-14, for example, detachment of an insulating layer does not occur during scribing at all.

In some embodiments, the light-emitting-device separation-trench is formed to the intermediate portion of the combination of the optical coupling layer and the buffer layer (for example, the case where the trench is formed to the intermediate portion of the optical coupling layer with almost the same depth as the light-emitting-unit separation-trench), and in such a case, again, the substrate is scratched by diamond scribing or the substrate material is partly ablated by laser scribing using the light-emitting-device separation-trench.

After finishing scratching (scribing), the integrated compound semiconductor light-emitting-devices are divided in the braking step into the individual devices, each of which is mounted on a submount preferably by, for example, a solder material.

As described above, there is manufactured the integrated compound semiconductor light-emitting-device as shown in FIGS. 1-1 and 1-3.

According to the manufacturing process of the invention disclosed in this Section, in addition to capability of manufacturing the advantageous structure having an optical coupling layer effectively, it is preferable as described above to conduct formation of the thin-film crystal layer, formation of the second-conductivity-type-side electrode, the etching steps (the first etching step, the second etching step and the third etching step), formation of the insulating layer, removal of the insulating layer (formation of the second-conductivity-type-side electrode exposed part, formation of the first current injection region and removal of the insulating layer near the light-emitting-device separation-trench) and formation of the first-conductivity-type-side electrode, in this sequence. Such a process sequence allows for providing a light-emitting-device without damage in the thin-film crystal layer immediately below the second-conductivity-type-side electrode or damage in the first-conductivity-type-side electrode. Furthermore, the device shape reflects the process flow. In other words, this light-emitting-device internally has a structure where there are deposited the second-conductivity-type-side electrode, the insulating layer and the first-conductivity-type-side electrode in this sequence. That is, the second-conductivity-type-side electrode is in contact with the second-conductivity-type cladding layer (or another second-conductivity-type thin-film crystal layer) without an intervening insulating layer; there is a part of the upper periphery of the second-conductivity-type-side electrode which is covered by an insulating layer; and there is an area where an electrode periphery is intervened by an insulating layer between the first-conductivity-type-side electrode and the first-conductivity-type cladding layer (or another first-conductivity-type thin-film crystal layer).

<<Section B>>

The invention disclosed in Section B relates to the followings.

[1] An integrated compound semiconductor light-emitting-device, comprising a substrate transparent to an emission wavelength and a plurality of light-emitting-units formed on the substrate, wherein the light-emitting-unit comprises a compound semiconductor thin-film crystal layer having a first-conductivity-type semiconductor layer containing a first-conductivity-type cladding layer, an active layer structure and a second-conductivity-type semiconductor layer containing a second-conductivity-type cladding layer; a second-conductivity-type-side electrode; and a first-conductivity-type-side electrode on the substrate;

a main light-extraction direction is the side of the substrate, and the first-conductivity-type-side electrode and the second-conductivity-type-side electrode are formed on the opposite side to the main light-extraction direction;

the light-emitting-units are electrically separated each other by a light-emitting-unit separation-trench formed between adjacent light-emitting-units;

the light-emitting-unit comprises a plurality of light-emitting-point comprising the active layer structure, the second-conductivity-type semiconductor layer and the second-conductivity-type-side electrode; and at least one first-conductivity-type-side electrode; wherein the first-conductivity-type semiconductor layer provides electrical connection in the single light-emitting-unit; and the light-emitting-device comprises an optical coupling layer formed between the substrate and the first-conductivity-type semiconductor layer; the optical coupling layer being common to the plurality of light-emitting-units, and capable of optical coupling of the plurality of light-emitting-units and distributing a light emitted from one light-emitting-unit to the other light-emitting-units.

[2] The light-emitting-device as described in [1], wherein the optical coupling layer is a layer formed between the substrate and the first-conductivity-type cladding layer as a part of the thin-film crystal layer so as to be common to the plurality of light-emitting-units.

[3] The light-emitting-device as described in [1] or [2], wherein when an average refractive index of the substrate is $n_{sb}$ and an average refractive index of the optical coupling layer is $n_{oc}$ and an average refractive index of the first-conductivity-type semiconductor layer is $n_1$, each at an emission wavelength, the relation:

$$n_{sb} < n_{oc} \text{ and } n_1 < n_{oc}$$

is satisfied.

[4] The light-emitting-device as described in any of [1] to [3], wherein when an emission wavelength of the light-emitting-device is λ (nm), an average refractive index of the substrate is $n_{sb}$ and an average refractive index of the optical coupling layer is $n_{oc}$, each at an emission wavelength, and a physical thickness of the optical coupling layer is $t_{oc}$ (nm) and where a relative refractive index difference $\Delta_{(oc-sb)}$ between the optical coupling layer and the substrate is defined as:

$$\Delta_{(oc-sb)} \equiv ((n_{oc})^2 - (n_{sb})^2)/(2 \times (n_{oc})^2),$$

$t_{oc}$ is selected such that the relation:

$$(\sqrt{(2 \times \Delta_{(oc-sb)})} \times n_{oc} \times \pi \times t_{oc})/\lambda \geq \pi/2$$

is satisfied.

[5] The light-emitting-device as described in any of [1] to [4], wherein when an emission wavelength of the light-emitting-device is λ (nm), an average refractive index of the optical coupling layer is $n_{oc}$ and an average refractive index of the first-conductivity-type semiconductor layer is $n_1$, each at an emission wavelength, and a physical thickness of the optical coupling layer is $t_{oc}$ (nm) and a relative refractive index difference $\Delta_{(oc-1)}$ between the optical coupling layer and the first-conductivity-type semiconductor layer is defined as $$\Delta_{(oc-1)} \equiv ((n_{oc})^2 - (n_1)^2)/(2 \times (n_{oc})^2),$$

$t_{oc}$ is selected such that the relation:

$$(\sqrt{(2 \times \Delta_{(oc-1)})} \times n_{oc} \times \pi \times t_{oc})/\lambda \geq \pi/2$$

is satisfied.

[6] The light-emitting-device as described in any of [1] to [5], wherein an overall specific resistance of the optical coupling layer $\rho_{oc}$(Ω·cm) satisfies the relation:

$$0.5 \leq \rho_{oc}.$$

[7] The light-emitting-device as described in any of [1] to [6], wherein the optical coupling layer has a stacked structure consisting of multiple layers.

[8] The light-emitting-device as described in any of [1] to [7], wherein the plurality of light-emitting-units are formed by forming the light-emitting-unit separation-trench by removing the thin-film crystal layer from the surface to the boundary of the optical coupling layer or to an inside portion of the optical coupling layer between the adjacent light-emitting-units.

[9] The light-emitting-device as described in any of [1] to [8], wherein the width of the light-emitting-unit separation-trench is 2 to 300 μm.

[10] The light-emitting-device as described in any of [1] to [9], further comprising a buffer layer in contact with the substrate.

[11] The light-emitting-device as described in any of [1] to [10], wherein the light-emitting-device has been divided from a scribe region in a light-emitting-device separation-trench formed between a plurality of light-emitting-devices; the light-emitting-device separation-trench being formed to the intermediate portion of the optical coupling layer.

[12] The light-emitting-device as described in [10], wherein the light-emitting-device has been divided from a scribe region in a light-emitting-device separation-trench formed between a plurality of light-emitting-devices; the light-emitting-device separation-trench being formed to the intermediate portion of the buffer layer.

[13] The light-emitting-device as described in any of [1] to [10], wherein the light-emitting-device has been divided from a scribe region in a light-emitting-device separation-trench formed between a plurality of light-emitting-devices; the light-emitting-device separation-trench being formed so as to reach the substrate.

[14] The light-emitting-device as described in any of [1] to [10], wherein the light-emitting-device has been divided from a scribe region in a light-emitting-device separation-trench formed between a plurality of light-emitting-devices; the light-emitting-device separation-trench being formed so as to remove a portion of the substrate.

[15] The light-emitting-device as described in any of [1] to [14], comprising an insulating layer which is:

covering a bottom surface and a sidewall in the light-emitting-unit separation-trench, covering at least a sidewall surface of the first-conductivity-type semiconductor layer, the active layer structure and the second-conductivity-type semiconductor layer among layers exposed as sidewall surface of the light-emitting-device, in contact with a part of the first-conductivity-type-side electrode at the side of the main light-extraction direction, and covering a part of the second-conductivity-type-side electrode on the side opposite to the main light-extraction direction.

[16] The light-emitting-device as described in [15], wherein the insulating layer covers whole sidewall of the layers exposed to the sidewall in the light-emitting-device separation-trench.

[17] The light-emitting-device as described in [16], wherein, as the scribe region, a region which is not covered by the insulating layer is formed on the trench bottom surface in the light-emitting-device separation-trench.

[18] The light-emitting-device as described in [15], wherein insulating layer is not formed on the trench bottom surface in the light-emitting-device separation-trench and is not formed on the sidewall, at least from the trench bottom side up to a part of non-conductive layers, among the sidewall of the layers exposed as sidewall of the light-emitting-device separation-trench.

[19] The light-emitting-device as described in any of [1] to [18], wherein the thin-film crystal layer is made of a Group III-V compound semiconductor containing nitrogen as a Group V atom.

[20] The light-emitting-device as described in any of [1] to [19], wherein the active layer structure consists of quantum well layer and barrier layer and when B is the number of the barrier layer and W is the number of the quantum well layer, B and W satisfy the relation:

$$B=W+1.$$

[21] The light-emitting-device as described in any of [1] to [20], wherein the substrate is selected from the group consisting of sapphire, SiC, GaN, $LiGaO_2$, ZnO, $ScAlMgO_4$, $NdGaO_3$ and MgO.

[22] The light-emitting-device as described in any of [1] to [18], wherein the insulating layer is a dielectric multilayer film consisting of multiple layers.

[23] The light-emitting-device as described in any of [15] to [18] and [22], wherein when R2 is a reflectance of reflection by the optical coupling layer, of a light having an emission wavelength of the light-emitting-device vertically incoming from the first-conductivity-type semiconductor layer side to the optical coupling layer, R12 is a reflectance of reflection by the insulating layer, of a light having an emission wavelength of the light-emitting-device vertically incoming from the second-conductivity-type semiconductor layer side to the insulating layer, R11 is a reflectance of reflection by the insulating layer, of a light having an emission wavelength of the light-emitting-device vertically incoming from the first-conductivity-type semiconductor layer side to the insulating layer and R1q is a reflectance of reflection by the insulating layer, of a light having an emission wavelength of the light-emitting-device vertically incoming from the active layer structure side to the insulating layer, the insulating layer is configured such that all of the conditions:

$$R2<R12 \quad \text{(Relation 1)}$$

$$R2<R11 \quad \text{(Relation 2)}$$

$$R2<R1q \quad \text{(Relation 3)}$$

are satisfied.

[24] The light-emitting-device as described in any of [1] to [23], wherein the surface of the light-extraction side of the substrate is not flat.

[25] The light-emitting-device as described in any of [1] to [24], wherein when R3 is a reflectance of reflection by the substrate, of a light having an emission wavelength of the light-emitting-device vertically incoming from the optical coupling layer to the substrate side and R4 is a reflectance of reflection by an interface with a space, of a light having an emission wavelength of the light-emitting-device vertically incoming from the substrate to the space of the light-extraction side, a low-reflecting optical film is formed in the light-extraction side of the substrate such that the relation:

$$R4<R3$$

is satisfied.

[26] The light-emitting-device as described in any of [1] to [25], wherein the first-conductivity-type is n-type and the second-conductivity-type is p-type.

[27] The light-emitting-device as described in any of [1] to [26], wherein the first-conductivity-type-side electrode and the second-conductivity-type-side electrode are bonded to a submount having a metal layer via a solder.

[28] A process for manufacturing an integrated compound semiconductor light-emitting-device having a plurality of light-emitting-units on a substrate, the process comprising:

a step of depositing an optical coupling layer on a substrate transparent to an emission wavelength;

a step of depositing a thin-film crystal layer having at least a first-conductivity-type semiconductor layer containing a first-conductivity-type cladding layer, an active layer structure and a second-conductivity-type semiconductor layer containing a second-conductivity-type cladding layer;

a step of forming a second-conductivity-type-side electrode on the surface of the second-conductivity-type semiconductor layer;

a first etching step of exposing a part of the first-conductivity-type semiconductor layer, and dividing the active layer structure and the second-conductivity-type semiconductor layer into a plurality of regions, for the formation of the plurality of light-emitting-point which comprises the active layer structure, the second-conductivity-type semiconductor layer and the second-conductivity-type-side electrode;

a step of forming at least a first-conductivity-type-side electrode on the surface of the first-conductivity-type semiconductor layer exposed by the first etching step;

a second etching step of removing the thin-film crystal layer from the surface to the boundary of the optical coupling layer or from the surface to an inside portion of the optical coupling layer for forming a light-emitting-unit separation-trench to separate electrically the light-emitting-unit each other; and a third etching step of removing at least the first-conductivity-type semiconductor layer, the active layer structure and the second-conductivity-type semiconductor layer for forming a light-emitting-device separation-trench to separate into a plurality of light-emitting-devices.

[29] The process as described in [28], wherein the optical coupling layer is formed as a part of the thin-film crystal layer before forming the first-conductivity-type semiconductor layer.

[30] The process as described in [28] or [29], wherein when an average refractive index of the substrate is $n_{sb}$ and an average refractive index of the optical coupling layer is $n_{oc}$, each at an emission wavelength, the relation:

$$n_{sb}<n_{oc}$$

is satisfied.

[31] The process as described in any of [28] to [30], wherein when an emission wavelength of the light-emittingdevice is λ (nm), an average refractive index of the substrate is $n_{sb}$ and an average refractive index of the optical coupling layer is $n_{oc}$, each at an emission wavelength, and a physical thickness of the optical coupling layer is $t_{oc}$ (nm) and where a relative refractive index difference $\Delta_{(oc-sb)}$ between the optical coupling layer and the substrate is defined as:

$$\Delta_{(oc-sb)} \equiv ((n_{oc})^2 - (n_{sb})^2)/(2 \times (n_{oc})^2),$$

$t_{oc}$ is selected such that the relation:

$$(\sqrt{(2 \times \Delta_{(oc-sb)})} \times n_{oc} \times \pi \times t_{oc})/\lambda \geq \pi/2$$

is satisfied.

[32] The process as described in any of [28] to [31], wherein when an emission wavelength of the light-emitting-device is λ (nm), an average refractive index of the optical coupling layer at an emission wavelength is $n_{oc}$, an average refractive index of the first-conductivity-type semiconductor layer at an emission wavelength is $n_1$ and a physical thickness of the optical coupling layer is $t_{oc}$ (nm) and a relative refractive index difference $\Delta_{(oc-1)}$ between the optical coupling layer and the first-conductivity-type semiconductor layer is defined as $$\Delta_{(oc-1)} \equiv ((n_{oc})^2 - (n_1)^2)/(2 \times (n_{oc})^2),$$

$t_{oc}$ is selected such that the relation:

$$(\sqrt{(2 \times \Delta_{(oc-1)})} \times n_{oc} \times \pi \times t_{oc})/\lambda \geq \pi/2$$

is satisfied.

[33] The process as described in any of [28] to [32], wherein an overall specific resistance of the optical coupling layer $\rho_{oc}$(Ω·cm) satisfies the relation:

$$0.5 \leq \rho_{oc}.$$

[34] The process as described in any of [28] to [33], wherein the optical coupling layer is formed as a stacked structure consisting of multiple layers.

[35] The process as described in any of [28] to [34], comprising a step of forming a buffer layer on the substrate before the step of forming the optical coupling layer.

[36] The process as described in any of [28] to [35], wherein the third etching step is performed simultaneously or separately with the second etching step and is performed to remove the thin-film crystal layer from the surface to the boundary of the optical coupling layer or from the surface to an inside portion of the optical coupling layer.

[37] The process as described in [35], wherein the third etching step is performed to remove the thin-film crystal layer from the surface to an inside portion of the buffer layer.

[38] The process as described in any of [28] to [35], wherein the third etching step is performed so as to reach the substrate surface.

[39] The process as described in any of [28] to [35], wherein the third etching step is performed so as to remove a portion of the substrate.

[40] The process as described in any of [28] to [39], wherein the second etching step and the third etching step are performed by dry etching process using gas selected from the group consisting of $Cl_2$, $BCl_3$, $SiCl_4$, $CCl_4$ and combination of two or more of these.

[41] The process as described in [40], wherein a patterned metal-fluoride layer is used as an etching mask.

[42] The process as described in [41], wherein the metal-fluoride layer is selected from the group consisting of $SrF_2$, $AlF_3$, $MgF_2$, $BaF_2$, $CaF_2$ and combination of two or more of these.

[43] The process as described in any of [28] to [42], wherein the step of forming a second-conductivity-type-side electrode, the first etching step and the step of forming a first-conductivity-type-side electrode are carried out in this order, and wherein, the process further comprises a step of forming a insulating layer before the step of forming a first-conductivity-type-side electrode.

[44] The process as described in [43], wherein the step of forming a insulating layer is carried out after the first to third etching steps.

[45] The process as described in any of [28] to [35], wherein the step of forming a second-conductivity-type-side electrode, the first etching step and the step of forming a first-conductivity-type-side electrode are carried out in this order, and the third etching step is performed to the depth, from the surface, until removing a portion of the optical coupling layer, until removing a portion of the buffer layer, provided the buffer layer is present, or until reaching the substrate, whereby forming the light-emitting-device separation-trench, and wherein, the process further comprises:

a step of forming a insulating layer after the first to third etching steps and before the step of forming a first-conductivity-type-side electrode; and a step of forming a scribe region by removing a portion of the insulating layer deposited on the trench bottom surface in the light-emitting-device separation-trench.

[46] The process as described in any of [28] to [35], wherein the step of forming a second-conductivity-type-side electrode, the first etching step and the step of forming a first-conductivity-type-side electrode are carried out in this order, and the third etching step is performed to the depth, from the surface, until removing a portion of the optical coupling layer, until removing a portion of the buffer layer, provided the buffer layer is present, or until reaching the substrate, whereby forming the light-emitting-device separation-trench, and wherein, the process further comprises:

a step of forming a insulating layer after the first to third etching steps and before the step of forming a first-conductivity-type-side electrode; and a step of removing whole of the insulating layer deposited on the trench bottom surface in the light-emitting-device separation-trench and a portion of the insulating layer formed on the sidewall of the light-emitting-device separation-trench near the trench bottom.

[47] The process as described in [45], wherein the second etching step and the third etching step are performed simultaneously and are performed to the depth, from the surface, until reaching the boundary of the optical coupling layer or until removing a portion of the optical coupling layer, whereby forming the light-emitting-device separation-trench.

[48] The process as described in [46], wherein the second etching step and the third etching step are performed simultaneously and are performed to the depth, from the surface, until reaching the boundary of the optical coupling layer or until removing a portion of the optical coupling layer, whereby forming the light-emitting-device separation-trench.

[49] The process as described in any of [28] to [48], further comprising:

a step of separating into a plurality of light-emitting-devices, and a step of bonding the first-conductivity-type-side electrode and the second-conductivity-type-side electrode to a metal layer on the submount.

[50] The process as described in [49], wherein the bonding is performed via a solder.

According to the invention disclosed in this Section, there can be provided an integrated compound semiconductor light-emitting-device capable of emitting light as a large-area plane light source, exhibiting excellent in-plane uniformity in emission intensity. Furthermore, there can be provided a device wherein even when deterioration in an emission intensity varies from one light-emitting-unit to the other to some extent, higher in-plane uniformity can be ensured and maintained.

In particular, blue or ultraviolet plane-like emission with relatively higher uniformity in emission intensity can be realized even when an area of a light-emitting-device is more than several $cm^2$. Furthermore, the present invention also relates to a flip-chip type light-emitting-device where light is extracted from the substrate side and both p- and n-side electrodes are disposed on the opposite side to the light-extraction side, whereby adequate heat dissipation and a higher light-extraction efficiency can be ensured because an element can be mounted by fusion-bonding a p-side and an n-side electrodes on a highly heat-dissipative submount having a meal interconnection using a solder without using a metal wire for current introduction.

The light-emitting-units are electrically separated each other while being optically combined via an optical coupling layer, so that a light emitted from a quantum well layer in one light-emitting-unit is distributed in the other light-emitting-unit. Thus, in the light-emitting-device according to the present invention, light is emitted from the area between light-emitting-units where a luminance is reduced in a conventional configuration, so that surface emission with relatively higher uniformity can be achieved. Furthermore, even when an emission intensity varies or deterioration in an emission intensity varies to some extent between light-emitting-units, higher in-plane uniformity in emission intensity is ensured because of the presence of the optical coupling layer. Furthermore, even if one light-emitting-unit does not emit light due to some defect, emission intensity is ensured to some extent directly over the defective light-emitting-unit, resulting in good surface uniformity.

The light-emitting-device according to the invention disclosed in this Section, the characteristic feature resides in that it is not only the integration of the light-emitting-points electrically connected mutually, but also it comprises light-emitting-units electrically separated mutually each of which includes an appropriate number of light-emitting-points. That is, if the light-emitting-device as a whole is constructed from light-emitting-points electrically connected mutually only, the degradation in a single light-emitting-points leads the change in current injection rout in the entirety of the light-emitting-device and affects the uniformity of light intensity in the entirety of the light-emitting-device. However, if an appropriate number of light-emitting-points are contained in each light-emitting-unit, the electrical influence of the degradation in light-emitting-point is limited within the light-emitting-unit only. In addition, since the light-emitting-units are mutually optically connected as described above, the degradation in a single light-emitting-point, i.e. the degradation in a light-emitting-unit containing the degraded light-emitting-point, tends to be advantageously compensated optically by the neighboring light-emitting-units.

Description of Embodiments of the Invention in Section B

Hereinafter, the present invention of this Section will be explained in more details.

FIG. 2-1 shows an example of an integrated compound semiconductor light-emitting-device (hereinafter, simply referred to as a "light-emitting-device") of the invention disclosed in this Section. Furthermore, the structure of the light-emitting-device in FIG. 2-1 will be detailed with reference to FIG. 2-2 showing a shape in the course of the manufacturing. There is shown an example where one light-emitting-unit 11 contains three light-emitting-points 17 and one light-emitting-device 10 is constituted from four light-emitting-units 11 as shown in FIGS. 2-1 and 2-2. However, there are no particular restrictions to the number of integration of the light-emitting-points contained in a single light-emitting-unit and the number of integration of the light-emitting-units and these numbers can be appropriately varied in one substrate provided. For example, the number of integration of light-emitting-units may be two, or alternatively more than 500 units may be integrated. Here, preferably the number is 25 to 200 units. In addition, two-dimensional arrangement may be also preferred. With respect to the number of integration of the light-emitting-points contained in the light-emitting-unit, it may be two, or alternatively more than 500 points may be integrated. Here, the number is preferably 5 to 100 and is more preferably 10 to 50. In addition, two-dimensional arrangement may be also preferred.

In the invention disclosed in this Section, one light-emitting-unit has, as shown in the figure, at least, a compound semiconductor thin-film crystal layer containing a first-conductivity-type semiconductor layer including a first-conductivity-type cladding layer 24, a second-conductivity-type semiconductor layer including a second-conductivity-type cladding layer 26 and an active layer structure 25 sandwiched between the first and the second-conductivity-type semiconductor layers; a second-conductivity-type-side electrode 27; and a first-conductivity-type-side electrode 28, on a substrate 21. As shown in the figure, a light-emitting-unit separation-trench 12 defines the light-emitting-unit 11 within the integrated compound semiconductor light-emitting-device 10, while the substrate 21 and the optical coupling layer 23 are common to the light-emitting-units. Furthermore, a buffer layer 22, which is initially formed on the substrate, is also common to the light-emitting-units.

In this example, on a part of the second-conductivity-type cladding layer 26, the second-conductivity-type-side electrode 27 is disposed and the part where the second-conductivity-type cladding layer 26 and the second-conductivity-type-side electrode 27 are in contact with each other is a second current injection region 35. In this configuration, parts of the second-conductivity-type cladding layer and the active layer structure, and a part of the first-conductivity-type cladding layer are removed. The first-conductivity-type-side electrode 28 is disposed in contact with the first-conductivity-type cladding layer 24 exposed in the removed part, so that the second-conductivity-type-side electrode 27 and the first-conductivity-type-side electrode 28 are disposed on the same side in relation to the substrate. Here, in the invention disclosed in this Section, the active layer structure 25 and the second-conductivity-type semiconductor layer (including a second-conductivity-type cladding layer 26) are divided and constitute light-emitting-points 17, each of which is independently capable of emitting light, while first-conductivity-type semiconductor layer is present in common in a light-emitting-unit. One second-conductivity-type-side electrode 27 is formed on each light-emitting-point 17. While it is enough if one first-conductivity-type-side electrode 28 is present in one light-emitting-unit, it may be formed corresponding to the number of the light-emitting-points. The number of first-conductivity-type-side electrode 28 may exceed the number of light-emitting-points in one light-emitting-unit. In the present invention, however, in the case that the second-conductivity-type-side electrode is p-type side electrode in a preferred embodiment, the number or area of the second-conductivity-type-side electrode is preferably more or larger than the number or area of the first-conductivity-type-side electrode, respectively. This is because a part which substantially contributes light emission is quantum well layer(s) in the active layer structure just under (or upper, depending on how to see it) the second-conductivity-type-side electrode. Therefore, in one light-emitting-unit, the number or area of the second-conductivity-type-side electrode is preferably relatively more or larger than the number or area of the first-conductivity-type-side electrode. Further, in terms of current injection regions described later, the number or area of the second current injection region is preferably more or larger than the number or area of the first current injection region. Most preferably, both of the above relation regarding the electrodes and the above relation regarding the current injection regions are satisfied.

In the invention disclosed in this Section, light-emitting-points 17 are mutually electrically connected with first-conductivity-type semiconductor layer within a light-emitting-unit 11, and the light-emitting-units 11 are electrically separated each other by a light-emitting-unit separation-trench 12. That is, the light-emitting-unit separation-trench 12 divides highly conductive layers in the thin-film crystal layer, and thus there are substantially no electric connection between light-emitting-units.

On the other hand, in the present invention, the optical coupling layer 23 is commonly present between the light-emitting-units, which creates the state that the light-emitting-units are optically connected. In other words, a light emitted from one light-emitting-unit reaches the other units through moderate diffusion and radiation (leak) in the optical coupling layer and also reaches the other light-emitting-units without being localized in one light-emitting-unit. Thus, it is necessary that the light-emitting-unit separation-trench 12 reaches the interface of the optical coupling layer or, as shown in FIG. 2-1, reaches the intermediate portion of the optical coupling layer on the condition that the layer is not divided. Although details will be described later, the optical coupling layer is substantially insulative and made of a material having a relatively higher refractive index for achieving appropriate waveguide function within the layer.

In the invention disclosed in this Section, a width of the light-emitting-unit separation-trench is preferably 2 to 300 μm, more preferably 5 to 50 μm, most preferably 8 to 15 μm. A smaller width of the light-emitting-unit separation-trench, together with the optical coupling layer, improves uniformity in surface emission.

FIG. 2-2 shows a part of the other light-emitting-device adjacent to the central light-emitting-device 10 on the same substrate, where the individual light-emitting-devices 10 are separated by a light-emitting-device separation-trench 13. In a scribe region 14 in the light-emitting-device separation-trench 13, the individual light-emitting-devices are separated by scribing and breaking. To the metal surface 41 on the submount 40 are connected a second-conductivity-type-side electrode 27 and a first-conductivity-type-side electrode 28 via a metal solder 42 to provide a light-emitting-device as shown in FIG. 2-1.

The light-emitting-device separation-trench is formed, in this example, by removing the thin-film crystal layer so as to reach the substrate, which is one of preferable embodiments. Alternatively, an embodiment where the light-emitting-device separation-trench is formed to the intermediate portion of the combined layer of the optical coupling layer and the buffer layer is preferable. Or an embodiment where the trench is formed by partly removing the substrate may be possible. In any of these, an insulating layer can be easily formed on the sidewall of a highly conductive layer near the active layer structure side in relation to the optical coupling layer. In any of these, the individual light-emitting-devices are separated by dividing in the scribe region within the light-emitting-device separation-trench.

In the light-emitting-device of the invention disclosed in this Section, the insulating layer 30 covers most of the exposed area including the surfaces and the sidewalls of the thin-film crystal layers 22 to 26, and several embodiments are possible for the shape of the insulating layer on the sidewall of the light-emitting-device of FIG. 2-1, that is, in the light-emitting-device separation-trench 13 in the state of FIG. 2-2 before the light-emitting-devices are separated. In any embodiment, it is preferable that before separating the light-emitting-devices, there is a part without an insulating layer within the light-emitting-device separation-trench 13 defining the light-emitting-devices. Furthermore, the light-emitting-devices are preferably separated from the part without an insulating film. As a result, in a preferred configuration of the light-emitting-device of the invention disclosed in this Section, the insulating layer covering the sidewall does not reach the edge of the light-emitting-device. There will be described a specific example of a preferable insulating layer.

In an embodiment of the invention disclosed in this Section, as shown in FIG. 2-2, the insulating layer 30 does not cover the whole surface of the inside of the light-emitting-device separation-trench 13, but there is formed the scribe region 14 without the insulating layer 30 in a part in contact with the substrate surface (that it, the trench bottom surface). It is preferable because a thin-film crystal layer is not damaged during inter-device separation and an insulating layer is not detached. In a resulting light-emitting-device, as shown in part A (dotted line circle) in FIG. 2-1, the insulating layer 30 does not reach the edge of the substrate. In a device having this configuration, detachment of an insulating layer is reliably prevented and as a result, even if running around of a solder in the sidewall of the light-emitting-unit occurs, the functions of the light-emitting-device are not deteriorated, resulting in a highly reliable device.

Figures 1, 2, 3, 4:
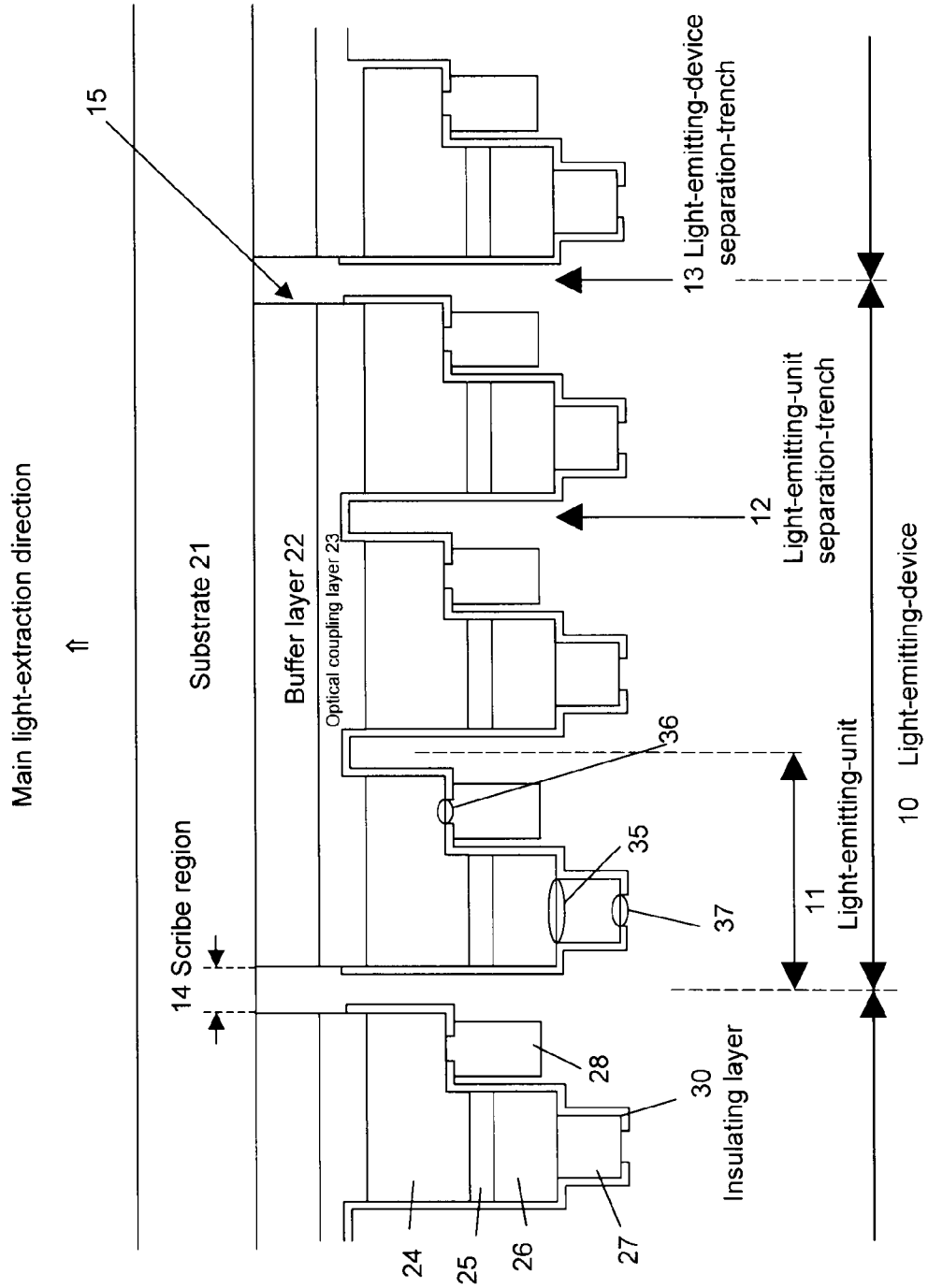

In another embodiment of the invention disclosed in this Section, as shown in FIG. 2-4, there is a part without an insulating layer 15 where an insulating layer 30 is not formed in the substrate (that is the trench bottom) and the trench sidewall in the vicinity of the substrate. This structure is also preferable because detachment of an insulating layer is eliminated during inter-device separation. In the resulting light-emitting-device, as shown in part B (dotted line circle) in FIG. 2-3, there is a part without an insulating layer 15 where the insulating layer 30 does not reach the substrate surface. Although the whole sidewall of the buffer layer 22 and a part of the sidewall of the optical coupling layer 23 are exposed in this figure, the sidewall of the optical coupling layer can be covered while a part of the buffer layer is exposed. The exposed part is preferably an undoped layer which is not doped. Preferably, the optical coupling layer is also covered by an insulating layer. In a device having such a configuration, detachment of an insulating layer is reliably prevented and when a highly insulative material is exposed, a highly reliable device comparable to the light-emitting-device having the configuration of FIG. 2-1 can be provided. Furthermore, when the light-emitting-device separation-trench is formed by etching into the portion of the substrate, only the substrate part may be exposed as the trench sidewall while the buffer layer is covered by an insulating layer.

When the light-emitting-device separation-trench is formed to the intermediate portion of the combined layer of the optical coupling layer and the buffer layer, a light-emitting-device having the following configuration is provided. First, when the light-emitting-device separation-trench is formed to the intermediate portion of the optical coupling layer 23, as shown in FIGS. 2-17 and 2-18, the optical coupling layer 23 and the buffer layer 22 extend to the edge of the light-emitting-device, the whole sidewall of the buffer layer is exposed, the optical coupling layer has a step based on the bottom of the light-emitting-device separation-trench, the sidewall of the optical coupling layer has a part which is not covered by an insulating layer in accordance with the sidewall of the buffer layer and a sidewall part receded from the edge of the light-emitting-device (the sidewall of the light-emitting-device separation-trench). In FIGS. 2-17 and 2-18, the edge of the optical coupling layer 23 and of the buffer layer 22 is identical to the edge face of the substrate, but it may be inside or outside of the substrate 21 depending on a separation method. In the example in FIG. 2-17, the insulating layer 30 covers the bottom and the sidewall of the separation trench from a position in the trench bottom distant from the edge of the optical coupling layer 23 as shown in part C (dotted line circle) in FIG. 2-17. This corresponds to a configuration where formation of the light-emitting-device separation-trench is stopped in the intermediate portion of the optical coupling layer 23 in FIGS. 2-1 and 2-2. The example in FIG. 2-18 corresponds to a configuration where formation of the light-emitting-device separation-trench is stopped in the intermediate portion of the optical coupling layer 23 in FIGS. 2-3 and 2-4, and as shown in part D (dotted line circle) in FIG. 2-18, there is a part which is not covered by an insulating layer, in the main light-extraction direction side of the sidewall inside of the edge of the light-emitting-device (the sidewall of the light-emitting-device separation-trench).

Next, when the light-emitting-device separation-trench is formed to the intermediate portion of the buffer layer 22, as shown in FIGS. 2-19 and 2-20, the buffer layer 22 extend to the edge of the light-emitting-device, the buffer layer has a step based on the bottom of the light-emitting-device separation-trench, the sidewall of the buffer layer has a part which is not covered by an insulating layer (the edge of the device) and a sidewall part receded from the edge of the light-emitting-device (the sidewall of the light-emitting-device separation-trench). Again, in FIGS. 2-19 and 2-20, the edge of the buffer layer 22 is in line with the edge face of the substrate, but it may be inside or outside of the substrate 21 depending on a separation method. In the example in FIG. 2-19, the insulating layer 30 covers the bottom and the sidewall of the separation trench, from a position in the trench bottom distant from the edge of the buffer layer 22, and also covers the sidewall of the optical coupling layer 23 (the sidewall of the light-emitting-device separation-trench) as shown in part E (dotted line circle) in FIG. 2-19. This corresponds to a configuration where formation of the light-emitting-device separation-trench is stopped in the intermediate portion of the buffer layer 22 in FIGS. 2-1 and 2-2. The example in FIG. 2-20 corresponds to a configuration where formation of the light-emitting-device separation-trench is stopped in the intermediate portion of the buffer layer 22 in FIGS. 2-3 and 2-4, and as shown in part F (dotted line circle) in FIG. 2-20, there is a part which is not covered by an insulating layer, in the main light-extraction direction side of the sidewall inside of the edge of the light-emitting-device (the sidewall of the light-emitting-device separation-trench).

As in these examples, even when the light-emitting-device separation-trench is formed to the intermediate portion of the combined layer of the optical coupling layer and the buffer layer, a device having a configuration where an insulating layer covering the sidewall does not reach the edge of the light-emitting-device ensures prevention of detachment of the insulating layer, and by forming the exposed layer from a highly insulative material, there can be provided a highly reliable device comparable to the light-emitting-device having the configuration in FIGS. 2-1 and 2-3.

Furthermore, for the light-emitting-device of the invention disclosed in this Section, it is preferable that the insulating layer 30 is in contact with a part of the first-conductivity-type-side electrode 28 at the side of the main light-extraction direction as shown in FIG. 2-1, that is, there is a part intervened by an insulating layer in the periphery of the contact area between the first-conductivity-type-side electrode 28 and the first-conductivity-type semiconductor layer (the first-conductivity-type cladding layer 24 in the figure); and covers a part of the second-conductivity-type-side electrode 27 on the opposite side of the main light-extraction direction, that is, there is not an insulating layer between the second-conductivity-type-side electrode 27 and the second-conductivity-type semiconductor layer (the second-conductivity-type cladding layer 26 in the figure) and the insulating layer covers a periphery portion of the second-conductivity-type-side electrode 27. This configuration means that the insulating layer 30 is formed after the second-conductivity-type-side electrode 27 is formed; and after the insulating layer 30 is formed, the first-conductivity-type-side electrode 28 is formed. A manufacturing process with this sequence leads to less damage to a second-conductivity-type semiconductor layer such as the second-conductivity-type cladding layer 26 and to the first-conductivity-type-side electrode, resulting in a light-emitting-device with a high efficiency as described later. In other words, the fact having such a configuration means that the light-emitting-device exhibits high efficiency.

Furthermore, although the second-conductivity-type-side electrode 27 has the same size as the second current injection region 35, the exposed surface 37 in the second-conductivity-type-side electrode (the exposed part in the second-conductivity-type-side electrode) preferably has a smaller size than the second current injection region 35. Furthermore, in a part of the insulating layer 30 covering the surface of the first-conductivity-type cladding layer 24, there is formed an opening for contact of the first-conductivity-type-side electrode 28 with the first-conductivity-type cladding layer 24, which becomes a first current injection region 36. It is preferable that the first-conductivity-type-side electrode 28 has an area larger than that of the first current injection region.

It is also preferable that the second-conductivity-type-side electrode and the first-conductivity-type-side electrode are not spatially overlapped.

There will be further detailed the materials and the structures constituting a device.

Substrate

A substrate employed in the invention according to this Section is as described in Section A.

Buffer Layer

A buffer layer employed in the invention according to this Section is as described in Section A.

Optical Coupling Layer

An optical coupling layer employed in the invention according to this Section is as described in Section A.

First-Conductivity-Type Semiconductor Layer and First-Conductivity-Type Cladding Layer A first-conductivity-type semiconductor layer and a first-conductivity-type cladding layer employed in the invention according to this Section are as described in Section A Active Layer Structure An active layer structure employed in the invention according to this Section is as described in Section A.

Second-Conductivity-Type Semiconductor Layer and Second-Conductivity-Type Cladding Layer A second-conductivity-type semiconductor layer and a second-conductivity-type cladding layer employed in the invention according to this Section are as described in Section A.

Second-Conductivity-Type-Side Electrode

A second-conductivity-type-side electrode employed in the invention according to this Section is as described in Section A.

First-Conductivity-Type-Side Electrode

A first-conductivity-type-side electrode employed in the invention according to this Section is as described in Section A.

Insulating Layer

An insulating layer employed in the invention according to this Section is as described in Section A.

Submount

A submount employed in the invention according to this Section is as described in Section A.

Manufacturing Process for a Light-Emitting-Device Disclosed in Section B

Next, there will be described a process for manufacturing an integrated compound semiconductor light-emitting-device according to the invention disclosed in this Section.

In an embodiment of a manufacturing process disclosed in this Section, as shown in FIG. 2-6, first a substrate 21 is provided and over the surface are sequentially deposited a buffer layer 22, an optical coupling layer 23, a first-conductivity-type cladding layer 24, an active layer structure 25 and a second-conductivity-type cladding layer 26 by thin-film crystal growth. For formation of these thin-film crystal layers, MOCVD is preferably employed. However, it is possible to use MBE, PLD, PED processes and the like for forming all or some of the thin-film crystal layers. A configuration of these layers can be appropriately changed, depending on, for example, an application of the device. After forming thin-film crystal layers, a variety of processings are allowed. As used herein, the term "thin-film crystal growth" includes heat-treatment after growing a thin-film crystal layer.

For providing the configuration shown in FIGS. 2-1 and 2-2 after growing thin-film crystal layers in the present invention, it is preferable that a second-conductivity-type-side electrode 27 is formed as shown in FIG. 2-6. That is, it is preferable that scheduled formation of the second-conductivity-type-side electrode 27 in the second current injection region 35 is conducted before formation of an insulating layer 30, formation of a first current injection region 36 and formation of a first-conductivity-type-side electrode 28. This is because when the second-conductivity-type is p-type as a desirable embodiment, formation of a p-side electrode after processing the exposed surface of the p-type cladding layer by various processes leads to reduction of a hole concentration in the p-GaN cladding layer with a relatively lower activation rate among GaN materials, due to process damage. For example, if the step of forming an insulating layer by p-CVD is conducted before forming the second-conductivity-type-side electrode, plasma damage remains in its surface. Thus, in the present invention, it is desirable that after thin-film crystal growth, formation of the second-conductivity-type-side electrode is conducted before any of the other process steps (for example, a first etching step, a second etching step, a third etching step or the step of forming an insulating layer, the step of forming an exposed part in a second-conductivity-type-side electrode, the step of forming a first current injection region and the step of forming a first-conductivity-type-side electrode as described later).

In the invention disclosed in this Section, when the second-conductivity-type is p-type and when the exposed surface is a relatively stable metal such as Au (in a typical example, the surface of the second-conductivity-type-side electrode is expected to be Au as described above), the surface is not likely process-damaged through the subsequent processes. In this respect, it is again desirable in the present invention that after thin-film crystal growth, formation of the second-conductivity-type-side electrode is conducted before any other process step.

In the present invention, when a layer in which the second-conductivity-type-side electrode is formed is the second-conductivity-type contact layer, process damage to the second-conductivity-type semiconductor layer can be reduced in the same manner.

The second-conductivity-type-side electrode 27 can be formed by applying a variety of deposition processes such as sputtering and vacuum evaporation, and a desired shape can be obtained by appropriately applying, for example, a lift-off process using photolithography technique or site-selective evaporation using, for example, a metal mask.

After forming the second-conductivity-type-side electrode 27, a part of the first-conductivity-type cladding layer 24 is exposed as shown in FIG. 2-7. In this step, it is preferable to remove the second-conductivity-type cladding layer 26, the active layer structure 25 and further a part of the first-conductivity-type cladding layer 24 by etching (a first etching step). In this step, the second-conductivity-type semiconductor layer (second-conductivity-type cladding layer 26) and the active layer structure 25 are divided to give structures of individual light-emitting-points 17 which comprise the active layer structure 25, the second-conductivity-type semiconductor layer (second-conductivity-type cladding layer 26) and the second-conductivity-type-side electrode 27. The first etching step is also conducted also for the purpose of exposing a semiconductor layer into which a first-conductivity-type-side electrode described later injects first-conductivity-type carriers, and therefore, when a thin-film crystal layer contains another layer, for example, a cladding layer consists of two layers or contains a contact layer, the layer including the additional layer may be etched.

The first etching step does not require very high etching precision and thus can be a known dry etching technique by plasma etching using, for example, $Cl_2$ and using a etching mask of a nitride such as $SiN_x$ or an oxide such as $SiO_x$. It is, however, also preferable that dry etching can be conducted using a metal fluoride mask as detailed in a second etching step and a third etching step described later. It is particularly preferable to conduct etching by plasma excited dry etching using a gas such as $Cl_2$, $SiCl_4$, $BCl_3$ and $SiCl_4$ and using an etching mask containing a metal-fluoride layer selected from the group consisting of $SrF_2$, $AlF_3$, $MgF_2$, $BaF_2$, $CaF_2$ and combinations of these. Furthermore, the optimal dry etching is ICP type dry etching capable of generating high density plasma.

Here, the second-conductivity-type-side electrode 27 receives process history of the formation of a $SiN_x$ mask formed by, for example, plasma CVD or the step of removing the $SiN_x$ mask after the first etching step. However, when a stable metal such as Au is formed over the surface, the second-conductivity-type-side electrode is less process-damaged.

Then, as shown in FIG. 2-8, a light-emitting-unit separation-trench 12 is formed by a second etching step. In the second etching step, the GaN material must be etched to more depth compared with the first etching step. The sum of a layer depth etched by the first etching step is generally about 0.5 μm. Whereas, in the second etching step, the whole first-conductivity-type cladding layer 24 and a part of the optical coupling layer 23 must be etched. Therefore, the depth is generally 1 μm or more, for example, in the range of 1 to 5 μm, or in the range of 3 μm or more, for example 3 to 7 μm. In some cases it is in the range of 3 to 10 μm, or furthermore more than 10 μm.

Generally, a metal mask, a nitride mask such as $SiN_x$ and an oxide mask such as $SiO_x$ have a selectivity ratio to a GaN material, in terms of tolerance to etching by $Cl_2$ plasma, of about 5. In conducting the second etching step where a GaN material with a large film thickness must be etched, a relatively thicker $SiN_x$ film is necessary. For example, etching a GaN material with a thickness of 4 μm by a second dry-etching process requires a $SiN_x$ mask with a thickness of 0.8 μm. However, with a $SiN_x$ mask with such a thickness, the $SiN_x$ mask is also etched during the dry etching, and not only its thickness in a longitudinal direction but also its shape in a horizontal direction are changed, so that a desired GaN material part cannot be selectively etched.

Thus, when forming the light-emitting-unit separation-trench in the second etching step, dry etching using a mask including a metal-fluoride layer is preferred. A material constituting the metal-fluoride layer is preferably $MgF_2$, $CaF_2$, $SrF_2$, $BaF_2$ or $AlF_3$, most preferably $SrF_2$ in the light of balance between dry etching tolerance and wet-etching properties.

A metal fluoride film must be sufficiently tolerant to dry etching in the first, the second etching steps and the third etching steps while being easily etched by etching for patterning (preferably, wet etching) to give a patterning shape with good linearity particularly in the sidewall. Deposition of a metal-fluoride layer at a temperature of 150° C. or higher gives a dense film having good adhesiveness to a base layer, and the film after patterned by etching shows good linearity in a mask sidewall. A deposition temperature is preferably 250° C. or higher, further preferably 300° C. or higher, most preferably 350° C. or higher. Particularly, a metal-fluoride layer deposited at 350° C. or higher exhibits good adhesiveness to any type of base layer and gives a fine film which is highly tolerant to dry etching and exhibits quite higher linearity in its sidewall in terms of a patterning shape, ensuring controllability to a width of the opening, and thus it is the most preferable as an etching mask.

Thus, although deposition at a high temperature is preferable for providing an etching mask exhibiting good adhesiveness to a base layer, giving a fine film, being highly tolerant to dry etching and exhibiting very high linearity in its sidewall and very high controllability of a width of the opening in terms of a patterning shape, a too high deposition temperature gives a film having excessive tolerance to wet etching using, for example, hydrochloric acid preferably used for patterning a metal fluoride, and thus the film cannot be easily removed. Particularly, as described later, when a mask such as $SrF_2$ is exposed to plasma such as chlorine plasma during dry etching of a semiconductor layer, an etching rate in a later process for removing the mask layer tends to be reduced in comparison with that before exposure to plasma such as chlorine plasma. Therefore, deposition of a metal fluoride at an excessively higher temperature is undesirable in the light of its patterning and final removal.

First, in a metal fluoride before being exposed to plasma in dry etching of a semiconductor layer, a layer deposited at a lower temperature has a larger etching rate to an etchant such as hydrochloric acid, resulting in a higher etching rate and a layer deposited at a higher temperature has a smaller etching rate, resulting in a lower etching rate. When deposition temperature becomes 300° C. or higher, the etching rate decreases noticeably in comparison with a film deposited at a temperature of about 250° C., and a temperature of about 350° C. to 450° C. is within a very favorable etching rate range. A deposition temperature of higher than 480° C., however, leads to an excessively smaller absolute etching rate value, so that patterning of the metal fluoride takes a too longer time and patterning may be difficult under the conditions where a resist mask layer and so on are not detached. Furthermore, in a metal fluoride after being exposed to plasma in dry etching of a semiconductor layer, a wet-etching rate by, for example, hydrochloric acid in a removal step tends to decrease and growth at an excessively high temperature makes it difficult to remove the metal fluoride.

From such a viewpoint, a deposition temperature of a metal-fluoride layer is preferably 480° C. or lower, further preferably 470° C. or lower, particularly preferably 460° C. or lower.

Using a mask patterned considering the above (the mask may be a multilayer with $SiN_x$ or $SiO_2$ such that the metal-fluoride layer becomes a surface layer), dry etching is conducted. A gas species for the dry etching may be preferably selected from $Cl_2$, $BCl_3$, $SiCl_4$, $CCl_4$ and combinations of these. In the dry etching, a selectivity ratio of the $SrF_2$ mask to a GaN material is over 100, so that a thick GaN film can be easily and precisely etched. Furthermore, the optimal dry etching technique is ICP type dry etching capable of generating high-density plasma.

After the above etching, when the used unnecessary metal-fluoride layer mask is removed by an etchant such as hydrochloric acid, a multilayer mask with $SiN_x$, $SiO_2$ or the like may be formed such that the metal-fluoride layer becomes a surface layer if a material susceptible to an acid is present under the metal fluoride mask, for example, if an electrode material is susceptible to an acid. In such a case, $SiN_x$ or $SiO_2$ may be present in the whole region under the metal fluoride mask or alternatively, as shown, for example, in FIG. 2-21, a mask 51 such as $SiN_x$ and $SiO_2$ is not necessarily present in the whole region of the metal fluoride mask layer 52 but can be at least formed over a material susceptible to an acid.

By such a second etching step, the light-emitting-unit separation-trench is formed as shown in FIG. 2-8.

Then, as shown in FIG. 2-9, a light-emitting-device separation-trench 13 is formed by a third etching step. In the third etching step, the thickness of the GaN material to be etched is extremely deep compared with even the second etching step because whole buffer layer and the optical coupling layer must be etched, and is sometimes 5 to 10 μm, and in some cases more than 10 μm. Therefore, as explained for the second etching step, dry etching using a mask including a metal-fluoride layer is preferred. The preferred condition and the like (including a stacked layer mask and the like) are as described for the second etching step.

It is necessary that the light-emitting-device separation-trench is formed such that it interrupts at least the first-conductivity-type cladding layer. In a preferred embodiment disclosed in this Section, as shown in FIG. 1-9, the light-emitting-device separation-trench 13 is formed such that it reaches the substrate 21. Here, when diamond scribing is conducted from the side where the thin-film crystal layers have been formed in the steps of scribing and breaking for device separation, detachment of a GaN material on the sapphire substrate can be inhibited. Furthermore, it is advantageous that when laser scribing is conducted, thin-film crystal layers are not damaged. Furthermore, it is also preferable that the light-emitting-device separation-trench is formed by conducting etching into a part of the sapphire substrate (same for other substrates such as GaN).

Alternatively, a configuration where the light-emitting-device separation-trench does not reach the substrate is also preferable. For example, when the light-emitting-device separation-trench is formed to the intermediate portion of the combination of the optical coupling layer and the buffer layer, an insulating layer can be formed on the sidewall of the first-conductivity-type cladding layer, to maintain insulation to a running-around solder (see FIGS. 2-17 to 2-20 for a configuration after completion of the light-emitting-device). In this case, a layer exposed from the sidewall without being covered by the insulating layer is preferably highly insulative. In an embodiment where the light-emitting-device separation-trench is formed to the intermediate portion of the optical coupling layer, the second etching step and the third etching step can be carried out simultaneously, which enables simplifying a manufacturing process.

Regarding the first etching step and the second etching step and the third etching step, any of step can be carried out before or after the other step. It is also preferable for simplifying a process that the first etching step is first conducted and then without removing the etching mask, the second etching step and/or a third etching step is conducted. As shown in FIG. 2-21, first, a first etching mask 51 is formed from a material resistant to an acid such as $SiN_x$ and $SiO_2$ (preferably $SiN_x$) and etching is conducted such that a first-conductivity-type cladding layer 24 appears, and without removing the mask 51, a metal-fluoride layer is formed as a second and/or a third etching mask 52. Then, preferably, after conducting the second etching step and/or the third etching step, the mask 52 is removed by an acid and then the mask 51 is removed as appropriate. The first etching mask 51 may be allowed to present after the completion of the both etching even when the second etching step and the third etching step is carried out separately.

When the narrowest width between the light-emitting-device separation-trenches formed is $2L_{WSPT1}$, $L_{WSPT1}$ is preferably 20 μm or more, for example 30 μm or more for device separation by breaking. For separation by dicing, $L_{WSPT1}$ is preferably 300 μm or more. Since an excessively large width is not correspondingly effective, $L_{WSPT1}$ is generally 2000 μm or less. These are needed for ensuring a margin for a device manufacturing process and a scribe region.

After the third etching step, an insulating layer 30 is formed as shown in FIG. 2-10. The insulating layer may be appropriately made of any material as long as electric insulation can be ensured, as detailed above. Deposition can be conducted by any known method such as plasma CVD.

Next, as shown in FIG. 2-11, a predetermined part in the insulating layer 30 is removed, to form a second-conductivity-type-side electrode exposed part 37 where the insulating layer on the second-conductivity-type-side electrode 27 is removed, a first current injection region 36 where the insulating layer on the first-conductivity-type cladding layer is removed, and a scribe region 14 where the insulating layer within the light-emitting-device separation-trench 13 is removed. Removal of the insulating layer 30 on the second-conductivity-type-side electrode 27 is preferably conducted such that the periphery of the second-conductivity-type-side electrode is covered by the insulating layer. That is, the surface area of the second-conductivity-type-side electrode exposed part is preferably smaller than the area of the second current injection region. Here, for ensuring a margin for a device manufacturing process, particularly a photolithography step or preventing unintended short circuit from occurring due to a solder material, $L_{2w}$ is preferably 15 μm or more, wherein $L_{2w}$ is the narrowest width in the part where the second-conductivity-type-side electrode is partly covered by the insulating layer. More preferably, it is 30 μm or more, and most preferably, it is 100 μm or more. In particular, covering the wide area of the second-conductivity-type-side electrode by the insulating layer allows for reducing unintended short circuit due to a metal solder material, with an another part such as the first-conductivity-type-side electrode. In addition, $L_{2w}$ is generally 2000 μm or less, and preferably 750 μm or less.

For removing the insulating layer, an etching procedure such as dry etching and wet etching may be selected, depending on a material selected. For example, when the insulating layer is a single layer of $SiN_x$, dry etching using a gas such as $SF_6$ or wet etching using a hydrofluoric acid etchant can be employed. When the insulating layer is a dielectric multilayer film made of $SiO_x$ and $TiO_x$, the multilayer film in a desired part can be removed by Ar-ion milling.

The second-conductivity-type-side electrode exposed part 37, the first current injection region 36 and the scribe region 14 can be separately formed. But they are, in general, simultaneously formed by etching. When the width of scribe region 14 is $2L_{ws}$ (FIG. 2-2), $2L_{ws}$ is preferably 30 μm or more. Since an excessively large width is not correspondingly effective, $2L_{ws}$ is generally 300 μm or less and is preferably 200 μm or less.

In another embodiment (corresponds to FIGS. 2-3 and 2-4) disclosed in this Section, a part without an insulating layer 15 is formed by etching the insulating film on the sidewall near the substrate in the light-emitting-device separation-trench as shown in FIG. 2-12. The following process may be used as a formation process for removing a part of the insulating film. First, a resist mask having an opening whose area is equal to or slightly smaller than the area of the light-emitting-device separation-trench 13 is formed by photolithography, and then, wet etching is conducted using an etchant capable of etching an insulating layer, to initiate removal of the insulating layer on the substrate surface within the light-emitting-device separation-trench. If the etching is further continued, side etching proceeds to remove the insulating layer covering the substrate side of the trench sidewall by the wet etchant and thus to give a shape as shown in FIG. 2-12 wherein an insulating layer of the sidewall is not present in the portion of the substrate side. In the case that the insulating layer is removed as this case, the exposed sidewall without an insulating layer is preferably sidewall of undoped layer. This is because it prevents unintended electric short circuit from occurring even if a solder for bonding to a submount attaches to the sidewall during flip-chip mounting.

In the invention disclosed in this Section, either embodiment of FIG. 2-11 or FIG. 2-12 can prevent unintended electric short circuit during flip-chip mounting. Generally, such an embodiment is sufficient that forms a scribe region 14 where the insulating layer is not present on the substrate surface as shown in FIG. 2-11. When the light-emitting-device separation-trench is formed to the intermediate portion of the combination of the optical coupling layer and the buffer layer, the same process can be employed, except the insulating film is deposited not on the substrate surface but on the trench bottom surface in the above process.

Then, a first-conductivity-type-side electrode 28 is formed as shown in FIGS. 2-13 and 2-14. FIGS. 2-13 and 2-14 correspond to structures after first-conductivity-type-side electrode 28 is formed in the structures in FIGS. 2-11 and 2-12, respectively. An electrode material preferably comprises, as described above, a material selected from Ti, Al, Ag and Mo or all of them as a constituent device when the first-conductivity-type is n-type. Generally, Al is exposed in a direction opposite to a main light-extraction direction of the n-side electrode.

For a film formation of the electrode material, there is used a variety of deposition processes such as sputtering and vacuum evaporation, and a desired electrode shape can be obtained by appropriately applying, for example, a lift-off process using photolithography technique or site-selective evaporation using, for example, a metal mask. Considering a process margin to some extent, when $L_{1w}$ is the narrowest width in the part of the first-conductivity-type-side electrode in contact with the insulating layer, $L_{1w}$ is preferably 7 μm or more, particularly preferably 9 μm or more. Furthermore, $L_{1w}$ is generally 500 μm or less, preferably 100 μm or less. In general, when it is 5 μm or more, a process margin by a photolithography process and a liftoff procedure can be ensured.

The first-conductivity-type-side electrode is formed in this example such that a part thereof contacts with the first-conductivity-type cladding layer, but can be formed to contact with, in case formed, a first-conductivity-type-side contact layer.

In a manufacturing process of the invention disclosed in this Section, the first-conductivity-type-side electrode is formed in the final step of forming a stacked structure, which is advantageous in the light of reducing process damage. When the first-conductivity-type is n-type, Al is formed on the surface of the electrode material of the n-side electrode in a preferred embodiment. Here, if the n-side electrode is formed before formation of an insulating layer as the second-conductivity-type-side electrode, the n-side electrode surface, that is, Al metal receives a history of the etching process of the insulating layer. Etching of the insulating layer is conveniently conducted by wet etching using a hydrofluoric acid etchant as described above, but Al is less tolerant to various etchants including hydrofluoric acid, so that when effectively conducting such a process, the electrode itself is damaged. Furthermore, even if dry etching is employed, Al is relatively reactive, so that damages including oxidation may be introduced. Therefore, in the present invention, it is effective in reducing damage to the electrode that the first-conductivity-type-side electrode is formed after forming the insulating layer and after removing a predetermined unnecessary part in the insulating layer.

Thus, after forming the structure shown in FIG. 2-13 (FIG. 2-2) and FIG. 2-14 (FIG. 2-4), the substrate is scratched by diamond scribing or the substrate material is partly ablated by laser scribing using the light-emitting-device separation-trench for separating individual integrated compound semiconductor light-emitting-devices.

In case that there is no thin-film crystal layer in the light-emitting-device separation-trench in the step of inter-device separation (this corresponds to the structures in FIGS. 2-13 and 2-14), no process damage is introduced in the thin-film crystal layer. Furthermore, in case that there is no insulating layers in the scribe region as shown in FIGS. 2-13 and 2-14, for example, detachment of an insulating layer does not occur during scribing at all.

In some embodiments, the light-emitting-device separation-trench is formed to the intermediate portion of the combination of the optical coupling layer and the buffer layer (for example, the case where the trench is formed to the intermediate portion of the optical coupling layer with almost the same depth as the light-emitting-unit separation-trench), and in such a case, again, the substrate is scratched by diamond scribing or the substrate material is partly ablated by laser scribing using the light-emitting-device separation-trench.

After finishing scratching (scribing), the integrated compound semiconductor light-emitting-devices are divided in the braking step into the individual devices, each of which is mounted on a submount preferably by, for example, a solder material.

As described above, there is manufactured the integrated compound semiconductor light-emitting-device as shown in FIGS. 2-1 and 2-3.

According to the manufacturing process of the invention disclosed in this Section, in addition to capability of manufacturing the advantageous structure having an optical coupling layer effectively, it is preferable as described above to conduct formation of the thin-film crystal layer, formation of the second-conductivity-type-side electrode, the etching steps (the first etching step, the second etching step and the third etching step), formation of the insulating layer, removal of the insulating layer (formation of the second-conductivity-type-side electrode exposed part, formation of the first current injection region and removal of the insulating layer near the light-emitting-device separation-trench) and formation of the first-conductivity-type-side electrode, in this sequence. Such a process sequence allows for providing a light-emitting-device without damage in the thin-film crystal layer immediately below the second-conductivity-type-side electrode or damage in the first-conductivity-type-side electrode. Furthermore, the device shape reflects the process flow. In other words, this light-emitting-device internally has a structure where there are deposited the second-conductivity-type-side electrode, the insulating layer and the first-conductivity-type-side electrode in this sequence. That is, the second-conductivity-type-side electrode is in contact with the second-conductivity-type cladding layer (or another second-conductivity-type thin-film crystal layer) without an intervening insulating layer; there is a part of the upper periphery of the second-conductivity-type-side electrode which is covered by an insulating layer; and there is an area where an electrode periphery is intervened by an insulating layer between the first-conductivity-type-side electrode and the first-conductivity-type-side cladding layer (or another first-conductivity-type thin-film crystal layer).

<<Section C>>

The invention disclosed in Section C relates to the followings.

[1] An integrated compound semiconductor light-emitting-device, comprising a plurality of light-emitting-units, wherein the light-emitting-unit comprises a compound semiconductor thin-film crystal layer having a first-conductivity-type semiconductor layer containing a first-conductivity-type cladding layer, an active layer structure and a second-conductivity-type semiconductor layer containing a second-conductivity-type cladding layer; a second-conductivity-type-side electrode; and a first-conductivity-type-side electrode;

a main light-extraction direction is the side of the first-conductivity-type semiconductor layer in relation to the active layer structure, and the first-conductivity-type-side electrode and the second-conductivity-type-side electrode are formed on the opposite side to the main light-extraction direction;

the light-emitting-units are electrically separated each other by a light-emitting-unit separation-trench formed between adjacent light-emitting-units; and the light-emitting-device comprises:

an optical coupling layer formed at the main light-extraction direction side of the first-conductivity-type semiconductor layer; the optical coupling layer being common to the plurality of light-emitting-units, and capable of optical coupling of the plurality of light-emitting-units and distributing a light emitted from one light-emitting-unit to the other light-emitting-units; and a buffer layer formed at the main light-extraction direction side of the optical coupling layer.

[2] The light-emitting-device as described in [1], wherein the optical coupling layer is a layer formed as a part of the thin-film crystal layer so as to be common to the plurality of light-emitting-units.

[3] The light-emitting-device as described in [1] or [2], wherein when an average refractive index of the optical coupling layer is $n_{oc}$ and an average refractive index of the first-conductivity-type semiconductor layer is $n_1$, the relation:

$$n_1 < n_{oc}$$

is satisfied.

[4] The light-emitting-device as described in any of [1] to [3], wherein when an average refractive index of the optical coupling layer is $n_{oc}$ and an average refractive index of the buffer layer is $n_{bf}$, the relation:

$$n_{bf} \leq n_{oc}$$

is satisfied.

[5] The light-emitting-device as described in any of [1] to [4], wherein when an emission wavelength of the light-emitting-device is $\lambda$ (nm), an average refractive index of the optical coupling layer is $n_{oc}$ and an average refractive index of the first-conductivity-type semiconductor layer is $n_1$, each at an emission wavelength, and a physical thickness of the optical coupling layer is $t_{oc}$ (nm) and a relative refractive index difference $\Delta_{(oc-1)}$ between the optical coupling layer and the first-conductivity-type semiconductor layer $\Delta_{(oc-1)}$ is defined as $$\Delta_{(oc-1)} \equiv ((n_{oc})^2 - (n_1)^2)/(2 \times (n_{oc})^2),$$

$t_{oc}$ is selected such that the relation:

$$(\sqrt{(2 \times \Delta_{(oc-1)})} \times n_{oc} \times \pi \times t_{oc})/\lambda \geq \pi/2$$

is satisfied.

[6] The light-emitting-device as described in [5], wherein $t_{oc}$ is selected such that the relation:

$$(\sqrt{(2 \times \Delta_{(oc-1)})} \times n_{oc} \times \pi \times t_{oc})/\lambda \geq 2 \times \pi$$

is further satisfied.

[7] The light-emitting-device as described in any of [1] to [6], wherein an overall specific resistance of the optical coupling layer $\rho_{oc}$ ($\Omega \cdot cm$) satisfies the relation:

$$0.5 \leq \rho_{oc}.$$

[8] The light-emitting-device as described in any of [1] to [7], wherein the optical coupling layer has a stacked structure consisting of multiple layers.

[9] The light-emitting-device as described in any of [1] to [8], wherein the plurality of light-emitting-units are formed by forming the light-emitting-unit separation-trench by removing the thin-film crystal layer from the surface to the boundary of the optical coupling layer or to an inside portion of the optical coupling layer between the adjacent light-emitting-units.

[10] The light-emitting-device as described in any of [1] to [9], wherein the width of the light-emitting-unit separation-trench is 2 to 300 µm.

[11] The light-emitting-device as described in any of [1] to [10], wherein the light-emitting-device has been divided from a light-emitting-device separation-trench formed between a plurality of light-emitting-devices; the light-emitting-device separation-trench being formed to the intermediate portion of the optical coupling layer.

[12] The light-emitting-device as described in [10], wherein the light-emitting-device has been divided from a light-emitting-device separation-trench formed between a plurality of light-emitting-devices; the light-emitting-device separation-trench being formed to the intermediate portion of the buffer layer.

[13] The light-emitting-device as described in [10], wherein the light-emitting-device has been divided from a light-emitting-device separation-trench formed between a plurality of light-emitting-devices; the light-emitting-device separation-trench being formed by removing the buffer layer.

[14] The light-emitting-device as described in any of [1] to [13], comprising an insulating layer which is:

covering a bottom surface and a sidewall in the light-emitting-unit separation-trench, covering at least a sidewall surface of the first-conductivity-type semiconductor layer, the active layer structure and the second-conductivity-type semiconductor layer among layers exposed as sidewall surface of the light-emitting-device, in contact with a part of the first-conductivity-type-side electrode at the side of the main light-extraction direction, and covering a part of the second-conductivity-type-side electrode on the side opposite to the main light-extraction direction.

[15] The light-emitting-device as described in [14], wherein a region without an insulating layer is present on a side surface of the light-emitting-device, and the insulating layer covers at least the sidewall surface of the first-conductivity-type semiconductor layer, the active layer structure and the second-conductivity-type semiconductor layer.

[16] The light-emitting-device as described in any of [1] to [15], wherein the thin-film crystal layer is made of a Group III-V compound semiconductor containing nitrogen as a Group V atom.

[17] The light-emitting-device as described in any of [1] to [16], wherein the active layer structure consists of quantum well layer and barrier layer and when B is the number of the barrier layer and W is the number of the quantum well layer, B and W satisfy the relation:

$$B = W + 1.$$

[18] The light-emitting-device as described in [14] or [15], wherein the insulating layer is a dielectric multilayer film consisting of multiple layers.

[19] The light-emitting-device as described in any of [14] to [18], wherein when R2 is a reflectance of reflection by the optical coupling layer, of a light having an emission wavelength of the light-emitting-device vertically incoming from the first-conductivity-type semiconductor layer side to the optical coupling layer, R12 is a reflectance of reflection by the insulating layer, of a light having an emission wavelength of the light-emitting-device vertically incoming from the second-conductivity-type semiconductor layer side to the insulating layer, R11 is a reflectance of reflection by the insulating layer, of a light having an emission wavelength of the light-emitting-device vertically incoming from the first-conductivity-type semiconductor layer side to the insulating layer and R1q is a reflectance of reflection by the insulating layer, of a light having an emission wavelength of the light-emitting-device vertically incoming from the active layer structure side to the insulating layer, the insulating layer is configured such that all of the conditions:

$$R2<R12 \quad \text{(Relation 1)}$$

$$R2<R11 \quad \text{(Relation 2)}$$

$$R2<R1q \quad \text{(Relation 3)}$$

are satisfied.

[20] The light-emitting-device as described in any of [1] to [19], wherein the surface of the main light-extraction side of the buffer layer is not flat.

[21] The light-emitting-device as described in any of [1] to [20], wherein when R3 is a reflectance of reflection by the buffer layer, of a light having an emission wavelength of the light-emitting-device vertically incoming from the optical coupling layer to the buffer layer side and R4 is a reflectance of reflection by an interface with a space, of a light having an emission wavelength of the light-emitting-device vertically incoming from the buffer layer to the space of the light-extraction side, a low-reflecting optical film is formed in the light-extraction side of the buffer layer such that the relation:

$$R4<R3$$

is satisfied.

[22] The light-emitting-device as described in any of [1] to [21], wherein the first-conductivity-type is n-type and the second-conductivity-type is p-type.

[23] The light-emitting-device as described in any of [1] to [22], wherein the first-conductivity-type-side electrode and the second-conductivity-type-side electrode are bonded to a support having a metal layer via a solder.

[24] The light-emitting-device as described in [23], wherein bonding between each of the first-conductivity-type-side electrode and the second-conductivity-type-side electrode and the metal layer on the support is formed by a metal solder alone, or a metal solder and a metal bump.

[25] The light-emitting-device as described in [23] or [24], wherein the base material of the support is selected from the group consisting of AlN, $Al_2O_3$, Si, glass, SiC, diamond, BN and CuW.

[26] The light-emitting-device as described in any of [23] to [25], wherein the metal layer is not formed in a device-separating region in the support.

[27] A process for manufacturing an integrated compound semiconductor light-emitting-device having a plurality of light-emitting-units on a support, the process comprising:

a step of depositing a buffer layer and an optical coupling layer on a substrate in this sequence;

a step of depositing a thin-film crystal layer having at least a first-conductivity-type semiconductor layer containing a first-conductivity-type cladding layer, an active layer structure and a second-conductivity-type semiconductor layer containing a second-conductivity-type cladding layer;

a step of forming a second-conductivity-type-side electrode on the surface of the second-conductivity-type semiconductor layer;

a first etching step of exposing a part of the first-conductivity-type semiconductor layer;

a step of forming a first-conductivity-type-side electrode on the surface of the first-conductivity-type semiconductor layer exposed by the first etching step;

a second etching step of removing the thin-film crystal layer from the surface to the boundary of the optical coupling layer or from the surface to an inside portion of the optical coupling layer for forming a light-emitting-unit separation-trench to separate electrically the light-emitting-unit each other;

a third etching step of removing at least the first-conductivity-type semiconductor layer, the active layer structure and the second-conductivity-type semiconductor layer for forming a light-emitting-device separation-trench to separate into a plurality of light-emitting-devices; and a step of removing the substrate.

[28] The process as described in [27], comprising, after the step of removing the substrate, a step of mounting on the support by bonding the first-conductivity-type-side electrode and the second-conductivity-type-side electrode to a metal layer on the support.

[29] The process as described in [28], comprising, after the step of removing the substrate, a step of separating into a plurality of light-emitting-devices.

[30] The process as described in any of [27] to [29], wherein the optical coupling layer is formed as a part of the thin-film crystal layer before forming the first-conductivity-type semiconductor layer.

[31] The process as described in any of [27] to [30], wherein when an average refractive index of the optical coupling layer is $n_{oc}$ and an average refractive index of the first-conductivity-type semiconductor layer is $n_1$, the relation:

$$n_1<n_{oc}$$

is satisfied.

[32] The process as described in any of [27] to [31], wherein when an average refractive index of the optical coupling layer is $n_{oc}$ and an average refractive index of the buffer layer is $n_{bf}$, the relation:

$$n_{bf} \leq n_{oc}$$

is satisfied.

[33] The process as described in any of [27] to [32], wherein when an emission wavelength of the light-emitting-device is $\lambda$ (nm), an average refractive index of the optical coupling layer at an emission wavelength is $n_{oc}$, an average refractive index of the first-conductivity-type semiconductor layer at an emission wavelength is $n_1$ and a physical thickness of the optical coupling layer is $t_{oc}$ (nm) and a relative refractive index difference $\Delta_{(oc-1)}$ between the optical coupling layer and the first-conductivity-type semiconductor layer is defined as $$\Delta_{(oc-1)} \equiv ((n_{oc})^2-(n_1)^2)/(2\times(n_{oc})^2),$$

$t_{oc}$ is selected such that the relation:

$$(\sqrt{(2\times\Delta_{(oc-1)})}\times n_{oc}\times\pi\times t_{oc})/\lambda \geq \pi/2$$

is satisfied.

[34] The process as described in [33], wherein $t_{oc}$ is selected such that the relation:

$$(\sqrt{(2\times\Delta_{(oc-1)})}\times n_{oc}\times\pi\times t_{oc})/\lambda \geq 2\times\pi$$

is further satisfied.

[35] The process as described in any of [27] to [34], wherein an overall specific resistance of the optical coupling layer $\rho_{oc}(\Omega\cdot cm)$ satisfies the relation:

$$0.5 \leq \rho_{oc}.$$

[36] The process as described in any of [27] to [35], wherein the optical coupling layer is formed as a stacked structure consisting of multiple layers.

[37] The process as described in any of [27] to [36], wherein the third etching step is performed simultaneously or separately with the second etching step and is performed to remove the thin-film crystal layer from the surface to the boundary of the optical coupling layer or from the surface to an inside portion of the optical coupling layer.

[38] The process as described in any of [27] to [36], wherein the third etching step is performed to remove the thin-film crystal layer from the surface to an inside portion of the buffer layer.

[39] The process as described in any of [27] to [36], wherein the third etching step is performed so as to at least reach the substrate surface.

[40] The process as described in any of [27] to [39], wherein the second etching step and the third etching step are performed by dry etching process using gas selected from the group consisting of $Cl_2$, $BCl_3$, $SiCl_4$, $CCl_4$ and combination of two or more of these.

[41] The process as described in [40], wherein a patterned metal-fluoride layer is used as an etching mask.

[42] The process as described in [41], wherein the metal-fluoride layer is selected from the group consisting of $SrF_2$, $AlF_3$, $MgF_2$, $BaF_2$, $CaF_2$ and combination of two or more of these.

[43] The process as described in any of [27] to [42], wherein the step of forming a second-conductivity-type-side electrode, the first etching step and the step of forming a first-conductivity-type-side electrode are carried out in this order, and wherein, the process further comprises a step of forming a insulating layer before the step of forming a first-conductivity-type-side electrode.

[44] The process as described in [43], wherein the step of forming a insulating layer is carried out after the first to third etching steps.

[45] The process as described in any of [27] to [36], wherein the step of forming a second-conductivity-type-side electrode, the first etching step and the step of forming a first-conductivity-type-side electrode are carried out in this order, and the third etching step is performed to the depth, from the surface, until removing a portion of the optical coupling layer or until removing a portion of the buffer layer, whereby forming the light-emitting-device separation-trench, and wherein, the process further comprises:

a step of forming a insulating layer after the first to third etching steps and before the step of forming a first-conductivity-type-side electrode; and a step of forming a scribe region by removing a portion of the insulating layer deposited on the trench bottom surface in the light-emitting-device separation-trench.

[46] The process as described in any of [27] to [36], wherein the step of forming a second-conductivity-type-side electrode, the first etching step and the step of forming a first-conductivity-type-side electrode are carried out in this order, and the third etching step is performed to the depth, from the surface, until removing a portion of the optical coupling layer, until removing a portion of the buffer layer, or until reaching the substrate, whereby forming the light-emitting-device separation-trench, and wherein, the process further comprises:

a step of forming a insulating layer after the first to third etching steps and before the step of forming a first-conductivity-type-side electrode; and a step of removing whole of the insulating layer deposited on the trench bottom surface in the light-emitting-device separation-trench and a portion of the insulating layer formed on the sidewall of the light-emitting-device separation-trench near the trench bottom.

[47] The process as described in [45], wherein the second etching step and the third etching step are performed simultaneously and are performed to the depth, from the surface, until reaching the boundary of the optical coupling layer or until removing a portion of the optical coupling layer, whereby forming the light-emitting-device separation-trench.

[48] The process as described in [46], wherein the second etching step and the third etching step are performed simultaneously and are performed to the depth, from the surface, until reaching the boundary of the optical coupling layer or until removing a portion of the optical coupling layer, whereby forming the light-emitting-device separation-trench.

[49] The process as described in any of [27] to [48], wherein the step of removing the substrate is performed by irradiating a light which penetrates the substrate and is absorbed by the buffer layer, from the substrate side to decompose a part of the buffer layer and effect delamination at the boundary between the substrate and the buffer layer.

[50] The process as described in [28], wherein the bonding of the first-conductivity-type-side electrode and the second-conductivity-type-side electrode to the metal layer on the support is performed via a solder.

[51] The process as described in [28] or [50], wherein the base material of the support is selected from the group consisting of metal, AlN, $Al_2O_3$, Si, glass, SiC, diamond, BN and CuW.

[52] The process as described in any of [27] to [51], wherein the substrate is selected from the group consisting of sapphire, SiC, GaN, $LiGaO_2$, ZnO, $ScAlMgO_4$, $NdGaO_3$ and MgO.

According to the invention disclosed in this Section, there can be provided an integrated compound semiconductor light-emitting-device capable of emitting light as a large-area plane light source, exhibiting excellent in-plane uniformity in emission intensity. Furthermore, there can be provided a device wherein even when deterioration in an emission intensity varies from one light-emitting-unit to the other to some extent, higher in-plane uniformity can be ensured and maintained.

In particular, blue or ultraviolet plane-like emission with relatively higher uniformity in emission intensity can be realized even when an area of a light-emitting-device is more than several $cm^2$. Furthermore, the present invention also relates to a flip-chip type light-emitting-device where light is extracted from the substrate side and both p- and n-side electrodes are disposed on the opposite side to the light-extraction side, whereby adequate heat dissipation and a higher light-extraction efficiency can be ensured because an element can be mounted by fusion-bonding a p-side and an n-side electrodes on a highly heat-dissipative submount having a meal interconnection using a solder without using a metal wire for current introduction.

In the invention disclosed in this Section, light-emitting-units are electrically separated each other while being optically combined via an optical coupling layer, so that a light emitted from a quantum well layer in one light-emitting-unit is distributed in the other light-emitting-unit. Thus, in the light-emitting-device according to the present invention, light is emitted from the area between light-emitting-units where a luminance is reduced in a conventional configuration, so that surface emission with relatively higher uniformity can be achieved. Furthermore, even when an emission intensity varies or deterioration in an emission intensity varies to some extent between light-emitting-units, higher in-plane uniformity in emission intensity is ensured because of the presence of the optical coupling layer. Furthermore, even if one light-emitting-unit does not emit light due to some defect, emission intensity is ensured to some extent directly over the defective light-emitting-unit, resulting in good surface uniformity.

In addition, since there is no substrate in the direction of the main light-extraction side in the invention disclosed in this Section, there can be provided advantages simultaneously as follows. For example, in the case of light emitting device formed of any of GaN materials, InGaN materials, AlGaN materials, InAlGaN materials, InAlGaBN materials and the like formed by a general MOCVD on C+ plane sapphire substrate, the side to the sapphire substrate is N-plane and the side to growth direction is Ga plane in these material, generally. Here, since the Ga-plane is not easily chemically etched and the formation of rough surface for improving light-extraction efficiency is not easy. Whereas, N-plane is relatively easily chemically etched and the formation of rough surface is possible. Contrary to this, if a substrate exist, typically such as a sapphire substrate, chemical etching is almost impossible. In the invention disclosed in this Section, the formation of the rough surface is easily performed by removing the substrate, followed by chemical etching of the exposed N-plane; and therefore improving the light emission efficiency of the light emitting device is easily attained.

Description of Embodiments of the Invention in Section C

Hereinafter, the present invention of this Section will be explained in more details.

FIG. 3-1 shows an example of an integrated compound semiconductor light-emitting-device (hereinafter, simply referred to as a "light-emitting-device") of the invention disclosed in this Section. Furthermore, the structure of the light-emitting-device in FIG. 3-1 will be detailed with reference to FIG. 3-2 showing a shape in the course of the manufacturing. Although there is shown an example where one light-emitting-device 10 is constituted from three light-emitting-units 11 as shown in FIGS. 3-1 and 3-2, there are no particular restrictions to the number of integrated units and the number of units can be appropriately varied in one substrate provided. For example, the number of integrated units may be two, or alternatively more than 500 units may be integrated. Here, preferably the number is 25 to 200 units. In addition, two-dimensional arrangement may be also preferred.

In the invention disclosed in this Section, one light-emitting-unit has, as shown in the figure, at least, a compound semiconductor thin-film crystal layer containing a first-conductivity-type semiconductor layer including a first-conductivity-type cladding layer 24, a second-conductivity-type semiconductor layer including a second-conductivity-type cladding layer 26 and an active layer structure 25 sandwiched between the first and the second-conductivity-type semiconductor layers; a second-conductivity-type-side electrode 27; and a first-conductivity-type-side electrode 28. As shown in the figure, a light-emitting-unit separation-trench 12 defines the light-emitting-unit 11 within the integrated compound semiconductor light-emitting-device 10, while the optical coupling layer 23 is common to the light-emitting-units. Furthermore, a buffer layer 22, which is initially formed on the substrate 21, is also common to the light-emitting-units.

In this example, on a part of the second-conductivity-type cladding layer 26, the second-conductivity-type-side electrode 27 is disposed and the part where the second-conductivity-type cladding layer 26 and the second-conductivity-type-side electrode 27 are in contact with each other is a second current injection region 35. In this configuration, parts of the second-conductivity-type cladding layer and the active layer structure, and a part of the first-conductivity-type cladding layer are removed. The first-conductivity-type-side electrode 28 is disposed in contact with the first-conductivity-type cladding layer 24 exposed in the removed part, so that the second-conductivity-type-side electrode 27 and the first-conductivity-type-side electrode 28 are disposed on the same side in relation to the substrate.

In the invention disclosed in this Section, the light-emitting-units 11 are electrically separated each other by a light-emitting-unit separation-trench 12. That is, the light-emitting-unit separation-trench 12 divides highly conductive layers in the thin-film crystal layer, and thus there are substantially no electric connection between light-emitting-units. In the invention disclosed in this Section, one light-emitting-unit has one light-emitting-point (an independent light-emitting part).

On the other hand, in the present invention, the optical coupling layer 23 is commonly present between the light-emitting-units, which creates the state that the light-emitting-units are optically connected. In other words, a light emitted from one light-emitting-unit reaches the other units through moderate diffusion and radiation (leak) in the optical coupling layer and also reaches the other light-emitting-units without being localized in one light-emitting-unit. Thus, it is necessary that the light-emitting-unit separation-trench 12 reaches the interface of the optical coupling layer or, as shown in FIG. 3-1, reaches the intermediate portion of the optical coupling layer on the condition that the layer is not divided. Although details will be described later, the optical coupling layer is substantially insulative and made of a material having a relatively higher refractive index for achieving appropriate waveguide function within the layer.

In the invention disclosed in this Section, a width of the light-emitting-unit separation-trench is preferably 2 to 300 µm, more preferably 5 to 50 µm, most preferably 8 to 15 µm. A smaller width of the light-emitting-unit separation-trench, together with the optical coupling layer, improves uniformity in surface emission.

FIG. 3-2 shows a part of the other light-emitting-device adjacent to the central light-emitting-device 10. In the manufacturing process, as shown here, the individual light-emitting-devices 10 are formed by being separated by a light-emitting-device separation-trench 13 on the same substrate 21. The completed light-emitting-device as shown in FIG. 3-1 corresponds to the structure where one of the light-emitting-devices 10 shown in FIG. 3-2 is bonded by connected a second-conductivity-type-side electrode 27 and a first-conductivity-type-side electrode 28 via a metal solder 42 to the metal surface 41 on the support 40. An example of the manufacturing process will be described later.

In the example shown in FIG. 3-2, the light-emitting-device separation-trench is formed by removing the thin-film crystal layer so as to reach the substrate, which is one of preferable embodiments. Alternatively, an embodiment where the light-emitting-device separation-trench is formed to the intermediate portion of the combined layer of the optical coupling layer and the buffer layer is preferable. In any of these, an insulating layer can be easily formed on the sidewall of a highly conductive layer near the active layer structure side in relation to the optical coupling layer.

In the light-emitting-device of the invention disclosed in this Section, the insulating layer 30 covers most of the exposed area including the surfaces and the sidewalls of the thin-film crystal layers 22 to 26, and several embodiments are possible for the shape of the insulating layer on the sidewall of the light-emitting-device of FIG. 3-1, that is, in the light-emitting-device separation-trench 13 in the state of FIG. 3-2 before the light-emitting-devices are separated. In any embodiment, it is preferable that before separating the light-emitting-devices, the insulating layer does not contact with the substrate, and there is a part without an insulating layer within the light-emitting-device separation-trench 13 defining the light-emitting-devices. Furthermore, the light-emitting-devices are preferably separated from the part without an insulating film. As a result, in a preferred configuration of the light-emitting-device of the invention disclosed in this Section, the insulating layer covering the sidewall does not reach the light-extraction side interface of the buffer layer. There will be described a specific example of a preferable insulating layer.

In an embodiment of the invention disclosed in this Section, as shown in FIG. 3-2, the insulating layer 30 does not cover the whole surface of the inside of the light-emitting-device separation-trench 13, but there is a part without an insulating layer 15 where an insulating layer 30 is not formed on the substrate (that is the trench bottom) and the trench sidewall near the substrate. According to this structure no insulating layer 30 is attached to the substrate 21, therefore, there is no possibility of detachment of the insulating layer when removing the substrate 21, for example by delamination. Thus this structure is most preferable. In the resulting light-emitting-device, as shown in part B (dotted line circle) in FIG. 3-1, there is a part without an insulating layer 15 where the insulating layer 30 does not reach the substrate surface. In a device having this configuration, detachment of an insulating layer is reliably prevented and as a result, even if running around of a solder occurs, the functions of the light-emitting-device are not deteriorated, resulting in a highly reliable device.

In this FIG. 3-1, the whole sidewall of the buffer layer 22 and a part of the sidewall of the optical coupling layer 23 are exposed. However, the sidewall of the optical coupling layer can be covered while a part of the buffer layer is exposed (see FIG. 3-11). The exposed part is preferably an undoped layer which is not doped. A highly reliable device can be provided by forming the exposed layer using a high insulative material.

When the light-emitting-device separation-trench is formed to the intermediate portion of the combined layer of the optical coupling layer and the buffer layer, a light-emitting-device having the following configuration is provided. First, when the light-emitting-device separation-trench is formed to the intermediate portion of the optical coupling layer 23, as shown in FIGS. 3-13 and 3-14, the optical coupling layer 23 and the buffer layer 22 extend to the edge of the light-emitting-device, the whole sidewall of the buffer layer is exposed, the optical coupling layer has a step based on the bottom of the light-emitting-device separation-trench, the sidewall of the optical coupling layer has a part which is not covered by an insulating layer in accordance with the sidewall of the buffer layer and a sidewall part receded from the edge of the light-emitting-device (the sidewall of the light-emitting-device separation-trench). In the example in FIG. 3-13, the insulating layer 30 covers the bottom and the sidewall of the separation trench from a position in the trench bottom distant from the edge of the optical coupling layer 23 as shown in part C (dotted line circle) in FIG. 3-13. This corresponds to a configuration where formation of the light-emitting-device separation-trench is stopped in the intermediate portion of the optical coupling layer 23 in FIG. 3-2 and a scribe region is formed by removing a part of the insulating layer deposited on the trench bottom surface of the optical coupling layer and the device is divided from the scribe region. The example in FIG. 3-14 corresponds to a configuration where formation of the light-emitting-device separation-trench is stopped in the intermediate portion of the optical coupling layer 23 in FIGS. 3-1 and 3-2, and as shown in part D (dotted line circle) in FIG. 3-14, there is a part which is not covered by an insulating layer, in the main light-extraction direction side of the sidewall inside of the edge of the light-emitting-device (the sidewall of the light-emitting-device separation-trench).

Next, when the light-emitting-device separation-trench is formed to the intermediate portion of the buffer layer 22, as shown in FIGS. 3-15 and 3-16, the buffer layer 22 extend to the edge of the light-emitting-device, the buffer layer has a step based on the bottom of the light-emitting-device separation-trench, the sidewall of the buffer layer has a part which is not covered by an insulating layer (the edge of the device) and a sidewall part receded from the edge of the light-emitting-device (the sidewall of the light-emitting-device separation-trench). In the example in FIG. 3-15, the insulating layer 30 covers the bottom and the sidewall of the buffer layer 22 in the separation trench, from a position in the trench bottom distant from the edge, and also covers the sidewall of the optical coupling layer (the sidewall of the light-emitting-device separation-trench) as shown in part E (dotted line circle) in FIG. 3-15. This corresponds to a configuration where formation of the light-emitting-device separation-trench is stopped in the intermediate portion of the buffer layer 22 in FIG. 3-2 and a scribe region is formed by removing a part of the insulating layer deposited on the trench bottom surface of the buffer layer and the device is divided from the scribe region. The example in FIG. 3-16 corresponds to a configuration where formation of the light-emitting-device separation-trench is stopped in the intermediate portion of the buffer layer 22 in FIGS. 3-1 and 3-2, and as shown in part F (dotted line circle) in FIG. 3-16, there is a part which is not covered by an insulating layer, in the main light-extraction direction side of the sidewall inside of the edge of the light-emitting-device (the sidewall of the light-emitting-device separation-trench).

As in these examples, even when the light-emitting-device separation-trench is formed to the intermediate portion of the combined layer of the optical coupling layer and the buffer layer, a device having a configuration where an insulating layer covering the sidewall does not reach the edge of the light-emitting-device ensures prevention of detachment of the insulating layer, and by forming the exposed layer from a highly insulative material, there can be provided a highly reliable device comparable to the light-emitting-device having the configuration in FIG. 3-1.

Furthermore, for the light-emitting-device of the invention disclosed in this Section, it is preferable that the insulating layer 30 is in contact with a part of the first-conductivity-type-side electrode 28 at the side of the main light-extraction direction as shown in FIG. 3-1, that is, there is a part intervened by an insulating layer in the periphery of the contact area between the first-conductivity-type-side electrode 28 and the first-conductivity-type semiconductor layer (the first-conductivity-type cladding layer 24 in the figure); and covers a part of the second-conductivity-type-side electrode 27 on the opposite side of the main light-extraction direction, that is, there is not an insulating layer between the second-conductivity-type-side electrode 27 and the second-conductivity-type semiconductor layer (the second-conductivity-type cladding layer 26 in the figure) and the insulating layer covers a periphery portion of the second-conductivity-type-side electrode 27. This configuration means that the insulating layer 30 is formed after the second-conductivity-type-side electrode 27 is formed; and after the insulating layer 30 is formed, the first-conductivity-type-side electrode 28 is formed. A manufacturing process with this sequence leads to less damage to a second-conductivity-type semiconductor layer such as the second-conductivity-type cladding layer 26 and to the first-conductivity-type-side electrode as described later, resulting in a light-emitting-device with a high efficiency. In other words, the fact having such a configuration means that the light-emitting-device exhibits high efficiency.

Furthermore, although the second-conductivity-type-side electrode 27 has the same size as the second current injection region 35, the exposed surface 37 in the second-conductivity-type-side electrode (the exposed part in the second-conductivity-type-side electrode) preferably has a smaller size than the second current injection region 35. Furthermore, in a part of the insulating layer 30 covering the surface of the first-conductivity-type cladding layer 24, there is formed an opening for contact of the first-conductivity-type-side electrode 28 with the first-conductivity-type cladding layer 24, which becomes a first current injection region 36. It is preferable that the first-conductivity-type-side electrode 28 has an area larger than that of the first current injection region.

It is also preferable that the second-conductivity-type-side electrode and the first-conductivity-type-side electrode are not spatially overlapped.

There will be further detailed the materials and the structures constituting a device.

Substrate

In the invention disclosed in this Section, a substrate is selected, on which a semiconductor layer can be grown and which can be finally removed. The substrate does not have to be transparent, but when the substrate is delaminated by laser debonding described later in the manufacturing process, it preferably allows a laser beam at the particular wavelength for penetrating. Preferably, it is electrically an insulating substrate. This is because when a substrate is delaminated by a laser debonding method in the manufacturing process, free electrons in a conductive substrate makes it difficult to employ the above substrate delaminating method. Specific examples of such a material is preferably selected from sapphire, SiC, GaN, LiGaO$_2$, ZnO, ScAlMgO$_4$, NdGaO$_3$ and MgO, particularly preferably sapphire, GaN and ZnO substrates for growing a thin-film crystal of an InAlGaN light-emitting material or an InAlBGaN material on the substrate. In particular, when a GaN substrate is used, its Si doping concentration is preferably a Si concentration of $3 \times 10^{17}$ cm$^{-3}$ or less for an undoped substrate, more preferably $1 \times 10^{17}$ cm$^{-3}$ or less in the light of electric resistance and crystallinity. When the substrate is removed based on chemical etching, ZnO which can be easily removed using, for example, hydrochloric acid is preferable.

A substrate used in the invention disclosed in this Section may be, in addition to a just-substrate completely defined by a so-called plane index, a so-called off-substrate (miss oriented substrate) in the light of controlling crystallinity during thin-film crystal growth. An off-substrate is widely used as a substrate because it is effective for promoting favorable crystal growth in a step flow mode and thus effective for improving device morphology. For example, when a c+ plane substrate of sapphire is used as a substrate for crystal growth of an InAlGaN material, it is preferable to use a plane inclined to an m+ direction by about 0.2°. An off-substrate having a small inclination of about 0.1 to 0.2° is generally used, but in an InAlGaN material formed on sapphire, a relatively larger off-angle is possible for canceling an electric field due to piezoelectric effect to a quantum well layer as a light-emitting-point within an active layer structure.

A substrate may be pretreated by chemical etching or heating for manufacturing an integrated compound semiconductor light-emitting-device utilizing crystal growth technique such as MOCVD and MBE. Alternatively, a substrate may be deliberately processed to have irregularity in relation to a buffer layer described later to prevent penetrating dislocation generated in an interface between a thin-film crystal layer and the substrate from being introduced near an active layer of a light-emitting-device or a light-emitting-unit described later.

In one of the embodiments disclosed in this Section, a thickness of the substrate is generally about 250 to 700 μm in an initial stage of device preparation for ensuring mechanical strength during semiconductor crystal growth and a device manufacturing process. After required growth of a semiconductor layer using a substrate, the substrate is removed by, for example, polishing, etching, laser debonding or the like.

Buffer Layer

A buffer layer 22 is formed mainly for facilitating thin-film crystal growth, for example, for preventing dislocation, alleviating imperfection in a substrate crystal and reducing various mutual mismatches between a substrate crystal and a desired thin-film crystal growth layer in growing a thin-film crystal on a substrate.

A buffer layer is particularly important since when a material such as an InAlGaN material, an InAlBGaN material, an InGaN material, an AlGaN material and a GaN material is grown on a foreign substrate by thin-film crystal growth, which is a desirable embodiment in the invention disclosed in this Section, matching of a lattice constant with a substrate is not necessarily ensured. For example, when a thin-film crystal growth layer including an optical coupling layer and thereafter is grown by organic metal vapor deposition (MOVPE), a low temperature growth AlN layer at about 600° C. may be used as a buffer layer, or a low temperature growth GaN layer formed at about 500° C. may be used. A material such as AlN, GaN, AlGaN, InAlGaN and InAlBGaN grown at a high temperature of about 800° C. to 1000° C. may be used. These layers are generally as thin as about 5 to 40 nm.

A buffer layer 22 needs not necessarily to be a single layer, and on a GaN buffer layer grown at a low temperature, a GaN layer may be grown at a temperature of about 1000° C. to several μm without doping for further improving crystallinity. In practice, it is common to form such a thick film buffer layer with a thickness of about 0.5 to 7 μm. In the invention disclosed in this Section, the buffer layer preferably does not contain a doped layer because the buffer layer is present in common to light-emitting-units in a compound semiconductor light-emitting-device. However, in case that a doped layer is contained in the buffer layer in consideration of crystallinity and the like, it is necessary that a undoped layer is formed after the growth of the doped layer so that the electrical insulation between the light-emitting-units is completely attained. Alternatively, buffer layer may be formed by stacking doped layer(s) and undoped layer(s) therein.

A buffer layer may be formed by epitaxial lateral overgrowth (ELO) as a kind of so-called microchannel epitaxy, which may allow for significant reduction of penetrating dislocation generated between a substrate such as sapphire and an InAlGaN material. Furthermore, when a processed substrate whose surface is made irregular, dislocation can be partly diminished during epitaxial lateral overgrowth, and it is preferable to apply such a combination of a substrate and a buffer layer to the invention disclosed in this Section. Furthermore, such a configuration is preferable because the irregularity formed in the surface of the substrate improves light-extraction efficiency.

In the invention disclosed in this Section, a buffer layer may be integrated with an optical coupling layer described later to effect optical coupling between the light-emitting-units because the buffer layer is a layer common to the light-emitting-units. In this case, it is necessary not to deteriorate the electrical insulation between the light-emitting-units. Further, a part or the whole of the buffer layer may also act as an optical coupling layer.

In the invention disclosed in this Section, for confining a light in the optical coupling layer described later for wave guiding, at an emission wavelength, a refractive index of the buffer layer of the light-emitting-device is equal to or less than an average refractive index of the optical coupling layer, preferably less than an average refractive index of the optical coupling layer. A physical thickness of the buffer layer is preferably more than $4\lambda/n_{bf}$ wherein an emission wavelength of a light-emitting-device is $\lambda$ (nm) and an average refractive index of the buffer layer is $n_{bf}$.

Since the substrate is removed in the course of the manufacturing process, in an embodiment of the invention disclosed in this Section, the buffer layer constitutes a main light-extraction face. As described later, one of the methods of removing the substrate includes a process where a part of the buffer layer is optically decomposed using a light which is transparent to the substrate and can be absorbed by the buffer layer, to remove the substrate. When employing such a method, a material suitable for the process is selected. For example, when the substrate is sapphire and the buffer layer is GaN, a laser debonding can be conduced, where an excimer laser having an oscillation wavelength of 248 nm is irradiated from the substrate side where the thin-film crystal has not been grown, to decompose GaN in the buffer layer into metal Ga and nitrogen and thus to delaminate the substrate.

Since there is not a substrate in a main light-extraction direction in the configuration disclosed in this Section, it is desirable that a so-called low reflecting coating layer or low-reflecting optical film is formed on a plane in a main light-extraction direction of the buffer layer. It may lead to inhibiting reflection due to a refractive index difference in a buffer layer-air interface and an output and device efficiency can be improved. Here, when R3 is a reflectance of reflection by the buffer layer, of a light having an emission wavelength of the light-emitting-device vertically incoming from the optical coupling layer described later to the buffer layer side and R4 is a reflectance of reflection by an interface with a space, of a light having an emission wavelength of the light-emitting-device vertically incoming from the buffer layer to the space of the light-extraction side, it is preferable that a low-reflecting optical film is formed in the light-extraction side of the buffer layer such that the relation:

$$R4 < R3$$

is satisfied. For example, when the buffer layer is GaN, the low reflecting coating film is preferably, for example, $Al_2O_3$. This is because since a refractive index of the low reflecting coating film is preferably near $\sqrt{n_{bf}}$ in relation to a refractive index $n_{bf}$ of the buffer layer at an emission wavelength of the device, and because $Al_2O_3$ has a refractive index near a square root of a refractive index of GaN.

In the invention disclosed in this Section, it is also preferable that a plane in a main light-extraction direction of the buffer layer is an irregular or crude surface. It allows for extracting light generated within a quantum well layer with a high efficiency, which is desirable in the light of improving an device output and an efficiency. When an emission wavelength of an device is $\lambda$ (nm), a surface crudeness of the buffer layer is preferably such that an average roughness Ra (nm) satisfy the relation:

$$\lambda/5 \text{ (nm)} < Ra \text{ (nm)} < 10 \times \lambda \text{ (nm)}$$

more preferably, the relation:

$$\lambda/2 \text{ (nm)} < Ra \text{ (nm)} < 2 \times \lambda \text{ (nm)}.$$

In the invention disclosed in this Section, at least a part of the buffer layer is exposed at a device edge. Therefore, it is preferable that at least the exposed part is made undoped because insufficient insulation which may occur by soldering during device assembly can be prevented.

Optical Coupling Layer

An optical coupling layer in the invention disclosed in this Section is a layer to effect the optical coupling between light-emitting-units constituting a light-emitting-device and that not to deteriorate the electrical insulation between the light-emitting-units contained in the integrated semiconductor light-emitting-device.

The optical coupling layer 23 is preferably formed in a compound semiconductor layer and as shown in the drawings such as FIGS. 3-1 and 2, it is formed between a buffer layer and a first-conductivity-type semiconductor layer (a first-conductivity-type cladding layer in figures). There are no particular restrictions to a deposition method, but the layer is preferably formed by thin-film crystal growth together with the other thin-film crystal layers for conveniently preparing an integrated semiconductor light-emitting-device.

In the invention disclosed in this Section, a refractive index of the optical coupling layer is preferably selected such that at least, light is confined within the layer, that is, the distribution density of the light is high. Thus, it is preferable that an average refractive index of optical coupling layer ($n_{oc}$) is larger than an average refractive index of a first-conductivity-type cladding layer. Particularly preferably, it is larger than an average refractive index of the first-conductivity-type semiconductor layer ($n_1$) present between an optical coupling layer and an active layer structure. It is equal to or larger than an average refractive index of a buffer layer ($n_{bf}$), i.e. $n_{bf} \leq n_{oc}$, particularly preferably more than an average refractive index of a buffer layer, i.e. $n_{bf} < n_{oc}$. When a light-emitting-device is based on an InAlGaN type Group III-V nitride, it is preferable that a material constituting the optical coupling layer contains In or Al in such an amount that a light emitted from the active layer structure is not absorbed, and particularly preferably, In is contained in consideration of improving a refractive index.

An optical coupling layer does not have to be a single layer, but may have a multilayer configuration. For a multilayer configuration, it may be a plurality of layers such as AlGaN, InGaN, InAlGaN and GaN or a superlattice structure.

Here, an average refractive index (nav) of each layer is a quotient of the sum of products of a refractive index (nx) of each of n materials constituting the layer and a physical thickness (tx) of the material by the whole thickness, which is calculated by the following equation:

$$nav = (n1 \times t1 + n2 \times t2 + \ldots + nn \times tn)/(t1 + t2 + \ldots + tn).$$

Further, an optical coupling layer may, depending on its structure, cause effects such as light scattering, multiple reflection and thin-film interference. In this case, these effects can further improve the uniformity at light-extraction face of the light-emitting-device as a whole.

As an example of an optical coupling layer, for example, a single layer of undoped GaN may be used as the optical coupling layer when an active layer structure has a quantum well layer with a composition of $In_aGa_{1-a}N$ and an emission wavelength of 460 nm, a first-conductivity-type cladding layer is n-GaN, a buffer layer is undoped GaN and a substrate is sapphire. Generally, there is a tendency that the higher a carrier concentration is, the smaller a refractive index of a semiconductor material at a transparent wavelength to the material is.

Further, a single layer of undoped GaN may be used as the optical coupling layer when an active layer structure has a quantum well layer with a composition of $In_aGa_{1-a}N$ and an emission wavelength of 460 nm, a first-conductivity-type cladding layer consists of an n-GaN and an n-AlGaN layers, a buffer layer is a stacked structure of an undoped GaN and a Si-doped GaN and a substrate is sapphire. Generally, there is a tendency that the higher a carrier concentration is, the smaller a refractive index of a semiconductor material at a transparent wavelength to the material is.

Further, an optical coupling layer may be a multilayer structure having a thick film of undoped GaN which contains $In_bGa_{1-b}N$ having a composition transparent to an emission wavelength and having a desired thickness in a desired number when an active layer structure has a quantum well layer having a composition of $In_aGa_{1-a}N$ and an emission wavelength of 460 nm, a first-conductivity-type cladding layer consists of an n-GaN and an n-AlGaN layers, a buffer layer is a stacked structure of undoped GaN and Si-doped GaN and a substrate is Si-doped GaN. Generally, there is a tendency that the higher a carrier concentration is, the smaller a refractive index of a semiconductor material at a transparent wavelength to the material is.

In these structures, it may be also desirable that an optical coupling layer contains a material such as $In_bGa_{1-b}N$ and $In_cAl_dGa_{1-c-d}N$. The appropriate selection of the composition parameters b, c and d, thickness and so on provides a layer which is transparent at a wavelength of 460 nm and has a refractive index larger than that of n-GaN which may be contained in a first-conductivity-type semiconductor layer, of undoped GaN which may be contained in a buffer layer, of sapphire which may be contained in a substrate, so that it may be used as an optical coupling layer. These materials can be used in the form of single layer or in multiple layers formed of these materials and undoped GaN layers.

Furthermore, it is also preferable that the optical coupling layer has a superlattice quantum well structure consisting of an InGaN layer and a GaN layer in which an In composition and a InGaN layer thickness are adjusted so as not to absorb the emission wavelength of a compound semiconductor light-emitting-device.

It is also important that a thickness of the optical coupling layer is selected such that it acts as a multimode optical waveguide receiving part of a light emitted from each light-emitting-unit and distributing the light therethrough to the other light-emitting-units.

When a physical thickness of the optical coupling layer is $t_{oc}$ (nm), an emission wavelength of the light-emitting-device is $\lambda$ (nm), an average refractive index of the optical coupling layer is $n_{oc}$, and an average refractive index of the first-conductivity-type semiconductor layer is $n_1$, a relative refractive index difference $\Delta_{(oc-1)}$ between the optical coupling layer and the first-conductivity-type semiconductor layer is defined as:

$$\Delta_{(oc-1)} = ((n_{oc})^2 - (n_1)^2)/(2 \times (n_{oc})^2),$$

Regarding the optical coupling layer as a symmetric slab waveguide sandwiched by average refractive indices of the first-conductivity-type semiconductor layer, the condition for the waveguide to be a multimode is that a normalized frequency is $\pi/2$ or more, and thus it is desirable that $t_{oc}$ is selected such that the relationship:

$$(\sqrt{(2 \times \Delta_{(oc-1)})} \times n_{oc} \times \pi \times t_{oc})/\lambda \geq \pi/2$$

is satisfied. Further, a thicker waveguide is more preferable and therefore $t_{oc}$ is more preferably selected such that the relationship:

$$(\sqrt{(2 \times \Delta_{(oc-1)})} \times n_{oc} \times \pi \times t_{oc})/\lambda \geq \pi/2$$

is satisfied.

This is the preferred condition as well as the condition of the refractive index for confining light in the optical coupling layer. Specifically, for example, assuming that an average refractive index of the optical coupling layer is 2.50 and an average refractive index of the first-conductivity-type semiconductor layer is 2.499, each at a wavelength of 460 nm, the above relationship is satisfied when a thickness of the optical coupling layer is about 3.3 µm or more.

Confinement of light achieved as above improves the optical coupling between the light-emitting-units, which then facilitates the uniform emission of light from the integrated compound semiconductor light-emitting-device. In addition, because of the presence of the optical coupling layer even in the place of light-emitting-unit separation-trench between light-emitting-units, relatively uniform light emission from the proximity to the light-emitting-unit separation-trench is achieved.

If a light is extremely confined in the optical coupling layer, luminescence uniformity in an integrated compound semiconductor light-emitting-device is improved but light-extraction becomes difficult, and it is, therefore, preferable that a thickness, a material, a structure, a configuration, a refractive index and so on of the optical coupling layer are appropriately selected such that wave guide is attained while it is leaky to some extent. Particularly, in terms of its thickness, it is not desirable that a thickness of the optical coupling layer is extremely large, leading to excessive light confinement in the waveguide; for example, its upper limit is preferably 30 µm or less, more preferably 10 µm or less, most preferably 5 µm or less.

Furthermore, since the optical coupling layer is present common to the light-emitting-units, it is essential that its material is selected so as not to deteriorate electric insulation between light-emitting-units. If all light-emitting-units are connected electrically in the light-emitting-device, the degradation in a single light-emitting-unit (a pair of pn junction) not only leads to the decrease in luminescence in the degraded light-emitting-unit, but also affects as the occurrence of change in current injection rout in the entirety of integrated compound semiconductor light-emitting-device. Therefore, the degradation in a light-emitting-unit shows up in a large scale as a fluctuation in properties of a light-emitting-device. In the invention disclosed in this Section, the material of the optical coupling layer is very preferably selected so as to ensure the electrical insulation between the light-emitting-units. If electrically insulated, the degradation in a light-emitting-unit, if happened during driving it, is limited to the problem of the degradation in a single light-emitting-unit. Further, since the adjacent light-emitting-units are coupled optically, light emission from the proximity of the light-emitting-unit which has degraded is expected to some extent, and an extreme decrease in the emission intensity is also avoided.

Therefore, the plane uniformity of the light intensity is relatively easily maintained including the degraded portion.

The optical coupling layer is insulative to the extent that changes such as degradation in a light-emitting-unit do not incur the influence in the other units. For example, a specific resistance $\rho_{oc}$ (Ω·cm) of the whole layer is preferably 0.5 (Ω·cm) or higher. It is more preferably 1.0 (Ω·cm) or higher, further preferably 1.5 (Ω·cm) or higher, most preferably 5 (Ω·cm) or higher. For a higher specific resistance, the optical coupling layer is preferably undoped. In addition, for example, when the optical coupling layer consists of multiple layers, a doped layer may be contained without problems if it is sandwiched between undoped layers and the light-emitting-units are not mutually electrically connected. In this case, it is required that a layer adjacent to the first-conductivity-type semiconductor layer (for example, a first-conductivity-type cladding layer) has the above specific resistance. Since generally in a wavelength region transparent to the material in a semiconductor, an undoped layer has a higher refractive index than that of a layer having many carriers deliberately doped even for the same material, an undoped layer is preferable in view of not only optical properties but also electric properties.

In the invention disclosed in this Section, while the optical coupling layer couples light-emitting-units optically and distributes and spreads light, the above buffer layer is for reduce various mismatches in crystal growth on a substrate, so that their functions are different. However, the single layer may have two functions at the same time. When the optical coupling layer or the buffer layer consists of multiple layers, some layers may have two functions. Furthermore, when a growing method or conditions are different even in the same composition, the layer may have only one function.

As described above, in the invention disclosed in this Section, light-emitting-unit separation-trench is present between light-emitting-units and this separation trench is formed so as to divide at least a first-conductivity-type cladding layer. Cladding layers and the like are generally doped for injecting carriers into a pn junction in a light-emitting-unit. Therefore, the cladding layer needs to be separated between the light-emitting-units in the invention disclosed in this Section in order to ensure the electrical insulation. Accordingly, it is sufficient that the light-emitting-unit separation-trench reaches the interface of the optical coupling layer. However, this is not easily controlled; and therefore the separation trench is generally formed to the intermediate portion of the optical coupling layer.

Further, a sidewall of the thin-film crystal layer exposed in the light-emitting-unit separation-trench is preferably covered by an insulating layer. This is because short circuit and the like can be prevented at sidewall of the thin-film crystal layer due to a solder when the light-emitting-device is flip-chip mounted on a support and the like First-Conductivity-Type Semiconductor Layer and First-Conductivity-Type Cladding Layer A first-conductivity-type semiconductor layer and a first-conductivity-type cladding layer employed in the invention according to this Section are as described in Section A Active Layer Structure An active layer structure employed in the invention according to this Section is as described in Section A.

Second-Conductivity-Type Semiconductor Layer and Second-Conductivity-Type Cladding Layer A second-conductivity-type semiconductor layer and a second-conductivity-type cladding layer employed in the invention according to this Section are as described in Section A.

Second-Conductivity-Type-Side Electrode

A second-conductivity-type-side electrode employed in the invention according to this Section is as described in Section A.

First-Conductivity-Type-Side Electrode

A first-conductivity-type-side electrode employed in the invention according to this Section is as described in Section A.

Insulating Layer

An insulating layer employed in the invention according to this Section is as described in Section A.

Support

Since the light-emitting-device of this Section does not have a substrate, functions required to a support are more or less different from those described in Section A.

Although it is essential that a support 40 plays a role as a support for a thin-film crystal layer during substrate removal, the support after the device manufacturing is completed very preferably has functions of current input and heat dissipation simultaneously. In this view, a base material of the support is preferably selected from the group consisting of a metal, AlN, SiC, diamond, BN and CuW. These materials are preferred because they exhibit good heat dissipation properties and can efficiently prevent the problem of heat generation which is inevitable in a high-output light-emitting-device. Furthermore, $Al_2O_3$, Si, glasses and so on are also preferable because they are inexpensive and can be used as a support in a wide variety of applications. It is desirable to conduct wet etching for removing metal Ga after decomposing a part of the thin-film crystal layer into metal Ga and nitrogen by laser irradiation in substrate removal described later, and in such a case, the support is preferably made of a material resistant to etching. It is desirable that when selecting a base material for a support from metals, its periphery is covered by, for example, a dielectric material which is etching resistant. A metal base material is preferably a material having a higher reflectance at an emission wavelength of the light-emitting-device, preferably Al, Ag and so on. When it is covered by a dielectric material, $SiN_x$, $SiO_2$ and so on formed by any of various CVD processes are desirable.

In view of having both functions of current introduction and of heat dissipation after completion of a device, the support preferably has an electrode interconnection for current input on a base material, and the part on the electrode interconnection where a device is mounted preferably has an adhesion layer for bonding of the support to a device as appropriate. Here, the adhesion layer may be formed using an Ag-containing paste, a metal bump or the like, and it is very preferably made of a metal solder in the light of heat dissipating properties. A metal solder can allow for flip-chip mounting with significantly excellent heat dissipating properties in comparison with an Ag-containing paste or a metal bump. Here, a metal solder may be a material such as In, InAg, InSn, SnAg, PbSn, AuSn, AuGe and AuSi. A high-melting solder such as AuSn, AuSi and AuGe is more preferred. This is because a temperature of an area near the solder material is increased to about 200° C. when introducing a large current for ultrahigh power driving of a light-emitting-device, and thus as a solder material, preferred is a metal solder having a melting point higher than a device temperature during driving. In some cases, it is preferable that bonding is formed using a bump whose periphery is filled with a metal solder material for canceling height difference in a device during flip-chip mount mounting.

In a compound semiconductor light-emitting-device of the invention disclosed in this Section, the light-emitting-units in a single light-emitting-device can be connected in parallel, in series or in combination of these by varying metal wiring on the support.

Manufacturing Process for a Light-Emitting-Device Disclosed in Section C

Next, there will be described a process for manufacturing a semiconductor light-emitting-device according to the invention disclosed in this Section.

In an embodiment of a manufacturing process disclosed in this Section, as shown in FIG. 3-4, first a substrate 21 is provided and over the surface are sequentially deposited a buffer layer 22, an optical coupling layer 23, a first-conductivity-type cladding layer 24, an active layer structure 25 and a second-conductivity-type cladding layer 26 by thin-film crystal growth. For formation of these thin-film crystal layers, MOCVD is preferably employed. However, it is possible to use MBE, PLD processes and the like for forming all or some of the thin-film crystal layers. A configuration of these layers can be appropriately changed, depending on, for example, an application of the device. After forming thin-film crystal layers, a variety of processings are allowed. As used herein, the term "thin-film crystal growth" includes heat-treatment after growing a thin-film crystal layer.

For providing the configuration shown in FIGS. 3-1 and 3-2 after growing thin-film crystal layers in the present invention, it is preferable that a second-conductivity-type-side electrode 27 is formed as shown in FIG. 3-4. That is, it is preferable that scheduled formation of the second-conductivity-type-side electrode 27 in the second current injection region 35 is conducted before formation of an insulating layer 30, formation of a first current injection region 36 and formation of a first-conductivity-type-side electrode 28. This is because when the second-conductivity-type is p-type as a desirable embodiment, formation of a p-side electrode after processing the exposed surface of the p-type cladding layer by various processes leads to reduction of a hole concentration in the p-GaN cladding layer with a relatively lower activation rate among GaN materials, due to process damage. For example, if the step of forming an insulating layer by p-CVD is conducted before forming the second-conductivity-type-side electrode, plasma damage remains in its surface. Thus, in the present invention, it is desirable that after thin-film crystal growth, formation of the second-conductivity-type-side electrode is conducted before any of the other process steps (for example, a first etching step, a second etching step, a third etching step or the step of forming an insulating layer, the step of forming an exposed part in a second-conductivity-type-side electrode, the step of forming a first current injection region and the step of forming a first-conductivity-type-side electrode as described later).

In the invention disclosed in this Section, when the second-conductivity-type is p-type and when the exposed surface is a relatively stable metal such as Au (in a typical example, the surface of the second-conductivity-type-side electrode is expected to be Au as described above), the surface is not likely process-damaged through the subsequent processes. In this respect, it is again desirable in the present invention that after thin-film crystal growth, formation of the second-conductivity-type-side electrode is conducted before any other process step.

In the present invention, when a layer in which the second-conductivity-type-side electrode is formed is the second-conductivity-type contact layer, process damage to the second-conductivity-type semiconductor layer can be reduced in the same manner.

The second-conductivity-type-side electrode 27 can be formed by applying a variety of deposition processes such as sputtering and vacuum evaporation, and a desired shape can be obtained by appropriately applying, for example, a lift-off process using photolithography technique or site-selective evaporation using, for example, a metal mask.

Figures 1, 2, 3, 4, 5, 6:
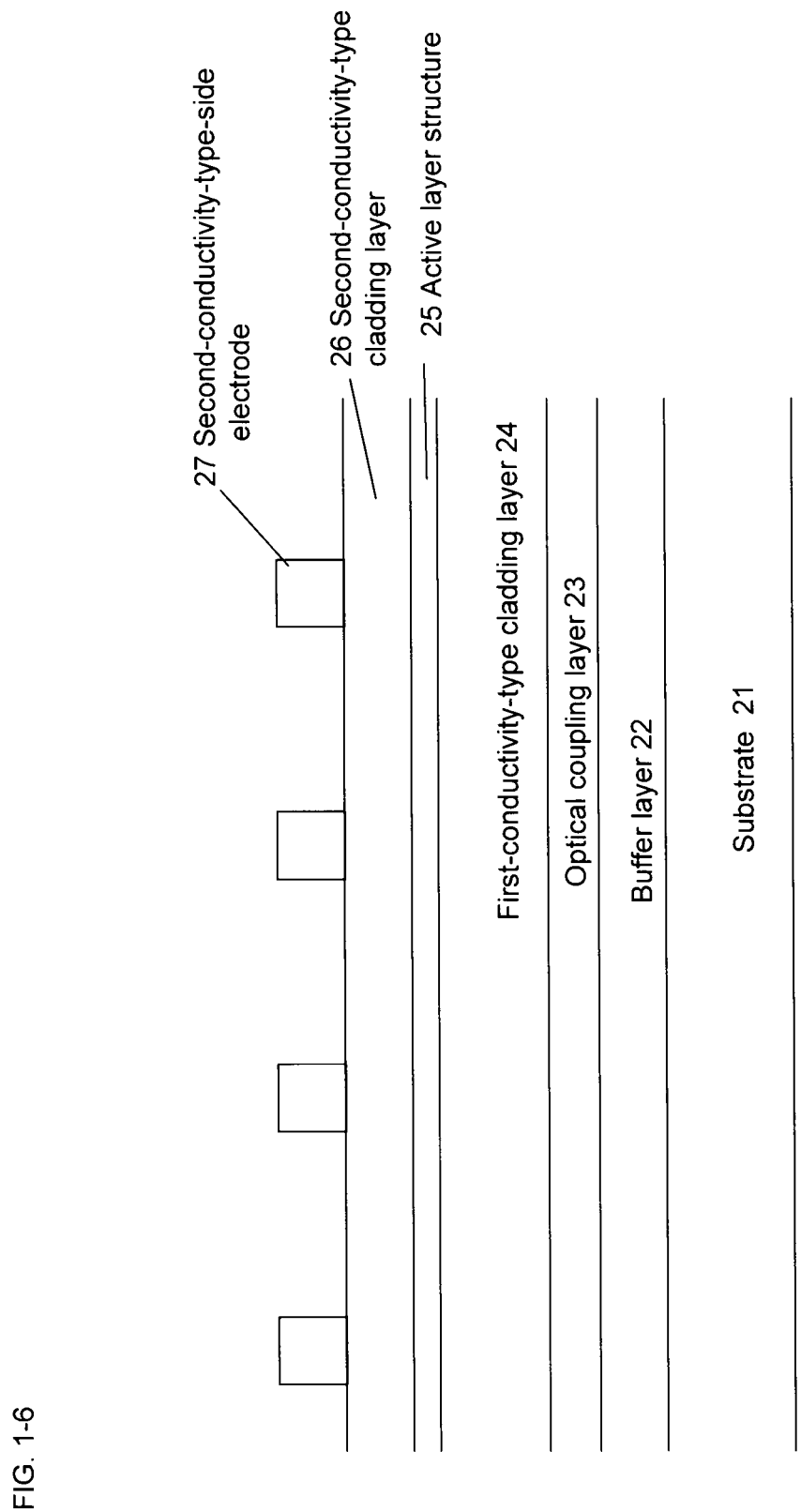
Figures 1, 2, 3, 4, 5, 6, 7:
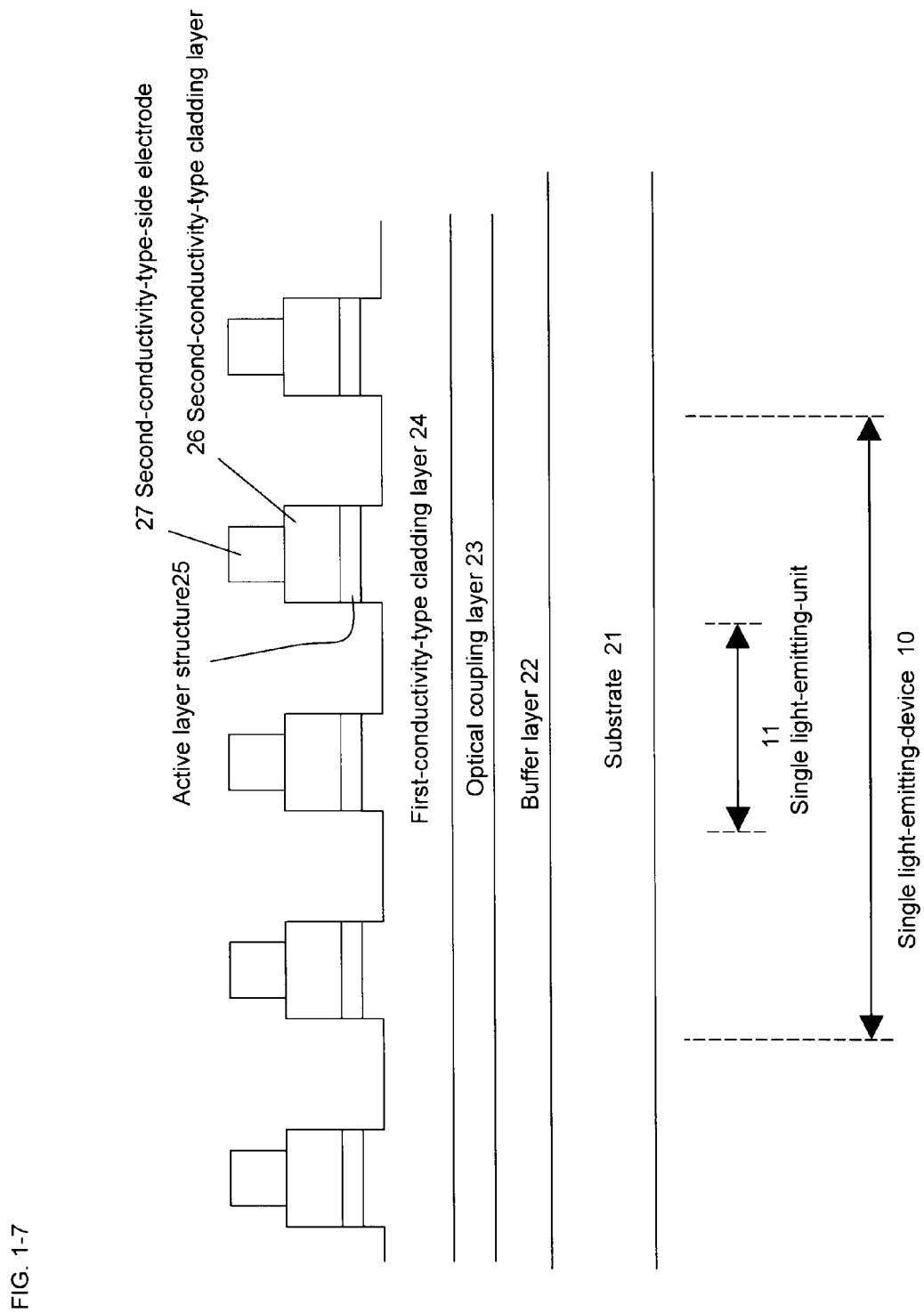
Figures 1, 2, 3, 4, 5, 6, 7, 8:
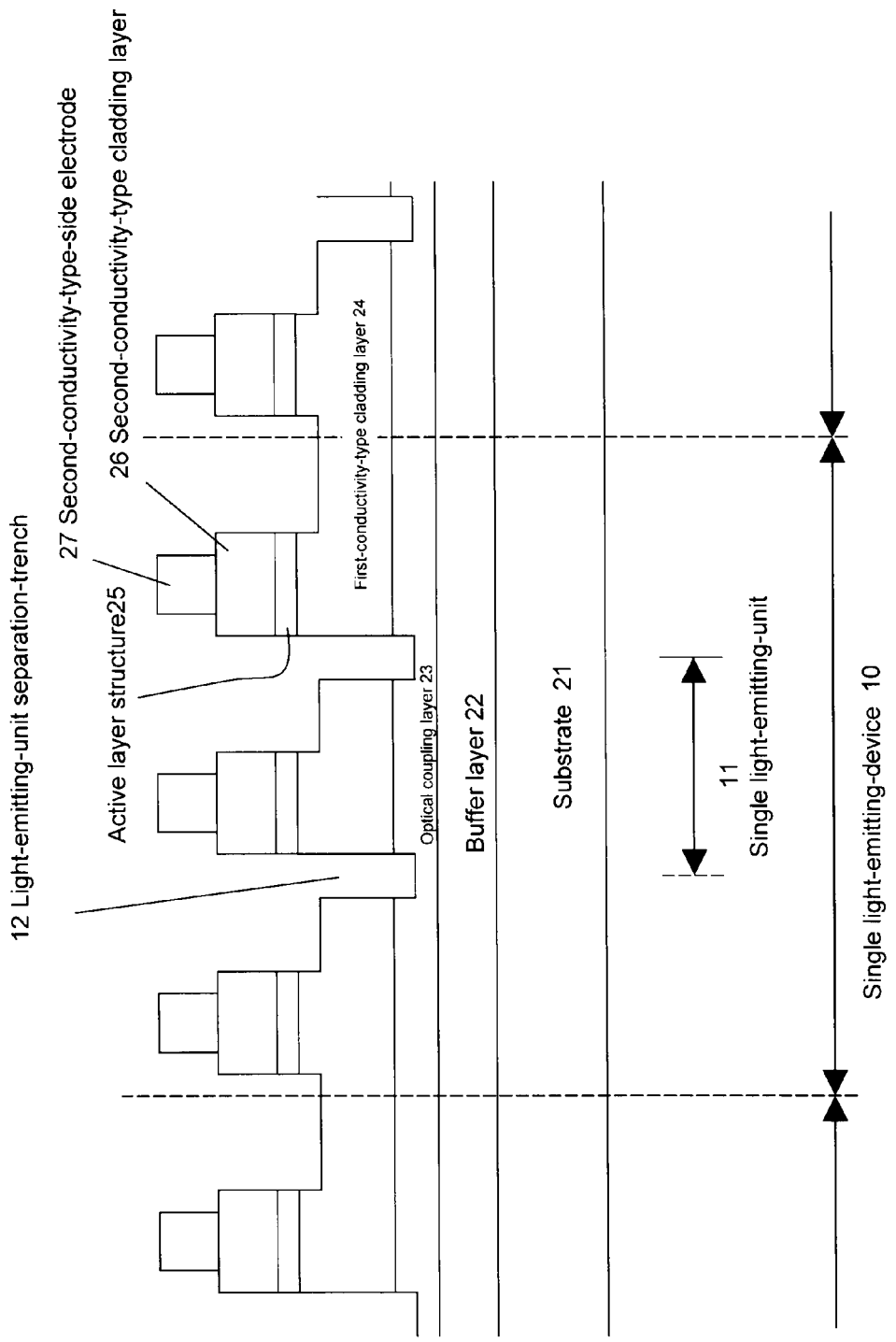

After forming the second-conductivity-type-side electrode 27, a part of the first-conductivity-type cladding layer 24 is exposed as shown in FIG. 3-5. In this step, it is preferable to remove the second-conductivity-type cladding layer 26, the active layer structure 25 and further a part of the first-conductivity-type cladding layer 24 by etching (a first etching step). The first etching step is conducted for the purpose of exposing a semiconductor layer into which a first-conductivity-type-side electrode described later injects first-conductivity-type carriers, and therefore, when a thin-film crystal layer contains another layer, for example, a cladding layer consists of two layers or contains a contact layer, the layer including the additional layer may be etched.

The first etching step does not require very high etching precision and thus can be a known dry etching technique by plasma etching using, for example, $Cl_2$ and using a etching mask of a nitride such as $SiN_x$ or an oxide such as $SiO_x$. It is, however, also preferable that dry etching can be conducted using a metal fluoride mask as detailed in a second etching step and a third etching step described later. It is particularly preferable to conduct etching by plasma excited dry etching using a gas such as $Cl_2$, $SiCl_4$, $BCl_3$ and $SiCl_4$ and using an etching mask containing a metal-fluoride layer selected from the group consisting of $SrF_2$, $AlF_3$, $MgF_2$, $BaF_2$, $CaF_2$ and combinations of these. Furthermore, the optimal dry etching is ICP type dry etching capable of generating high density plasma.

Here, the second-conductivity-type-side electrode 27 receives process history of the formation of a $SiN_x$ mask formed by, for example, plasma CVD or the step of removing the $SiN_x$ mask after the first etching step. However, when a stable metal such as Au is formed over the surface, the second-conductivity-type-side electrode is less process-damaged.

Then, as shown in FIG. 3-6, a light-emitting-unit separation-trench 12 is formed by a second etching step. In the second etching step, the GaN material must be etched to more depth compared with the first etching step. The sum of a layer depth etched by the first etching step is generally about 0.5 μm. Whereas, in the second etching step, the whole first-conductivity-type cladding layer 24 and a part of the optical coupling layer 23 must be etched. Therefore, the depth is generally 1 μm or more, for example, in the range of 1 to 5 μm, or in the range of 3 μm or more, for example 3 to 7 μm. In some cases it is in the range of 3 to 10 μm, or furthermore more than 10 μm.

Generally, a metal mask, a nitride mask such as $SiN_x$ and an oxide mask such as $SiO_x$ have a selectivity ratio to a GaN material, in terms of tolerance to etching by $Cl_2$ plasma, of about 5. In conducting the second etching step where a GaN material with a large film thickness must be etched, a relatively thicker $SiN_x$ film is necessary. For example, etching a GaN material with a thickness of 4 μm by a second dry-etching process requires a $SiN_x$ mask with a thickness of 0.8 μm. However, with a $SiN_x$ mask with such a thickness, the $SiN_x$ mask is also etched during the dry etching, and not only its thickness in a longitudinal direction but also its shape in a horizontal direction are changed, so that a desired GaN material part cannot be selectively etched.

Thus, when forming the light-emitting-unit separation-trench in the second etching step, dry etching using a mask including a metal-fluoride layer is preferred. A material constituting the metal-fluoride layer is preferably $MgF_2$, $CaF_2$, $SrF_2$, $BaF_2$ or $AlF_3$, most preferably $SrF_2$ in the light of balance between dry etching tolerance and wet-etching properties.

A metal fluoride film must be sufficiently tolerant to dry etching in the first, the second etching steps and the third etching steps while being easily etched by etching for patterning (preferably, wet etching) to give a patterning shape with good linearity particularly in the sidewall. Deposition of a metal-fluoride layer at a temperature of 150° C. or higher gives a dense film having good adhesiveness to a base layer, and the film after patterned by etching shows good linearity in a mask sidewall. A deposition temperature is preferably 250° C. or higher, further preferably 300° C. or higher, most preferably 350° C. or higher. Particularly, a metal-fluoride layer deposited at 350° C. or higher exhibits good adhesiveness to any type of base layer and gives a fine film which is highly tolerant to dry etching and exhibits quite higher linearity in its sidewall in terms of a patterning shape, ensuring controllability to a width of the opening, and thus it is the most preferable as an etching mask.

Thus, although deposition at a high temperature is preferable for providing an etching mask exhibiting good adhesiveness to a base layer, giving a fine film, being highly tolerant to dry etching and exhibiting very high linearity in its sidewall and very high controllability of a width of the opening in terms of a patterning shape, a too high deposition temperature gives a film having excessive tolerance to wet etching using, for example, hydrochloric acid preferably used for patterning a metal fluoride, and thus the film cannot be easily removed. Particularly, as described later, when a mask such as $SrF_2$ is exposed to plasma such as chlorine plasma during dry etching of a semiconductor layer, an etching rate in a later process for removing the mask layer tends to be reduced in comparison with that before exposure to plasma such as chlorine plasma. Therefore, deposition of a metal fluoride at an excessively higher temperature is undesirable in the light of its patterning and final removal.

First, in a metal fluoride before being exposed to plasma in dry etching of a semiconductor layer, a layer deposited at a lower temperature has a larger etching rate to an etchant such as hydrochloric acid, resulting in a higher etching rate and a layer deposited at a higher temperature has a smaller etching rate, resulting in a lower etching rate. When deposition temperature becomes 300° C. or higher, the etching rate decreases noticeably in comparison with a film deposited at a temperature of about 250° C., and a temperature of about 350° C. to 450° C. is within a very favorable etching rate range. A deposition temperature of higher than 480° C., however, leads to an excessively smaller absolute etching rate value, so that patterning of the metal fluoride takes a too longer time and patterning may be difficult under the conditions where a resist mask layer and so on are not detached. Furthermore, in a metal fluoride after being exposed to plasma in dry etching of a semiconductor layer, a wet-etching rate by, for example, hydrochloric acid in a removal step tends to decrease and growth at an excessively high temperature makes it difficult to remove the metal fluoride.

From such a viewpoint, a deposition temperature of a metal-fluoride layer is preferably 480° C. or lower, further preferably 470° C. or lower, particularly preferably 460° C. or lower.

Using a mask patterned considering the above (the mask may be a multilayer with $SiN_x$ or $SiO_2$ such that the metal-fluoride layer becomes a surface layer), dry etching is conducted. A gas species for the dry etching may be preferably selected from $Cl_2$, $BCl_3$, $SiCl_4$, $CCl_4$ and combinations of these. In the dry etching, a selectivity ratio of the $SrF_2$ mask to a GaN material is over 100, so that a thick GaN film can be easily and precisely etched. Furthermore, the optimal dry etching technique is ICP type dry etching capable of generating high-density plasma.

After the above etching, when the used unnecessary metal-fluoride layer mask is removed by an etchant such as hydrochloric acid, a multilayer mask with $SiN_x$, $SiO_2$ or the like may be formed such that the metal-fluoride layer becomes a surface layer if a material susceptible to an acid is present under the metal fluoride mask, for example, if an electrode material is susceptible to an acid. In such a case, $SiN_x$ or $SiO_2$ may be present in the whole region under the metal fluoride mask or alternatively, as shown, for example, in FIG. 3-17, a mask 51 such as $SiN_x$ and $SiO_2$ is not necessarily present in the whole region of the metal fluoride mask layer 52 but can be at least formed over a material susceptible to an acid.

By such a second etching step, the light-emitting-unit separation-trench is formed as shown in FIG. 3-6.

Then, as shown in FIG. 3-7, a light-emitting-device separation-trench 13 is formed by a third etching step. In the third etching step, the thickness of the GaN material to be etched is extremely deep compared with even the second etching step because whole buffer layer and the optical coupling layer must be etched, and is sometimes 5 to 10 µm, and in some cases more than 10 µm. Therefore, as explained for the second etching step, dry etching using a mask including a metal-fluoride layer is preferred. The preferred condition and the like (including a stacked layer mask and the like) are as described for the second etching step.

It is necessary that the light-emitting-device separation-trench is formed such that it interrupts at least the first-conductivity-type cladding layer. In a preferred embodiment disclosed in this Section, as shown in FIG. 3-7, the light-emitting-device separation-trench 13 is formed such that it reaches the substrate 21. In this case, the device is easily divided. It is also possible that the light-emitting-device separation-trench is formed by conducting etching into a portion of a substrate.

Alternatively, a configuration where the light-emitting-device separation-trench does not reach the substrate is also preferable. For example, when the light-emitting-device separation-trench is formed to the intermediate portion of the combination of the optical coupling layer and the buffer layer, an insulating layer can be formed on the sidewall of the first-conductivity-type cladding layer, to maintain insulation to a running-around solder (see FIGS. 3-13 to 3-16 for a configuration after completion of the light-emitting-device). In this case, a layer exposed from the sidewall without being covered by the insulating layer is preferably highly insulative. In an embodiment where the light-emitting-device separation-trench is formed to the intermediate portion of the optical coupling layer, the second etching step and the third etching step can be carried out simultaneously, which enables simplifying a manufacturing process.

Regarding the first etching step and the second etching step and the third etching step, any of step can be carried out before or after the other step. It is also preferable for simplifying a process that the first etching step is first conducted and then without removing the etching mask, the second etching step and/or a third etching step is conducted. As shown in FIG. 3-17, first, a first etching mask 51 is formed from a material resistant to an acid such as $SiN_x$ and $SiO_2$ (preferably $SiN_x$) and etching is conducted such that a first-conductivity-type cladding layer 24 appears, and without removing the mask 51, a metal-fluoride layer is formed as a second and/or a third etching mask 52. Then, preferably, after conducting the second etching step and/or the third etching step, the mask 52 is removed by an acid and then the mask 51 is removed as appropriate. The first etching mask 51 may be allowed to present after the completion of the both etching even when the second etching step and the third etching step is carried out separately.

When the narrowest width between the light-emitting-device separation-trenches formed is $2L_{WSPT1}$, $L_{WSPT1}$ is preferably 20 μm or more, for example 30 μm or more for device separation by breaking. For separation by dicing, $L_{WSPT1}$ is preferably 300 μm or more. Since an excessively large width is not correspondingly effective, $L_{WSPT1}$ is generally 2000 μm or less. These are needed for ensuring a margin for a device manufacturing process and a scribe region.

After the third etching step, an insulating layer 30 is formed as shown in FIG. 3-8. The insulating layer may be appropriately made of any material as long as electric insulation can be ensured, as detailed above. Deposition can be conducted by any known method such as plasma CVD.

Next, as shown in FIG. 3-9, a predetermined part in the insulating layer 30 is removed, to form a second-conductivity-type-side electrode exposed part 37 where the insulating layer on the second-conductivity-type-side electrode 27 is removed, a first current injection region 36 where the insulating layer on the first-conductivity-type cladding layer is removed, and a region without an insulating layer 15 where the insulating layer on the substrate and on the sidewall within the light-emitting-device separation-trench 13 is removed. Removal of the insulating layer 30 on the second-conductivity-type-side electrode 27 is preferably conducted such that the periphery of the second-conductivity-type-side electrode is covered by the insulating layer. That is, the surface area of the second-conductivity-type-side electrode exposed part is preferably smaller than the area of the second current injection region. Here, for ensuring a margin for a device manufacturing process, particularly a photolithography step or preventing unintended short circuit from occurring due to a solder material, $L_{2w}$ is preferably 15 μm or more, wherein $L_{2w}$ is the narrowest width in the part where the second-conductivity-type-side electrode is partly covered by the insulating layer. More preferably, it is 30 μm or more, and most preferably, it is 100 μm or more. In particular, covering the wide area of the second-conductivity-type-side electrode by the insulating layer allows for reducing unintended short circuit due to a metal solder material, with an another part such as the first-conductivity-type-side electrode. In addition, $L_{2w}$ is generally 2000 μm or less, and preferably 750 μm or less.

For removing the insulating layer, an etching procedure such as dry etching and wet etching may be selected, depending on a material selected. For example, when the insulating layer is a single layer of $SiN_x$, dry etching using a gas such as $SF_6$ or wet etching using a hydrofluoric acid etchant can be employed. When the insulating layer is a dielectric multilayer film made of $SiO_x$ and $TiO_x$, the multilayer film in a desired part can be removed by Ar-ion milling.

The second-conductivity-type-side electrode exposed part 37, the first current injection region 36 and the region without an insulating layer 15 can be separately formed. But they are, in general, simultaneously formed by etching.

In order to form the part without an insulating layer 15 by etching a portion of the insulating layer on the sidewall in the light-emitting-device separation-trench, the following process may be used as a formation process. First, a resist mask having an opening whose area is equal to or slightly smaller than the area of the light-emitting-device separation-trench 13 is formed by photolithography, and then, wet etching is conducted using an etchant capable of etching an insulating layer, to initiate removal of the insulating layer on the substrate surface within the light-emitting-device separation-trench. If the etching is further continued, side etching proceeds to remove the insulating layer covering the substrate side of the trench sidewall by the wet etchant and thus to give a shape as shown in FIG. 3-9 wherein an insulating layer of the sidewall is not present in the portion of the substrate side. In the case that the insulating layer is removed as this case, the exposed sidewall without an insulating layer is preferably sidewall of undoped layer. This is because it prevents unintended electric short circuit from occurring even if a solder for bonding to a support attaches to the sidewall during flip-chip mounting. The shape of the removed insulating layer of this type is advantageous for the process particularly when the substrate is removed in the manufacturing process for a light-emitting-device, because unintended defects such as detachment of an insulating layer with the substrate is prevented.

In addition, when the light-emitting-device separation-trench is formed to the intermediate portion of the combination of the optical coupling layer and the buffer layer, in the configuration that there is a part which is not covered by an insulating layer in the main light-extraction direction side of the sidewall inside of the edge of the light-emitting-device (the sidewall of the light-emitting-device separation-trench) (for example, in the case to form the structures of FIGS. 3-14 and 3-16), the same above process can be employed, except the insulating film is deposited not on the substrate surface but on the trench bottom surface in the above process. In forming the configuration that the insulating layer covers a part of the trench bottom surface and the sidewall of the separating trench (for example, in the case to form the structures of FIGS. 3-13 and 3-15), a scribe region is formed by removing a part of insulating layer on the trench bottom surface by providing an appropriate etching mask shape using photolithography suitable for a predetermined shape and not performing the side etching in the above process.

Then, a first-conductivity-type-side electrode 28 is formed as shown in FIG. 3-10. An electrode material preferably comprises, as described above, a material selected from Ti, Al, Ag and Mo or all of them as a constituent device when the first-conductivity-type is n-type. Generally, Al is exposed in a direction opposite to a main light-extraction direction of the n-side electrode.

For a film formation of the electrode material, there is used a variety of deposition processes such as sputtering and vacuum evaporation, and a desired electrode shape can be obtained by appropriately applying, for example, a lift-off process using photolithography technique or site-selective evaporation using, for example, a metal mask. Considering a process margin to some extent, when $L_{1w}$ is the narrowest width in the part of the first-conductivity-type-side electrode in contact with the insulating layer, $L_{1w}$ is preferably 7 μm or more, particularly preferably 9 μm or more. Furthermore, $L_{1w}$ is generally 500 μm or less, preferably 100 μm or less. In general, when it is 5 μm or more, a process margin by a photolithography process and a liftoff procedure can be ensured.

The first-conductivity-type-side electrode is formed in this example such that a part thereof contacts with the first-conductivity-type cladding layer, but can be formed to contact with, in case formed, a first-conductivity-type-side contact layer.

In a manufacturing process of the present invention, the first-conductivity-type-side electrode is formed in the final step of forming a stacked structure, which is advantageous in the light of reducing process damage. When the first-conductivity-type is n-type, Al is formed on the surface of the electrode material of the n-side electrode in a preferred embodiment. Here, if the n-side electrode is formed before formation of an insulating layer as the second-conductivity-type-side electrode, the n-side electrode surface, that is, Al metal receives a history of the etching process of the insulating layer. Etching of the insulating layer is conveniently conducted by wet etching using a hydrofluoric acid etchant as described above, but Al is less tolerant to various etchants including hydrofluoric acid, so that when effectively conducting such a process, the electrode itself is damaged. Furthermore, even if dry etching is employed, Al is relatively reactive, so that damages including oxidation may be introduced. Therefore, in the present invention, it is effective in reducing damage to the electrode that the first-conductivity-type-side electrode is formed after forming the insulating layer and after removing a predetermined unnecessary part in the insulating layer.

Thus, after forming the structure of FIG. 3-10 (FIG. 3-2), there is carried out a preparation for substrate removal. Generally, the structure shown in FIG. 3-10 is first bonded to the support 40 as the whole or a part of the wafer. This is because since even the thin-film crystal layers as a whole has at most a thickness of about 15 µm, once the substrate is removed mechanical strength is insufficient, resulting that it cannot tolerate the later processes by itself. A material for the support is as described above. The structure is mounted on a metal layer 41 (for example, an electrode interconnection) on a support 40, for example, via connection with a metal solder 42.

Here, in the light-emitting-device of the present invention, the second-conductivity-type-side electrode 27 and the first-conductivity-type-side electrode 28 are disposed such that they are not spatially overlapped at all and the first-conductivity-type-side electrode is larger than the first current injection region and preferably has an adequate area to ensure both prevention of unintended short circuit and improved heat dissipating properties. Furthermore, since the sidewalls of the other thin-film crystal layers are covered by an insulating film except a part of the buffer layer, particularly the undoped part, running out of a solder does not cause a problem such as short circuit in an active layer structure sidewall within the thin-film crystal layer.

Subsequently, the device is bonded to the support and then the substrate is removed. Removal of the substrate can be conducted by any method such as polishing, etching and laser debonding. When polishing a sapphire substrate, the substrate can be removed using a polishing material such as diamond. A substrate can be removed by dry etching. Furthermore, for example, when the substrate is sapphire and a thin-film crystal growth part is made of an InAlGaN material, laser debonding can be employed by using an excimer laser from the sapphire substrate side at oscillation wave length of 248 nm which penetrates the sapphire substrate and is absorbed by, for example, GaN used for a buffer layer, to decompose GaN in a part of the buffer layer into metal Ga and nitrogen and delaminate the substrate.

When using ZnO, ScAlMgO$_4$ or the like as a substrate, an etchant such as HCl can be used in wet etching to remove the substrate.

Since the substrate is not in contact with the insulating layer at all in the invention disclosed in this Section, removal of the substrate does not secondarily cause a problem such as detachment of the insulating layer.

Then, in a separation region corresponding to the area where the light-emitting-device separation-trench is present, the light-emitting-device is separated together with the support to provide a single light-emitting-device. Here, it is preferable that a metal interconnection is not present in the separation region of the support. This is because a metal interconnection in the region makes inter-device separation difficult. In an integrated compound semiconductor light-emitting-device of the invention disclosed in this Section, the light-emitting-units in a single light-emitting-device can be connected in parallel, in series or in combination of these by varying metal wiring on the support.

Cutting of the separation region in the support can be conducted by an appropriate process such as dicing, scribing and breaking depending on a base material. When the light-emitting-device separation-trench is formed to the intermediate portion of the combination of the optical coupling layer and the buffer layer (for example, in the configuration where the trench is formed to the intermediate portion of the optical coupling layer as similar depth of the light-emitting-unit separation-trench), scratching by diamond scribing or partial ablation of the optical coupling layer and/or the buffer layer by laser scribing can be conducted using the light-emitting-device separation-trench to easily separate between light-emitting-devices in the thin-film crystal growth layer. Then, the support can be separated into individual light-emitting-devices by dicing. Optionally, separation between light-emitting-devices can be conducted by simultaneous separation of the thin-film crystal growth layer and the support by dicing.

As described above, there is manufactured the integrated compound semiconductor light-emitting-device as shown in FIG. 3-1.

According to the manufacturing process of the invention disclosed in this Section, in addition to capability of manufacturing the advantageous structure having an optical coupling layer effectively, it is preferable as described above to conduct formation of the thin-film crystal layer, formation of the second-conductivity-type-side electrode, the etching steps (the first etching step, the second etching step and the third etching step), formation of the insulating layer, removal of the insulating layer (formation of the second-conductivity-type-side electrode exposed part, formation of the first current injection region and removal of the insulating layer near the light-emitting-device separation-trench) and formation of the first-conductivity-type-side electrode, in this sequence. Such a process sequence allows for providing a light-emitting-device without damage in the thin-film crystal layer immediately below the second-conductivity-type-side electrode or damage in the first-conductivity-type-side electrode. Furthermore, the device shape reflects the process flow. In other words, this light-emitting-device internally has a structure where there are deposited the second-conductivity-type-side electrode, the insulating layer and the first-conductivity-type-side electrode in this sequence. That is, the second-conductivity-type-side electrode is in contact with the second-conductivity-type cladding layer (or another second-conductivity-type thin-film crystal layer) without an intervening insulating layer; there is a part of the upper periphery of the second-conductivity-type-side electrode which is covered by an insulating layer; and there is an area where an electrode periphery is intervened by an insulating layer between the first-conductivity-type-side electrode and the first-conductivity-type-side cladding layer (or another first-conductivity-type thin-film crystal layer).

<<Section D>>

The invention disclosed in Section D relates to the followings.

[1] An integrated compound semiconductor light-emitting-device, comprising a plurality of light-emitting-units formed, wherein the light-emitting-unit comprises a compound semiconductor thin-film crystal layer having a first-conductivity-type semiconductor layer containing a first-conductivity-type cladding layer, an active layer structure and a second-conductivity-type semiconductor layer containing a second-conductivity-type cladding layer; a second-conductivity-type-side electrode; and a first-conductivity-type-side electrode;

a main light-extraction direction is the side of the first-conductivity-type semiconductor layer in relation to the active layer structure, and the first-conductivity-type-side electrode and the second-conductivity-type-side electrode are formed on the opposite side to the main light-extraction direction;

the light-emitting-units are electrically separated each other by a light-emitting-unit separation-trench formed between adjacent light-emitting-units;

the light-emitting-unit comprises a plurality of light-emitting-point comprising the active layer structure, the second-conductivity-type semiconductor layer and the second-conductivity-type-side electrode; and at least one first-conductivity-type-side electrode; wherein the first-conductivity-type semiconductor layer provides electrical connection in the single light-emitting-unit; and the light-emitting-device comprises:
an optical coupling layer formed at the main light-extraction direction side of the first-conductivity-type semiconductor layer; the optical coupling layer being common to the plurality of light-emitting-units, and capable of optical coupling of the plurality of light-emitting-units and distributing a light emitted from one light-emitting-unit to the other light-emitting-units; and
a buffer layer formed at the main light-extraction direction side of the optical coupling layer.

[2] The light-emitting-device as described in [1], wherein the optical coupling layer is a layer formed as a part of the thin-film crystal layer so as to be common to the plurality of light-emitting-units.

[3] The light-emitting-device as described in [1] or [2], wherein when an average refractive index of the optical coupling layer is $n_{oc}$ and an average refractive index of the first-conductivity-type semiconductor layer is $n_1$, the relation:

$$n_1 < n_{oc}$$

is satisfied.

[4] The light-emitting-device as described in any of [1] to [3], wherein when an average refractive index of the optical coupling layer is $n_{oc}$ and an average refractive index of the buffer layer is $n_{bf}$, the relation:

$$n_{bf} \leq n_{oc}$$

is satisfied.

[5] The light-emitting-device as described in any of [1] to [4], wherein when an emission wavelength of the light-emitting-device is λ (nm), an average refractive index of the optical coupling layer is $n_{oc}$ and an average refractive index of the first-conductivity-type semiconductor layer is $n_1$, each at an emission wavelength, and a physical thickness of the optical coupling layer is $t_{oc}$ (nm) and a relative refractive index difference $\Delta_{(oc-1)}$ between the optical coupling layer and the first-conductivity-type semiconductor layer is defined as $$\Delta_{(oc-1)} \equiv ((n_{oc})^2 - (n_1)^2)/(2 \times (n_{oc})^2),$$

$t_{oc}$ is selected such that the relation:

$$(\sqrt{(2 \times \Delta_{(oc-1)})} \times n_{oc} \times \pi \times t_{oc})/\lambda \geq \pi/2$$

is satisfied.

[6] The light-emitting-device as described in [5], wherein $t_{oc}$ is selected such that the relation:

$$(\sqrt{(2 \times \Delta_{(oc-1)})} \times n_{oc} \times \pi \times t_{oc})/\lambda \geq 2 \times \pi$$

is further satisfied.

[7] The light-emitting-device as described in any of [1] to [6], wherein an overall specific resistance of the optical coupling layer $\rho_{oc}(\Omega \cdot cm)$ satisfies the relation:

$$0.5 \leq \rho_{oc}.$$

[8] The light-emitting-device as described in any of [1] to [7], wherein the optical coupling layer has a stacked structure consisting of multiple layers.

[9] The light-emitting-device as described in any of [1] to [8], wherein the plurality of light-emitting-units are formed by forming the light-emitting-unit separation-trench by removing the thin-film crystal layer from the surface to the boundary of the optical coupling layer or to an inside portion of the optical coupling layer between the adjacent light-emitting-units.

[10] The light-emitting-device as described in any of [1] to [9], wherein the width of the light-emitting-unit separation-trench is 2 to 300 μm.

[11] The light-emitting-device as described in any of [1] to [10], wherein the light-emitting-device has been divided from a light-emitting-device separation-trench formed between a plurality of light-emitting-devices; the light-emitting-device separation-trench being formed to the intermediate portion of the optical coupling layer.

[12] The light-emitting-device as described in [10], wherein the light-emitting-device has been divided from a light-emitting-device separation-trench formed between a plurality of light-emitting-devices; the light-emitting-device separation-trench being formed to the intermediate portion of the buffer layer.

[13] The light-emitting-device as described in [10], wherein the light-emitting-device has been divided from a light-emitting-device separation-trench formed between a plurality of light-emitting-devices; the light-emitting-device separation-trench being formed by removing the buffer layer.

[14] The light-emitting-device as described in any of [1] to [13], comprising an insulating layer which is:
covering a bottom surface and a sidewall in the light-emitting-unit separation-trench,
covering at least a sidewall surface of the first-conductivity-type semiconductor layer, the active layer structure and the second-conductivity-type semiconductor layer among layers exposed as sidewall surface of the light-emitting-device,
in contact with a part of the first-conductivity-type-side electrode at the side of the main light-extraction direction, and
covering a part of the second-conductivity-type-side electrode on the side opposite to the main light-extraction direction.

[15] The light-emitting-device as described in [14], wherein a region without an insulating layer is present on a side surface of the light-emitting-device, and the insulating layer covers at least the sidewall surface of the first-conductivity-type semiconductor layer, the active layer structure and the second-conductivity-type semiconductor layer.

[16] The light-emitting-device as described in any of [1] to [15], wherein the thin-film crystal layer is made of a Group III-V compound semiconductor containing nitrogen as a Group V atom.

[17] The light-emitting-device as described in any of [1] to [16], wherein the active layer structure consists of quantum well layer and barrier layer and when B is the number of the barrier layer and W is the number of the quantum well layer, B and W satisfy the relation:

$$B = W + 1.$$

[18] The light-emitting-device as described in [14] or [15], wherein the insulating layer is a dielectric multilayer film consisting of multiple layers.

[19] The light-emitting-device as described in any of [14] to [18], wherein when R2 is a reflectance of reflection by the optical coupling layer, of a light having an emission wavelength of the light-emitting-device vertically incoming from the first-conductivity-type semiconductor layer side to the optical coupling layer, R12 is a reflectance of reflection by the insulating layer, of a light having an emission wavelength of the light-emitting-device vertically incoming from the second-conductivity-type semiconductor layer side to the insulating layer, R11 is a reflectance of reflection by the insulating layer, of a light having an emission wavelength of the light-emitting-device vertically incoming from the first-conductivity-type semiconductor layer side to the insulating layer and R1q is a reflectance of reflection by the insulating layer, of a light having an emission wavelength of the light-emitting-device vertically incoming from the active layer structure side to the insulating layer, the insulating layer is configured such that all of the conditions:

$$R2<R12 \quad \text{(Relation 1)}$$

$$R2<R11 \quad \text{(Relation 2)}$$

$$R2<R1q \quad \text{(Relation 3)}$$

are satisfied.

[20] The light-emitting-device as described in any of [1] to [19], wherein the surface of the main light-extraction side of the buffer layer is not flat.

[21] The light-emitting-device as described in any of [1] to [20], wherein when R3 is a reflectance of reflection by the buffer layer, of a light having an emission wavelength of the light-emitting-device vertically incoming from the optical coupling layer to the buffer layer side and R4 is a reflectance of reflection by an interface with a space, of a light having an emission wavelength of the light-emitting-device vertically incoming from the buffer layer to the space of the light-extraction side, a low-reflecting optical film is formed in the light-extraction side of the buffer layer such that the relation:

$$R4<R3$$

is satisfied.

[22] The light-emitting-device as described in any of [1] to [21], wherein the first-conductivity-type is n-type and the second-conductivity-type is p-type.

[23] The light-emitting-device as described in any of [1] to [22], wherein the first-conductivity-type-side electrode and the second-conductivity-type-side electrode are bonded to a support having a metal layer via a solder.

[24] The light-emitting-device as described in [23], wherein bonding between each of the first-conductivity-type-side electrode and the second-conductivity-type-side electrode and the metal layer on the support is formed by a metal solder alone, or a metal solder and a metal bump.

[25] The light-emitting-device as described in [23] or [24], wherein the base material of the support is selected from the group consisting of AlN, $Al_2O_3$, Si, glass, SiC, diamond, BN and CuW.

[26] The light-emitting-device as described in any of [23] to [25], wherein the metal layer is not formed in a device-separating region in the support.

[27] A process for manufacturing an integrated compound semiconductor light-emitting-device having a plurality of light-emitting-units on a support, the process comprising:

a step of depositing a buffer layer and an optical coupling layer on a substrate in this sequence;

a step of depositing a thin-film crystal layer having at least a first-conductivity-type semiconductor layer containing a first-conductivity-type cladding layer, an active layer structure and a second-conductivity-type semiconductor layer containing a second-conductivity-type cladding layer;

a step of forming a second-conductivity-type-side electrode on the surface of the second-conductivity-type semiconductor layer;

a first etching step of exposing a part of the first-conductivity-type semiconductor layer, and dividing the active layer structure and the second-conductivity-type semiconductor layer into a plurality of regions, for the formation of the plurality of light-emitting-point which comprises the active layer structure, the second-conductivity-type semiconductor layer and the second-conductivity-type-side electrode;

a step of forming at least a first-conductivity-type-side electrode on the surface of the first-conductivity-type semiconductor layer exposed by the first etching step;

a second etching step of removing the thin-film crystal layer from the surface to the boundary of the optical coupling layer or from the surface to an inside portion of the optical coupling layer for forming a light-emitting-unit separation-trench to separate electrically the light-emitting-unit each other;

a third etching step of removing at least the first-conductivity-type semiconductor layer, the active layer structure and the second-conductivity-type semiconductor layer for forming a light-emitting-device separation-trench to separate into a plurality of light-emitting-devices; and a step of removing the substrate.

[28] The process as described in [27], comprising, after the step of removing the substrate, a step of mounting on the support by bonding the first-conductivity-type-side electrode and the second-conductivity-type-side electrode to a metal layer on the support.

[29] The process as described in [28], comprising, after the step of removing the substrate, a step of separating into a plurality of light-emitting-devices.

[30] The process as described in any of [27] to [29], wherein the optical coupling layer is formed as a part of the thin-film crystal layer before forming the first-conductivity-type semiconductor layer.

[31] The process as described in any of [27] to [30], wherein when an average refractive index of the optical coupling layer is $n_{oc}$ and an average refractive index of the first-conductivity-type semiconductor layer is $n_1$, the relation:

$$n_1<n_{oc}$$

is satisfied.

[32] The process as described in any of [27] to [31], wherein when an average refractive index of the optical coupling layer is $n_{oc}$ and an average refractive index of the buffer layer is $n_{bf}$, the relation:

$$n_{bf} \leq n_{oc}$$

is satisfied.

[33] The process as described in any of [27] to [32], wherein when an emission wavelength of the light-emitting-device is λ (nm), an average refractive index of the optical coupling layer at an emission wavelength is $n_{oc}$, an average refractive index of the first-conductivity-type semiconductor layer at an emission wavelength is $n_1$ and a physical thickness of the optical coupling layer is $t_{oc}$ (nm) and a relative refractive index difference $\Delta_{(oc-1)}$ between the optical coupling layer and the first-conductivity-type semiconductor layer is defined as $$\Delta_{(oc-1)}=((n_{oc})^2-(n_1)^2)/(2\times(n_{oc})^2),$$

$t_{oc}$ is selected such that the relation:

$$(\sqrt{(2\times\Delta_{(oc-1)})}\times n_{oc}\times\pi\times t_{oc})/\lambda\geq\pi/2$$

is satisfied.

[34] The process as described in [33], wherein $t_{oc}$ is selected such that the relation:

$$(\sqrt{(2\times\Delta_{(oc-1)})}\times n_{oc}\times\pi\times t_{oc})/\lambda\geq 2\times\pi$$

is further satisfied.

[35] The process as described in any of [27] to [34], wherein an overall specific resistance of the optical coupling layer $\rho_{oc}(\Omega\cdot cm)$ satisfies the relation:

$$0.5\leq\rho_{oc}.$$

[36] The process as described in any of [27] to [35], wherein the optical coupling layer is formed as a stacked structure consisting of multiple layers.

[37] The process as described in any of [27] to [36], wherein the third etching step is performed simultaneously or separately with the second etching step and is performed to remove the thin-film crystal layer from the surface to the boundary of the optical coupling layer or from the surface to an inside portion of the optical coupling layer.

[38] The process as described in any of [27] to [36], wherein the third etching step is performed to remove the thin-film crystal layer from the surface to an inside portion of the buffer layer.

[39] The process as described in any of [27] to [36], wherein the third etching step is performed so as to at least reach the substrate surface.

[40] The process as described in any of [27] to [39], wherein the second etching step and the third etching step are performed by dry etching process using gas selected from the group consisting of $Cl_2$, $BCl_3$, $SiCl_4$, $CCl_4$ and combination of two or more of these.

[41] The process as described in [40], wherein a patterned metal-fluoride layer is used as an etching mask.

[42] The process as described in [41], wherein the metal-fluoride layer is selected from the group consisting of $SrF_2$, $AlF_3$, $MgF_2$, $BaF_2$, $CaF_2$ and combination of two or more of these.

[43] The process as described in any of [27] to [42], wherein the step of forming a second-conductivity-type-side electrode, the first etching step and the step of forming a first-conductivity-type-side electrode are carried out in this order, and
wherein, the process further comprises a step of forming a insulating layer before the step of forming a first-conductivity-type-side electrode.

[44] The process as described in [43], wherein the step of forming a insulating layer is carried out after the first to third etching steps.

[45] The process as described in any of [27] to [36], wherein
the step of forming a second-conductivity-type-side electrode, the first etching step and the step of forming a first-conductivity-type-side electrode are carried out in this order, and
the third etching step is performed to the depth, from the surface, until removing a portion of the optical coupling layer or until removing a portion of the buffer layer, whereby forming the light-emitting-device separation-trench, and wherein, the process further comprises:
a step of forming a insulating layer after the first to third etching steps and before the step of forming a first-conductivity-type-side electrode; and
a step of forming a scribe region by removing a portion of the insulating layer deposited on the trench bottom surface in the light-emitting-device separation-trench.

[46] The process as described in any of [27] to [36], wherein
the step of forming a second-conductivity-type-side electrode, the first etching step and the step of forming a first-conductivity-type-side electrode are carried out in this order, and
the third etching step is performed to the depth, from the surface, until removing a portion of the optical coupling layer, until removing a portion of the buffer layer, or until reaching the substrate, whereby forming the light-emitting-device separation-trench, and
wherein, the process further comprises:
a step of forming a insulating layer after the first to third etching steps and before the step of forming a first-conductivity-type-side electrode; and
a step of removing whole of the insulating layer deposited on the trench bottom surface in the light-emitting-device separation-trench and a portion of the insulating layer formed on the sidewall of the light-emitting-device separation-trench near the trench bottom.

[47] The process as described in [45], wherein the second etching step and the third etching step are performed simultaneously and are performed to the depth, from the surface, until reaching the boundary of the optical coupling layer or until removing a portion of the optical coupling layer, whereby forming the light-emitting-device separation-trench.

[48] The process as described in [46], wherein the second etching step and the third etching step are performed simultaneously and are performed to the depth, from the surface, until reaching the boundary of the optical coupling layer or until removing a portion of the optical coupling layer, whereby forming the light-emitting-device separation-trench.

[49] The process as described in any of [27] to [48], wherein the step of removing the substrate is performed by irradiating a light which penetrates the substrate and is absorbed by the buffer layer, from the substrate side to decompose a part of the buffer layer and effect delamination at the boundary between the substrate and the buffer layer.

[50] The process as described in [28], wherein the bonding of the first-conductivity-type-side electrode and the second-conductivity-type-side electrode to the metal layer on the support is performed via a solder.

[51] The process as described in [28] or [50], wherein the base material of the support is selected from the group consisting of metal, AlN, $Al_2O_3$, Si, glass, SiC, diamond, BN and CuW.

[52] The process as described in any of [27] to [51], wherein the substrate is selected from the group consisting of sapphire, SiC, GaN, $LiGaO_2$, ZnO, $ScAlMgO_4$, $NdGaO_3$ and MgO.

According to the invention disclosed in this Section, there can be provided an integrated compound semiconductor light-emitting-device capable of emitting light as a large-area plane light source, exhibiting excellent in-plane uniformity in emission intensity. Furthermore, there can be provided a device wherein even when deterioration in an emission intensity varies from one light-emitting-unit to the other to some extent, higher in-plane uniformity can be ensured and maintained.

In particular, blue or ultraviolet plane-like emission with relatively higher uniformity in emission intensity can be realized even when an area of a light-emitting-device is more than several cm$^2$. Furthermore, the present invention also relates to a flip-chip type light-emitting-device where light is extracted from the substrate side and both p- and n-side electrodes are disposed on the opposite side to the light-extraction side, whereby adequate heat dissipation and a higher light-extraction efficiency can be ensured because an element can be mounted by fusion-bonding a p-side and an n-side electrodes on a highly heat-dissipative submount having a meal interconnection using a solder without using a metal wire for current introduction.

In the invention disclosed in this Section, light-emitting-units are electrically separated each other while being optically combined via an optical coupling layer, so that a light emitted from a quantum well layer in one light-emitting-unit is distributed in the other light-emitting-unit. Thus, in the light-emitting-device according to the present invention, light is emitted from the area between light-emitting-units where a luminance is reduced in a conventional configuration, so that surface emission with relatively higher uniformity can be achieved. Furthermore, even when an emission intensity varies or deterioration in an emission intensity varies to some extent between light-emitting-units, higher in-plane uniformity in emission intensity is ensured because of the presence of the optical coupling layer. Furthermore, even if one light-emitting-unit does not emit light due to some defect, emission intensity is ensured to some extent directly over the defective light-emitting-unit, resulting in good surface uniformity.

In addition, since there is no substrate in the direction of the main light-extraction side in the invention disclosed in this Section, there can be provided advantages simultaneously as follows. For example, in the case of light emitting device formed of any of GaN materials, InGaN materials, AlGaN materials, InAlGaN materials, InAlGaBN materials and the like formed by a general MOCVD on C+ plane sapphire substrate, the side to the sapphire substrate is N-plane and the side to growth direction is Ga plane in these material, generally. Here, since the Ga-plane is not easily chemically etched and the formation of rough surface for improving light-extraction efficiency is not easy. Whereas, N-plane is relatively easily chemically etched and the formation of rough surface is possible. Contrary to this, if a substrate exist, typically such as a sapphire substrate, chemical etching is almost impossible. In the invention disclosed in this Section, the formation of the rough surface is easily performed by removing the substrate, followed by chemical etching of the exposed N-plane; and therefore improving the light emission efficiency of the light emitting device is easily attained.

The light-emitting-device according to the invention disclosed in this Section, the characteristic feature resides in that it is not only the integration of the light-emitting-points electrically connected mutually, but also it comprises light-emitting-units electrically separated mutually each of which includes an appropriate number of light-emitting-points. That is, if the light-emitting-device as a whole is constructed from light-emitting-points electrically connected mutually only, the degradation in a single light-emitting-points leads the change in current injection rout in the entirety of the light-emitting-device and affects the uniformity of light intensity in the entirety of the light-emitting-device. However, if an appropriate number of light-emitting-points are contained in each light-emitting-unit, the electrical influence of the degradation in light-emitting-point is limited within the light-emitting-unit only. In addition, since the light-emitting-units are mutually optically connected as described above, the degradation in a single light-emitting-point, i.e. the degradation in a light-emitting-unit containing the degraded light-emitting-point, tends to be advantageously compensated optically by the neighboring light-emitting-units.

Description of Embodiments of the Invention in Section D

Hereinafter, the present invention of this Section will be explained in more details.

FIG. 4-1 shows an example of an integrated compound semiconductor light-emitting-device (hereinafter, simply referred to as a "light-emitting-device") of the invention disclosed in this Section. Furthermore, the structure of the light-emitting-device in FIG. 4-1 will be detailed with reference to FIG. 4-2 showing a shape in the course of the manufacturing. There is shown an example where one light-emitting-unit 11 contains three light-emitting-points 17 and one light-emitting-device 10 is constituted from four light-emitting-units 11 as shown in FIGS. 4-1 and 4-2. However, there are no particular restrictions to the number of integration of the light-emitting-points contained in a single light-emitting-unit and the number of integration of the light-emitting-units and these numbers can be appropriately varied in one substrate provided. For example, the number of integration of light-emitting-units may be two, or alternatively more than 500 units may be integrated. Here, preferably the number is 25 to 200 units. In addition, two-dimensional arrangement may be also preferred. With respect to the number of integration of the light-emitting-points contained in the light-emitting-unit, it may be two, or alternatively more than 500 points may be integrated. Here, the number is preferably 5 to 100 and is more preferably 10 to 50. In addition, two-dimensional arrangement may be also preferred.

In the invention disclosed in this Section, one light-emitting-unit has, as shown in the figure, at least, a compound semiconductor thin-film crystal layer containing a first-conductivity-type semiconductor layer including a first-conductivity-type cladding layer 24, a second-conductivity-type semiconductor layer including a second-conductivity-type cladding layer 26 and an active layer structure 25 sandwiched between the first and the second-conductivity-type semiconductor layers; a second-conductivity-type-side electrode 27; and a first-conductivity-type-side electrode 28. As shown in the figure, a light-emitting-unit separation-trench 12 defines the light-emitting-unit 11 within the integrated compound semiconductor light-emitting-device 10, while the optical coupling layer 23 is common to the light-emitting-units. Furthermore, a buffer layer 22, which is initially formed on the substrate 21, is also common to the light-emitting-units.

In this example, on a part of the second-conductivity-type cladding layer 26, the second-conductivity-type-side electrode 27 is disposed and the part where the second-conductivity-type cladding layer 26 and the second-conductivity-type-side electrode 27 are in contact with each other is a second current injection region 35. In this configuration, parts of the second-conductivity-type cladding layer and the active layer structure, and a part of the first-conductivity-type cladding layer are removed. The first-conductivity-type-side electrode 28 is disposed in contact with the first-conductivity-type cladding layer 24 exposed in the removed part, so that the second-conductivity-type-side electrode 27 and the first-conductivity-type-side electrode 28 are disposed on the same side in relation to the substrate. Here, in the invention disclosed in this Section, the active layer structure 25 and the second-conductivity-type semiconductor layer (including a second-conductivity-type cladding layer 26) are divided and constitute light-emitting-points 17, each of which is independently capable of emitting light, while first-conductivity-type semiconductor layer is present in common in a light-emitting-unit. One second-conductivity-type-side electrode 27 is formed on each light-emitting-point 17. While it is enough if one first-conductivity-type-side electrode 28 is present in one light-emitting-unit, it may be formed corresponding to the number of the light-emitting-points. The number of first-conductivity-type-side electrode 28 may exceed the number of light-emitting-points in one light-emitting-unit. In the present invention, however, in the case that the second-conductivity-type-side electrode is p-type side electrode in a preferred embodiment, the number or area of the second-conductivity-type-side electrode is preferably more or larger than the number or area of the first-conductivity-type-side electrode, respectively. This is because a part which substantially contributes light emission is quantum well layer(s) in the active layer structure just under (or upper, depending on how to see it) the second-conductivity-type-side electrode. Therefore, in one light-emitting-unit, the number or area of the second-conductivity-type-side electrode is preferably relatively more or larger than the number or area of the first-conductivity-type-side electrode. Further, in terms of current injection regions described later, the number or area of the second current injection region is preferably more or larger than the number or area of the first current injection region. Most preferably, both of the above relation regarding the electrodes and the above relation regarding the current injection regions are satisfied.

In the invention disclosed in this Section, light-emitting-points 17 are mutually electrically connected with first-conductivity-type semiconductor layer within a light-emitting-unit 11, and the light-emitting-units 11 are electrically separated each other by a light-emitting-unit separation-trench 12. That is, the light-emitting-unit separation-trench 12 divides highly conductive layers in the thin-film crystal layer, and thus there are substantially no electric connection between light-emitting-units.

On the other hand, in the present invention, the optical coupling layer 23 is commonly present between the light-emitting-units, which creates the state that the light-emitting-units are optically connected. In other words, a light emitted from one light-emitting-unit reaches the other units through moderate diffusion and radiation (leak) in the optical coupling layer and also reaches the other light-emitting-units without being localized in one light-emitting-unit. Thus, it is necessary that the light-emitting-unit separation-trench 12 reaches the interface of the optical coupling layer or, as shown in FIG. 4-1, reaches the intermediate portion of the optical coupling layer on the condition that the layer is not divided. Although details will be described later, the optical coupling layer is substantially insulative and made of a material having a relatively higher refractive index for achieving appropriate waveguide function within the layer.

In the invention disclosed in this Section, a width of the light-emitting-unit separation-trench is preferably 2 to 300 μm, more preferably 5 to 50 μm, most preferably 8 to 15 μm. A smaller width of the light-emitting-unit separation-trench, together with the optical coupling layer, improves uniformity in surface emission.

FIG. 4-2 shows a part of the other light-emitting-device adjacent to the central light-emitting-device 10. In the manufacturing process, as shown here, the individual light-emitting-devices 10 are formed by being separated by a light-emitting-device separation-trench 13 on the same substrate 21. The completed light-emitting-device as shown in FIG. 4-1 corresponds to the structure where one of the light-emitting-devices 10 shown in FIG. 4-2 is bonded by connected a second-conductivity-type-side electrode 27 and a first-conductivity-type-side electrode 28 via a metal solder 42 to the metal surface 41 on the support 40. An example of the manufacturing process will be described later.

In the example shown in FIG. 4-2, the light-emitting-device separation-trench is formed by removing the thin-film crystal layer so as to reach the substrate, which is one of preferable embodiments. Alternatively, an embodiment where the light-emitting-device separation-trench is formed to the intermediate portion of the combined layer of the optical coupling layer and the buffer layer is preferable. In any of these, an insulating layer can be easily formed on the sidewall of a highly conductive layer near the active layer structure side in relation to the optical coupling layer.

In the light-emitting-device of the invention disclosed in this Section, the insulating layer 30 covers most of the exposed area including the surfaces and the sidewalls of the thin-film crystal layers 22 to 26, and several embodiments are possible for the shape of the insulating layer on the sidewall of the light-emitting-device of FIG. 4-1, that is, in the light-emitting-device separation-trench 13 in the state of FIG. 4-2 before the light-emitting-devices are separated. In any embodiment, it is preferable that before separating the light-emitting-devices, the insulating layer does not contact with the substrate, and there is a part without an insulating layer within the light-emitting-device separation-trench 13 defining the light-emitting-devices. Furthermore, the light-emitting-devices are preferably separated from the part without an insulating film. As a result, in a preferred configuration of the light-emitting-device of the invention disclosed in this Section, the insulating layer covering the sidewall does not reach the light-extraction side interface of the buffer layer. There will be described a specific example of a preferable insulating layer.

In an embodiment of the invention disclosed in this Section, as shown in FIG. 4-2, the insulating layer 30 does not cover the whole surface of the inside of the light-emitting-device separation-trench 13, but there is a part without an insulating layer 15 where an insulating layer 30 is not formed on the substrate (that is the trench bottom) and the trench sidewall near the substrate. According to this structure no insulating layer 30 is attached to the substrate 21, therefore, there is no possibility of detachment of the insulating layer when removing the substrate 21, for example by delamination. Thus this structure is most preferable. In the resulting light-emitting-device, as shown in part B (dotted line circle) in FIG. 4-1, there is a part without an insulating layer 15 where the insulating layer 30 does not reach the substrate surface. In a device having this configuration, detachment of an insulating layer is reliably prevented and as a result, even if running around of a solder occurs, the functions of the light-emitting-device are not deteriorated, resulting in a highly reliable device.

In this FIG. 4-1, the whole sidewall of the buffer layer 22 and a part of the sidewall of the optical coupling layer 23 are exposed. However, the sidewall of the optical coupling layer can be covered while a part of the buffer layer is exposed (see FIG. 4-11). The exposed part is preferably an undoped layer which is not doped. A highly reliable device can be provided by forming the exposed layer using a high insulative material.

When the light-emitting-device separation-trench is formed to the intermediate portion of the combined layer of the optical coupling layer and the buffer layer, a light-emitting-device having the following configuration is provided. First, when the light-emitting-device separation-trench is formed to the intermediate portion of the optical coupling layer 23, as shown in FIGS. 4-13 and 4-14, the optical coupling layer 23 and the buffer layer 22 extend to the edge of the light-emitting-device, the whole sidewall of the buffer layer is exposed, the optical coupling layer has a step based on the bottom of the light-emitting-device separation-trench, the sidewall of the optical coupling layer has a part which is not covered by an insulating layer in accordance with the sidewall of the buffer layer and a sidewall part receded from the edge of the light-emitting-device (the sidewall of the light-emitting-device separation-trench). In the example in FIG. 4-13, the insulating layer 30 covers the bottom and the sidewall of the separation trench from a position in the trench bottom distant from the edge of the optical coupling layer 23 as shown in part C (dotted line circle) in FIG. 4-13. This corresponds to a configuration where formation of the light-emitting-device separation-trench is stopped in the intermediate portion of the optical coupling layer 23 in FIG. 4-2 and a scribe region is formed by removing a part of the insulating layer deposited on the trench bottom surface of the optical coupling layer and the device is divided from the scribe region. The example in FIG. 4-14 corresponds to a configuration where formation of the light-emitting-device separation-trench is stopped in the intermediate portion of the optical coupling layer 23 in FIGS. 4-1 and 4-2, and as shown in part D (dotted line circle) in FIG. 4-14, there is a part which is not covered by an insulating layer, in the main light-extraction direction side of the sidewall inside of the edge of the light-emitting-device (the sidewall of the light-emitting-device separation-trench).

Next, when the light-emitting-device separation-trench is formed to the intermediate portion of the buffer layer 22, as shown in FIGS. 4-15 and 4-16, the buffer layer 22 extend to the edge of the light-emitting-device, the buffer layer has a step based on the bottom of the light-emitting-device separation-trench, the sidewall of the buffer layer has a part which is not covered by an insulating layer (the edge of the device) and a sidewall part receded from the edge of the light-emitting-device (the sidewall of the light-emitting-device separation-trench). In the example in FIG. 4-15, the insulating layer 30 covers the bottom and the sidewall of the buffer layer 22 in the separation trench, from a position in the trench bottom distant from the edge, and also covers the sidewall of the optical coupling layer (the sidewall of the light-emitting-device separation-trench) as shown in part E (dotted line circle) in FIG. 4-15. This corresponds to a configuration where formation of the light-emitting-device separation-trench is stopped in the intermediate portion of the buffer layer 22 in FIG. 4-2 and a scribe region is formed by removing a part of the insulating layer deposited on the trench bottom surface of the buffer layer and the device is divided from the scribe region. The example in FIG. 4-16 corresponds to a configuration where formation of the light-emitting-device separation-trench is stopped in the intermediate portion of the buffer layer 22 in FIGS. 4-1 and 4-2, and as shown in part F (dotted line circle) in FIG. 4-16, there is a part which is not covered by an insulating layer, in the main light-extraction direction side of the sidewall inside of the edge of the light-emitting-device (the sidewall of the light-emitting-device separation-trench).

As in these examples, even when the light-emitting-device separation-trench is formed to the intermediate portion of the combined layer of the optical coupling layer and the buffer layer, a device having a configuration where an insulating layer covering the sidewall does not reach the edge of the light-emitting-device ensures prevention of detachment of the insulating layer, and by forming the exposed layer from a highly insulative material, there can be provided a highly reliable device comparable to the light-emitting-device having the configuration in FIG. 4-1.

Furthermore, for the light-emitting-device of the invention disclosed in this Section, it is preferable that the insulating layer 30 is in contact with a part of the first-conductivity-type-side electrode 28 at the side of the main light-extraction direction as shown in FIG. 4-1, that is, there is a part intervened by an insulating layer in the periphery of the contact area between the first-conductivity-type-side electrode 28 and the first-conductivity-type semiconductor layer (the first-conductivity-type cladding layer 24 in the figure); and covers a part of the second-conductivity-type-side electrode 27 on the opposite side of the main light-extraction direction, that is, there is not an insulating layer between the second-conductivity-type-side electrode 27 and the second-conductivity-type semiconductor layer (the second-conductivity-type cladding layer 26 in the figure) and the insulating layer covers a periphery portion of the second-conductivity-type-side electrode 27. This configuration means that the insulating layer 30 is formed after the second-conductivity-type-side electrode 27 is formed; and after the insulating layer 30 is formed, the first-conductivity-type-side electrode 28 is formed. A manufacturing process with this sequence leads to less damage to a second-conductivity-type semiconductor layer such as the second-conductivity-type cladding layer 26 and to the first-conductivity-type-side electrode as described later, resulting in a light-emitting-device with a high efficiency. In other words, the fact having such a configuration means that the light-emitting-device exhibits high efficiency.

Furthermore, although the second-conductivity-type-side electrode 27 has the same size as the second current injection region 35, the exposed surface 37 in the second-conductivity-type-side electrode (the exposed part in the second-conductivity-type-side electrode) preferably has a smaller size than the second current injection region 35. Furthermore, in a part of the insulating layer 30 covering the surface of the first-conductivity-type cladding layer 24, there is formed an opening for contact of the first-conductivity-type-side electrode 28 with the first-conductivity-type cladding layer 24, which becomes a first current injection region 36. It is preferable that the first-conductivity-type-side electrode 28 has an area larger than that of the first current injection region.

It is also preferable that the second-conductivity-type-side electrode and the first-conductivity-type-side electrode are not spatially overlapped.

There will be further detailed the materials and the structures constituting a device.

Substrate

A substrate employed in the invention according to this Section is as described in Section C.

Buffer Layer

A buffer layer employed in the invention according to this Section is as described in Section C.

Optical Coupling Layer

An optical coupling layer employed in the invention according to this Section is as described in Section C.

First-Conductivity-Type Semiconductor Layer and First-Conductivity-Type Cladding Layer A first-conductivity-type semiconductor layer and a first-conductivity-type cladding layer employed in the invention according to this Section are as described in Section C Active Layer Structure An active layer structure employed in the invention according to this Section is as described in Section C.

Second-Conductivity-Type Semiconductor Layer and Second-Conductivity-Type Cladding Layer A second-conductivity-type semiconductor layer and a second-conductivity-type cladding layer employed in the invention according to this Section are as described in Section C.

Second-Conductivity-Type-Side Electrode

A second-conductivity-type-side electrode employed in the invention according to this Section is as described in Section C.

First-Conductivity-Type-Side Electrode

A first-conductivity-type-side electrode employed in the invention according to this Section is as described in Section C.

Insulating Layer

An insulating layer employed in the invention according to this Section is as described in Section C.

Support

A support employed in the invention according to this Section is as described in Section C.

Manufacturing Process for a Light-Emitting-Device Disclosed in Section D

Next, there will be described a process for manufacturing a semiconductor light-emitting-device according to the invention disclosed in this Section.

In an embodiment of a manufacturing process disclosed in this Section, as shown in FIG. 4-4, first a substrate 21 is provided and over the surface are sequentially deposited a buffer layer 22, an optical coupling layer 23, a first-conductivity-type cladding layer 24, an active layer structure 25 and a second-conductivity-type cladding layer 26 by thin-film crystal growth. For formation of these thin-film crystal layers, MOCVD is preferably employed. However, it is possible to use MBE, PLD processes and the like for forming all or some of the thin-film crystal layers. A configuration of these layers can be appropriately changed, depending on, for example, an application of the device. After forming thin-film crystal layers, a variety of processings are allowed. As used herein, the term "thin-film crystal growth" includes heat-treatment after growing a thin-film crystal layer.

For providing the configuration shown in FIGS. 4-1 and 4-2 after growing thin-film crystal layers in the present invention, it is preferable that a second-conductivity-type-side electrode 27 is formed as shown in FIG. 4-4. That is, it is preferable that scheduled formation of the second-conductivity-type-side electrode 27 in the second current injection region 35 is conducted before formation of an insulating layer 30, formation of a first current injection region 36 and formation of a first-conductivity-type-side electrode 28. This is because when the second-conductivity-type is p-type as a desirable embodiment, formation of a p-side electrode after processing the exposed surface of the p-type cladding layer by various processes leads to reduction of a hole concentration in the p-GaN cladding layer with a relatively lower activation rate among GaN materials, due to process damage. For example, if the step of forming an insulating layer by p-CVD is conducted before forming the second-conductivity-type-side electrode, plasma damage remains in its surface. Thus, in the present invention, it is desirable that after thin-film crystal growth, formation of the second-conductivity-type-side electrode is conducted before any of the other process steps (for example, a first etching step, a second etching step, a third etching step or the step of forming an insulating layer, the step of forming an exposed part in a second-conductivity-type-side electrode, the step of forming a first current injection region and the step of forming a first-conductivity-type-side electrode as described later).

In the invention disclosed in this Section, when the second-conductivity-type is p-type and when the exposed surface is a relatively stable metal such as Au (in a typical example, the surface of the second-conductivity-type-side electrode is expected to be Au as described above), the surface is not likely process-damaged through the subsequent processes. In this respect, it is again desirable in the present invention that after thin-film crystal growth, formation of the second-conductivity-type-side electrode is conducted before any other process step.

In the present invention, when a layer in which the second-conductivity-type-side electrode is formed is the second-conductivity-type contact layer, process damage to the second-conductivity-type semiconductor layer can be reduced in the same manner.

The second-conductivity-type-side electrode 27 can be formed by applying a variety of deposition processes such as sputtering and vacuum evaporation, and a desired shape can be obtained by appropriately applying, for example, a lift-off process using photolithography technique or site-selective evaporation using, for example, a metal mask.

After forming the second-conductivity-type-side electrode 27, a part of the first-conductivity-type cladding layer 24 is exposed as shown in FIG. 4-5. In this step, it is preferable to remove the second-conductivity-type cladding layer 26, the active layer structure 25 and further a part of the first-conductivity-type cladding layer 24 by etching (a first etching step). In this step, the second-conductivity-type semiconductor layer (second-conductivity-type cladding layer 26) and the active layer structure 25 are divided to give structures of individual light-emitting-points 17 which comprise the active layer structure 25, the second-conductivity-type semiconductor layer (second-conductivity-type cladding layer 26) and the second-conductivity-type-side electrode 27. The first etching step is conducted also for the purpose of exposing a semiconductor layer into which a first-conductivity-type-side electrode described later injects first-conductivity-type carriers, and therefore, when a thin-film crystal layer contains another layer, for example, a cladding layer consists of two layers or contains a contact layer, the layer including the additional layer may be etched.

The first etching step does not require very high etching precision and thus can be a known dry etching technique by plasma etching using, for example, $Cl_2$ and using a etching mask of a nitride such as $SiN_x$ or an oxide such as $SiO_x$. It is, however, also preferable that dry etching can be conducted using a metal fluoride mask as detailed in a second etching step and a third etching step described later. It is particularly preferable to conduct etching by plasma excited dry etching using a gas such as $Cl_2$, $SiCl_4$, $BCl_3$ and $SiCl_4$ and using an etching mask containing a metal-fluoride layer selected from the group consisting of $SrF_2$, $AlF_3$, $MgF_2$, $BaF_2$, $CaF_2$ and combinations of these. Furthermore, the optimal dry etching is ICP type dry etching capable of generating high density plasma.

Here, the second-conductivity-type-side electrode 27 receives process history of the formation of a $SiN_x$ mask formed by, for example, plasma CVD or the step of removing the $SiN_x$ mask after the first etching step. However, when a stable metal such as Au is formed over the surface, the second-conductivity-type-side electrode is less process-damaged.

Then, as shown in FIG. 4-6, a light-emitting-unit separation-trench 12 is formed by a second etching step. In the second etching step, the GaN material must be etched to more depth compared with the first etching step. The sum of a layer depth etched by the first etching step is generally about 0.5

µm. Whereas, in the second etching step, the whole first-conductivity-type cladding layer 24 and a part of the optical coupling layer 23 must be etched. Therefore, the depth is generally 1 µm or more, for example, in the range of 1 to 5 µm, or in the range of 3 µm or more, for example 3 to 7 µm. In some cases it is in the range of 3 to 10 µm, or furthermore more than 10 µm.

Generally, a metal mask, a nitride mask such as $SiN_x$ and an oxide mask such as $SiO_x$ have a selectivity ratio to a GaN material, in terms of tolerance to etching by $Cl_2$ plasma, of about 5. In conducting the second etching step where a GaN material with a large film thickness must be etched, a relatively thicker $SiN_x$ film is necessary. For example, etching a GaN material with a thickness of 4 µm by a second dry-etching process requires a $SiN_x$ mask with a thickness of 0.8 µm. However, with a $SiN_x$ mask with such a thickness, the $SiN_x$ mask is also etched during the dry etching, and not only its thickness in a longitudinal direction but also its shape in a horizontal direction are changed, so that a desired GaN material part cannot be selectively etched.

Thus, when forming the light-emitting-unit separation-trench in the second etching step, dry etching using a mask including a metal-fluoride layer is preferred. A material constituting the metal-fluoride layer is preferably $MgF_2$, $CaF_2$, $SrF_2$, $BaF_2$ or $AlF_3$, most preferably $SrF_2$ in the light of balance between dry etching tolerance and wet-etching properties.

A metal fluoride film must be sufficiently tolerant to dry etching in the first, the second etching steps and the third etching steps while being easily etched by etching for patterning (preferably, wet etching) to give a patterning shape with good linearity particularly in the sidewall. Deposition of a metal-fluoride layer at a temperature of 150° C. or higher gives a dense film having good adhesiveness to a base layer, and the film after patterned by etching shows good linearity in a mask sidewall. A deposition temperature is preferably 250° C. or higher, further preferably 300° C. or higher, most preferably 350° C. or higher. Particularly, a metal-fluoride layer deposited at 350° C. or higher exhibits good adhesiveness to any type of base layer and gives a fine film which is highly tolerant to dry etching and exhibits quite higher linearity in its sidewall in terms of a patterning shape, ensuring controllability to a width of the opening, and thus it is the most preferable as an etching mask.

Thus, although deposition at a high temperature is preferable for providing an etching mask exhibiting good adhesiveness to a base layer, giving a fine film, being highly tolerant to dry etching and exhibiting very high linearity in its sidewall and very high controllability of a width of the opening in terms of a patterning shape, a too high deposition temperature gives a film having excessive tolerance to wet etching using, for example, hydrochloric acid preferably used for patterning a metal fluoride, and thus the film cannot be easily removed. Particularly, as described later, when a mask such as $SrF_2$ is exposed to plasma such as chlorine plasma during dry etching of a semiconductor layer, an etching rate in a later process for removing the mask layer tends to be reduced in comparison with that before exposure to plasma such as chlorine plasma. Therefore, deposition of a metal fluoride at an excessively higher temperature is undesirable in the light of its patterning and final removal.

First, in a metal fluoride before being exposed to plasma in dry etching of a semiconductor layer, a layer deposited at a lower temperature has a larger etching rate to an etchant such as hydrochloric acid, resulting in a higher etching rate and a layer deposited at a higher temperature has a smaller etching rate, resulting in a lower etching rate. When deposition temperature becomes 300° C. or higher, the etching rate decreases noticeably in comparison with a film deposited at a temperature of about 250° C., and a temperature of about 350° C. to 450° C. is within a very favorable etching rate range. A deposition temperature of higher than 480° C., however, leads to an excessively smaller absolute etching rate value, so that patterning of the metal fluoride takes a too longer time and patterning may be difficult under the conditions where a resist mask layer and so on are not detached. Furthermore, in a metal fluoride after being exposed to plasma in dry etching of a semiconductor layer, a wet-etching rate by, for example, hydrochloric acid in a removal step tends to decrease and growth at an excessively high temperature makes it difficult to remove the metal fluoride.

From such a viewpoint, a deposition temperature of a metal-fluoride layer is preferably 480° C. or lower, further preferably 470° C. or lower, particularly preferably 460° C. or lower.

Using a mask patterned considering the above (the mask may be a multilayer with $SiN_x$ or $SiO_2$ such that the metal-fluoride layer becomes a surface layer), dry etching is conducted. A gas species for the dry etching may be preferably selected from $Cl_2$, $BCl_3$, $SiCl_4$, $CCl_4$ and combinations of these. In the dry etching, a selectivity ratio of the $SrF_2$ mask to a GaN material is over 100, so that a thick GaN film can be easily and precisely etched. Furthermore, the optimal dry etching technique is ICP type dry etching capable of generating high-density plasma.

After the above etching, when the used unnecessary metal-fluoride layer mask is removed by an etchant such as hydrochloric acid, a multilayer mask with $SiN_x$, $SiO_2$ or the like may be formed such that the metal-fluoride layer becomes a surface layer if a material susceptible to an acid is present under the metal fluoride mask, for example, if an electrode material is susceptible to an acid. In such a case, $SiN_x$ or $SiO_2$ may be present in the whole region under the metal fluoride mask or alternatively, as shown, for example, in FIG. 4-17, a mask 51 such as $SiN_x$ and $SiO_2$ is not necessarily present in the whole region of the metal fluoride mask layer 52 but can be at least formed over a material susceptible to an acid.

By such a second etching step, the light-emitting-unit separation-trench is formed as shown in FIG. 4-6.

Then, as shown in FIG. 4-7, a light-emitting-device separation-trench 13 is formed by a third etching step. In the third etching step, the thickness of the GaN material to be etched is extremely deep compared with even the second etching step because whole buffer layer and the optical coupling layer must be etched, and is sometimes 5 to 10 µm, and in some cases more than 10 µm. Therefore, as explained for the second etching step, dry etching using a mask including a metal-fluoride layer is preferred. The preferred condition and the like (including a stacked layer mask and the like) is as described for the second etching step.

It is necessary that the light-emitting-device separation-trench is formed such that it interrupts at least the first-conductivity-type cladding layer. In a preferred embodiment disclosed in this Section, as shown in FIG. 4-7, the light-emitting-device separation-trench 13 is formed such that it reaches the substrate 21. In this case, the device is easily divided. It is also possible that the light-emitting-device separation-trench is formed by conducting etching into a portion of a substrate.

Alternatively, a configuration where the light-emitting-device separation-trench does not reach the substrate is also preferable. For example, when the light-emitting-device separation-trench is formed to the intermediate portion of the combination of the optical coupling layer and the buffer layer, an insulating layer can be formed on the sidewall of the first-conductivity-type cladding layer, to maintain insulation to a running-around solder (see FIGS. 4-13 to 4-16 for a configuration after completion of the light-emitting-device). In this case, a layer exposed from the sidewall without being covered by the insulating layer is preferably highly insulative. In an embodiment where the light-emitting-device separation-trench is formed to the intermediate portion of the optical coupling layer, the second etching step and the third etching step can be carried out simultaneously, which enables simplifying a manufacturing process.

Regarding the first etching step and the second etching step and the third etching step, any of step can be carried out before or after the other step. It is also preferable for simplifying a process that the first etching step is first conducted and then without removing the etching mask, the second etching step and/or a third etching step is conducted. As shown in FIG. 4-17 (only surface portion is shown during the process), first, a first etching mask 51 is formed from a material resistant to an acid such as $SiN_x$ and $SiO_2$ (preferably $SiN_x$) and etching is conducted such that a first-conductivity-type cladding layer 24 appears, and without removing the mask 51, a metal-fluoride layer is formed as a second and/or a third etching mask 52. Then, preferably, after conducting the second etching step and/or the third etching step, the mask 52 is removed by an acid and then the mask 51 is removed as appropriate. The first etching mask 51 may be allowed to present after the completion of the both etching even when the second etching step and the third etching step is carried out separately.

When the narrowest width between the light-emitting-device separation-trenches formed is $2L_{WSPT1}$, $L_{WSPT1}$ is preferably 20 µm or more, for example 30 µm or more for device separation by breaking. For separation by dicing, $L_{WSPT1}$ is preferably 300 µm or more. Since an excessively large width is not correspondingly effective, $L_{WSPT1}$ is generally 2000 µm or less. These are needed for ensuring a margin for a device manufacturing process and a scribe region.

After the third etching step, an insulating layer 30 is formed as shown in FIG. 4-8. The insulating layer may be appropriately made of any material as long as electric insulation can be ensured, as detailed above. Deposition can be conducted by any known method such as plasma CVD.

Figures 1, 2, 3, 4, 5, 6, 7, 8, 9:
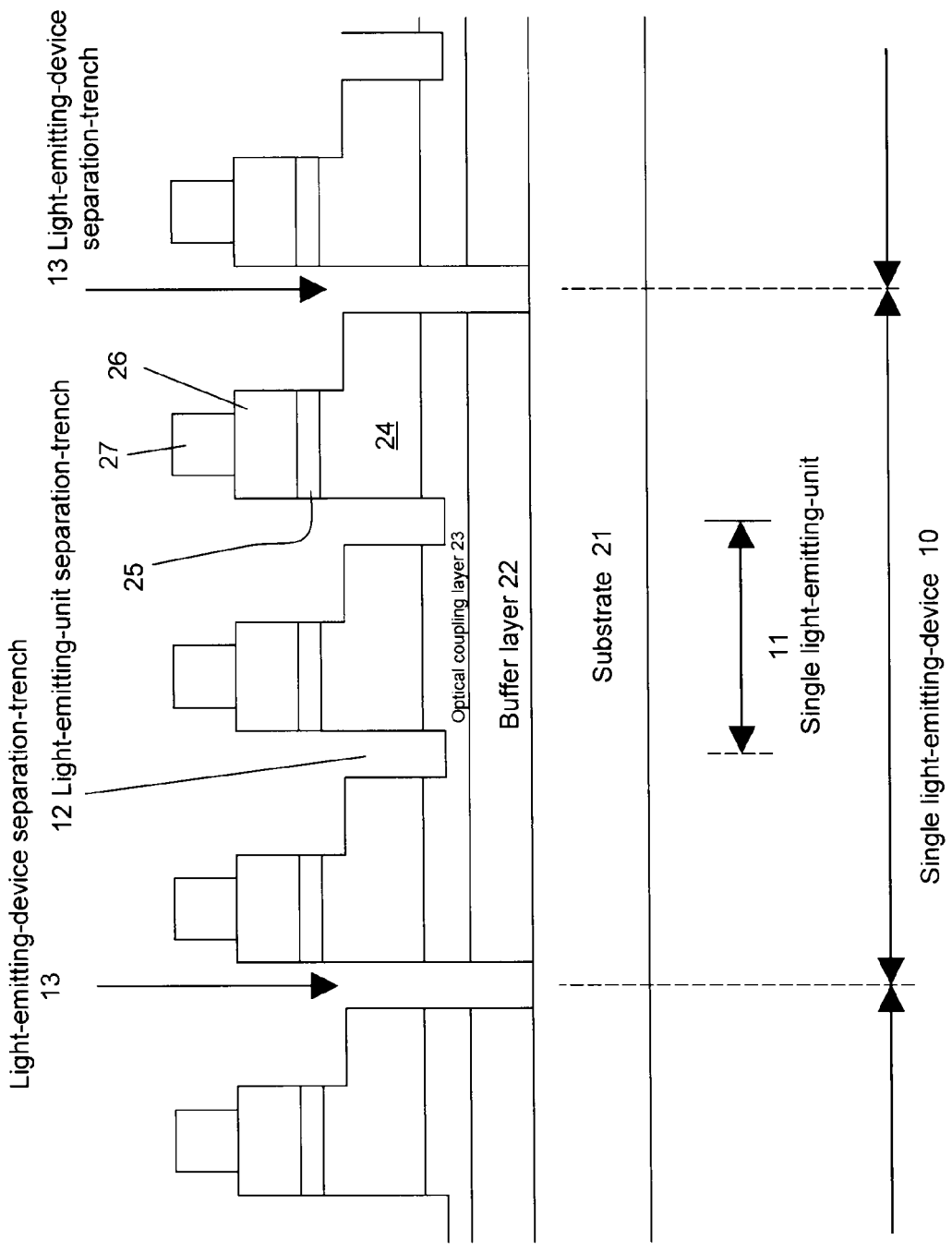

Next, as shown in FIG. 43-9, a predetermined part in the insulating layer 30 is removed, to form a second-conductivity-type-side electrode exposed part 37 where the insulating layer on the second-conductivity-type-side electrode 27 is removed, a first current injection region 36 where the insulating layer on the first-conductivity-type cladding layer is removed, and a region without an insulating layer 15 where the insulating layer on the substrate and on the sidewall within the light-emitting-device separation-trench 13 is removed. Removal of the insulating layer 30 on the second-conductivity-type-side electrode 27 is preferably conducted such that the periphery of the second-conductivity-type-side electrode is covered by the insulating layer. That is, the surface area of the second-conductivity-type-side electrode exposed part is preferably smaller than the area of the second current injection region. Here, for ensuring a margin for a device manufacturing process, particularly a photolithography step or preventing unintended short circuit from occurring due to a solder material, $L_{2w}$ is preferably 15 µm or more, wherein $L_{2w}$ is the narrowest width in the part where the second-conductivity-type-side electrode is partly covered by the insulating layer. More preferably, it is 30 µm or more, and most preferably, it is 100 µm or more. In particular, covering the wide area of the second-conductivity-type-side electrode by the insulating layer allows for reducing unintended short circuit due to a metal solder material, with an another part such as the first-conductivity-type-side electrode. In addition, $L_{2w}$ is generally 2000 µm or less, and preferably 750 µm or less.

For removing the insulating layer, an etching procedure such as dry etching and wet etching may be selected, depending on a material selected. For example, when the insulating layer is a single layer of $SiN_x$, dry etching using a gas such as $SF_6$ or wet etching using a hydrofluoric acid etchant can be employed. When the insulating layer is a dielectric multilayer film made of $SiO_x$ and $TiO_x$, the multilayer film in a desired part can be removed by Ar-ion milling.

The second-conductivity-type-side electrode exposed part 37, the first current injection region 36 and the region without an insulating layer 15 can be separately formed. But they are, in general, simultaneously formed by etching.

The part without an insulating layer 15 is formed. To perform this etching of a portion of the insulating layer on the sidewall in the light-emitting-device separation-trench, the following process may be used as a formation process. First, a resist mask having an opening whose area is equal to or slightly smaller than the area of the light-emitting-device separation-trench 13 is formed by photolithography, and then, wet etching is conducted using an etchant capable of etching an insulating layer, to initiate removal of the insulating layer on the substrate surface within the light-emitting-device separation-trench. If the etching is further continued, side etching proceeds to remove the insulating layer covering the substrate side of the trench sidewall by the wet etchant and thus to give a shape as shown in FIG. 4-9 wherein an insulating layer of the sidewall is not present in the portion of the substrate side. In the case that the insulating layer is removed as this case, the exposed sidewall without an insulating layer is preferably sidewall of undoped layer. This is because it prevents unintended electric short circuit from occurring even if a solder for bonding to a support attaches to the sidewall during flip-chip mounting. The shape of the removed insulating layer of this type is advantageous for the process particularly when the substrate is removed in the manufacturing process for a light-emitting-device, because unintended defects such as detachment of an insulating layer with the substrate is prevented.

In addition, when the light-emitting-device separation-trench is formed to the intermediate portion of the combination of the optical coupling layer and the buffer layer, in the configuration that there is a part which is not covered by an insulating layer, in the main light-extraction direction side of the sidewall inside of the edge of the light-emitting-device (the sidewall of the light-emitting-device separation-trench) (for example, in the case to form the structures of FIGS. 4-14 and 4-16), the same above process can be employed, except the insulating film is deposited not on the substrate surface but on the trench bottom surface in the above process. In forming the configuration that the insulating layer covers a part of the trench bottom surface and the sidewall of the separating trench (for example, in the case to form the structures of FIGS. 4-13 and 4-15), a scribe region is formed by removing a part of insulating layer on the trench bottom surface by providing an appropriate etching mask shape using photolithography suitable for a predetermined shape and not performing the side etching in the above process.

Then, a first-conductivity-type-side electrode 28 is formed as shown in FIG. 4-10. An electrode material preferably comprises, as described above, a material selected from Ti, Al, Ag and Mo or all of them as a constituent device when the first-conductivity-type is n-type. Generally, Al is exposed in a direction opposite to a main light-extraction direction of the n-side electrode.

For a film formation of the electrode material, there is used a variety of deposition processes such as sputtering and vacuum evaporation, and a desired electrode shape can be obtained by appropriately applying, for example, a lift-off process using photolithography technique or site-selective evaporation using, for example, a metal mask. Considering a process margin to some extent, when $L_{1w}$ is the narrowest width in the part of the first-conductivity-type-side electrode in contact with the insulating layer, $L_{1w}$ is preferably 7 μm or more, particularly preferably 9 μm or more. Furthermore, $L_{1w}$ is generally 500 μm or less, preferably 100 μm or less. In general, when it is 5 μm or more, a process margin by a photolithography process and a liftoff procedure can be ensured.

The first-conductivity-type-side electrode is formed in this example such that a part thereof contacts with the first-conductivity-type cladding layer, but can be formed to contact with, in case formed, a first-conductivity-type-side contact layer.

In a manufacturing process of the present invention, the first-conductivity-type-side electrode is formed in the final step of forming a stacked structure, which is advantageous in the light of reducing process damage. When the first-conductivity-type is n-type, Al is formed on the surface of the electrode material of the n-side electrode in a preferred embodiment. Here, if the n-side electrode is formed before formation of an insulating layer as the second-conductivity-type-side electrode, the n-side electrode surface, that is, Al metal receives a history of the etching process of the insulating layer. Etching of the insulating layer is conveniently conducted by wet etching using a hydrofluoric acid etchant as described above, but Al is less tolerant to various etchants including hydrofluoric acid, so that when effectively conducting such a process, the electrode itself is damaged. Furthermore, even if dry etching is employed, Al is relatively reactive, so that damages including oxidation may be introduced. Therefore, in the present invention, it is effective in reducing damage to the electrode that the first-conductivity-type-side electrode is formed after forming the insulating layer and after removing a predetermined unnecessary part in the insulating layer.

Thus, after forming the structure of FIG. 4-10 (FIG. 4-2), there is carried out a preparation for substrate removal. Generally, the structure shown in FIG. 4-10 is first bonded to the support 40 as the whole or a part of the wafer. This is because since even the thin-film crystal layers as a whole has at most a thickness of about 15 μm, once the substrate is removed mechanical strength is insufficient, resulting that it cannot tolerate the later processes by itself. A material for the support is as described above. The structure is mounted on a metal layer 41 (for example, an electrode interconnection) on a support 40, for example, via connection with a metal solder 42.

Here, in the light-emitting-device of the present invention, the second-conductivity-type-side electrode 27 and the first-conductivity-type-side electrode 28 are disposed such that they are not spatially overlapped at all and the first-conductivity-type-side electrode is larger than the first current injection region and preferably has an adequate area to ensure both prevention of unintended short circuit and improved heat dissipating properties. Furthermore, since the sidewalls of the other thin-film crystal layers are covered by an insulating film except a part of the buffer layer, particularly the undoped part, running out of a solder does not cause a problem such as short circuit in an active layer structure sidewall within the thin-film crystal layer.

Subsequently, the device is bonded to the support and then the substrate is removed. Removal of the substrate can be conducted by any method such as polishing, etching and laser debonding. When polishing a sapphire substrate, the substrate can be removed using a polishing material such as diamond. A substrate can be removed by dry etching. Furthermore, for example, when the substrate is sapphire and a thin-film crystal growth part is made of an InAlGaN material, laser debonding can be employed by using an excimer laser from the sapphire substrate side at oscillation wave length of 248 nm which penetrates the sapphire substrate and is absorbed by, for example, GaN used for a buffer layer, to decompose GaN in a part of the buffer layer into metal Ga and nitrogen and delaminate the substrate.

When using ZnO, $ScAlMgO_4$ or the like as a substrate, an etchant such as HCl can be used in wet etching to remove the substrate.

Since the substrate is not in contact with the insulating layer at all in the invention disclosed in this Section, removal of the substrate does not secondarily cause a problem such as detachment of the insulating layer.

Then, in a separation region corresponding to the area where the light-emitting-device separation-trench is present, the light-emitting-device is separated together with the support to provide a single light-emitting-device. Here, it is preferable that a metal interconnection is not present in the separation region of the support. This is because a metal interconnection in the region makes inter-device separation difficult. In an integrated compound semiconductor light-emitting-device of the invention disclosed in this Section, the light-emitting-units in a single light-emitting-device can be connected in parallel, in series or in combination of these by varying metal wiring on the support.

Cutting of the separation region in the support can be conducted by an appropriate process such as dicing, scribing and breaking depending on a base material. When the light-emitting-device separation-trench is formed to the intermediate portion of the combination of the optical coupling layer and the buffer layer (for example, in the configuration where the trench is formed to the intermediate portion of the optical coupling layer as similar depth of the light-emitting-unit separation-trench), scratching by diamond scribing or partial ablation of the optical coupling layer and/or the buffer layer by laser scribing can be conducted using the light-emitting-device separation-trench to easily separate between light-emitting-devices. Then, the support can be separated into individual light-emitting-devices by dicing. Optionally, separation between light-emitting-devices can be conducted by simultaneous separation of the crystal growth layer and the support by dicing.

As described above, there is manufactured the integrated compound semiconductor light-emitting-device as shown in FIG. 4-1.

According to the manufacturing process of the invention disclosed in this Section, in addition to capability of manufacturing the advantageous structure having an optical coupling layer effectively, it is preferable as described above to conduct formation of the thin-film crystal layer, formation of the second-conductivity-type-side electrode, the etching steps (the first etching step, the second etching step and the third etching step), formation of the insulating layer, removal of the insulating layer (formation of the second-conductivity-type-side electrode exposed part, formation of the first current injection region and removal of the insulating layer near the light-emitting-device separation-trench) and formation of the first-conductivity-type-side electrode, in this sequence. Such a process sequence allows for providing a light-emittingdevice without damage in the thin-film crystal layer immediately below the second-conductivity-type-side electrode or damage in the first-conductivity-type-side electrode. Furthermore, the device shape reflects the process flow. In other words, this light-emitting-device internally has a structure where there are deposited the second-conductivity-type-side electrode, the insulating layer and the first-conductivity-type-side electrode in this sequence. That is, the second-conductivity-type-side electrode is in contact with the second-conductivity-type cladding layer (or another second-conductivity-type thin-film crystal layer) without an intervening insulating layer; there is a part of the upper periphery of the second-conductivity-type-side electrode which is covered by an insulating layer; and there is an area where an electrode periphery is intervened by an insulating layer between the first-conductivity-type-side electrode and the first-conductivity-type-side cladding layer (or another first-conductivity-type thin-film crystal layer).

EXAMPLE

There will be described the present invention with reference to examples. Materials, amounts, proportions, specific processes and process orders in the following examples may be appropriately modified without departing from the scope of the invention. The scope of this invention should not be interpreted to be limited to the specific examples described below. Furthermore, in the drawings referred in the following examples, some sizes are deliberately changed to help understanding the structures, but practical dimensions are as indicated in the following description.

Examples of the Invention in Relation to Section A

Example A-1

The light-emitting-device shown in FIG. 1-15 was manufactured by the following procedure. FIGS. 1-6 to 10, 12 and 14 will be referred to as a related process drawing.

First was prepared a c+ plane sapphire substrate 21 with a thickness of 430 µm, on which an undoped GaN layer with a thickness of 10 nm was formed by growing at a low temperature by MOCVD as a first buffer layer 22a; and then an undoped GaN layer with a thickness of 0.5 µm and a Si-doped (Si concentration: $7 \times 10^{17}$ cm$^{-3}$) GaN layer with a thickness of 0.5 µm were deposited at 1040° C. as a second buffer layer 22b with a thickness of 1 µm. Subsequently, an undoped GaN layer with a thickness of 3.5 µm was formed at 1035° C. as an optical coupling layer 23.

Then, a Si-doped (Si concentration: $1 \times 10^{18}$ cm$^{-3}$) GaN layer was formed to 2 µm as a first-conductivity-type (n-type) second cladding layer 24b; a Si-doped (Si concentration: $3 \times 10^{18}$ cm$^{-3}$) GaN layer was formed to 0.5 µm as a first-conductivity-type (n-type) contact layer 24c; and then a Si-doped (Si concentration: $1.5 \times 10^{18}$ cm$^{-3}$) Al$_{0.15}$Ga$_{0.85}$N layer was formed to 0.1 µm as a first-conductivity-type (n-type) first cladding layer 24a. Then, an active layer structure 25 was formed by depositing alternately undoped GaN layer to a thickness of 13 nm at 850° C. as a barrier layer and undoped In$_{0.1}$Ga$_{0.9}$N layer to a thickness of 2 nm at 720° C. as a quantum well layer such that five quantum well layers were formed in total and both sides were the barrier layers. Then, after increasing a growth temperature to 1025° C., a Mg-doped (Mg concentration $5 \times 10^{19}$ cm$^{-3}$) Al$_{0.15}$Ga$_{0.85}$N layer was formed to 0.1 µm as a second-conductivity-type (p-type) first cladding layer 26a. Subsequently, a Mg-doped (Mg concentration: $5 \times 10^{19}$ cm$^{-3}$) GaN layer was formed to 0.07 µm as a second-conductivity-type (p-type) second cladding layer 26b. Finally, a Mg-doped (Mg concentration: $1 \times 10^{20}$ cm$^{-3}$) GaN layer was formed to 0.03 µm as a second-conductivity-type (p-type) contact layer 26c.

Then, after gradually lowering the temperature of the MOCVD growth furnace, the wafer was taken out and thus thin-film crystal growth was completed.

For forming a p-side electrode in the wafer after the thin-film crystal growth, photolithography was used to prepare for patterning a p-side electrode 27 by lift-off technique and a resist pattern was formed. Here, Ni (thickness: 20 nm)/Au (thickness: 500 nm) was deposited by vacuum evaporation as a p-side electrode, and an unnecessary part was removed in acetone by lift-off technique. Then, after heating, a p-side electrode was prepared. The structure manufactured so far substantially corresponds to FIG. 1-6. So far, there was not a step causing a damage such as a plasma process in the p-side current injection region just under the p-side electrode.

Next, for conducting the first etching step, an etching mask was formed. Here, by p-CVD, SiN$_x$ was deposited to 0.4 µm over the whole wafer surface at a substrate temperature of 400° C. Here, since Au was exposed in the p-side electrode surface, it was not deteriorated at all after the SiN$_x$ deposition process by p-CVD. Then, photolithography was again conducted for patterning the SiN$_x$ mask to prepare a SiN$_x$ etching mask. Here, the unnecessary part in the SiN$_x$ film was etched using SF$_6$ plasma by RIE, and the mask was left in a part where the thin-film crystal layer was not etched in the first etching step described later, while the SiN$_x$ film was removed in the part corresponding to the part of the thin-film crystal layer to be etched.

Next, as the first etching step, ICP plasma etching was conducted using Cl$_2$ gas for etching through the p-GaN contact layer 26c, the p-GaN second cladding layer 26b, the p-AlGaN first cladding layer 26a, the active layer structure 25 consisting of InGaN quantum well layers and GaN barrier layers and the n-AlGaN first cladding layer 24a to the intermediate portion of the n-GaN contact layer 24c, to expose the n-type contact layer 24c which was to be an injection part for n-type carriers.

After the ICP plasma etching, the SiN$_x$ mask was completely removed using buffered hydrofluoric acid. Again, since Au was exposed in the p-side electrode surface, the p-side electrode was not deteriorated at all after the SiN$_x$ deposition process by p-CVD. The structure manufactured so far substantially corresponds to FIG. 1-7.

Next, for conducting the second etching step of forming a light-emitting-unit separation-trench 12 in each light-emitting-device, a SrF$_2$ mask was formed over the whole wafer surface using vacuum evaporation. Then, the SrF$_2$ film in the region where a light-emitting-unit separation-trench was to be formed was removed to form a mask for forming a light-emitting-unit separation-trench on a thin-film crystal layer, that is, a SrF$_2$ mask for the second etching step.

Then, as the second etching step, were etched the thin-film crystal layers, including the p-GaN contact layer 26c, the p-GaN second cladding layer 26b, the p-AlGaN first cladding layer 26a, the active layer structure 25 consisting of the InGaN quantum well layers and the GaN barrier layers, the n-AlGaN first cladding layer 24a, the n-GaN contact layer 24c, the n-GaN second cladding layer 24b, and a portion of the undoped GaN optical coupling layer 23 in the part corresponding to the light-emitting-unit separation-trench by ICP etching using Cl$_2$ gas. During this second etching step, the SrF$_2$ mask was substantially not etched. The light-emitting-unit separation-trench 12 was formed to a width of 10 µm after this step.

After forming the light-emitting-unit separation-trench 12 by the second etching step, the used unnecessary SrF$_2$ mask was removed. Again, since Au was exposed in the p-side electrode surface, it was not deteriorated at all. The structure manufactured so far substantially corresponds to FIG. 1-8.

Next, for conducting the third etching step of forming a light-emitting-device separation-trench 13 between the compound semiconductor light-emitting-devices, a SrF$_2$ mask was formed over the whole wafer surface using vacuum evaporation. Then, the SrF$_2$ film in the region where a light-emitting-device separation-trench was to be formed was removed to form a mask for forming a light-emitting-device separation-trench on a thin-film crystal layer, that is, a SrF$_2$ mask for the third etching step.

Then, as the third etching step, were etched all the thin-film crystal layers, that is, the p-GaN contact layer 26c, the p-GaN second cladding layer 26b, the p-AlGaN first cladding layer 26a, the active layer structure 25 consisting of the InGaN quantum well layers and the GaN barrier layers, the n-AlGaN first cladding layer 24a, the n-GaN contact layer 24c, the n-GaN second cladding layer 24b, the undoped GaN optical coupling layer 23 and the buffer layer 22 (22a, 22b) in the part corresponding to the light-emitting-device separation-trench by ICP etching using Cl$_2$ gas. During this third etching step, the SrF$_2$ mask was substantially not etched. By this step, the light-emitting-device separation-trench having a width of 50 μm was formed.

After forming the light-emitting-device separation-trench 13 by the third etching step, the used unnecessary SrF$_2$ mask was removed. Again, since Au was exposed in the p-side electrode 27 surface, it was not deteriorated at all. The structure manufactured so far substantially corresponds to FIG. 1-9.

Next, over the whole wafer were sequentially formed SiO$_x$ and SiN$_x$ by p-CVD to form a dielectric multilayer film. Here, each of SiN$_x$ and SiO$_x$ was formed one by one to a thickness that is ¼ as an optical wavelength to an emission wavelength of the device, so that it had a relatively higher reflectance to the emission wavelength. The structure manufactured so far substantially corresponds to FIG. 1-10.

Then, a resist mask was formed using photolithography technique for simultaneously forming a p-side electrode exposed part on the p-side electrode 27 made of Ni—Au, forming an n-side current injection region (36) on the n-side contact layer 24c and removing portion of an insulating layer present on the sidewall of the undoped buffer layer within the light-emitting-device separation-trench. Next, a hydrofluoric acid containing etchant was used to remove the dielectric multilayer film (the insulating layer) which was not covered by the resist mask. Further, by the effect of side etching by hydrofluoric acid, the dielectric multilayer film (insulating layer) on the part of the sidewall of the undoped buffer layer 22 was also removed. Here, the periphery of the p-side electrode 27 was covered by the insulating layer consisting of SiN$_x$ and SiO$_x$ to 150 μm.

Subsequently, the used unnecessary resist mask was removed by acetone and by ashing with oxygen plasma by RIE. Again, since Au was exposed in the p-side electrode surface, it was not deteriorated at all after the SiN$_x$ deposition process by p-CVD. The structure manufactured so far substantially corresponds to FIG. 1-12.

Next, for forming an n-side electrode 28, photolithography was used to prepare for patterning an n-side electrode by lift-off technique and a resist pattern was formed. Here, Ti (thickness: 20 nm)/Al (thickness: 300 nm) was deposited over the whole wafer surface by vacuum evaporation as an n-side electrode, and an unnecessary part was removed in acetone by lift-off technique. Then, after heating, an n-side electrode was prepared. The n-side electrode was formed such that its periphery contacted the insulating layer by 30 μm for having an area larger than the n-side current injection region and such that it did not overlap the p-side electrode 27, considering facilitation of flip chip bonding using a metal solder and heat dissipating properties. In another manufacturing example, it was formed so as to contact by 10 μm, and a light-emitting-device exhibiting performance comparable to this example was manufactured. An Al electrode tends to be deteriorated during, for example, a plasma process and is etched by, for example, hydrofluoric acid, but since the n-side electrode was formed in the final step of the device manufacturing process, it was not damaged at all. The structure manufactured so far substantially corresponds to FIG. 1-14.

Then, on the rear surface of the sapphire substrate was formed a low-reflecting optical film 45 made of MgF$_2$ by vacuum evaporation. Here, MgF$_2$ was deposited to ¼ of an optical film thickness, giving a low-reflecting coating to an emission wavelength of the device.

Next, for dividing the individual light-emitting-devices formed over the wafer, a scribe line was formed from the thin-film crystal growth side in the inside of the light-emitting-device separation-trench 13 using a laser scriber. Then, along this scribe line, only the sapphire substrate and the MgF$_2$ low-reflecting optical film were broken to provide individual compound semiconductor light-emitting-devices. Here, no damages were introduced to the thin-film crystal layer and detachment of the dielectric film did not occur.

Then, this device was bonded to the metal layer 41 in the submount 40 using a metal solder 42, to provide the light-emitting-device shown in FIG. 1-15. Here, no defects such as unintended short circuit occurred in the device.

Example A-2

The procedure in Example A-1 was repeated, except that after depositing the optical coupling layer 23, a thin-film crystal layer was deposited as described below. Specifically, an undoped GaN was formed at 1035° C. to a thickness of 3.5 μm as an optical coupling layer 23 as described in Example A-1, and then a Si-doped (Si concentration: $5 \times 10^{18}$ cm$^{-3}$) GaN layer was formed to 4 μm as a first-conductivity-type (n-type) second cladding layer 24b; a Si-doped (Si concentration: $8 \times 10^{18}$ cm$^{-3}$) GaN layer was formed to 0.5 μm as a first-conductivity-type (n-type) contact layer 24c; and then a Si-doped (Si concentration: $5.0 \times 10^{18}$ cm$^{-3}$) Al$_{0.10}$Ga$_{0.90}$N layer was formed to 0.1 μm as a first-conductivity-type (n-type) first cladding layer 24a. Then, an active layer structure 25 were formed by depositing alternately undoped GaN layer to a thickness of 13 nm at 850° C. as a barrier layer and undoped In$_{0.1}$Ga$_{0.9}$N layer to a thickness of 2 nm at 720° C. as a quantum well layer such that eight quantum well layers were formed in total and both sides were the barrier layers. Then, after increasing a growth temperature to 1025° C., a Mg-doped (Mg concentration $5 \times 10^{19}$ cm$^{-3}$) Al$_{0.10}$Ga$_{0.90}$N was formed to 0.1 μm as a second-conductivity-type (p-type) first cladding layer 26a. Subsequently, a Mg-doped (Mg concentration: $5 \times 10^{19}$ cm$^{-3}$) GaN was formed to 0.07 μm as a second-conductivity-type (p-type) second cladding layer 26b. Finally, a Mg-doped (Mg concentration: $1 \times 10^{20}$ cm$^{-3}$) GaN was formed to 0.03 μm as a second-conductivity-type (p-type) contact layer 26c. The subsequent process was conducted as described in Example A-1, to provide the light-emitting-device shown in FIG. 1-15. Here, no defects such as unintended short circuit occurred in the device.

In the processes in Examples A-1 and 2, the $SiN_x$ mask was removed after the first etching step, but the $SiN_x$ mask may not be removed and can be removed after the second etching step. Alternatively it can be removed after the third etching step, which is also preferable.

Furthermore, the light-emitting-device shown in FIG. 1-20 can be manufactured (wherein the insulating film is a multilayer dielectric film) by stopping etching in the third etching step in the intermediate portion of the buffer layer. In this case, the light-emitting-device shown in FIG. 1-19 can be manufactured by providing an appropriate etching mask shape using photolithography suitable for a predetermined shape and the side etching is not conducted.

Furthermore, by stopping etching in the third etching step in the intermediate portion of the optical coupling layer, the light-emitting-device shown in FIG. 1-18 can be manufactured. In this case, the light-emitting-device shown in FIG. 1-17 can be manufactured by providing an appropriate etching mask shape using photolithography suitable for a predetermined shape and the side etching is not conducted.

Example A-3

The light-emitting-device shown in FIG. 1-16 was manufactured as follows.

First was prepared a c+ plane sapphire substrate 21 with a thickness of 430 μm, on which an undoped GaN layer with a thickness of 20 nm was formed by growing at a low temperature by MOCVD as a first buffer layer 22a and then an undoped GaN layer with a thickness of 1 μm was formed at 1040° C. as a second buffer layer 22b.

As the optical coupling layer 23, an undoped GaN layer was formed to 2 μm, which, in its center, includes a stacked structure consisting of ten undoped $In_{0.05}Ga_{0.95}N$ layers each having a thickness of 3 nm and ten undoped GaN layers each having a thickness of 12 nm. Here, the undoped GaN layer and the undoped $In_{0.05}Ga_{0.95}N$ layer were grown at 850° C. and 730° C., respectively.

Then, a Si-doped (Si concentration: $1\times10^{18}$ $cm^{-3}$) GaN layer was formed to 2 μm as a first-conductivity-type (n-type) second cladding layer 24b; a Si-doped (Si concentration: $2\times10^{18}$ $cm^{-3}$) GaN layer was formed to 0.5 μm as a first-conductivity-type (n-type) contact layer 24c; and then a Si-doped (Si concentration: $1.5\times10^{18}$ $cm^{-3}$) $Al_{0.15}Ga_{0.85}N$ layer was formed to 0.1 μm as a first-conductivity-type (n-type) first cladding layer 24a.

Then, an active layer structure 25 was formed by depositing alternately undoped GaN layer to a thickness of 13 nm at 850° C. as a barrier layer and undoped $In_{0.13}Ga_{0.87}N$ layer to a thickness of 2 nm at 715° C. as a quantum well layer such that three quantum well layers were formed in total and both sides were the barrier layers.

Then, after increasing a growth temperature to 1025° C., a Mg-doped (Mg concentration $5\times10^{19}$ $cm^{-3}$) $Al_{0.15}Ga_{0.85}N$ layer was formed to 0.1 μm as a second-conductivity-type (p-type) first cladding layer 26a. Subsequently, a Mg-doped (Mg concentration: $5\times10^{19}$ $cm^{-3}$) GaN layer was formed to 0.05 μm as a second-conductivity-type (p-type) second cladding layer 26b. Finally, a Mg-doped (Mg concentration: $1\times10^{20}$ $cm^{-3}$) GaN layer was formed to 0.02 μm as a second-conductivity-type (p-type) contact layer 26c.

Then, after gradually lowering the temperature of the MOCVD growth furnace, the wafer was taken out and thus thin-film crystal growth was completed.

For forming a p-side electrode 27 in the wafer after the thin-film crystal growth, photolithography was used to prepare for patterning a p-side electrode by lift-off technique and a resist pattern was formed. Here, Pd (thickness: 20 nm)/Au (thickness: 1000 nm) was deposited by vacuum evaporation as a p-side electrode, and an unnecessary part was removed in acetone by lift-off technique. Then, after heating, a p-side electrode 27 was prepared. So far, there was not a step causing a damage such as a plasma process in the p-side current injection region just under the p-side electrode.

Next, for conducting a second etching step of forming an light-emitting-unit separation-trench and a third etching step of forming a light-emitting-device separation-trench simultaneously, a $SrF_2$ mask was formed over the whole wafer surface using vacuum evaporation. Then, the $SrF_2$ film in the region where a light-emitting-unit separation-trench and a light-emitting-device separation-trench were to be formed was removed to form a separation etching mask, that is, an etching mask for conducting the second etching step and the third etching step simultaneously.

Then, as the second etching step and the third etching step conducted simultaneously, were etched the thin-film crystal layers, including the p-GaN contact layer 26c, the p-GaN second cladding layer 26b, the p-AlGaN first cladding layer 26a, the active layer structure 25 consisting of the InGaN quantum well layer and the GaN barrier layer, the n-AlGaN first cladding layer 24a, the n-GaN contact layer 24c, the n-GaN second cladding layer 24b, and a portion of the undoped InGaN/GaN optical coupling layer 23 in the part corresponding to the light-emitting-unit separation-trench and the light-emitting-device separation-trench by ICP etching using $Cl_2$ gas. During the simultaneous second and third etching step, the $SrF_2$ mask was substantially not etched. The light-emitting-unit separation-trench was formed to a width of 6 μm after this step.

After forming the light-emitting-unit separation-trench and the light-emitting-device separation-trench by the simultaneous second and third etching step, the used unnecessary $SrF_2$ mask was removed. Again, since Au was exposed in the p-side electrode surface, it was not deteriorated at all.

Subsequently, a mask for etching was formed to conduct a first etching step for exposing the first-conductivity-type contact layer as preparation before forming a first-conductivity-type-side electrode. Here, $SiN_x$ was deposited to 0.4 μm over the whole wafer surface at a substrate temperature of 400° C. by p-CVD. Here, since Au was exposed in the p-side electrode surface, it was not deteriorated at all after the $SiN_x$ deposition process by p-CVD. Then, a photolithography process was again conducted for patterning the $SiN_x$ layer to prepare a $SiN_x$ etching mask. Here, the unnecessary part in the $SiN_x$ film was etched using $SF_6$ plasma by RIE, and a part where the thin-film crystal layer was not etched in the first etching step described later was left, while the $SiN_x$ film was removed in the part corresponding to the part of the thin-film crystal layer to be etched.

Next, as the first etching step, ICP plasma etching was conducted using $Cl_2$ gas for etching through the p-GaN contact layer 26c, the p-GaN second cladding layer 26b, the p-AlGaN first cladding layer 26a, the active layer structure 25 consisting of an InGaN quantum well layer and a GaN barrier layer and the n-AlGaN first cladding layer 24a to the intermediate portion of the n-GaN contact layer 24c, to expose the n-type contact layer which was to be an injection part for n-type carriers.

After the ICP plasma etching, the $SiN_x$ mask was completely removed by RIE using $SF_6$ gas. Again, since Au was exposed in the p-side electrode surface, it was not deteriorated at all after the process.

Then, $SiN_x$ was formed over the whole wafer surface to 125 nm thickness as an insulating layer 30 by p-CVD. Next, for simultaneously forming a p-side electrode exposed part on the p-side electrode 27 made of Pd—Au, forming an n-side current injection region on the n-side contact layer and removing portion of an insulating layer present in the light-emitting-device separation-trench, first, a resist mask was formed by photolithography, and then, the insulating layer in the part which was not covered by a resist mask was removed using RIE plasma of $SF_6$ gas, so that formation of a p-side electrode exposed part and an n-side current injection region and removal of a portion of an insulating layer present in the light-emitting-device separation-trench are conducted. Here, the periphery of the p-side electrode was covered by the $SiN_x$ insulating layer. Furthermore, for example, the sidewall of the thin-film crystal layer was covered by an insulating layer, except the n-side current injection region. Further, as described in Examples A-1 and 2, the light-emitting-device shown in FIG. 1-18 (FIG. 1-16 represents this configuration) can be manufactured by providing an appropriate etching mask shape using photolithography suitable for a predetermined shape and allowing side etching of the insulating layer to proceed. Also, the light-emitting-device shown in FIG. 1-17 can be manufactured by providing an appropriate etching mask shape using photolithography suitable for a predetermined shape and the side etching of the insulating layer is not conducted.

Subsequently, the unnecessary resist mask was removed by acetone and by ashing with oxygen plasma by RIE. Again, since Au was exposed in the p-side electrode surface, it was not deteriorated at all.

Next, for forming an n-side electrode 28, photolithography was used to prepare for patterning an n-side electrode by lift-off technique and a resist pattern was formed. Here, Ti (thickness: 20 nm)/Al (thickness: 1500 nm) was deposited over the whole wafer surface by vacuum evaporation as an n-side electrode, and an unnecessary part was removed in acetone by lift-off technique. Then, after heating, an n-side electrode was prepared. The n-side electrode was formed such that its area was larger than the n-side current injection region and such that it does not overlap the p-side electrode, considering facilitation of flip chip bonding using a metal solder and heat dissipating properties. An Al electrode tends to be deteriorated during, for example, a plasma process and is etched by, for example, hydrofluoric acid, but since the n-side electrode was formed in the final step of the device manufacturing process, it was not damaged at all.

Then, this device was bonded to the metal layer 41 in the submount 40 using a metal solder 42, to provide a light-emitting-device. Here, no defects such as unintended short circuit occurred in the device.

Example A-4

A light-emitting-device was manufactured as described in Example A-3, except that the configurations of a substrate and thin-film crystal layers were modified as follows.

First, was prepared a c+ plane GaN substrate 21 (Si concentration: $1\times10^{17}$ cm$^{-3}$)) with a thickness of 300 μm, on which undoped GaN was first formed to 2 μm thickness at 1040° C. by MOCVD as a buffer layer 22.

As the optical coupling layer 23, an undoped GaN layer was formed to 4 μm, which, in its center, includes a stacked structure consisting of twenty undoped $In_{0.05}Ga_{0.95}N$ layers each having a thickness of 3 nm and twenty undoped GaN layers each having a thickness of 12 nm. Here, the undoped $In_{0.05}Ga_{0.95}N$ layer, the adjacent undoped GaN layer and the other GaN layers were grown at 730° C., 850° C. and 1035° C., respectively.

Then, a Si-doped (Si concentration: $5\times10^{18}$ cm$^{-3}$) GaN layer was formed to 4 μm as a first-conductivity-type (n-type) second cladding layer 24b; a Si-doped (Si concentration: $7\times10^{18}$ cm$^{-3}$) GaN layer was formed to 0.5 μm as a first-conductivity-type (n-type) contact layer 24c; and then a Si-doped (Si concentration: $5\times10^{18}$ cm$^{-3}$) $Al_{0.10}Ga_{0.90}N$ layer was formed to 0.1 μm as a first-conductivity-type (n-type) first cladding layer 24a.

Then, an active layer structure 25 was formed by depositing alternately undoped GaN layer to a thickness of 13 nm at 850° C. as a barrier layer and undoped $In_{0.13}Ga_{0.87}N$ layer to a thickness of 2 nm at 715° C. as a quantum well layer such that eight quantum well layers were formed in total and both sides were the barrier layers.

Then, after increasing a growth temperature to 1025° C., a Mg-doped (Mg concentration $5\times10^{19}$ cm$^{-3}$) $Al_{0.10}Ga_{0.90}N$ layer was formed to 0.1 μm as a second-conductivity-type (p-type) first cladding layer 26a. Subsequently, a Mg-doped (Mg concentration: $5\times10^{19}$ cm$^{-3}$) GaN was formed to 0.05 μm as a second-conductivity-type (p-type) second cladding layer 26b. Finally, a Mg-doped (Mg concentration: $1\times10^{20}$ cm$^{-3}$) GaN was formed to 0.02 as a second-conductivity-type (p-type) contact layer 26c.

Then, after gradually lowering the temperature of the MOCVD growth furnace, the wafer was removed and thus thin-film crystal growth was completed.

The subsequent process was conducted as described in Example A-3 to provide a light-emitting-device. Here, no defects such as unintended short circuit occurred in the device.

In Examples A-3 and 4, the second etching step and the third etching step were conducted simultaneously and before the first etching step, but the first etching step may be conducted before the simultaneous second and third etching step. It is also preferable that without removing the SiN mask used in the first etching step, the second and third etching step is conducted.

Examples of the Invention in Relation to Section B

Example B-1

The light-emitting-device shown in FIG. 2-15 was manufactured by the following procedure. FIGS. 2-6 to 10, 12 and 14 will be referred to as a related process drawing.

First was prepared a c+ plane sapphire substrate 21 with a thickness of 430 μm, on which an undoped GaN layer with a thickness of 10 nm was formed by growing at a low temperature by MOCVD as a first buffer layer 22a; and then an undoped GaN layer with a thickness of 0.5 μm and a Si-doped (Si concentration: $7\times10^{17}$ cm$^{-3}$) GaN layer with a thickness of 0.5 μm were deposited at 1040° C. as a second buffer layer 22b with a thickness of 1 p.m. Subsequently, an undoped GaN layer with a thickness of 3.5 μm was formed at 1035° C. as an optical coupling layer 23.

Then, a Si-doped (Si concentration: $1\times10^{18}$ cm$^{-3}$) GaN layer was formed to 2 μm as a first-conductivity-type (n-type) second cladding layer 24b; a Si-doped (Si concentration: $3\times10^{18}$ cm$^{-3}$) GaN layer was formed to 0.5 μm as a first-conductivity-type (n-type) contact layer 24c; and then a Si-doped (Si concentration: $1.5\times10^{18}$ cm$^{-3}$) $Al_{0.15}Ga_{0.85}N$ layer was formed to 0.1 μm as a first-conductivity-type (n-type) first cladding layer 24a. Then, an active layer structure 25 was formed by depositing alternately undoped GaN layer to a thickness of 13 nm at 850° C. as a barrier layer and undoped $In_{0.01}Ga_{0.9}N$ layer to a thickness of 2 nm at 720° C. as a quantum well layer such that five quantum well layers were formed in total and both sides were the barrier layers. Then, after increasing a growth temperature to 1025° C., a Mg-doped (Mg concentration $5\times10^{19}$ cm$^{-3}$) Al$_{0.15}$Ga$_{0.85}$N layer was formed to 0.1 μm as a second-conductivity-type (p-type) first cladding layer 26a. Subsequently, a Mg-doped (Mg concentration: $5\times10^{19}$ cm$^{-3}$) GaN layer was formed to 0.07 μm as a second-conductivity-type (p-type) second cladding layer 26b. Finally, a Mg-doped (Mg concentration: $1\times10^{20}$ cm$^{-3}$) GaN layer was formed to 0.03 μm as a second-conductivity-type (p-type) contact layer 26c.

Then, after gradually lowering the temperature of the MOCVD growth furnace, the wafer was taken out and thus thin-film crystal growth was completed.

For forming a p-side electrode in the wafer after the thin-film crystal growth, photolithography was used to prepare for patterning a p-side electrode 27 by lift-off technique and a resist pattern was formed. Here, Ni (thickness: 20 nm)/Au (thickness: 500 nm) was deposited by vacuum evaporation as a p-side electrode, and an unnecessary part was removed in acetone by lift-off technique. Then, after heating, a p-side electrode was prepared. The structure manufactured so far substantially corresponds to FIG. 2-6. So far, there was not a step causing a damage such as a plasma process in the p-side current injection region just under the p-side electrode.

Next, for conducting the first etching step, an etching mask was formed. Here, by p-CVD, SiN$_x$ was deposited to 0.4 μm over the whole wafer surface at a substrate temperature of 400° C. Here, since Au was exposed in the p-side electrode surface, it was not deteriorated at all after the SiN$_x$ deposition process by p-CVD. Then, photolithography was again conducted for patterning the SiN$_x$ mask to prepare a SiN$_x$ etching mask. Here, the unnecessary part in the SiN$_x$ film was etched using SF$_6$ plasma by RIE, and the mask was left in a part where the thin-film crystal layer was not etched in the first etching step described later, while the SiN$_x$ film was removed in the part corresponding to the part of the thin-film crystal layer to be etched.

Next, as the first etching step, ICP plasma etching was conducted using Cl$_2$ gas for etching through the p-GaN contact layer 26c, the p-GaN second cladding layer 26b, the p-AlGaN first cladding layer 26a, the active layer structure 25 consisting of InGaN quantum well layers and GaN barrier layers and the n-AlGaN first cladding layer 24a to the intermediate portion of the n-GaN contact layer 24c, to expose the n-type contact layer 24c which was to be an injection part for n-type carriers and simultaneously to form shape of a plurality of light-emitting-points.

After the ICP plasma etching, the SiN$_x$ mask was completely removed using buffered hydrofluoric acid. Again, since Au was exposed in the p-side electrode surface, the p-side electrode was not deteriorated at all after the SiN$_x$ deposition process by p-CVD. The structure manufactured so far substantially corresponds to FIG. 2-7.

Next, for conducting the second etching step of forming a light-emitting-unit separation-trench 12 in each light-emitting-device, a SrF$_2$ mask was formed over the whole wafer surface using vacuum evaporation. Then, the SrF$_2$ film in the region where a light-emitting-unit separation-trench was to be formed was removed to form a mask for forming a light-emitting-unit separation-trench on a thin-film crystal layer, that is, a SrF$_2$ mask for the second etching step.

Then, as the second etching step, were etched the thin-film crystal layers, including the p-GaN contact layer 26c, the p-GaN second cladding layer 26b, the p-AlGaN first cladding layer 26a, the active layer structure 25 consisting of the InGaN quantum well layers and the GaN barrier layers, the n-AlGaN first cladding layer 24a, the n-GaN contact layer 24c, the n-GaN second cladding layer 24b, and a portion of the undoped GaN optical coupling layer 23 in the part corresponding to the light-emitting-unit separation-trench by ICP etching using Cl$_2$ gas. During this second etching step, the SrF$_2$ mask was substantially not etched. The light-emitting-unit separation-trench 12 was formed to a width of 10 μm after this step.

After forming the light-emitting-unit separation-trench 12 by the second etching step, the used unnecessary SrF$_2$ mask was removed. Again, since Au was exposed in the p-side electrode surface, it was not deteriorated at all. The structure manufactured so far substantially corresponds to FIG. 2-8.

Next, for conducting the third etching step of forming a light-emitting-device separation-trench 13 between the compound semiconductor light-emitting-devices, a SrF$_2$ mask was formed over the whole wafer surface using vacuum evaporation. Then, the SrF$_2$ film in the region where a light-emitting-device separation-trench was to be formed was removed to form a mask for forming a light-emitting-device separation-trench on a thin-film crystal layer, that is, a SrF$_2$ mask for the third etching step.

Then, as the third etching step, were etched all the thin-film crystal layers, that is, the p-GaN contact layer 26c, the p-GaN second cladding layer 26b, the p-AlGaN first cladding layer 26a, the active layer structure 25 consisting of the InGaN quantum well layers and the GaN barrier layers, the n-AlGaN first cladding layer 24a, the n-GaN contact layer 24c, the n-GaN second cladding layer 24b, the undoped GaN optical coupling layer 23 and the buffer layer 22 (22a, 22b) in the part corresponding to the light-emitting-device separation-trench by ICP etching using Cl$_2$ gas. During this third etching step, the SrF$_2$ mask was substantially not etched. By this step, the light-emitting-device separation-trench having a width of 50 μm was formed.

After forming the light-emitting-device separation-trench 13 by the third etching step, the used unnecessary SrF$_2$ mask was removed. Again, since Au was exposed in the p-side electrode 27 surface, it was not deteriorated at all. The structure manufactured so far substantially corresponds to FIG. 2-9.

Next, over the whole wafer were sequentially formed SiO$_x$ and SiN$_x$ by p-CVD to form a dielectric multilayer film. Here, each of SiN$_x$ and SiO$_x$ was formed one by one to a thickness that is ¼ as an optical wavelength to an emission wavelength of the device, so that it had a relatively higher reflectance to the emission wavelength. The structure manufactured so far substantially corresponds to FIG. 2-10.

Then, a resist mask was formed using photolithography technique for simultaneously forming a p-side electrode exposed part on the p-side electrode 27 made of Ni—Au, forming an n-side current injection region (36) on the n-side contact layer 24c and removing portion of an insulating layer present on the sidewall of the undoped buffer layer within the light-emitting-device separation-trench. Next, a hydrofluoric acid containing etchant was used to remove the dielectric multilayer film (the insulating layer) which was not covered by the resist mask. Further, by the effect of side etching by hydrofluoric acid, the dielectric multilayer film (insulating layer) on the part of the sidewall of the undoped buffer layer 22 was also removed. Here, the periphery of the p-side electrode 27 was covered by the insulating layer consisting of SiN$_x$ and SiO$_x$ to 150 μm.

Subsequently, the used unnecessary resist mask was removed by acetone and by ashing with oxygen plasma by RIE. Again, since Au was exposed in the p-side electrode surface, it was not deteriorated at all after the SiN$_x$ deposition process by p-CVD. The structure manufactured so far substantially corresponds to FIG. 2-12.

Next, for forming an n-side electrode 28, photolithography was used to prepare for patterning an n-side electrode by lift-off technique and a resist pattern was formed. Here, Ti (thickness: 20 nm)/Al (thickness: 300 nm) was deposited over the whole wafer surface by vacuum evaporation as an n-side electrode, and an unnecessary part was removed in acetone by lift-off technique. Then, after heating, an n-side electrode was prepared. The n-side electrode was formed such that its periphery contacted the insulating layer by 30 µm for having an area larger than the n-side current injection region and such that it did not overlap the p-side electrode 27, considering facilitation of flip chip bonding using a metal solder and heat dissipating properties. In another manufacturing example, it was formed so as to contact by 10 µm, and a light-emitting-device exhibiting performance comparable to this example was manufactured. An Al electrode tends to be deteriorated during, for example, a plasma process and is etched by, for example, hydrofluoric acid, but since the n-side electrode was formed in the final step of the device manufacturing process, it was not damaged at all. The structure manufactured so far substantially corresponds to FIG. 2-14.

Then, on the rear surface of the sapphire substrate was formed a low-reflecting optical film 45 made of $MgF_2$ by vacuum evaporation. Here, $MgF_2$ was deposited to ¼ of an optical film thickness, giving a low-reflecting coating to an emission wavelength of the device.

Next, for dividing the individual light-emitting-devices formed over the wafer, a scribe line was formed from the thin-film crystal growth side in the inside of the light-emitting-device separation-trench 13 using a laser scriber. Then, along this scribe line, only the sapphire substrate and the $MgF_2$ low-reflecting optical film were broken to provide individual compound semiconductor light-emitting-devices. Here, no damages were introduced to the thin-film crystal layer and detachment of the dielectric film did not occur.

Then, this device was bonded to the metal layer 41 in the submount 40 using a metal solder 42, to provide the light-emitting-device shown in FIG. 1-15. Here, no defects such as unintended short circuit occurred in the device.

Examples B-2

The procedure in Example B-1 was repeated, except that after depositing the optical coupling layer 23, a thin-film crystal layer was deposited as described below. Specifically, an undoped GaN was formed at 1035° C. to a thickness of 3.5 µm as an optical coupling layer 23 as described in Example B-1, and then a Si-doped (Si concentration: $5\times10^{18}$ cm$^{-3}$) GaN layer was formed to 4 µm as a first-conductivity-type (n-type) second cladding layer 24b; a Si-doped (Si concentration: $8\times10^{18}$ cm$^{-3}$) GaN layer was formed to 0.5 µm as a first-conductivity-type (n-type) contact layer 24c; and then a Si-doped (Si concentration: $5.0\times10^{18}$ cm$^{-3}$) $Al_{0.10}Ga_{0.90}N$ layer was formed to 0.1 µm as a first-conductivity-type (n-type) first cladding layer 24a. Then, an active layer structure 25 were formed by depositing alternately undoped GaN layer to a thickness of 13 nm at 850° C. as a barrier layer and undoped $In_{0.1}Ga_{0.9}N$ layer to a thickness of 2 nm at 720° C. as a quantum well layer such that eight quantum well layers were formed in total and both sides were the barrier layers. Then, after increasing a growth temperature to 1025° C., a Mg-doped (Mg concentration $5\times10^{19}$ cm$^{-3}$) $Al_{0.10}Ga_{0.90}N$ was formed to 0.1 µm as a second-conductivity-type (p-type) first cladding layer 26a. Subsequently, a Mg-doped (Mg concentration: $5\times10^{19}$ cm$^{-3}$) GaN was formed to 0.07 µm as a second-conductivity-type (p-type) second cladding layer 26b. Finally, a Mg-doped (Mg concentration: $1\times10^{20}$ cm$^{-3}$) GaN was formed to 0.03 µm as a second-conductivity-type (p-type) contact layer 26c. The subsequent process was conducted as described in Example B-1, to provide the light-emitting-device shown in FIG. 2-15. Here, no defects such as unintended short circuit occurred in the device.

In the processes in Examples B-1 and 2, the $SiN_x$ mask was removed after the first etching step, but the $SiN_x$ mask may not be removed and can be removed after the second etching step. Alternatively it can be removed after the third etching step, which is also preferable.

Furthermore, the light-emitting-device shown in FIG. 2-20 can be manufactured (wherein the insulating film is a multi-layer dielectric film) by stopping etching in the third etching step in the intermediate portion of the buffer layer. In this case, the light-emitting-device shown in FIG. 2-19 can be manufactured by providing an appropriate etching mask shape using photolithography suitable for a predetermined shape and the side etching is not conducted.

Furthermore, by stopping etching in the second etching step in the intermediate portion of the optical coupling layer, the light-emitting-device shown in FIG. 2-18 can be manufactured. In this case, the light-emitting-device shown in FIG. 2-17 can be manufactured by providing an appropriate etching mask shape using photolithography suitable for a predetermined shape and the side etching is not conducted.

Example B-3

The light-emitting-device shown in FIG. 2-16 was manufactured as follows.

First was prepared a c+ plane sapphire substrate 21 with a thickness of 430 µm, on which an undoped GaN layer with a thickness of 20 nm was formed by growing at a low temperature by MOCVD as a first buffer layer 22a and then an undoped GaN layer with a thickness of 1 µm was formed at 1040° C. as a second buffer layer 22b.

As the optical coupling layer 23, an undoped GaN layer was formed to 2 µm, which, in its center, includes a stacked structure consisting of ten undoped $In_{0.05}Ga_{0.95}N$ layers each having a thickness of 3 nm and ten undoped GaN layers each having a thickness of 12 nm. Here, the undoped GaN layer and the undoped $In_{0.05}Ga_{0.95}N$ layer were grown at 850° C. and 730° C., respectively.

Then, a Si-doped (Si concentration: $1\times10^{18}$ cm$^{-3}$) GaN layer was formed to 2 µm as a first-conductivity-type (n-type) second cladding layer 24b; a Si-doped (Si concentration: $2\times10^{18}$ cm$^{-3}$) GaN layer was formed to 0.5 µm as a first-conductivity-type (n-type) contact layer 24c; and then a Si-doped (Si concentration: $1.5\times10^{18}$ cm$^{-3}$) $Al_{0.15}Ga_{0.85}N$ layer was formed to 0.1 µm as a first-conductivity-type (n-type) first cladding layer 24a.

Then, an active layer structure 25 was formed by depositing alternately undoped GaN layer to a thickness of 13 nm at 850° C. as a barrier layer and undoped $In_{0.13}Ga_{0.87}N$ layer to a thickness of 2 nm at 715° C. as a quantum well layer such that three quantum well layers were formed in total and both sides were the barrier layers.

Then, after increasing a growth temperature to 1025° C., a Mg-doped (Mg concentration $5\times10^{19}$ cm$^{-3}$) $Al_{0.15}Ga_{0.85}N$ layer was formed to 0.1 µm as a second-conductivity-type (p-type) first cladding layer 26a. Subsequently, a Mg-doped (Mg concentration: $5\times10^{19}$ cm$^{-3}$) GaN layer was formed to 0.05 µm as a second-conductivity-type (p-type) second cladding layer 26b. Finally, a Mg-doped (Mg concentration:

$1 \times 10^{20}$ cm$^{-3}$) GaN layer was formed to 0.02 μm as a second-conductivity-type (p-type) contact layer 26c.

Then, after gradually lowering the temperature of the MOCVD growth furnace, the wafer was taken out and thus thin-film crystal growth was completed.

For forming a p-side electrode 27 in the wafer after the thin-film crystal growth, photolithography was used to prepare for patterning a p-side electrode by lift-off technique and a resist pattern was formed. Here, Pd (thickness: 20 nm)/Au (thickness: 1000 nm) was deposited by vacuum evaporation as a p-side electrode, and an unnecessary part was removed in acetone by lift-off technique. Then, after heating, a p-side electrode 27 was prepared. So far, there was not a step causing a damage such as a plasma process in the p-side current injection region just under the p-side electrode.

Next, for conducting a second etching step of forming an light-emitting-unit separation-trench and a third etching step of forming a light-emitting-device separation-trench simultaneously, a SrF$_2$ mask was formed over the whole wafer surface using vacuum evaporation. Then, the SrF$_2$ film in the region where a light-emitting-unit separation-trench and a light-emitting-device separation-trench were to be formed was removed to form a separation etching mask, that is, an etching mask for conducting the second etching step and the third etching step simultaneously.

Then, as the second etching step and the third etching step conducted simultaneously, were etched the thin-film crystal layers, including the p-GaN contact layer 26c, the p-GaN second cladding layer 26b, the p-AlGaN first cladding layer 26a, the active layer structure 25 consisting of the InGaN quantum well layer and the GaN barrier layer, the n-AlGaN first cladding layer 24a, the n-GaN contact layer 24c, the n-GaN second cladding layer 24b, and a portion of the undoped InGaN/GaN optical coupling layer 23 in the part corresponding to the light-emitting-unit separation-trench and the light-emitting-device separation-trench by ICP etching using Cl$_2$ gas. During the simultaneous second and third etching step, the SrF$_2$ mask was substantially not etched. The light-emitting-unit separation-trench was formed to a width of 6 μm after this step.

After forming the light-emitting-unit separation-trench and the light-emitting-device separation-trench by the simultaneous second and third etching step, the used unnecessary SrF$_2$ mask was removed. Again, since Au was exposed in the p-side electrode surface, it was not deteriorated at all.

Subsequently, a mask for etching was formed to conduct a first etching step for exposing the first-conductivity-type contact layer as preparation before forming a first-conductivity-type-side electrode. Here, SiN$_x$ was deposited to 0.4 μm over the whole wafer surface at a substrate temperature of 400° C. by p-CVD. Here, since Au was exposed in the p-side electrode surface, it was not deteriorated at all after the SiN$_x$ deposition process by p-CVD. Then, a photolithography process was again conducted for patterning the SiN$_x$ layer to prepare a SiN$_x$ etching mask. Here, the unnecessary part in the SiN$_x$ film was etched using SF$_6$ plasma by RIE, and a part where the thin-film crystal layer was not etched in the first etching step described later was left, while the SiN$_x$ film was removed in the part corresponding to the part of the thin-film crystal layer to be etched.

Next, as the first etching step, ICP plasma etching was conducted using Cl$_2$ gas for etching through the p-GaN contact layer 26c, the p-GaN second cladding layer 26b, the p-AlGaN first cladding layer 26a, the active layer structure 25 consisting of an InGaN quantum well layer and a GaN barrier layer and the n-AlGaN first cladding layer 24a to the intermediate portion of the n-GaN contact layer 24c, to expose the n-type contact layer which was to be an injection part for n-type carriers and simultaneously to form shape of a plurality of light-emitting-points.

After the ICP plasma etching, the SiN$_x$ mask was completely removed by RIE using SF$_6$ gas. Again, since Au was exposed in the p-side electrode surface, it was not deteriorated at all after the process.

Then, SiN$_x$ was formed over the whole wafer surface to 125 nm thickness as an insulating layer 30 by p-CVD. Next, for simultaneously forming a p-side electrode exposed part on the p-side electrode 27 made of Pd—Au, forming an n-side current injection region on the n-side contact layer and removing portion of an insulating layer present in the light-emitting-device separation-trench, first, a resist mask was formed by photolithography, and then, the insulating layer in the part which was not covered by a resist mask was removed using RIE plasma of SF$_6$ gas, so that formation of a p-side electrode exposed part and an n-side current injection region and removal of a portion of an insulating layer present in the light-emitting-device separation-trench are conducted. Here, the periphery of the p-side electrode was covered by the SiN$_x$ insulating layer. Furthermore, for example, the sidewall of the thin-film crystal layer was covered by an insulating layer, except the n-side current injection region. Further, as described in Examples B-1 and 2, the light-emitting-device shown in FIG. 2-18 (FIG. 2-16 represents this configuration) can be manufactured by providing an appropriate etching mask shape using photolithography suitable for a predetermined shape and allowing side etching of the insulating layer to proceed. Also, the light-emitting-device shown in FIG. 2-17 can be manufactured by providing an appropriate etching mask shape using photolithography suitable for a predetermined shape and the side etching of the insulating layer is not conducted. In addition, the removal of the insulating layer was performed such that the number and area of the n-side current injection region were less and smaller than the number and area of the p-side current injection region, respectively in one light-emitting-unit.

Subsequently, the unnecessary resist mask was removed by acetone and by ashing with oxygen plasma by RIE. Again, since Au was exposed in the p-side electrode surface, it was not deteriorated at all.

Next, for forming an n-side electrode 28, photolithography was used to prepare for patterning an n-side electrode by lift-off technique and a resist pattern was formed. In this case, the patterning was performed such that the number and area of the n-side electrode are less and smaller than the number or area of the p-side electrode, respectively in one light-emitting-unit. Here, Ti (thickness: 20 nm)/Al (thickness: 1500 nm) was deposited over the whole wafer surface by vacuum evaporation as an n-side electrode, and an unnecessary part was removed in acetone by lift-off technique. Then, after heating, an n-side electrode was prepared. The n-side electrode was formed such that its area was larger than the n-side current injection region and such that it does not overlap the p-side electrode, considering facilitation of flip chip bonding using a metal solder and heat dissipating properties. An Al electrode tends to be deteriorated during, for example, a plasma process and is etched by, for example, hydrofluoric acid, but since the n-side electrode was formed in the final step of the device manufacturing process, it was not damaged at all.

Then, this device was bonded to the metal layer 41 in the submount 40 using a metal solder 42, to provide a light-emitting-device. Here, no defects such as unintended short circuit occurred in the device.

Example B-4

A light-emitting-device was manufactured as described in Example B-3, except that the configurations of a substrate and thin-film crystal layers were modified as follows.

First, was prepared a c+ plane GaN substrate 21 (Si concentration: $1\times10^{17}$ cm$^{-3}$)) with a thickness of 300 μm, on which undoped GaN was first formed to 2 μm thickness at 1040° C. by MOCVD as a buffer layer 22.

As the optical coupling layer 23, an undoped GaN layer was formed to 4 μm, which, in its center, includes a stacked structure consisting of twenty undoped In$_{0.05}$Ga$_{0.95}$N layers each having a thickness of 3 nm and twenty undoped GaN layers each having a thickness of 12 nm. Here, the undoped In$_{0.05}$Ga$_{0.95}$N layer, the adjacent undoped GaN layer and the other GaN layers were grown at 730° C., 850° C. and 1035° C., respectively.

Then, a Si-doped (Si concentration: $5\times10^{18}$ cm$^{-3}$) GaN layer was formed to 4 μm as a first-conductivity-type (n-type) second cladding layer 24b; a Si-doped (Si concentration: $7\times10^{18}$ cm$^{-3}$) GaN layer was formed to 0.5 μm as a first-conductivity-type (n-type) contact layer 24c; and then a Si-doped (Si concentration: $5\times10^{18}$ cm$^{-3}$) Al$_{0.10}$Ga$_{0.90}$N layer was formed to 0.1 μm as a first-conductivity-type (n-type) first cladding layer 24a.

Then, an active layer structure 25 was formed by depositing alternately undoped GaN layer to a thickness of 13 nm at 850° C. as a barrier layer and undoped In$_{0.13}$Ga$_{0.87}$N layer to a thickness of 2 nm at 715° C. as a quantum well layer such that eight quantum well layers were formed in total and both sides were the barrier layers.

Then, after increasing a growth temperature to 1025° C., a Mg-doped (Mg concentration $5\times10^{19}$ cm$^{-3}$) Al$_{0.10}$Ga$_{0.90}$N layer was formed to 0.1 μm as a second-conductivity-type (p-type) first cladding layer 26a. Subsequently, a Mg-doped (Mg concentration: $5\times10^{19}$ cm$^{-3}$) GaN was formed to 0.05 μm as a second-conductivity-type (p-type) second cladding layer 26b. Finally, a Mg-doped (Mg concentration: $1\times10^{20}$ cm$^{-3}$) GaN was formed to 0.02 μm as a second-conductivity-type (p-type) contact layer 26c.

Then, after gradually lowering the temperature of the MOCVD growth furnace, the wafer was removed and thus thin-film crystal growth was completed.

The subsequent process was conducted as described in Example B-3 to provide a light-emitting-device. Here, no defects such as unintended short circuit occurred in the device.

In Examples B-3 and 4, the second etching step and the third etching step were conducted simultaneously and before the first etching step, but the first etching step may be conducted before the simultaneous second and third etching step. It is also preferable that without removing the SiN mask used in the first etching step, the second and third etching step is conducted.

Examples of the Invention in Relation to Section C

Example C-1

Figures 1, 2, 3, 4, 5, 6, 7, 8, 9, 10:
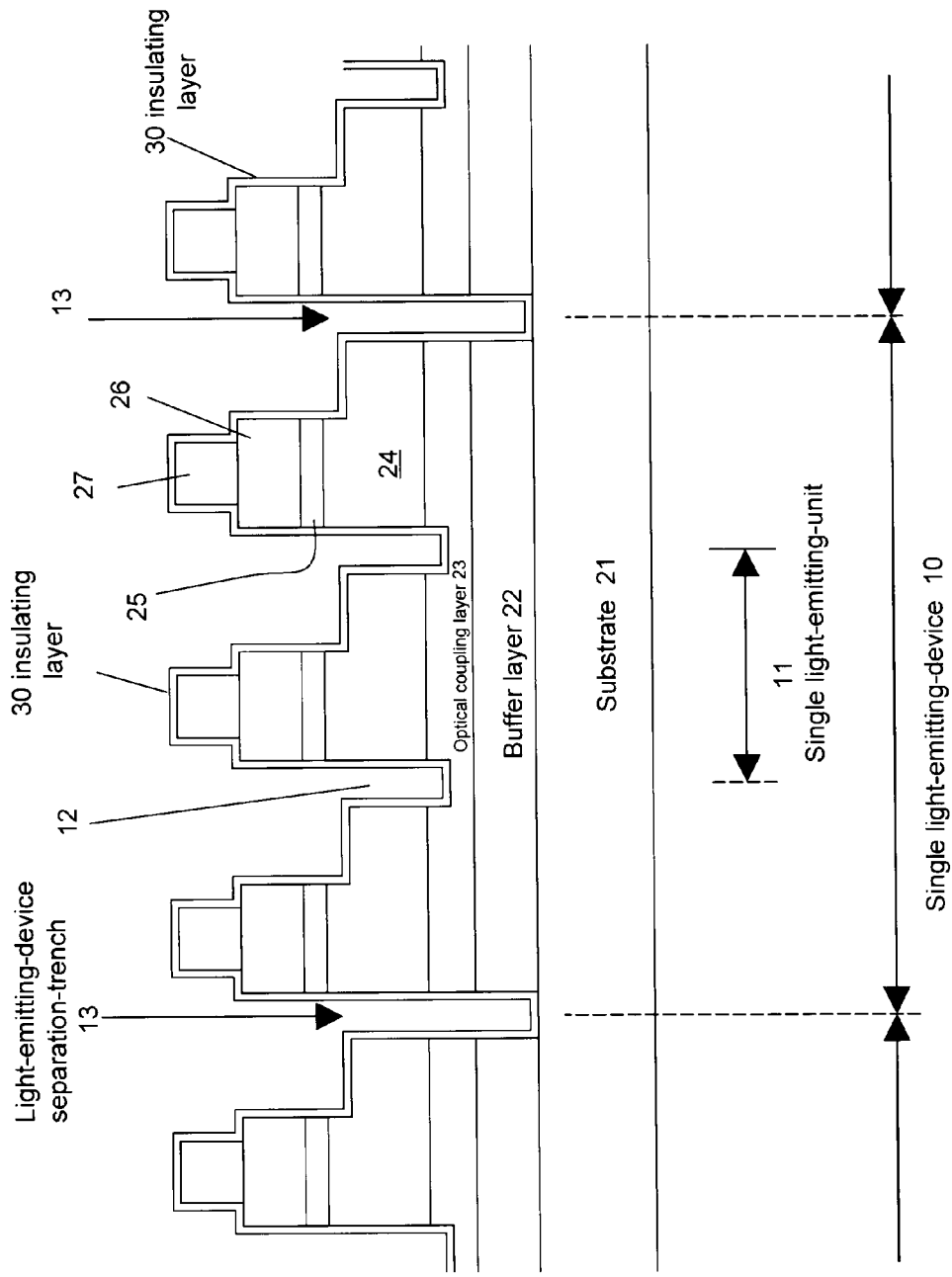
Figures 1, 2, 3, 4, 5, 6, 7, 8, 9, 10, 11:
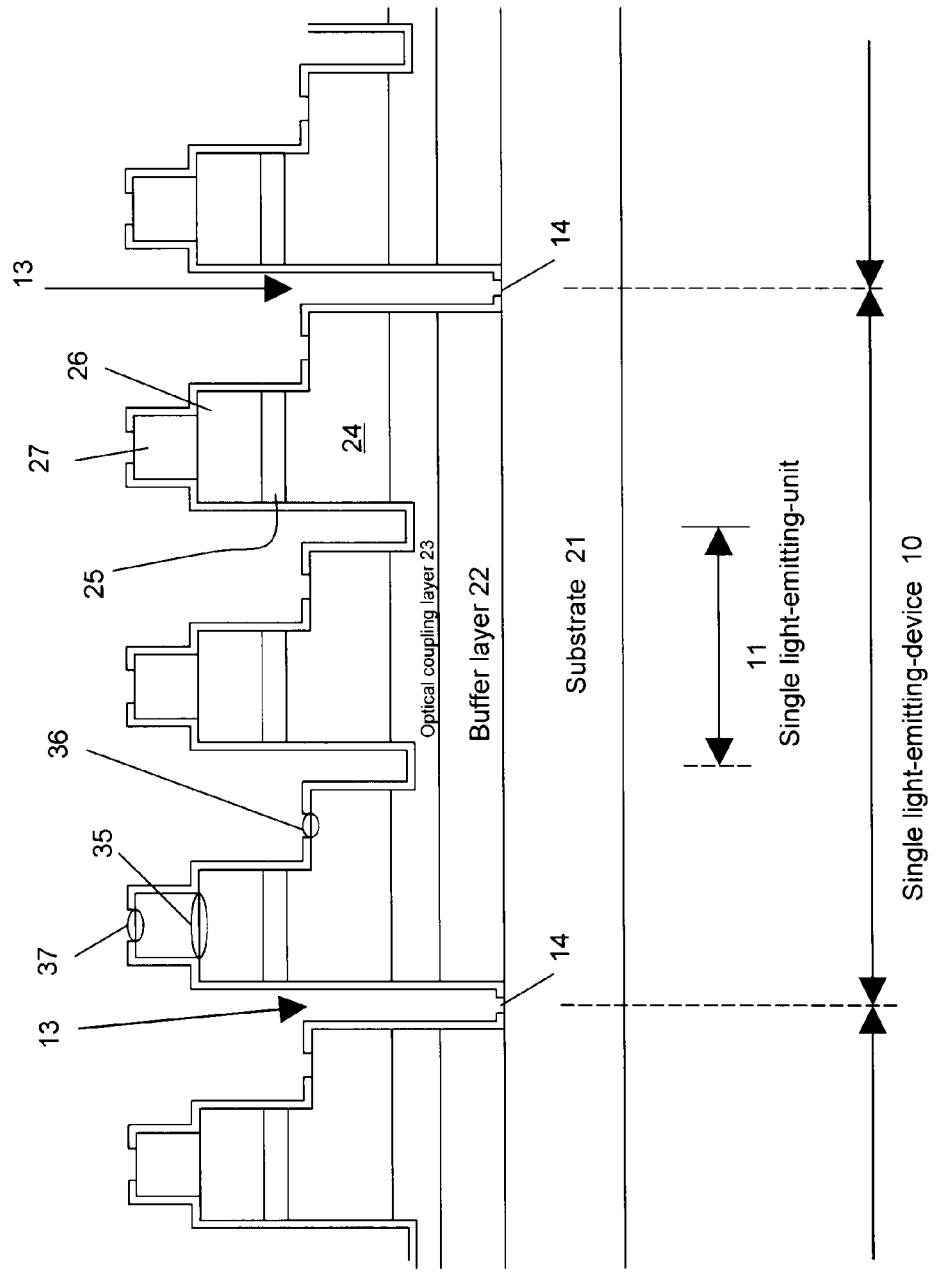
Figures 1, 2, 3, 4, 5, 6, 7, 8, 9, 10, 11, 12:
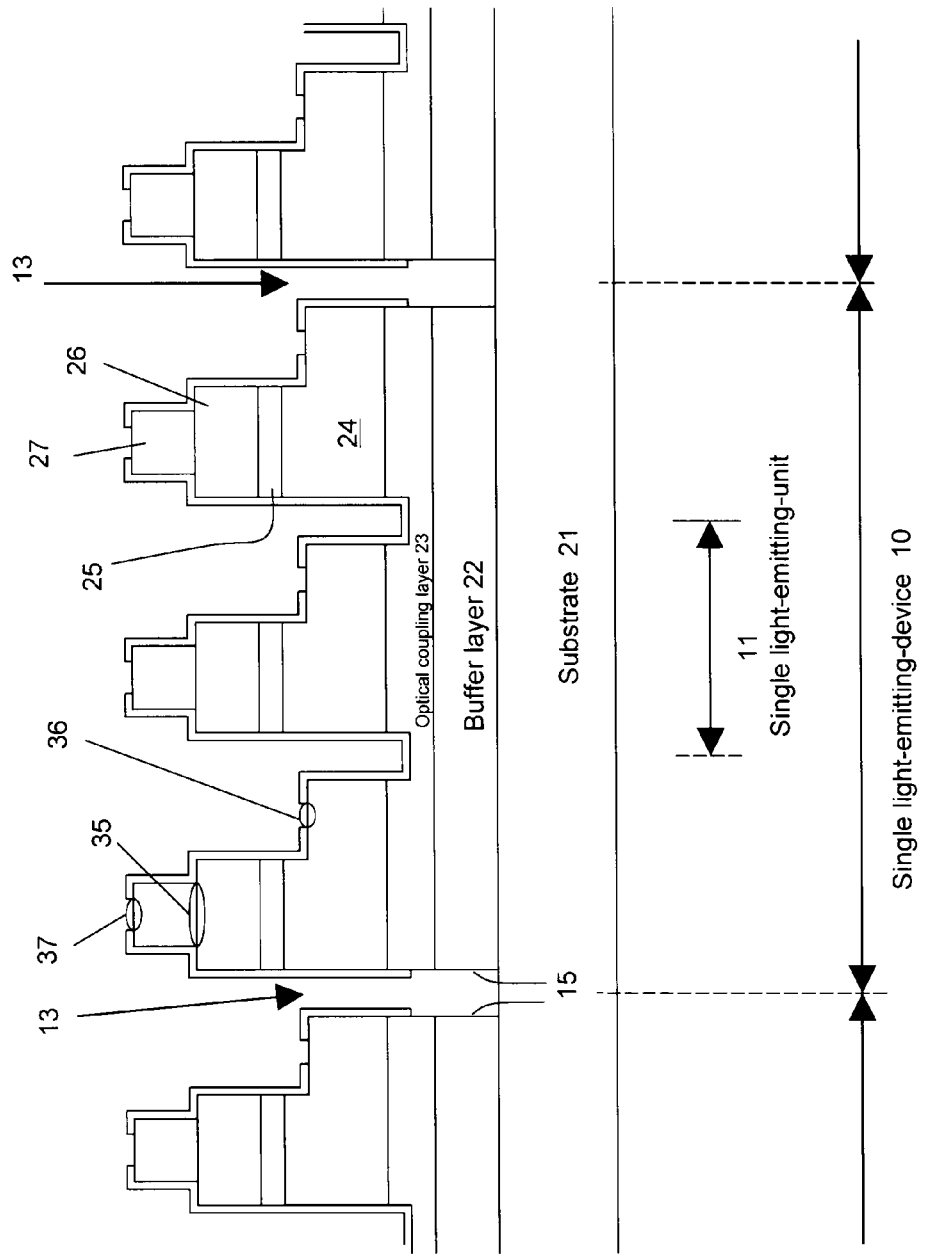
Figures 1, 2, 3, 4, 5, 6, 7, 8, 9, 10, 11, 12, 13:
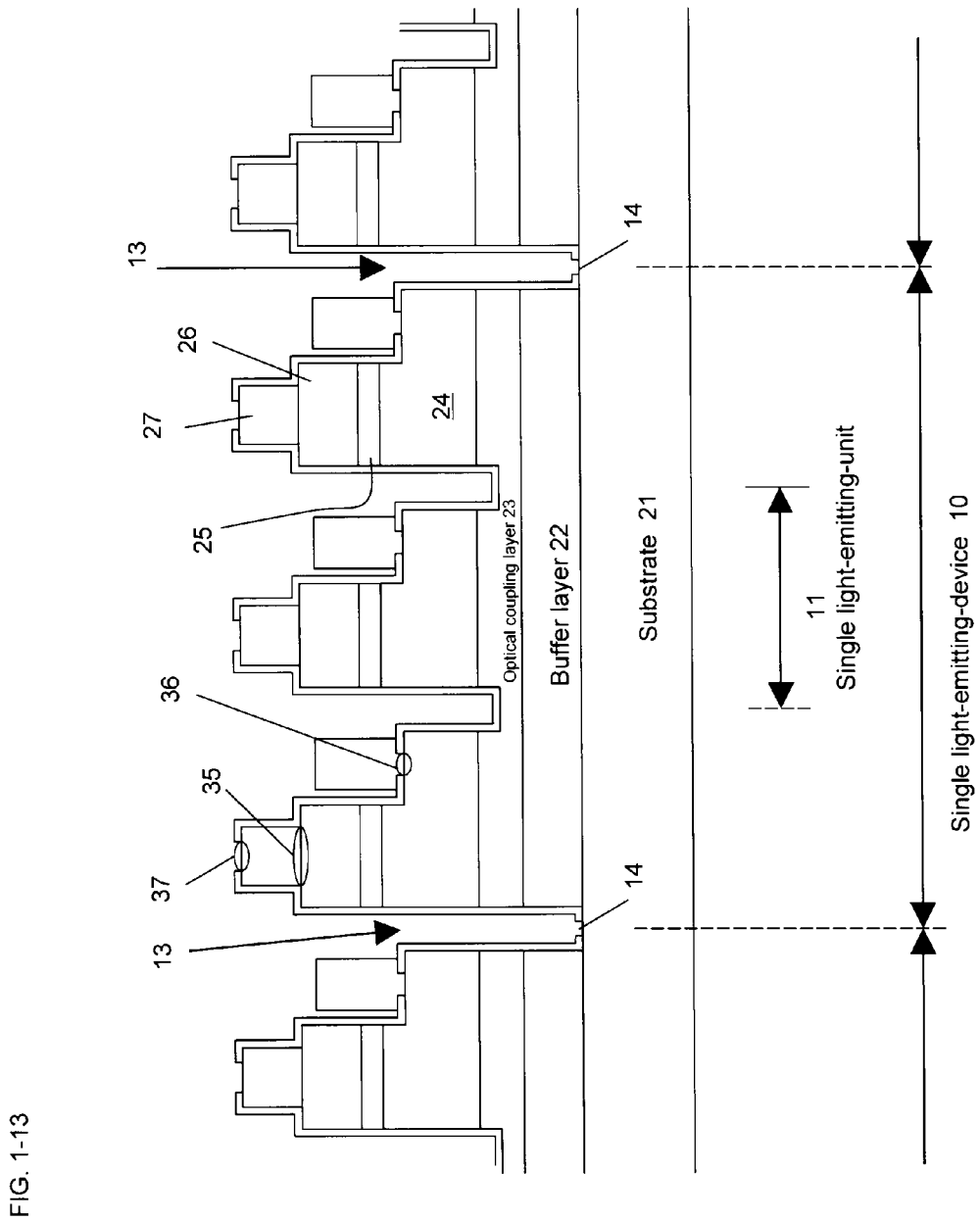
Figures 1, 2, 3, 4, 5, 6, 7, 8, 9, 10, 11, 12, 13, 14:
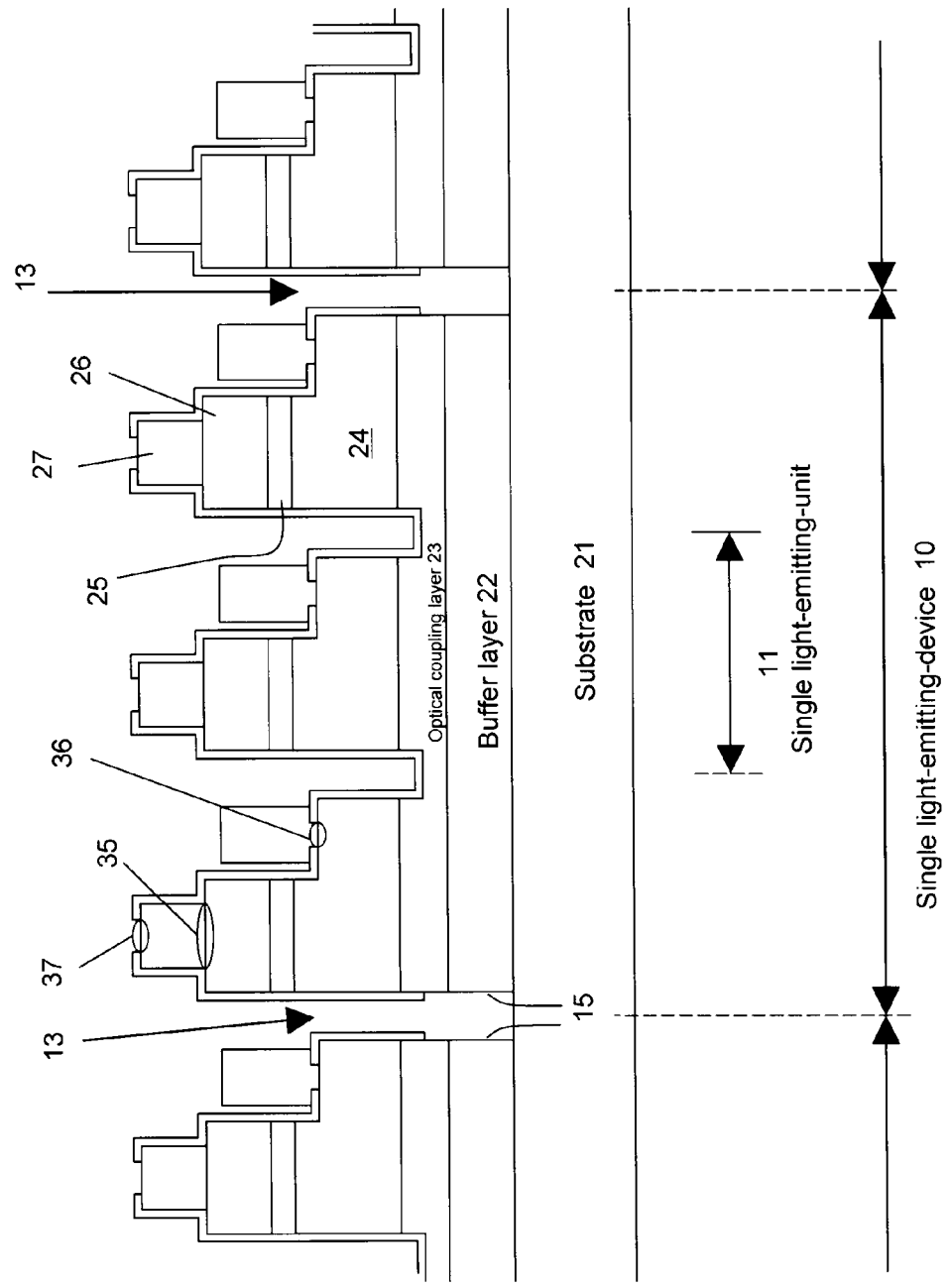
Figures 1, 2, 3, 4, 5, 6, 7, 8, 9, 10, 11, 12, 13, 14, 15:
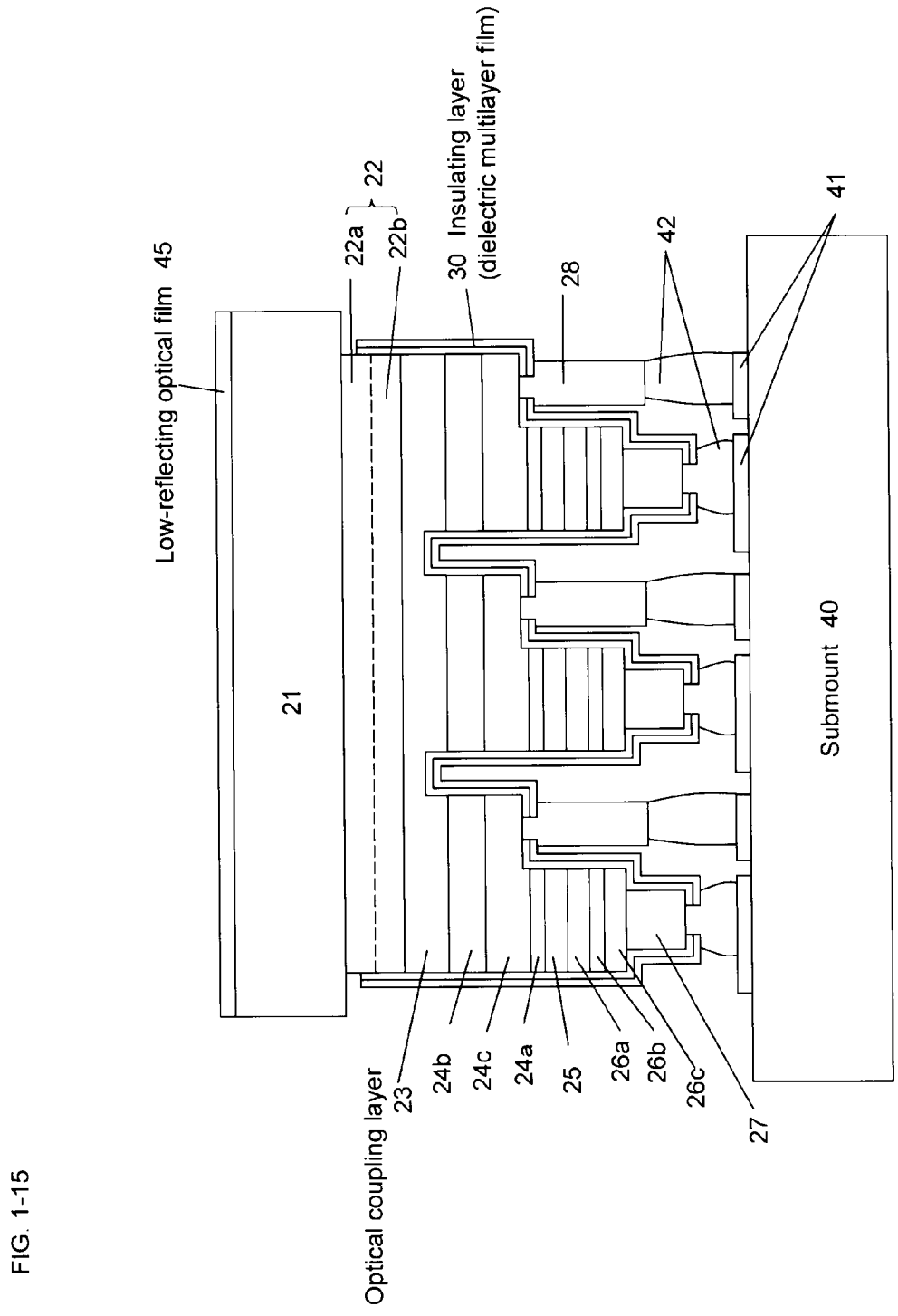
Figures 1, 2, 3, 4, 5, 6, 7, 8, 9, 10, 11, 12, 13, 14, 15, 16:
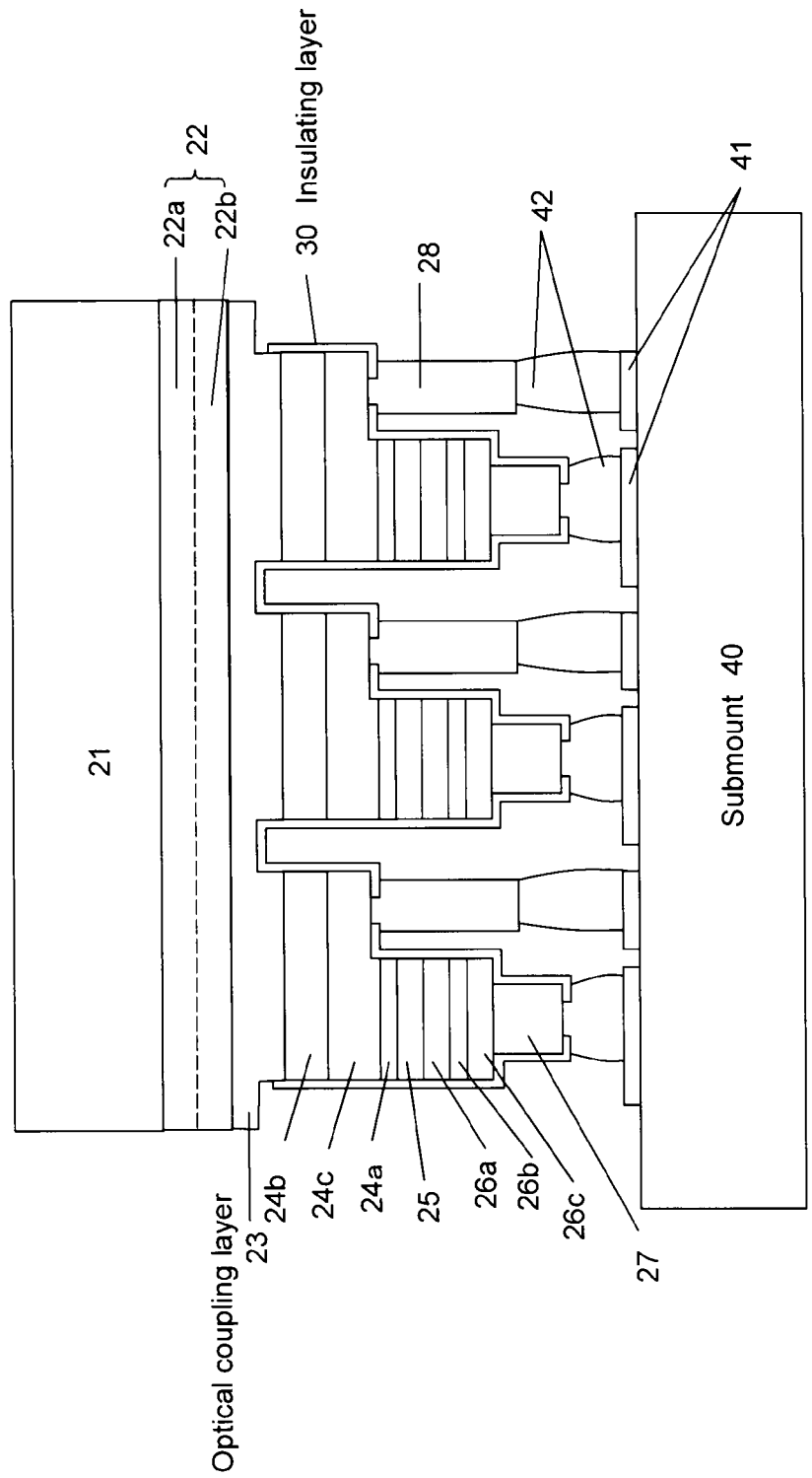
Figures 1, 2, 3, 4, 5, 6, 7, 8, 9, 10, 11, 12, 13, 14, 15, 16, 17:
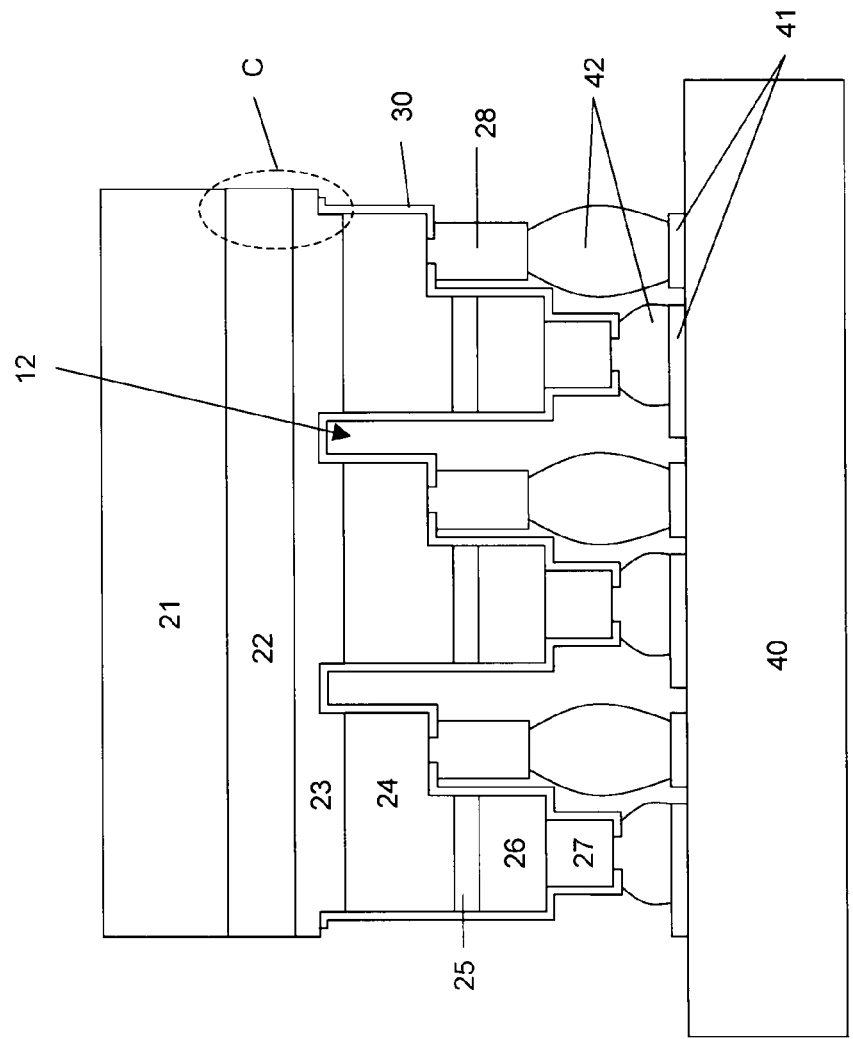
Figures 1, 2, 3, 4, 5, 6, 7, 8, 9, 10, 11, 12, 13, 14, 15, 16, 17, 18:
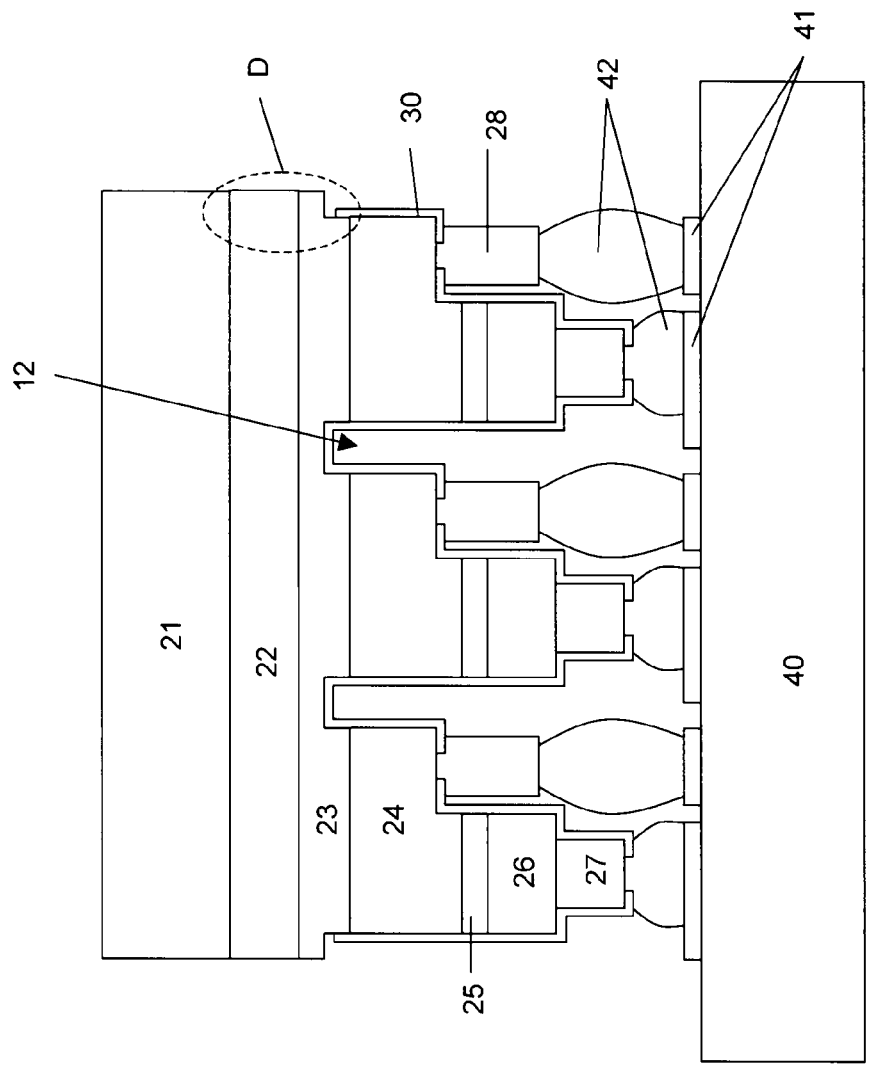
Figures 1, 2, 3, 4, 5, 6, 7, 8, 9, 10, 11, 12, 13, 14, 15, 16, 17, 18, 19:
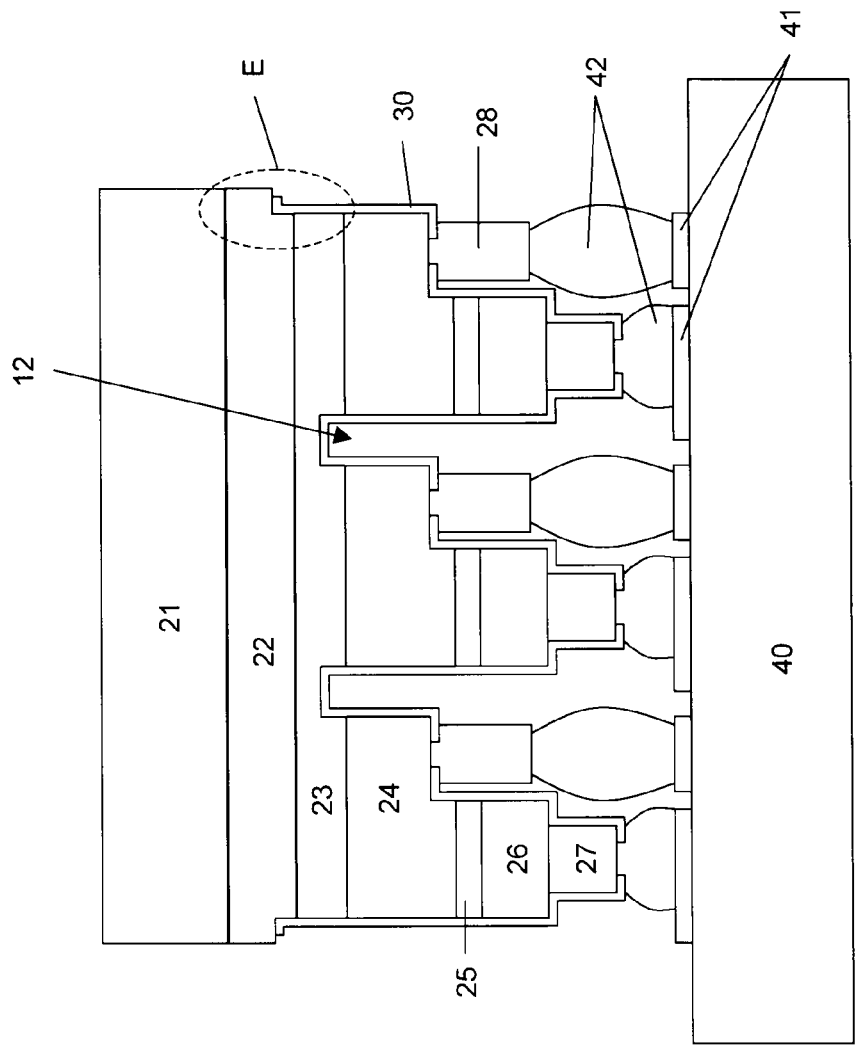
Figures 1, 2, 3, 4, 5, 6, 7, 8, 9, 10, 11, 12, 13, 14, 15, 16, 17, 18, 19, 20:
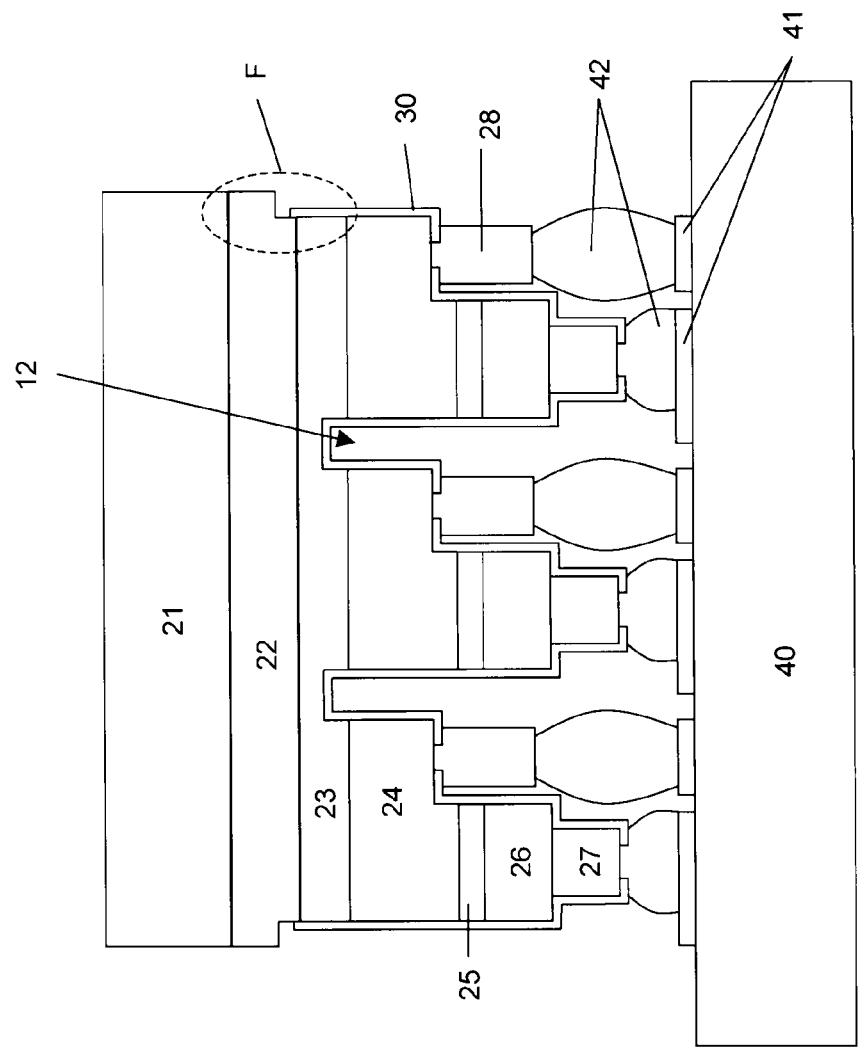
Figures 1, 2, 3, 4, 5, 6, 7, 8, 9, 10, 11, 12, 13, 14, 15, 16, 17, 18, 19, 20, 21:
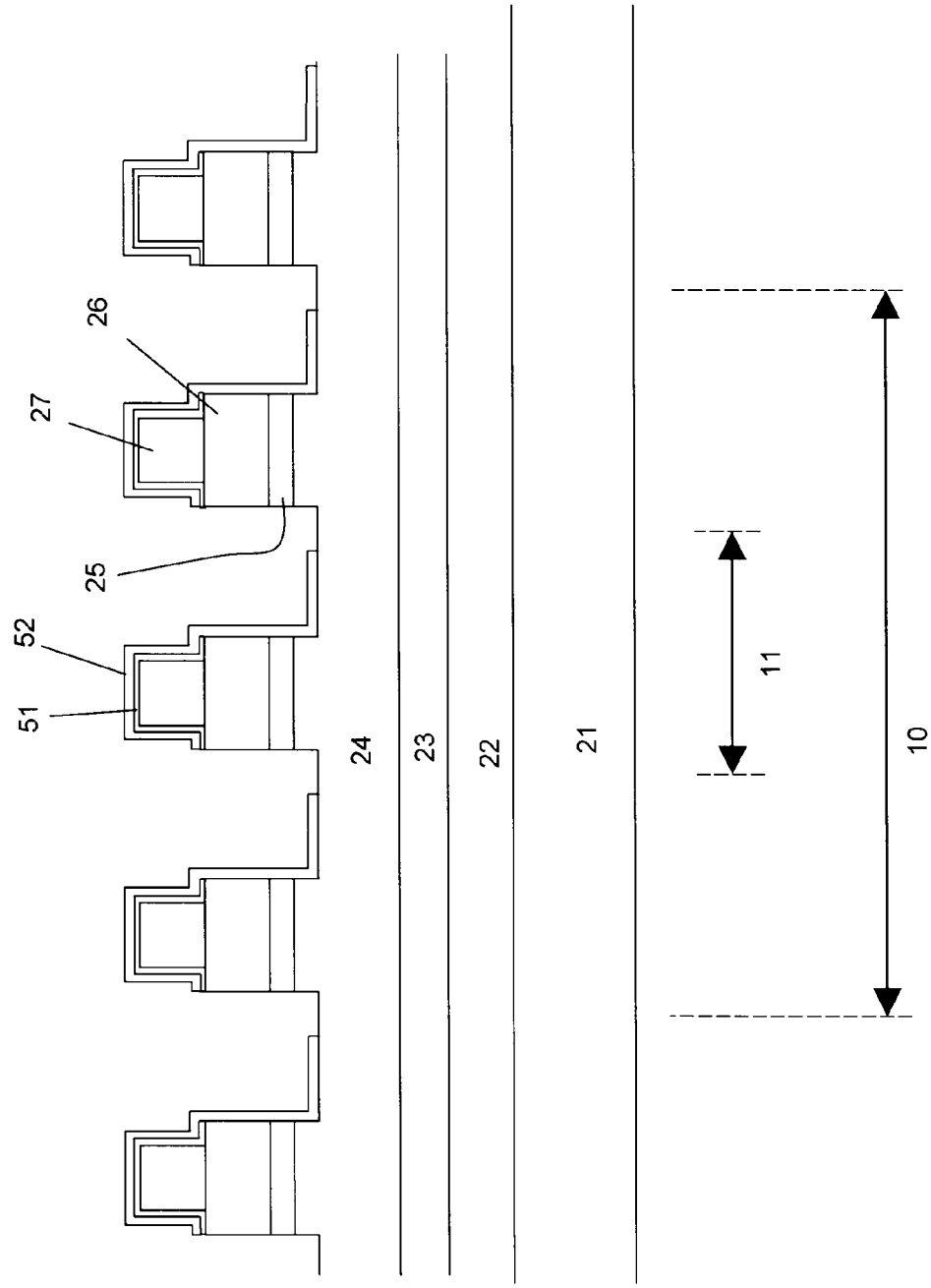
Figures 1, 2:
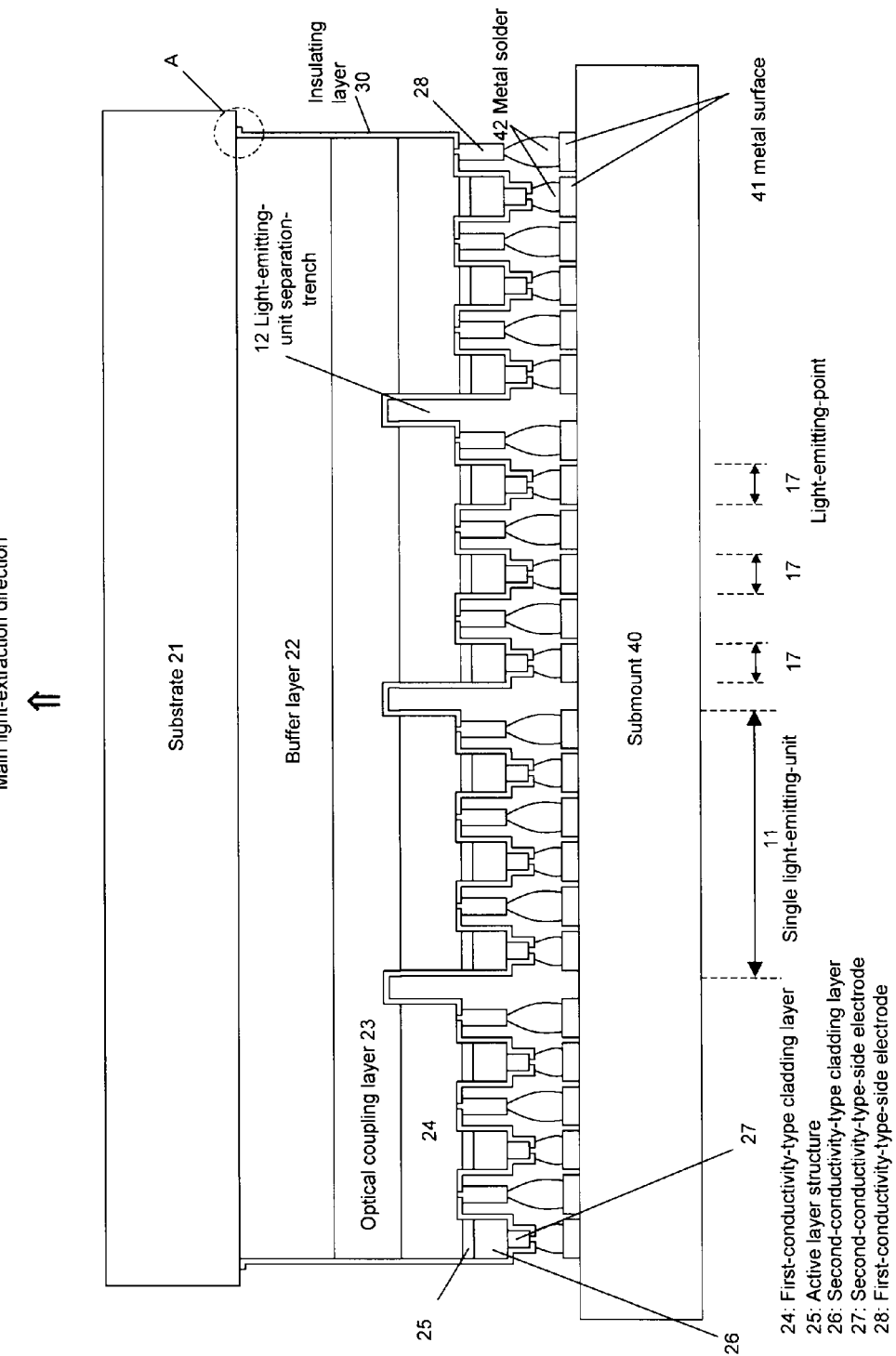
Figure 2:
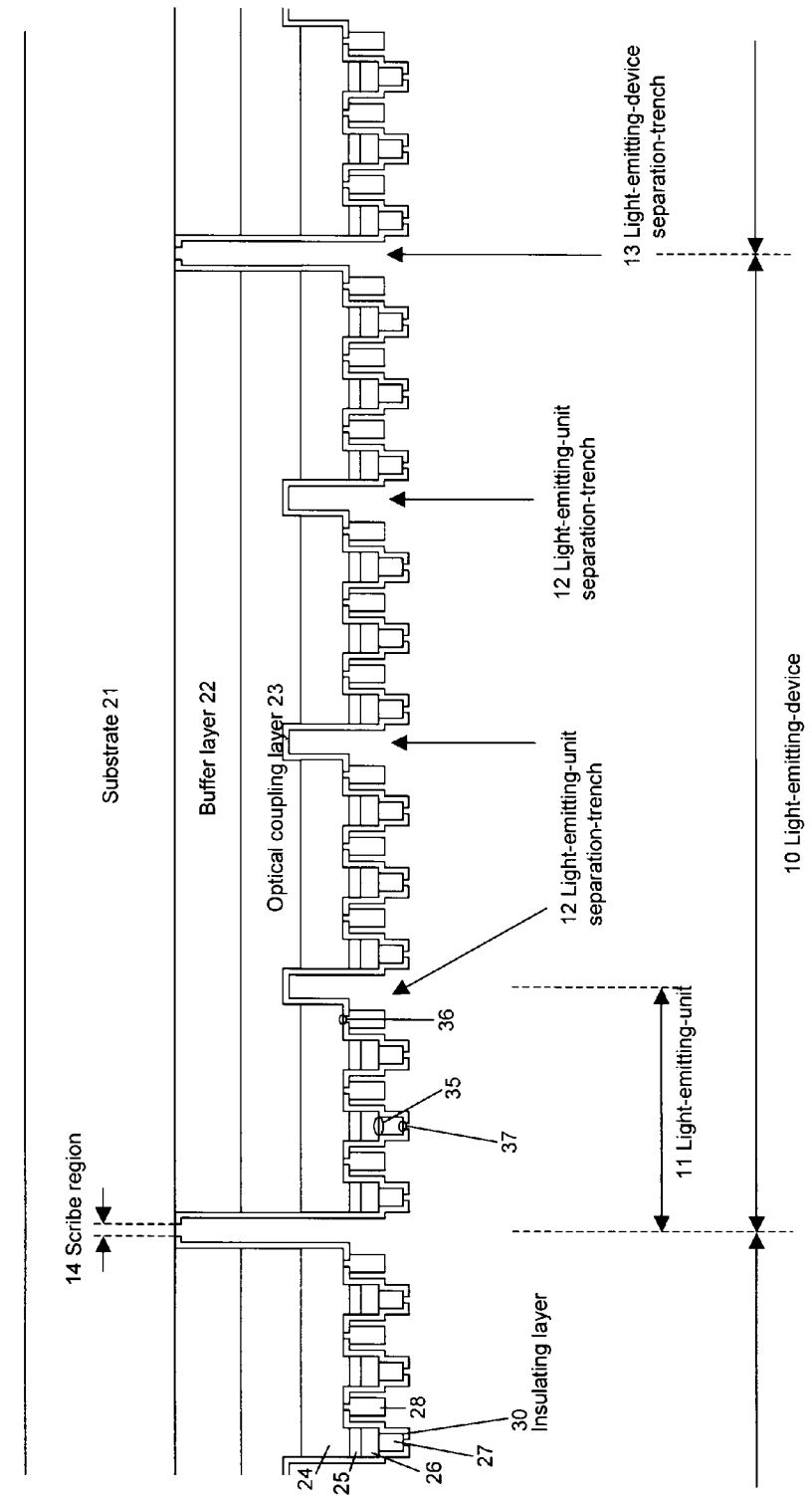
Figures 2, 3:
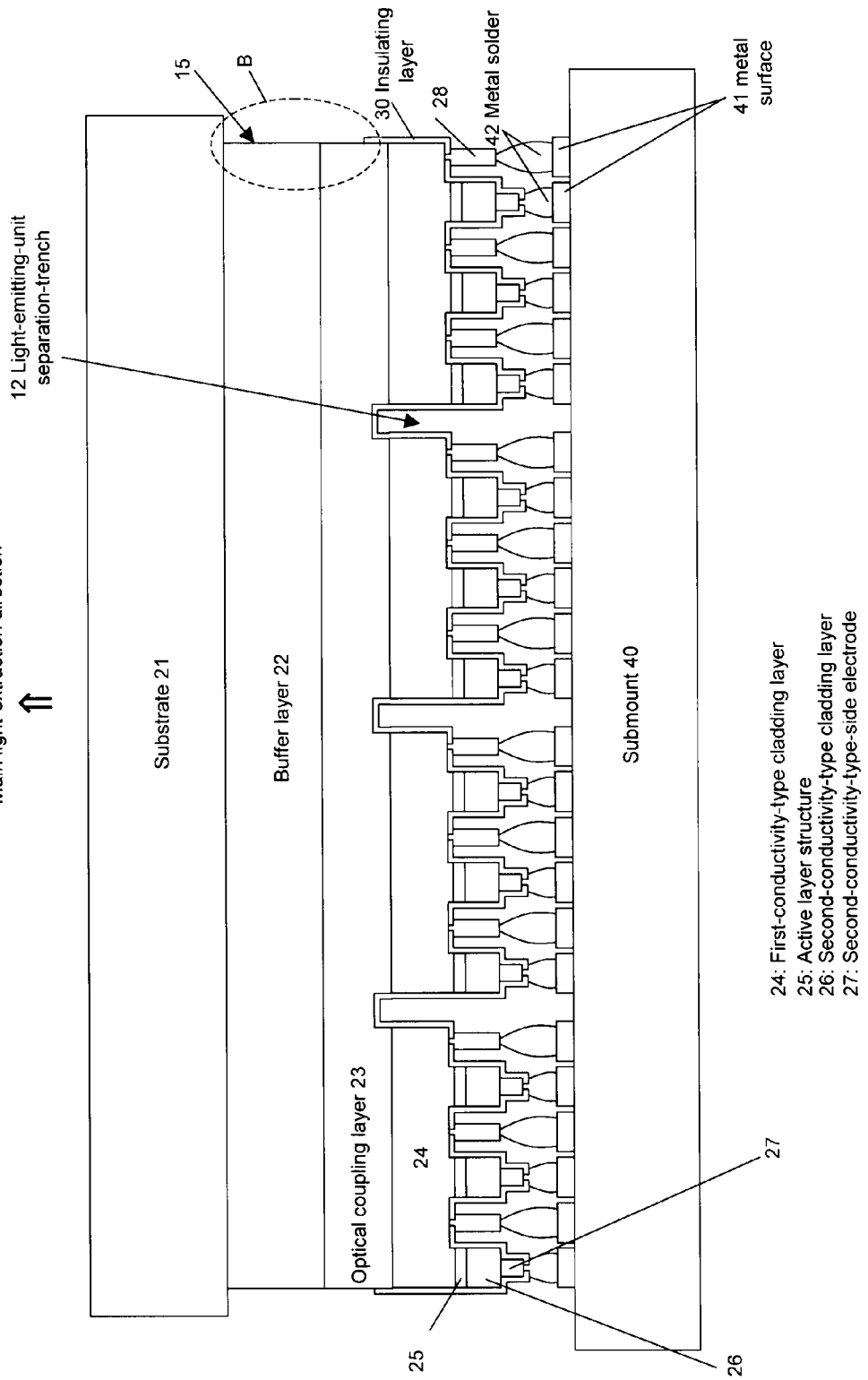
Figures 2, 3, 4:
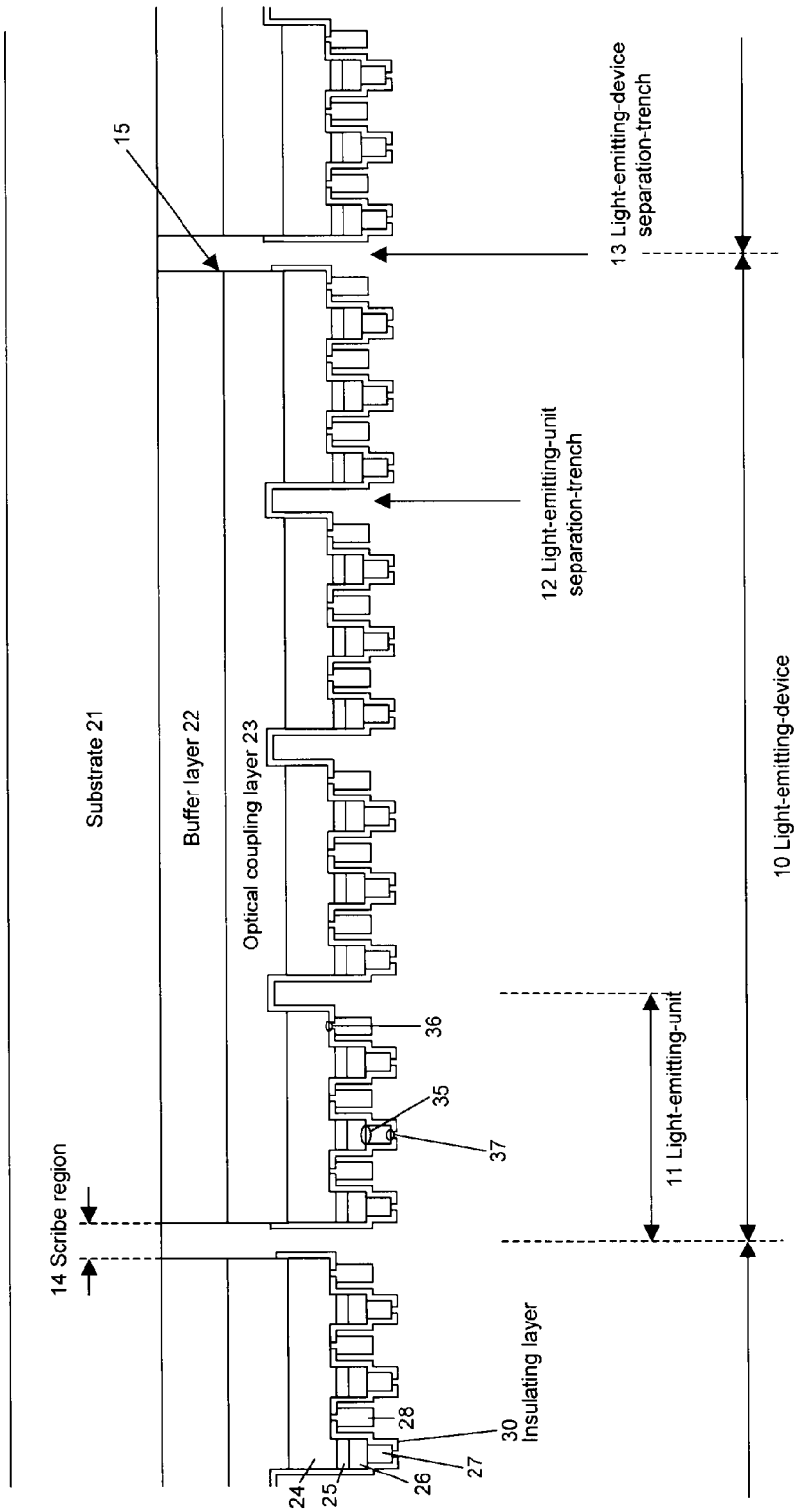
Figures 2, 3, 4, 5, 6:
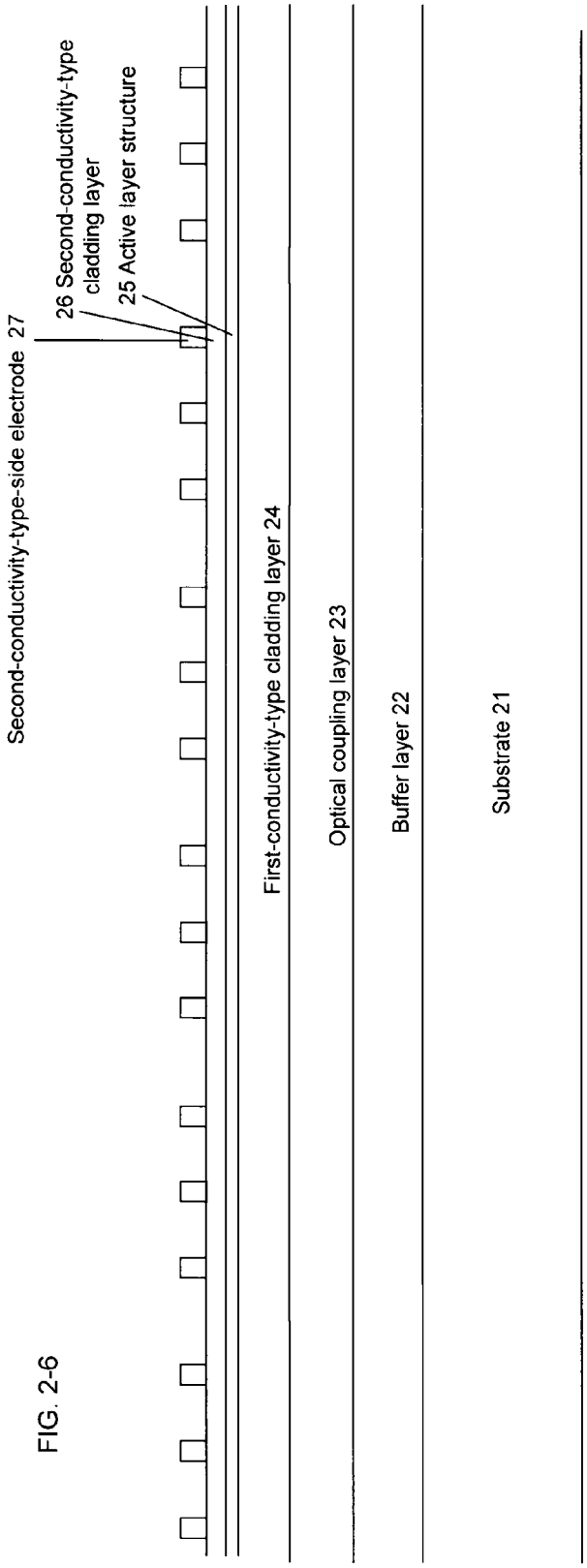
Figures 2, 3, 4, 5, 6, 7:
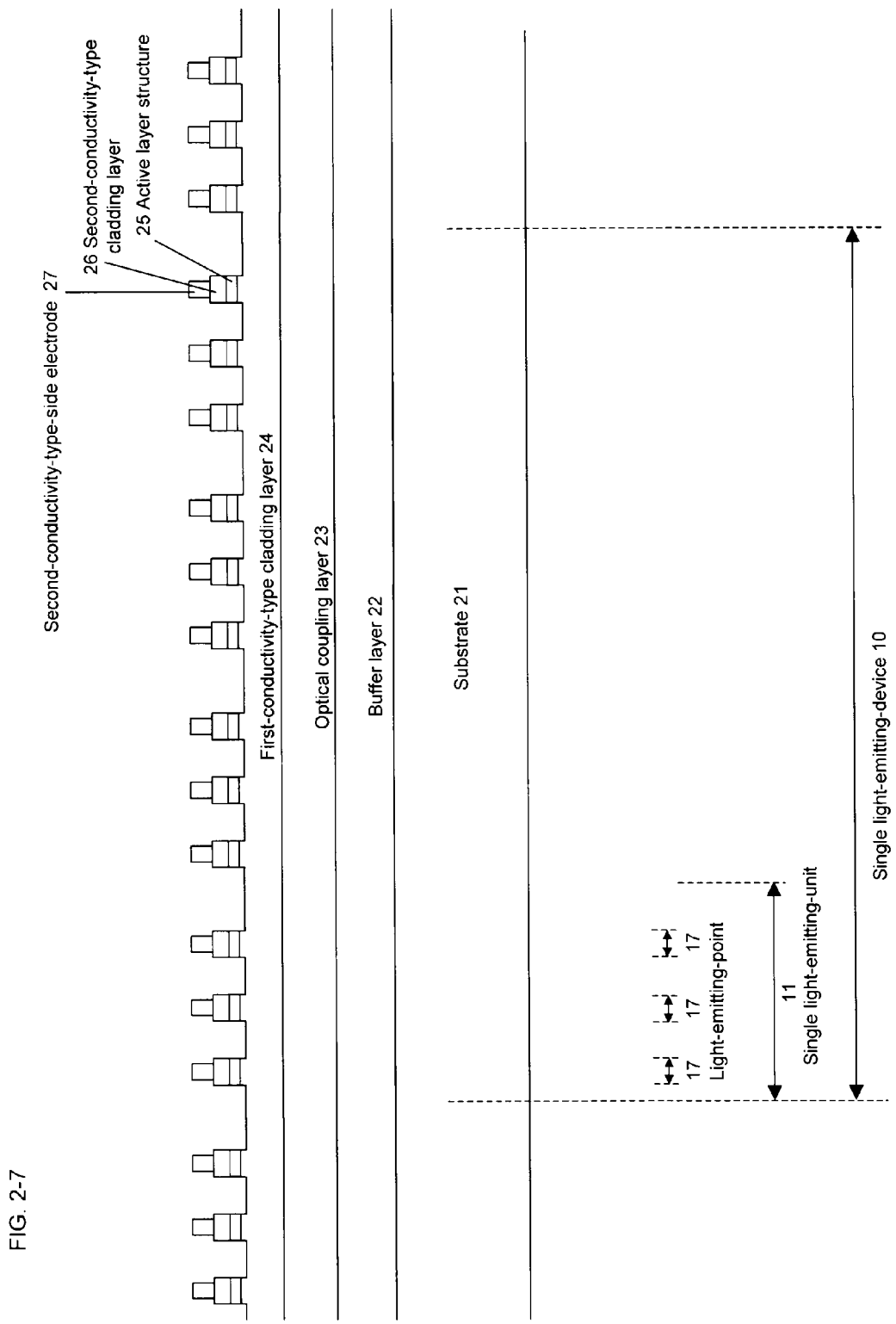
Figures 2, 3, 4, 5, 6, 7, 8:
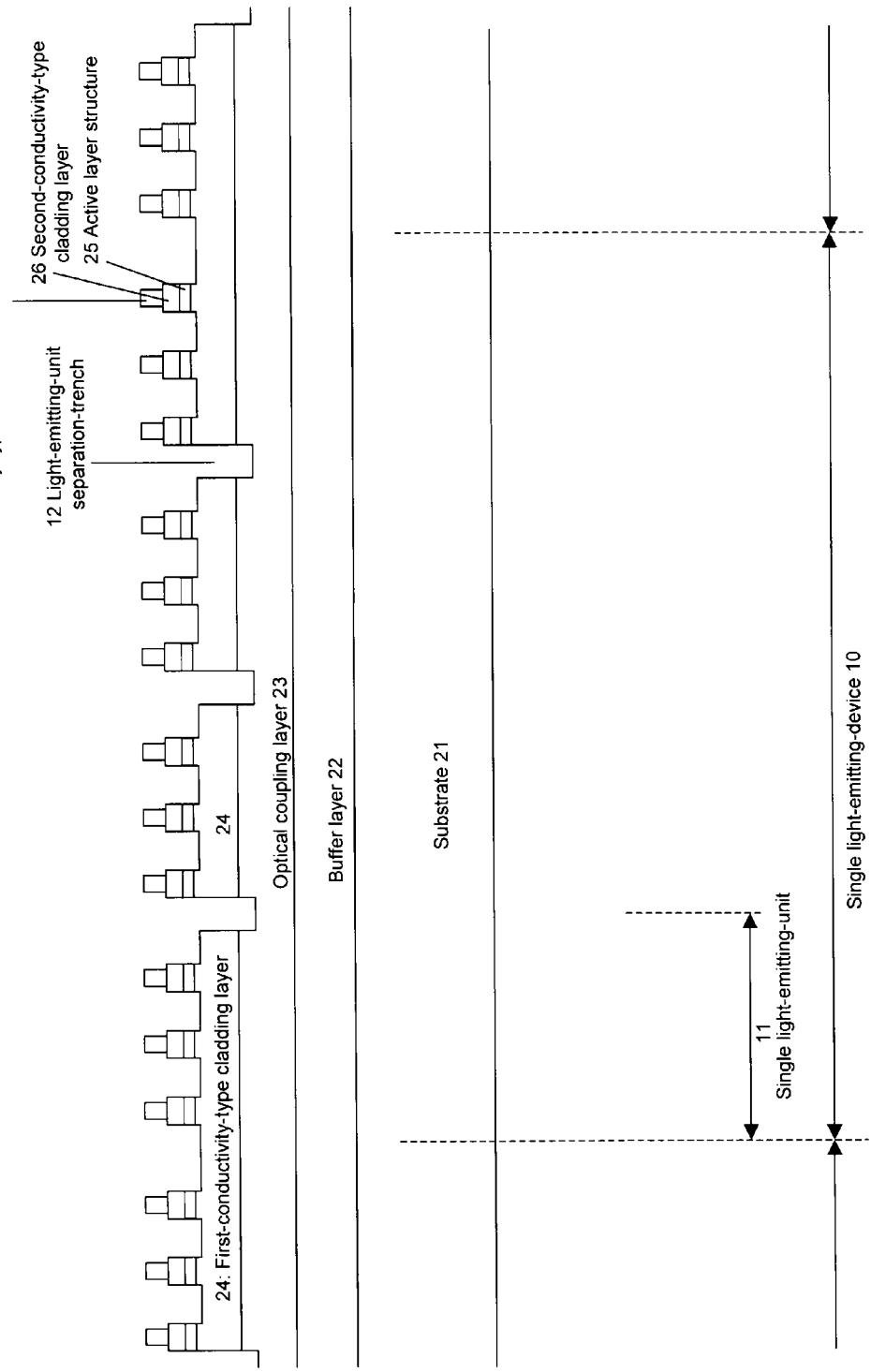
Figures 2, 3, 4, 5, 6, 7, 8, 9:
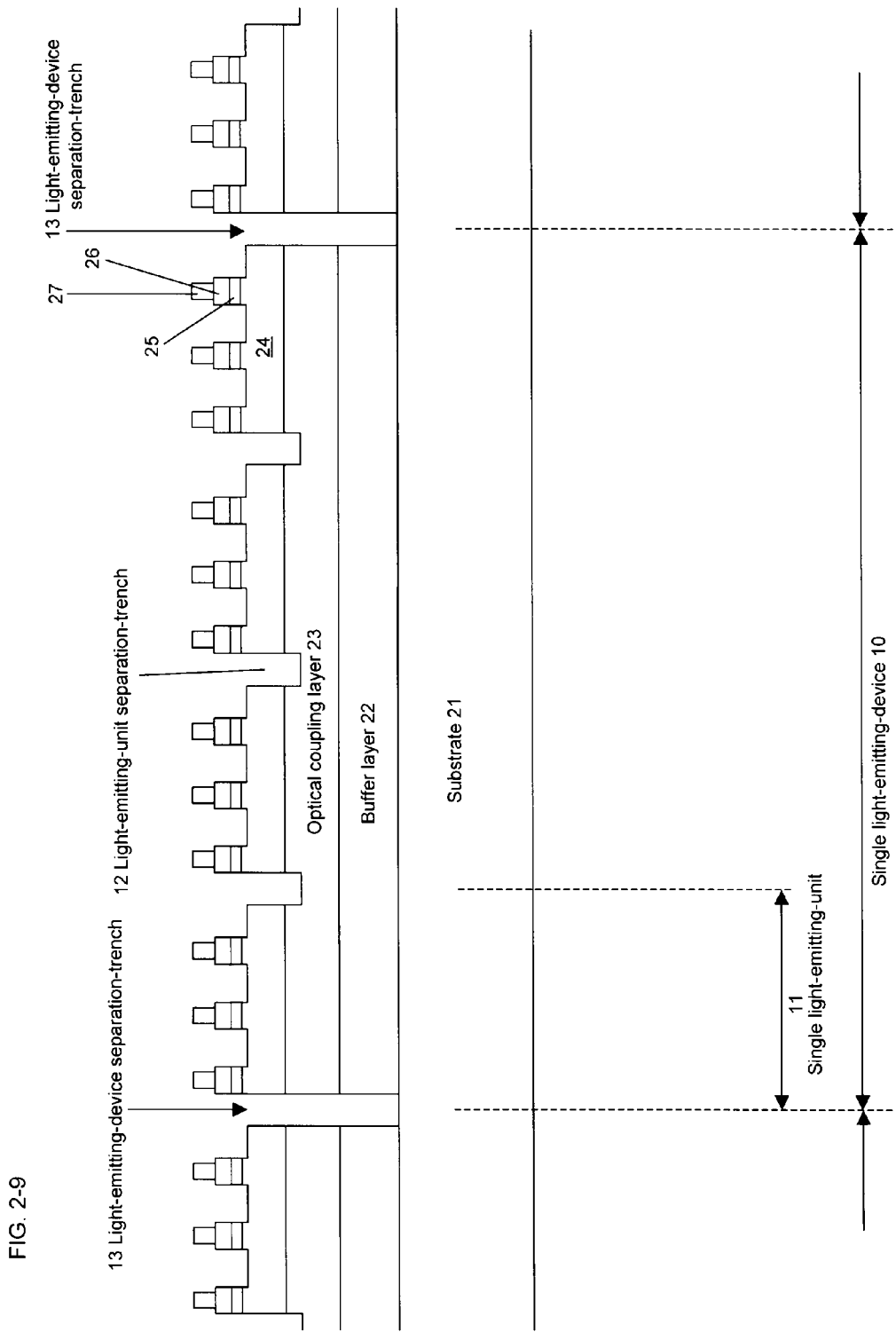
Figures 2, 3, 4, 5, 6, 7, 8, 9, 10:
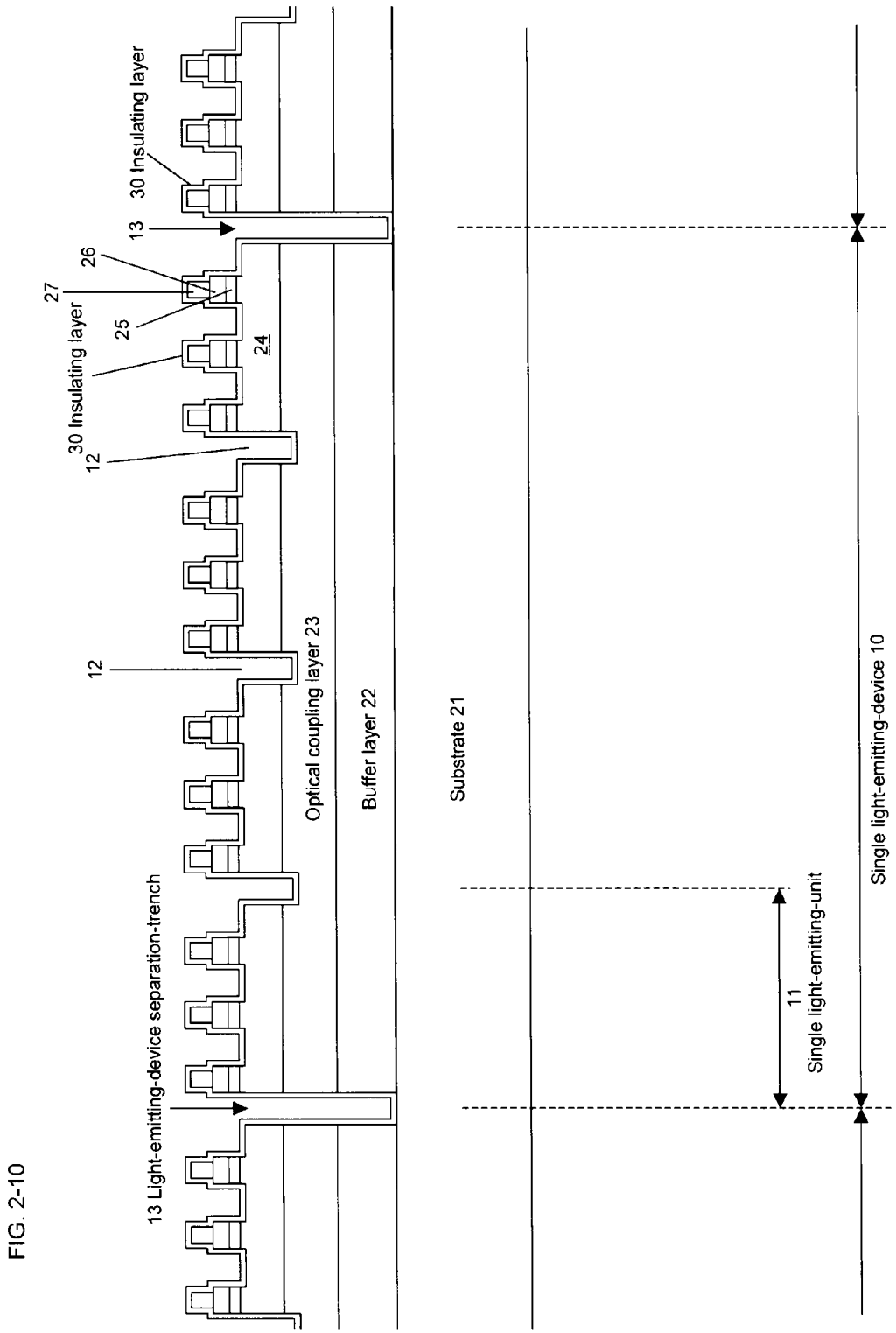
Figures 2, 3, 4, 5, 6, 7, 8, 9, 10, 11:
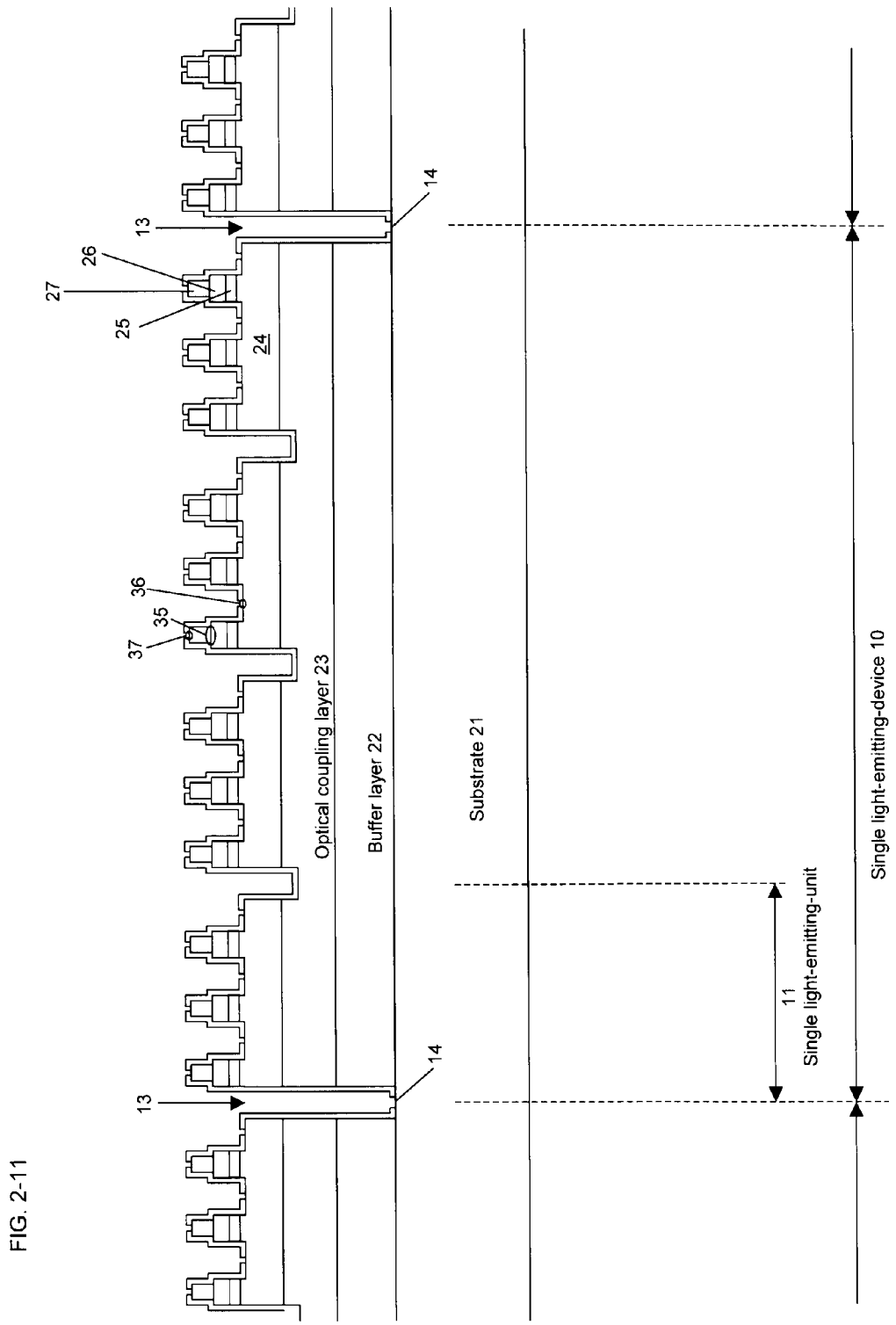
Figures 2, 3, 4, 5, 6, 7, 8, 9, 10, 11, 12:
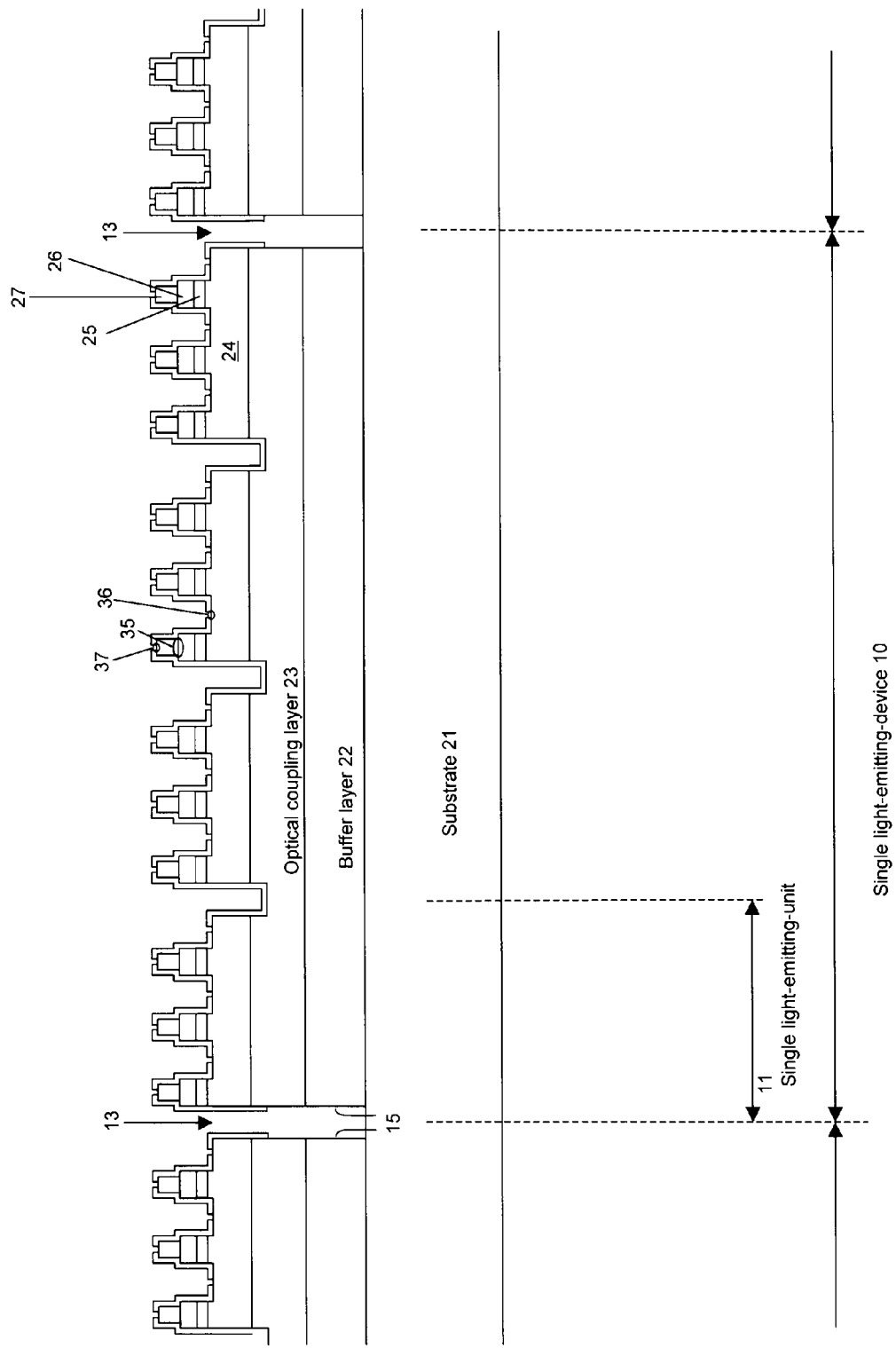
Figures 2, 3, 4, 5, 6, 7, 8, 9, 10, 11, 12, 13:
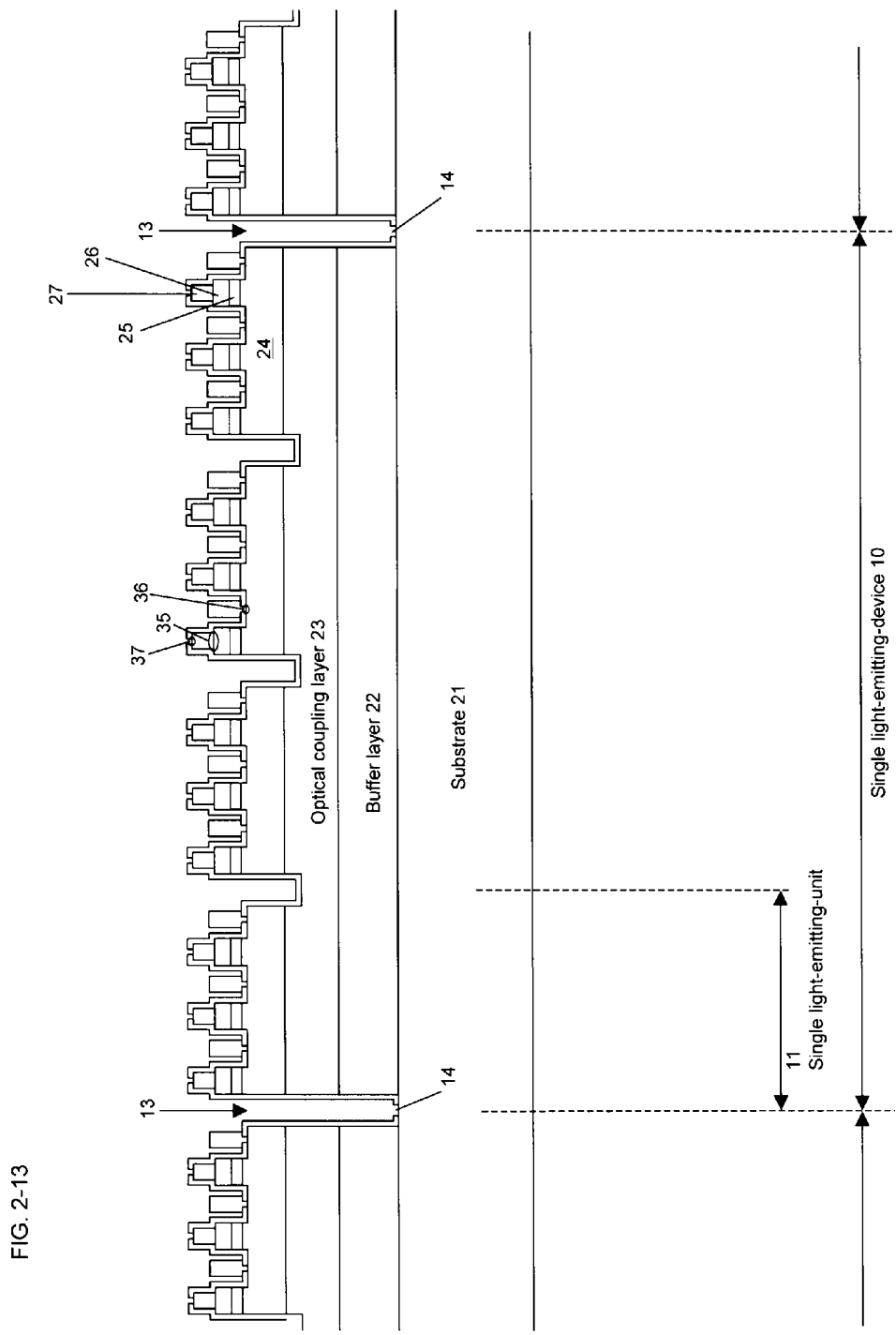
Figures 2, 3, 4, 5, 6, 7, 8, 9, 10, 11, 12, 13, 14:
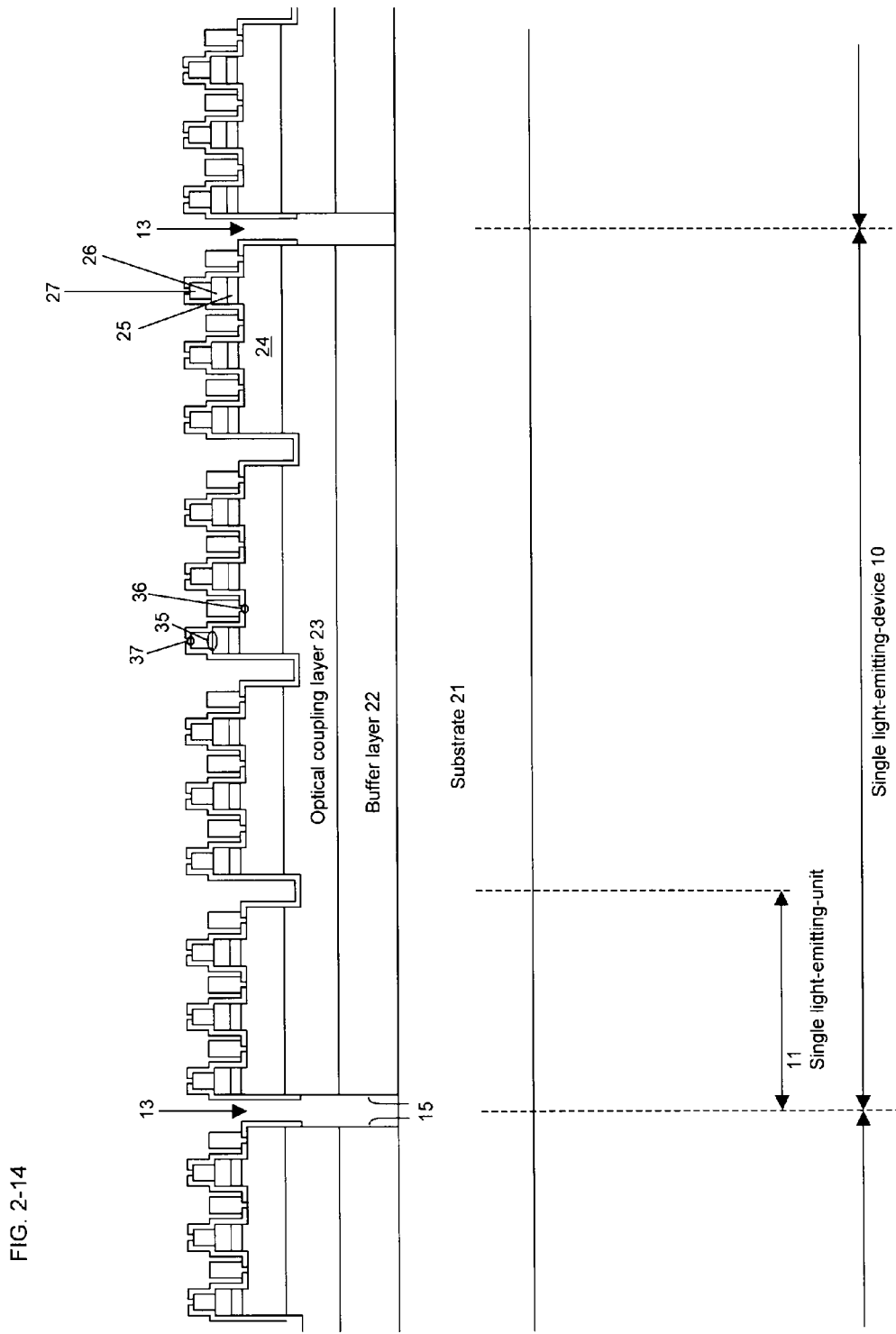
Figures 2, 3, 4, 5, 6, 7, 8, 9, 10, 11, 12, 13, 14, 15:
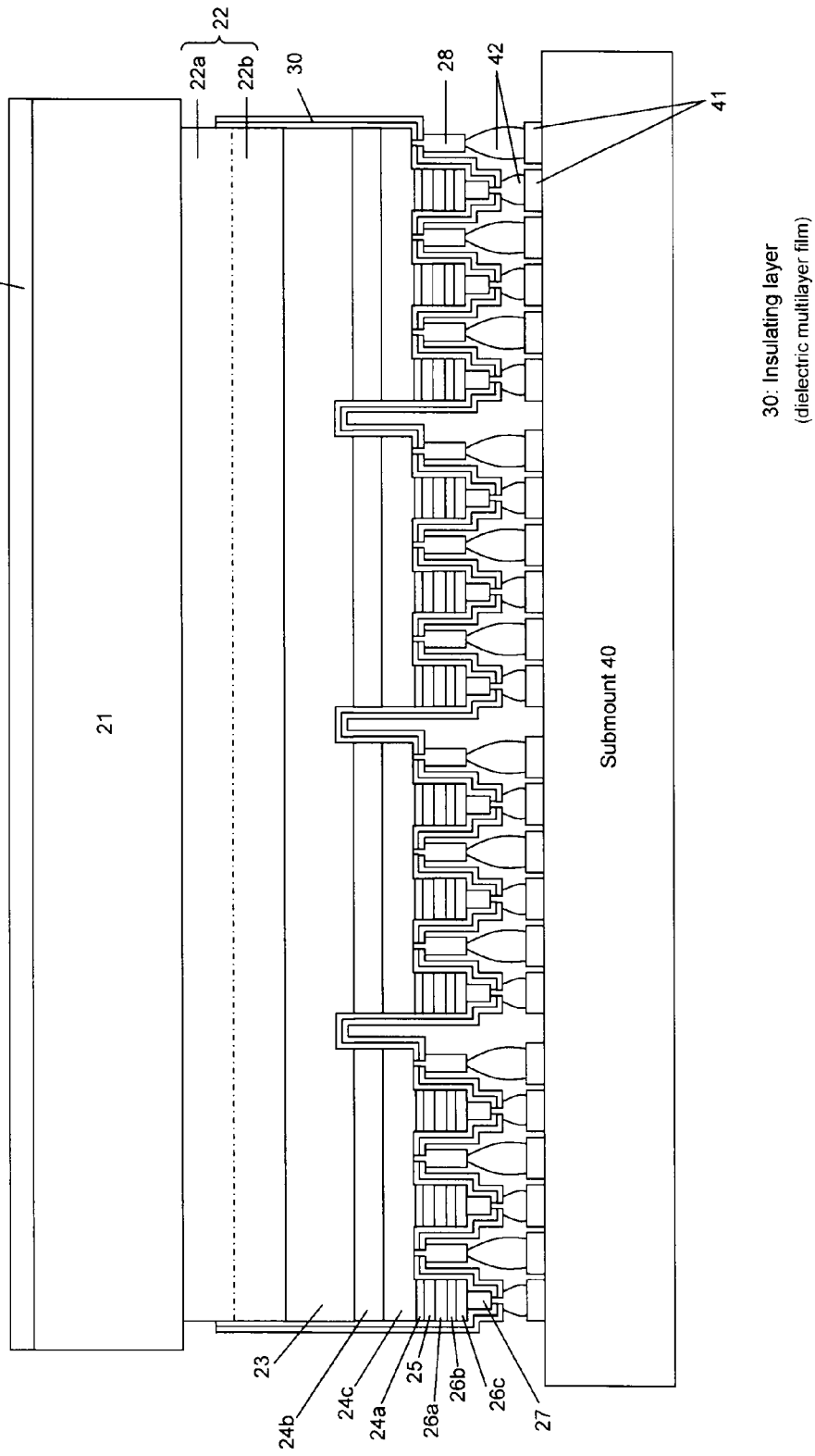
Figures 2, 3, 4, 5, 6, 7, 8, 9, 10, 11, 12, 13, 14, 15, 16:
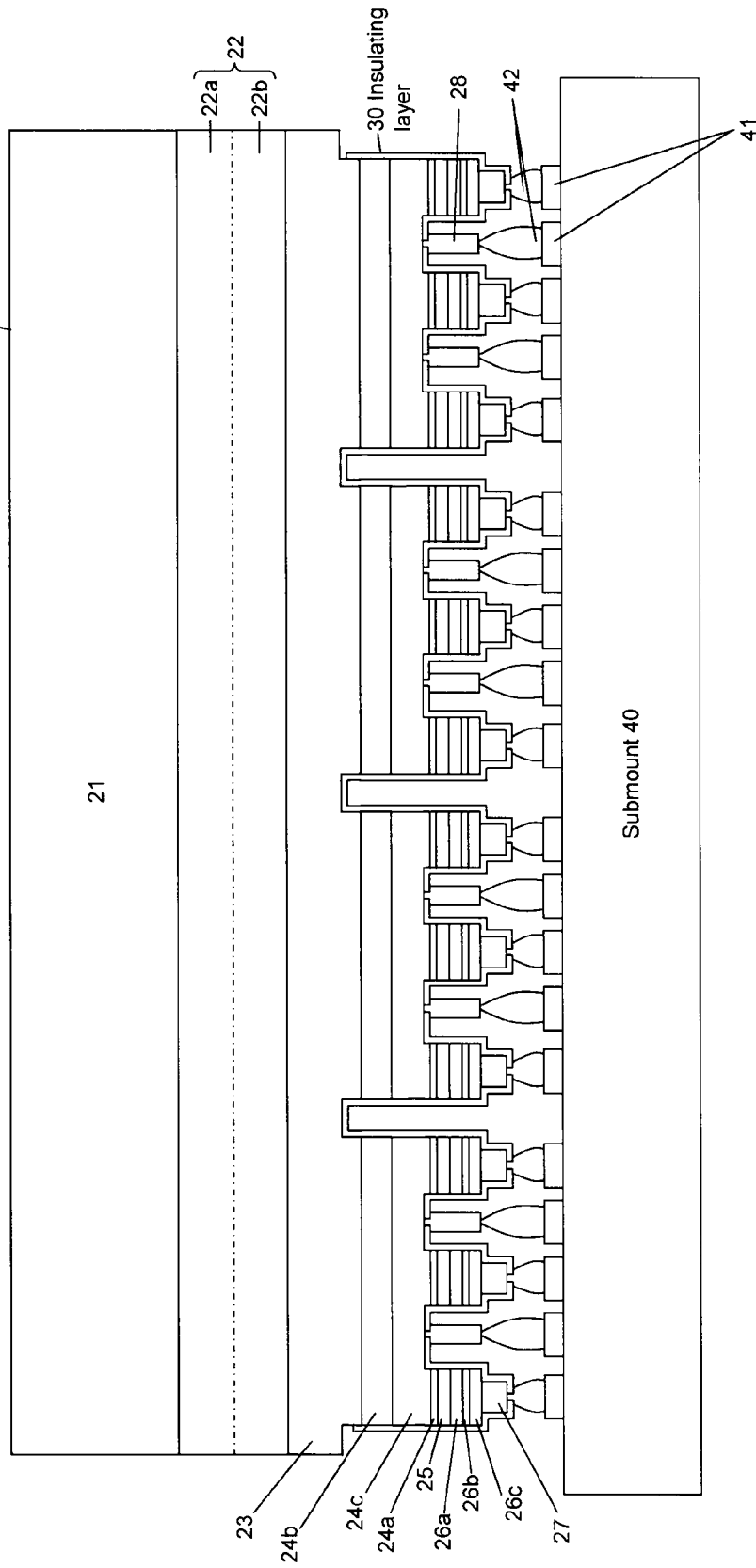
Figures 2, 3, 4, 5, 6, 7, 8, 9, 10, 11, 12, 13, 14, 15, 16, 17:
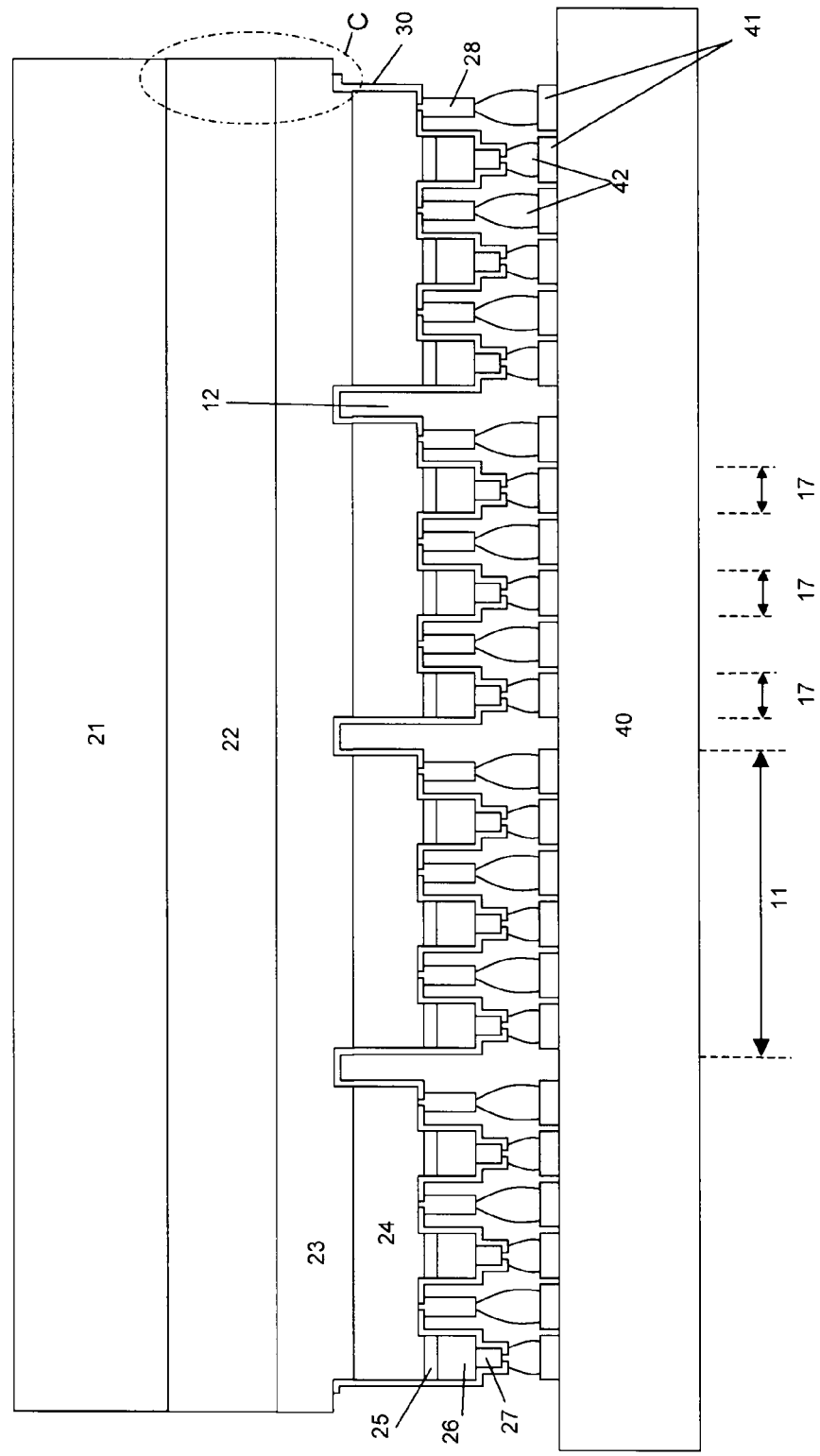
Figures 2, 3, 4, 5, 6, 7, 8, 9, 10, 11, 12, 13, 14, 15, 16, 17, 18:
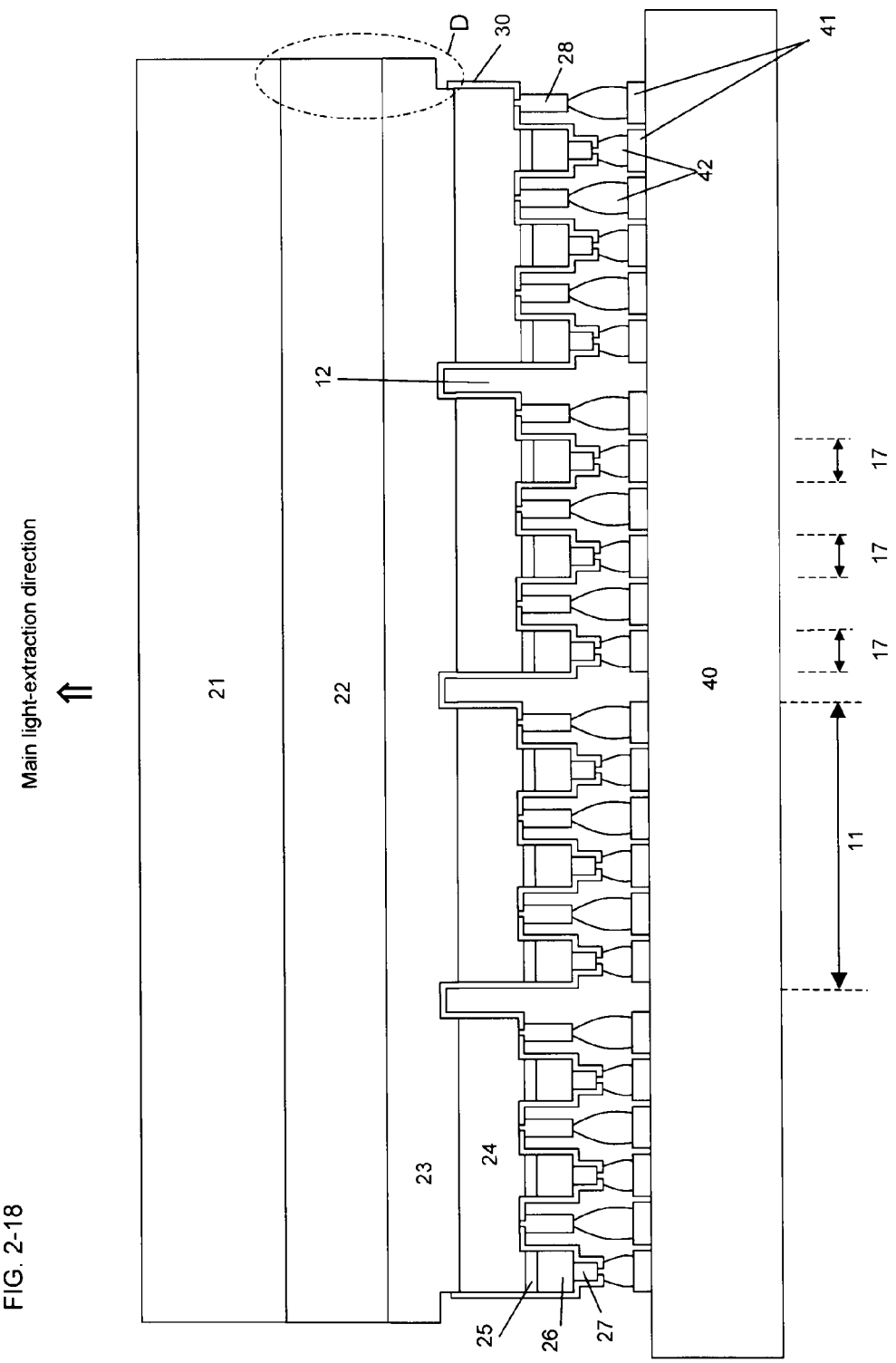
Figures 2, 3, 4, 5, 6, 7, 8, 9, 10, 11, 12, 13, 14, 15, 16, 17, 18, 19:
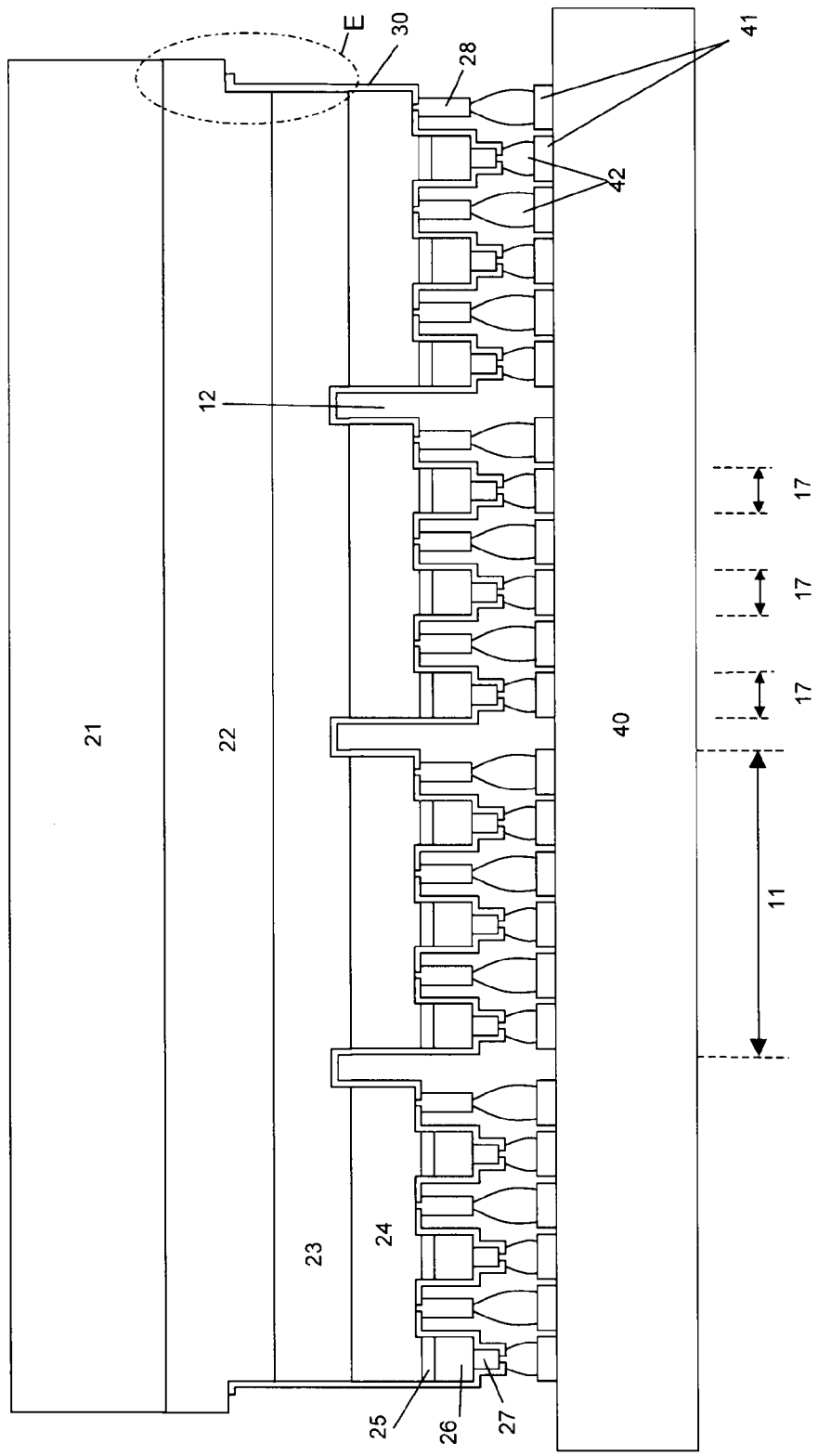
Figures 2, 3, 4, 5, 6, 7, 8, 9, 10, 11, 12, 13, 14, 15, 16, 17, 18, 19, 20:
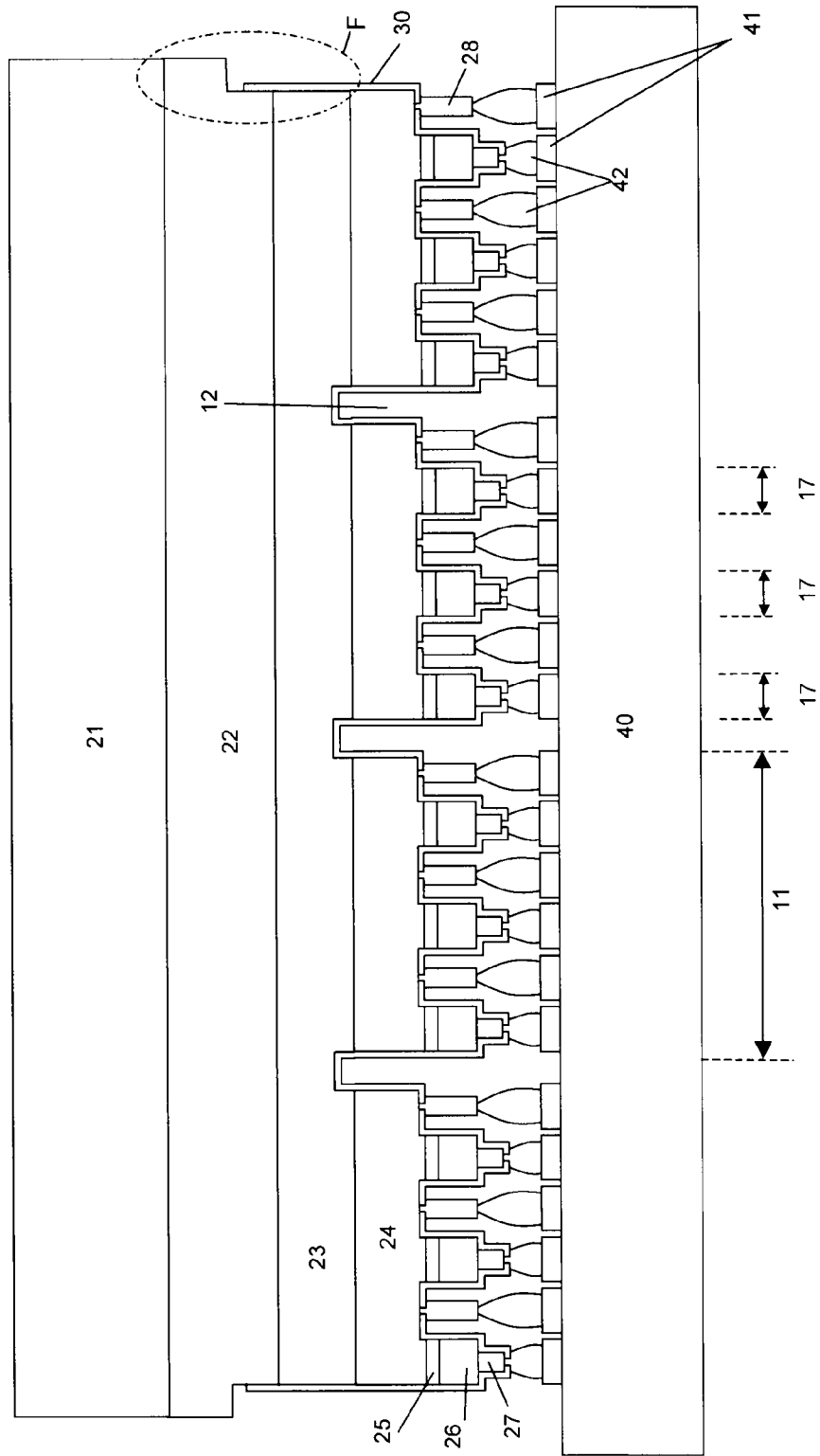
Figures 2, 3, 4, 5, 6, 7, 8, 9, 10, 11, 12, 13, 14, 15, 16, 17, 18, 19, 20, 21:
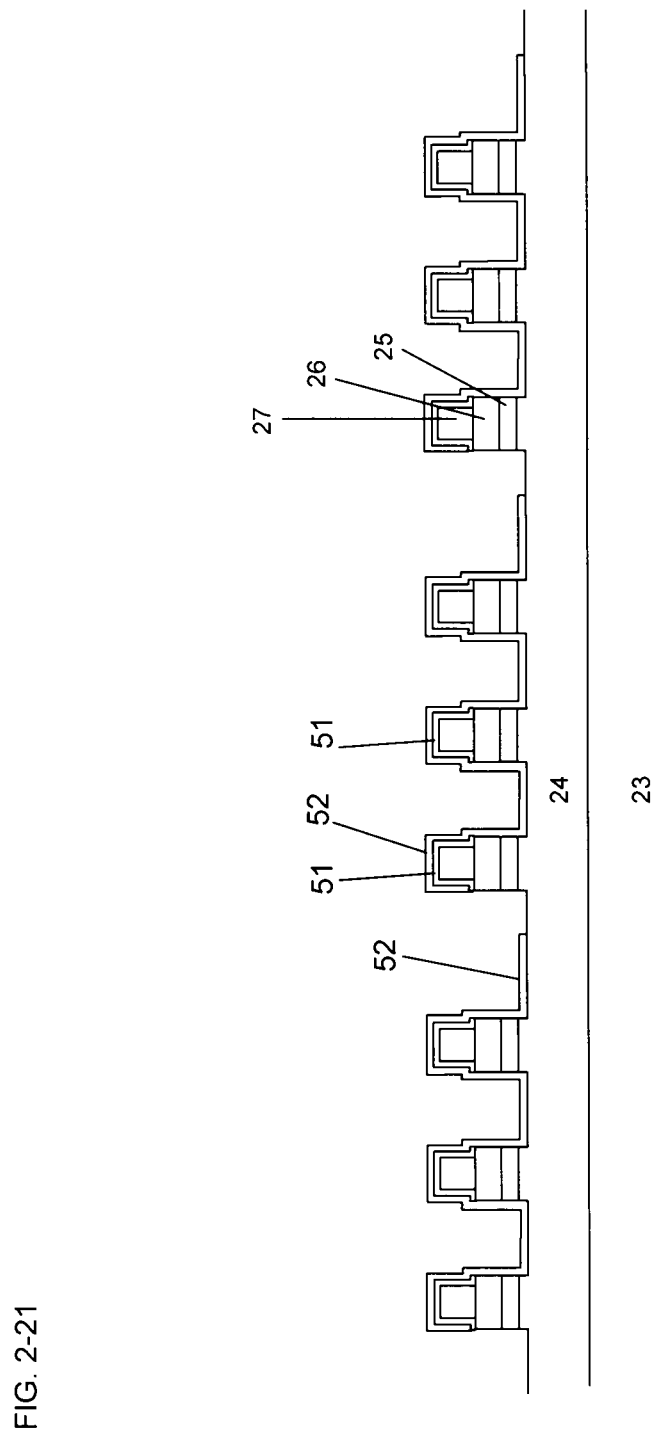
Figures 1, 3:
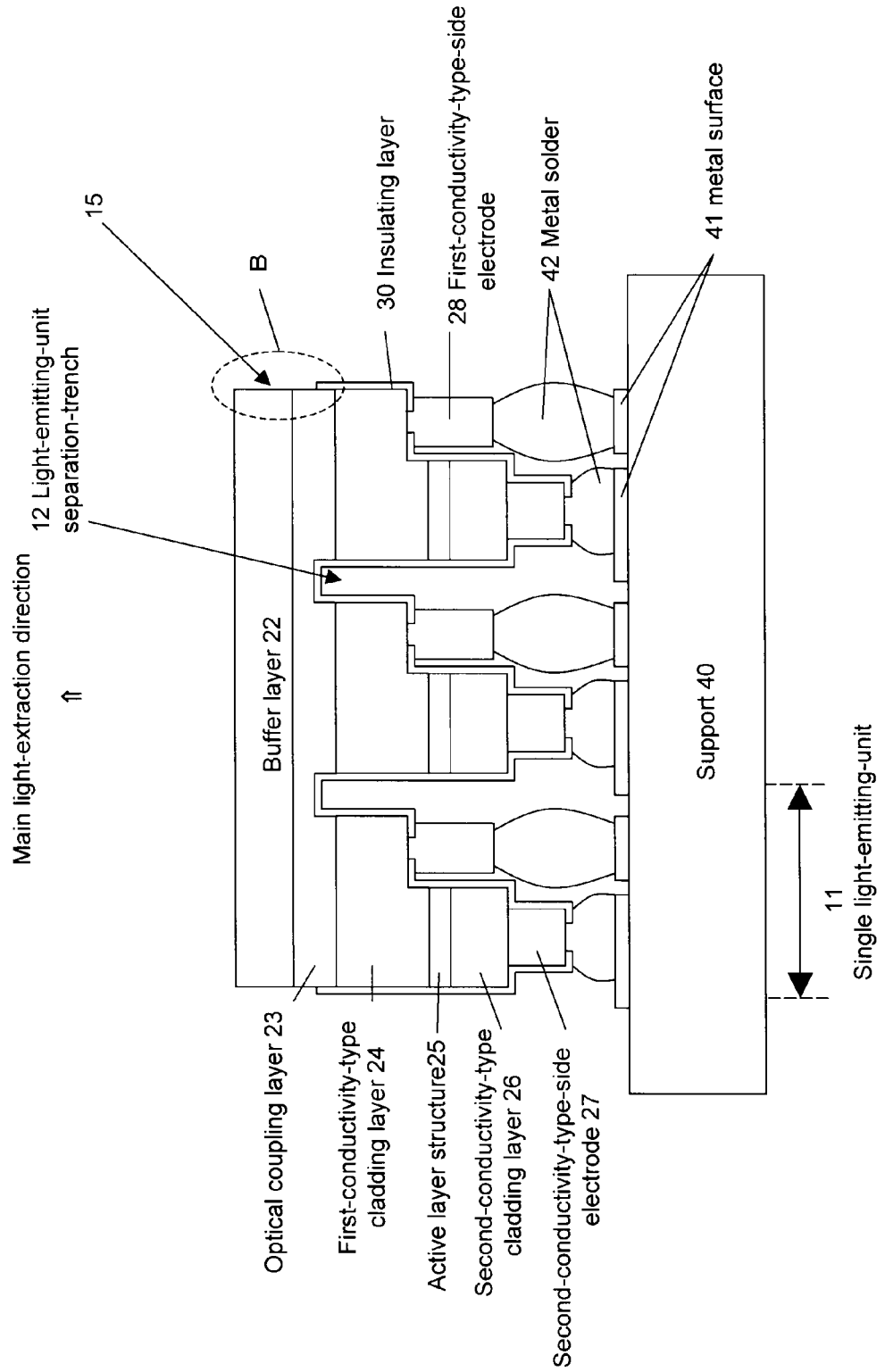
Figures 2, 3:
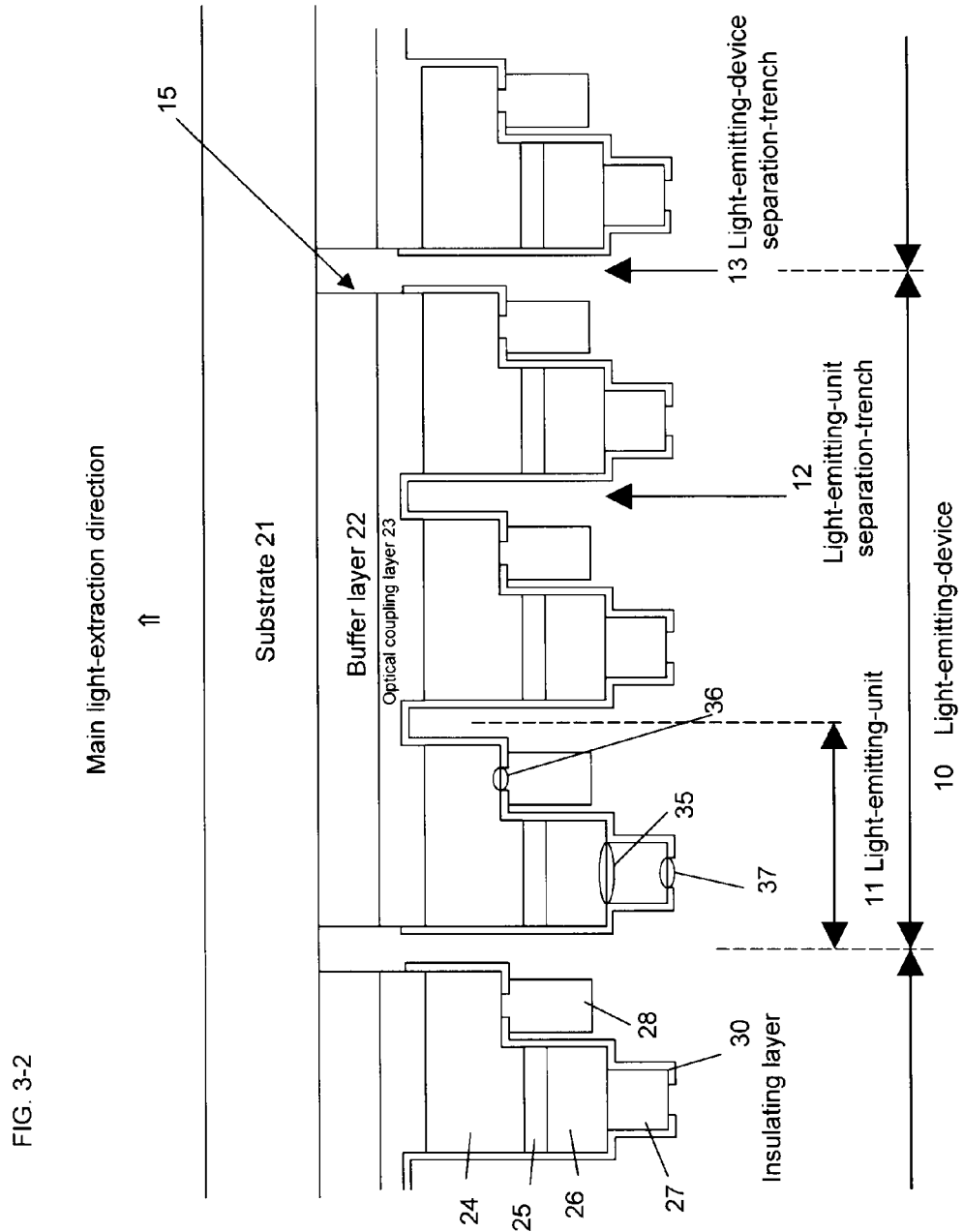
Figures 3, 4:
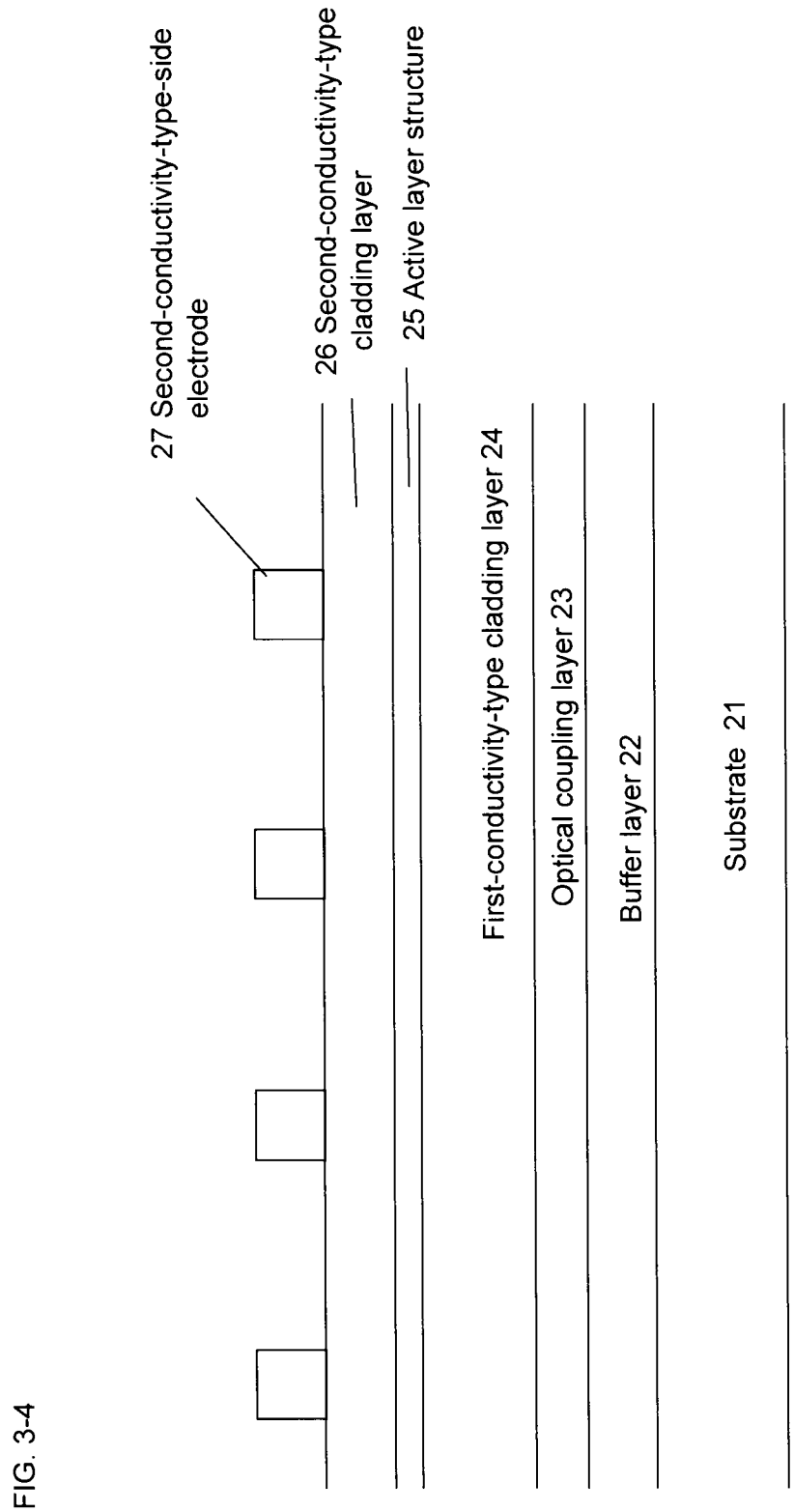
Figures 3, 4, 5, 6:
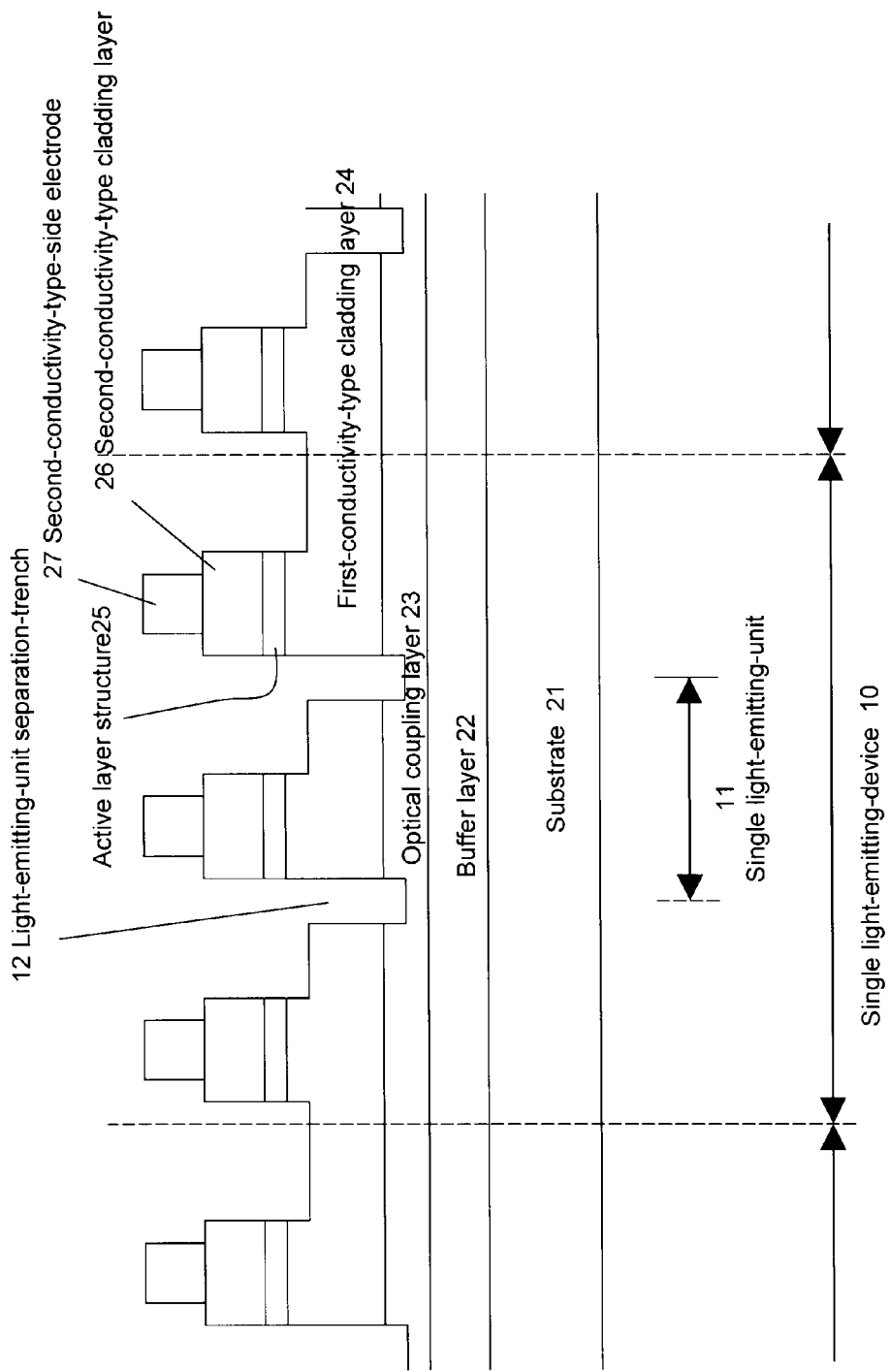
Figures 3, 4, 5, 6, 7:
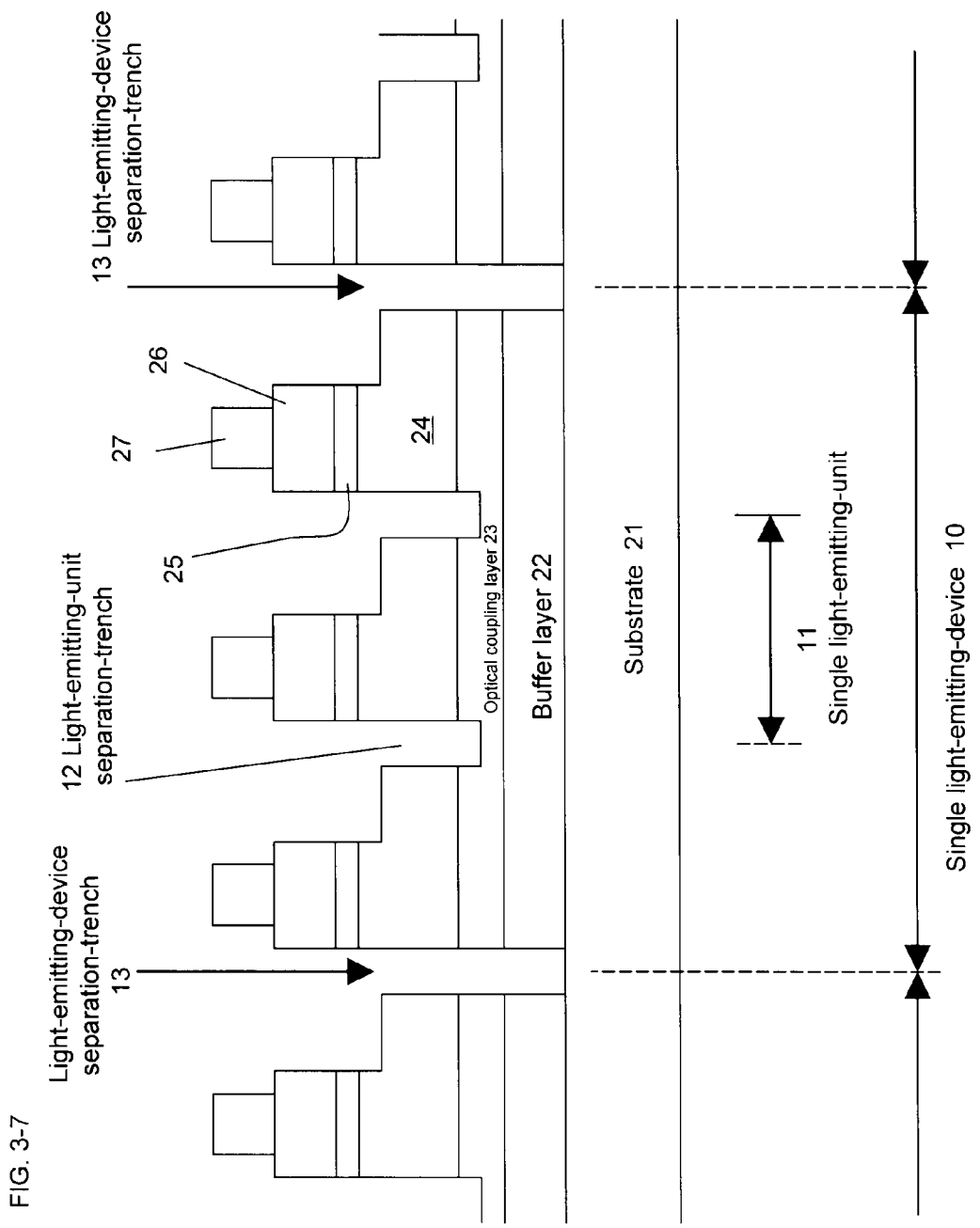
Figures 3, 4, 5, 6, 7, 8:
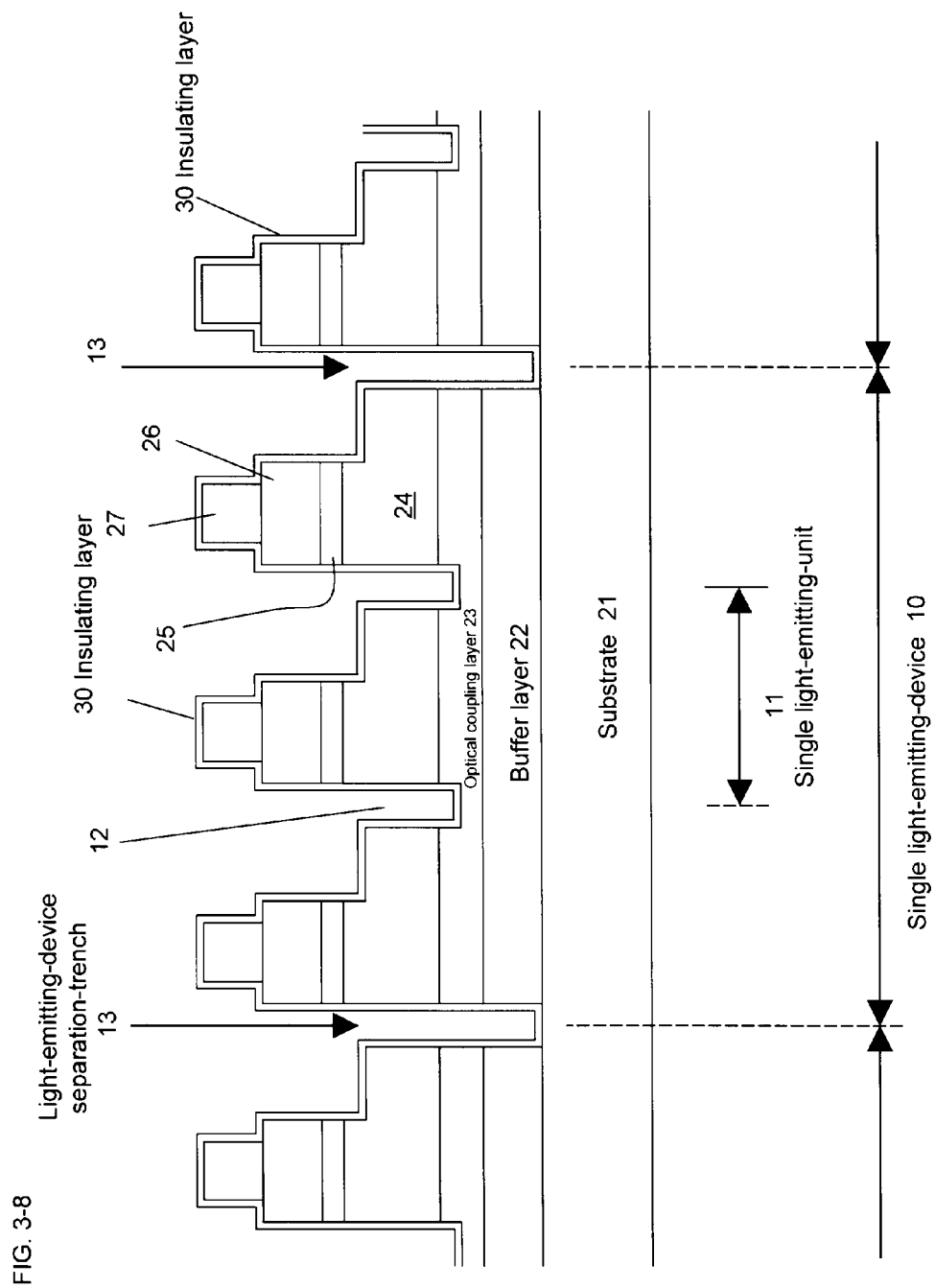
Figures 3, 4, 5, 6, 7, 8, 9:
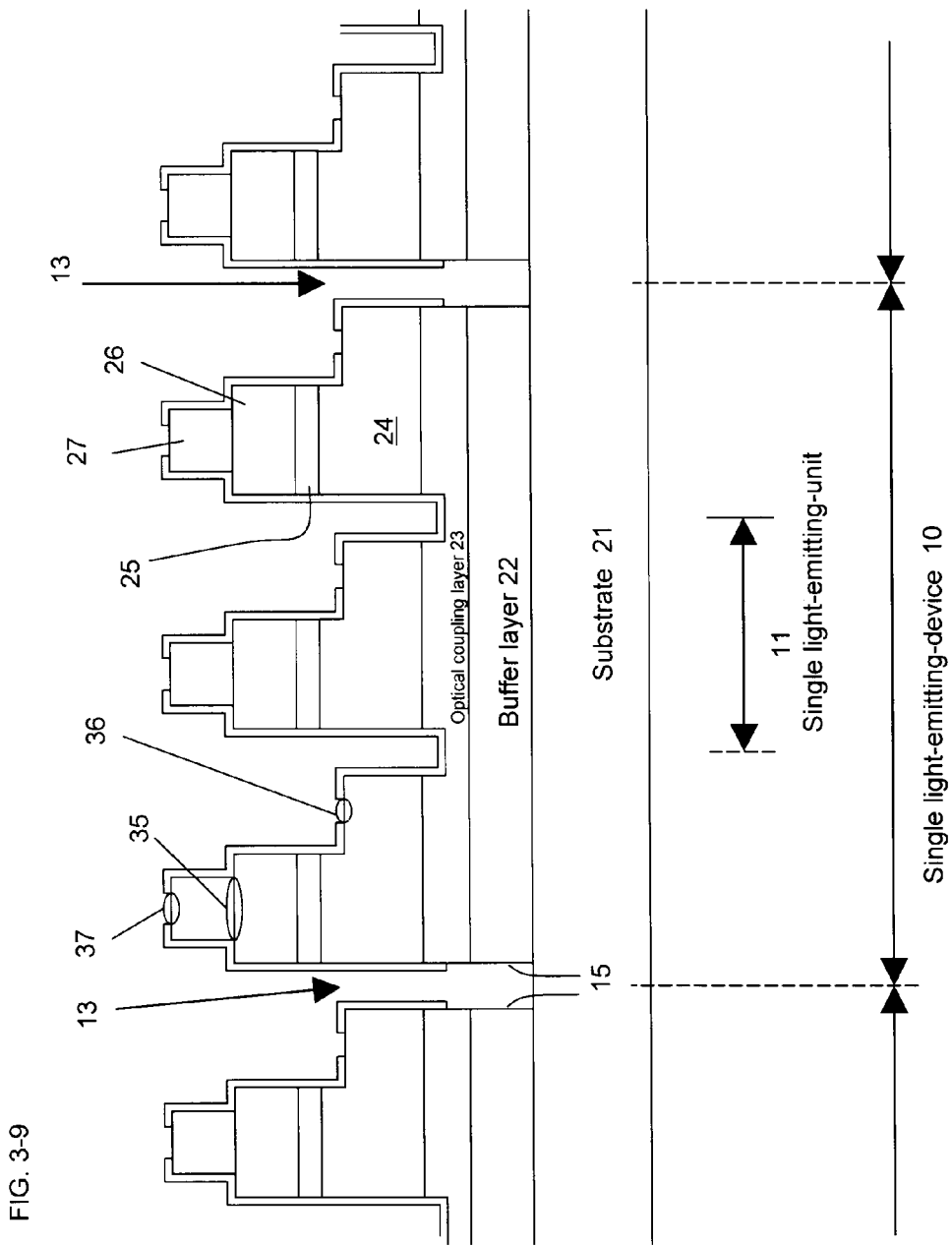
Figures 3, 4, 5, 6, 7, 8, 9, 10:
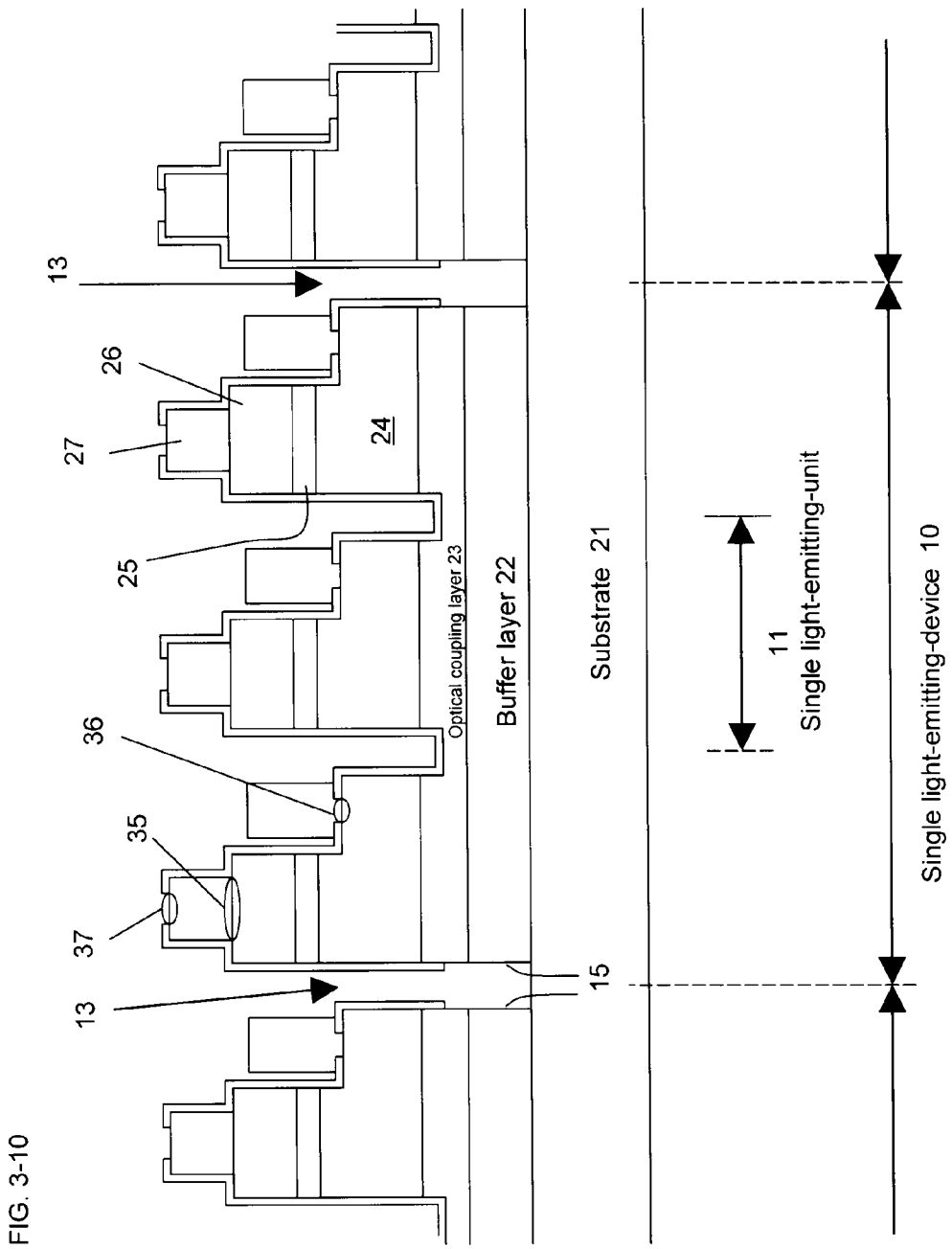
Figures 3, 4, 5, 6, 7, 8, 9, 10, 11:
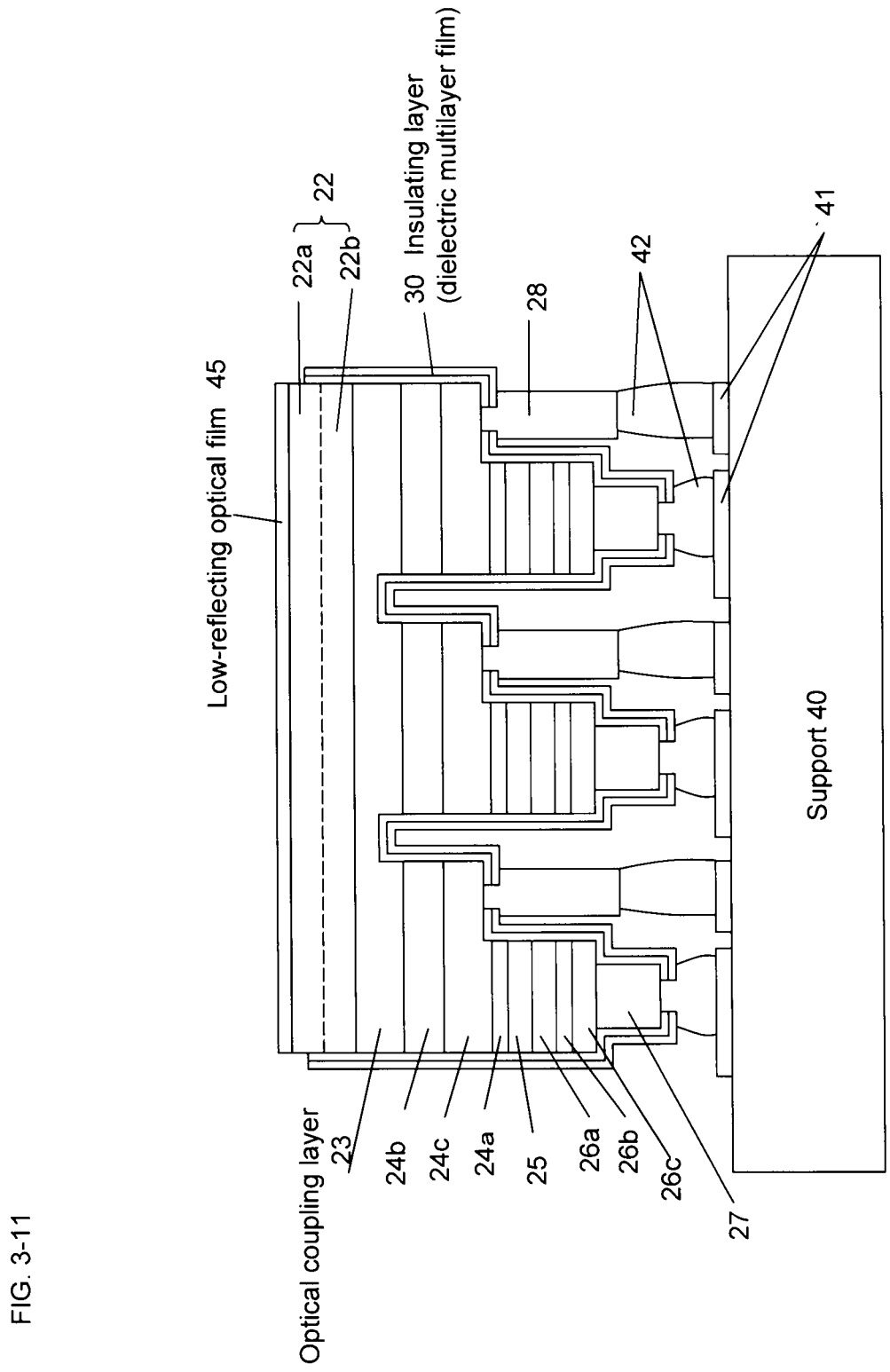
Figures 3, 4, 5, 6, 7, 8, 9, 10, 11, 12:
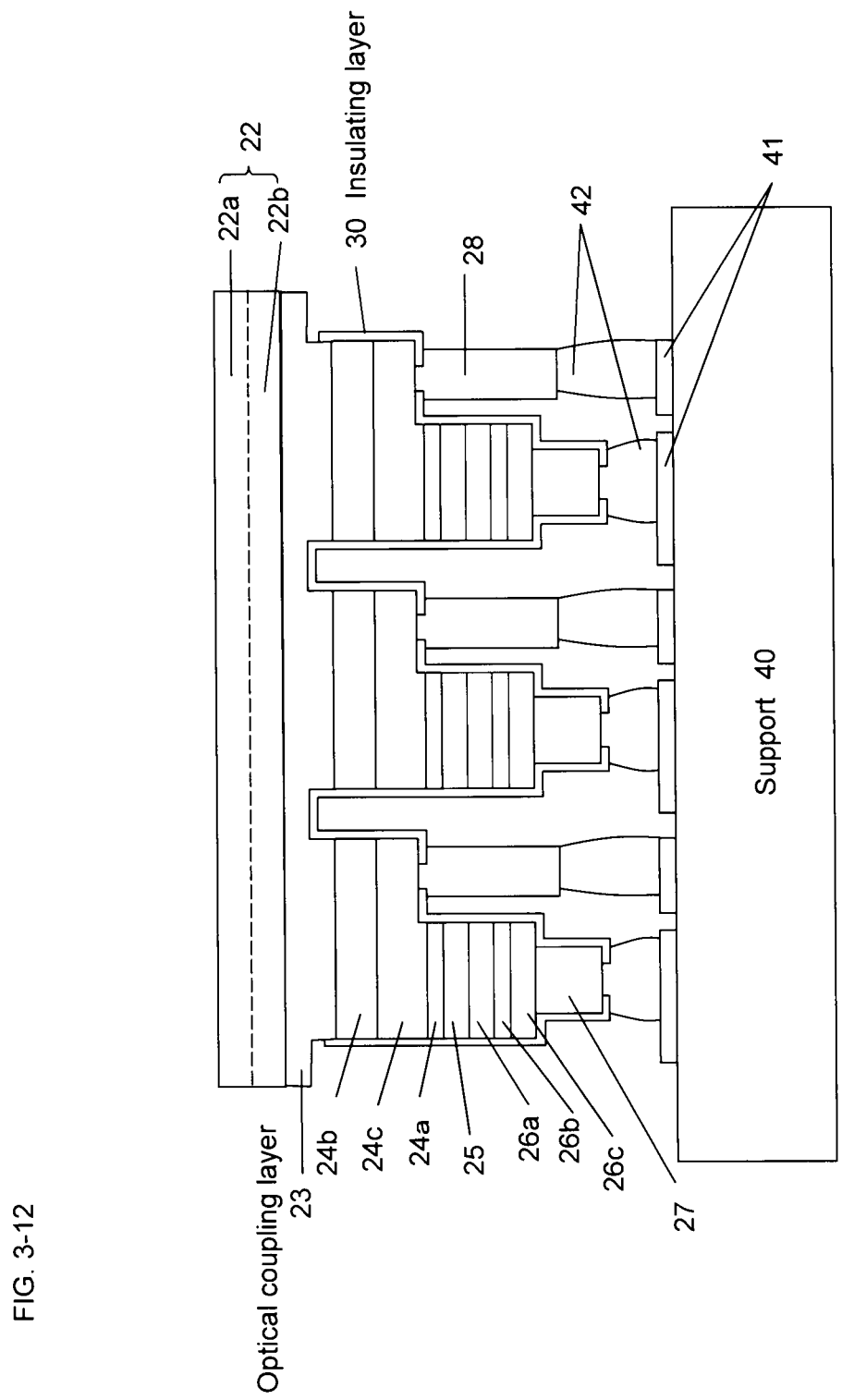
Figures 3, 4, 5, 6, 7, 8, 9, 10, 11, 12, 13:
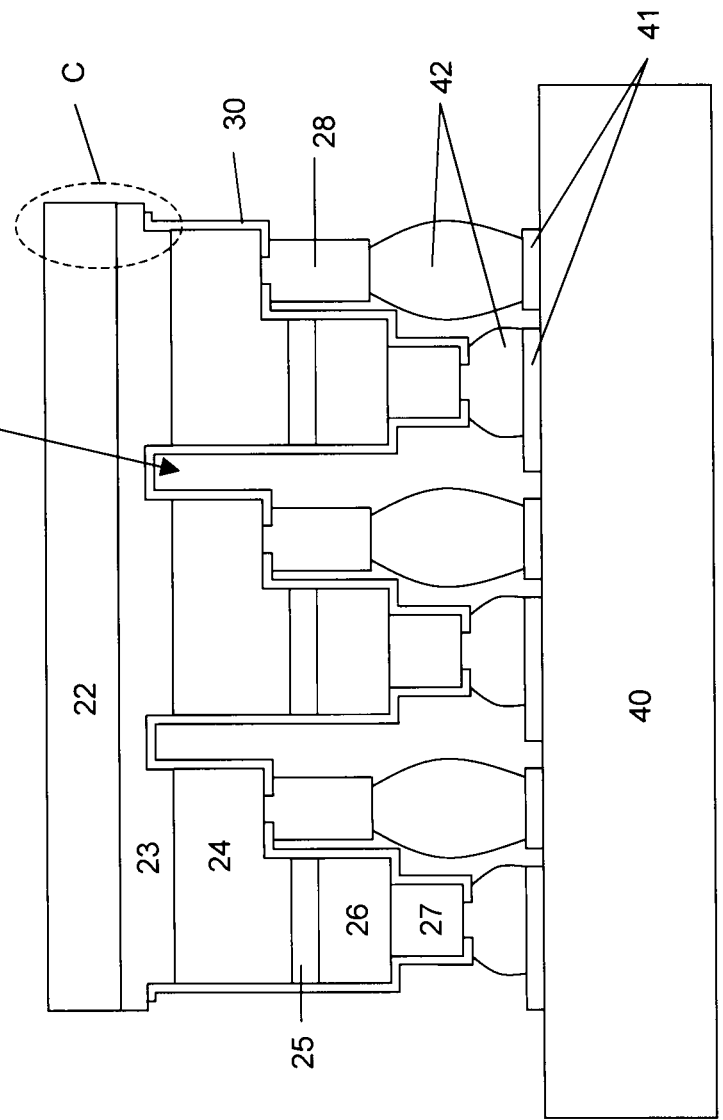
Figures 3, 4, 5, 6, 7, 8, 9, 10, 11, 12, 13, 14:
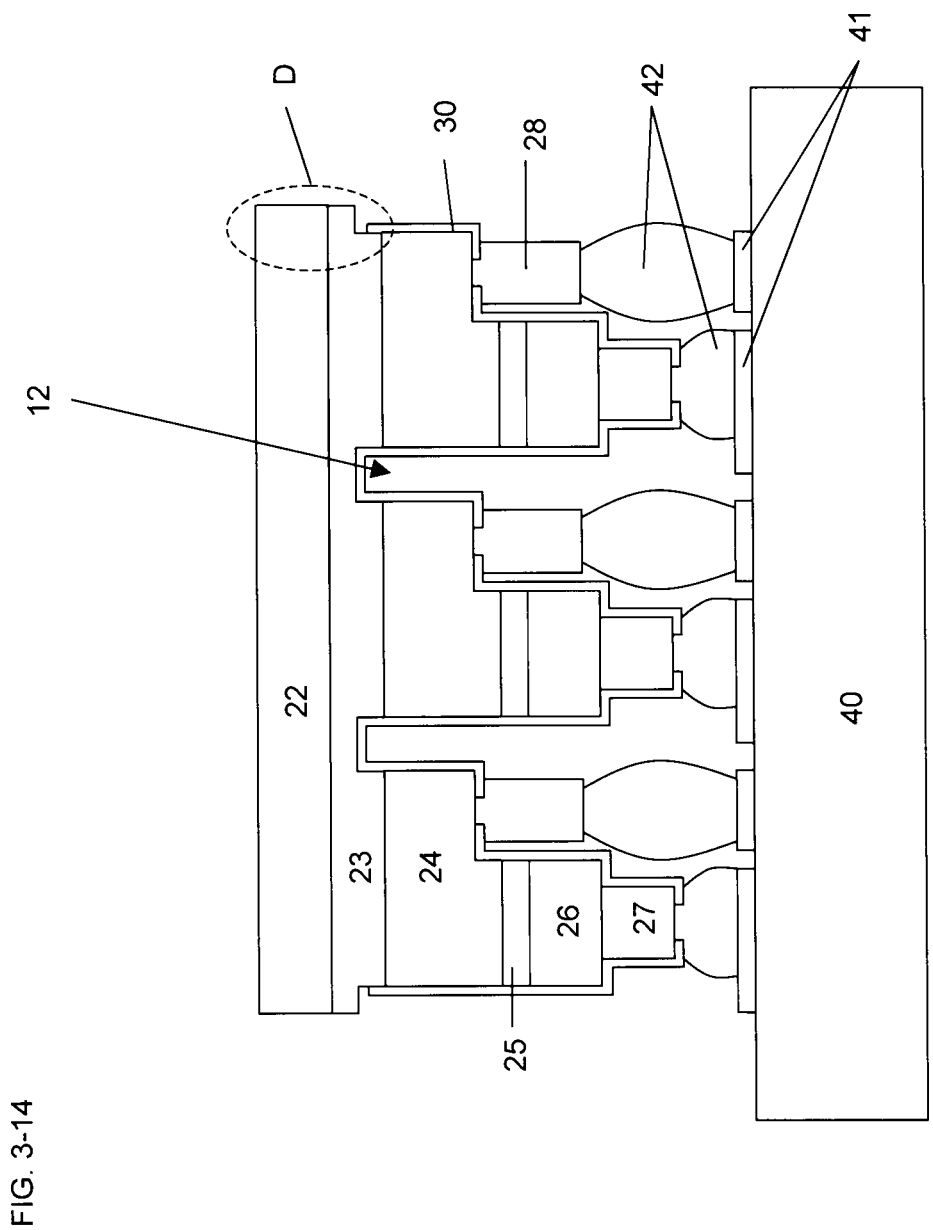
Figures 3, 4, 5, 6, 7, 8, 9, 10, 11, 12, 13, 14, 15:
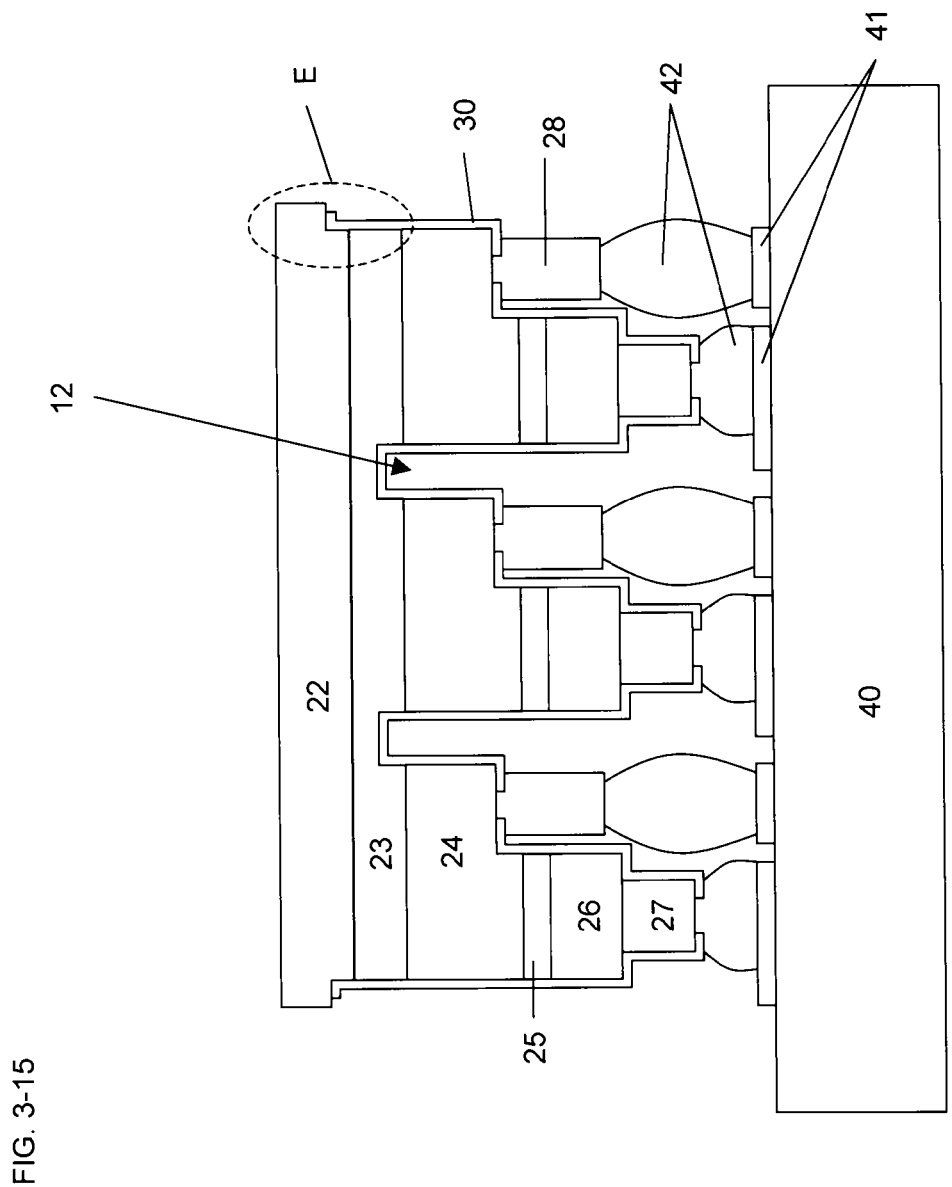
Figures 3, 4, 5, 6, 7, 8, 9, 10, 11, 12, 13, 14, 15, 16:
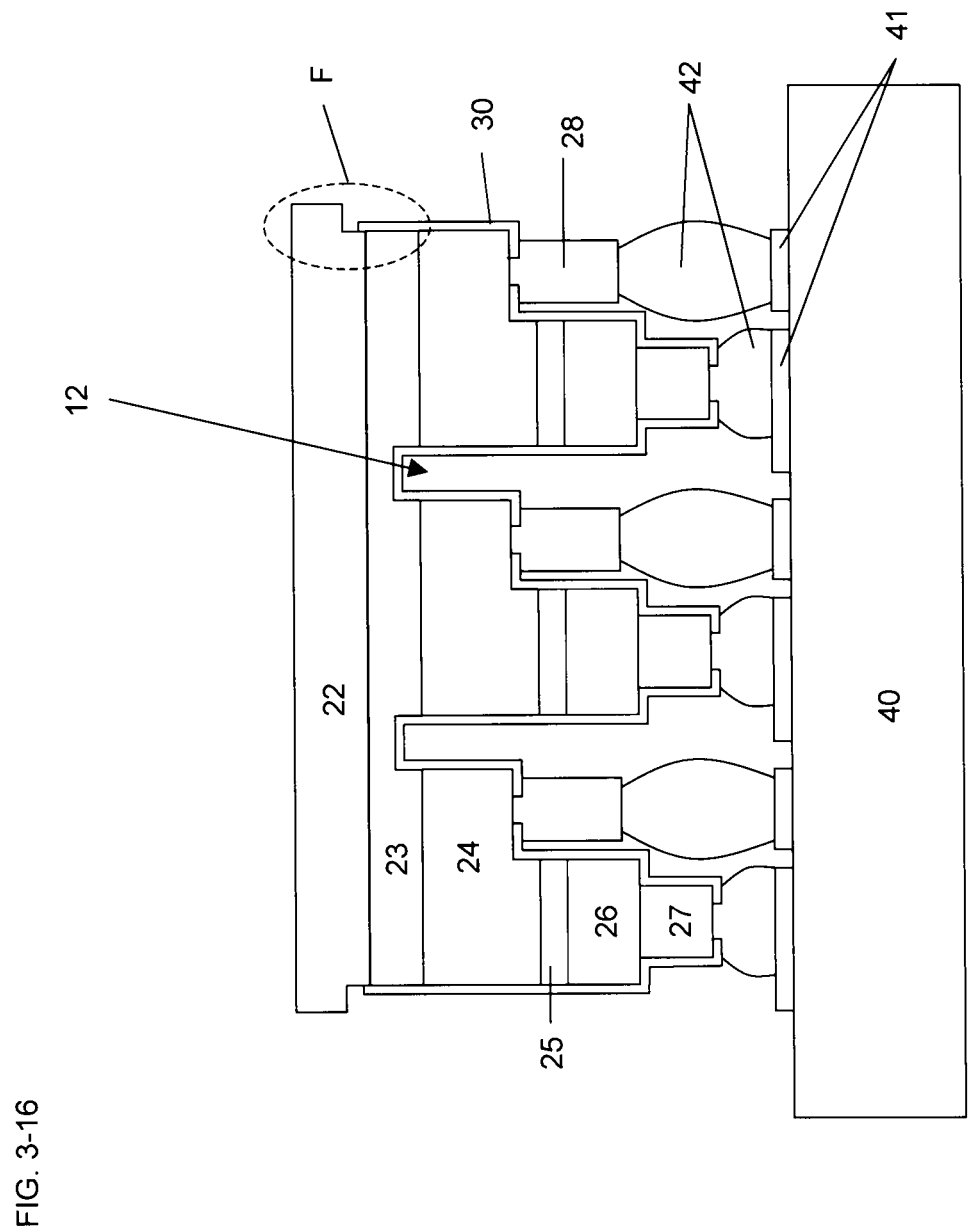
Figures 3, 4, 5, 6, 7, 8, 9, 10, 11, 12, 13, 14, 15, 16, 17:
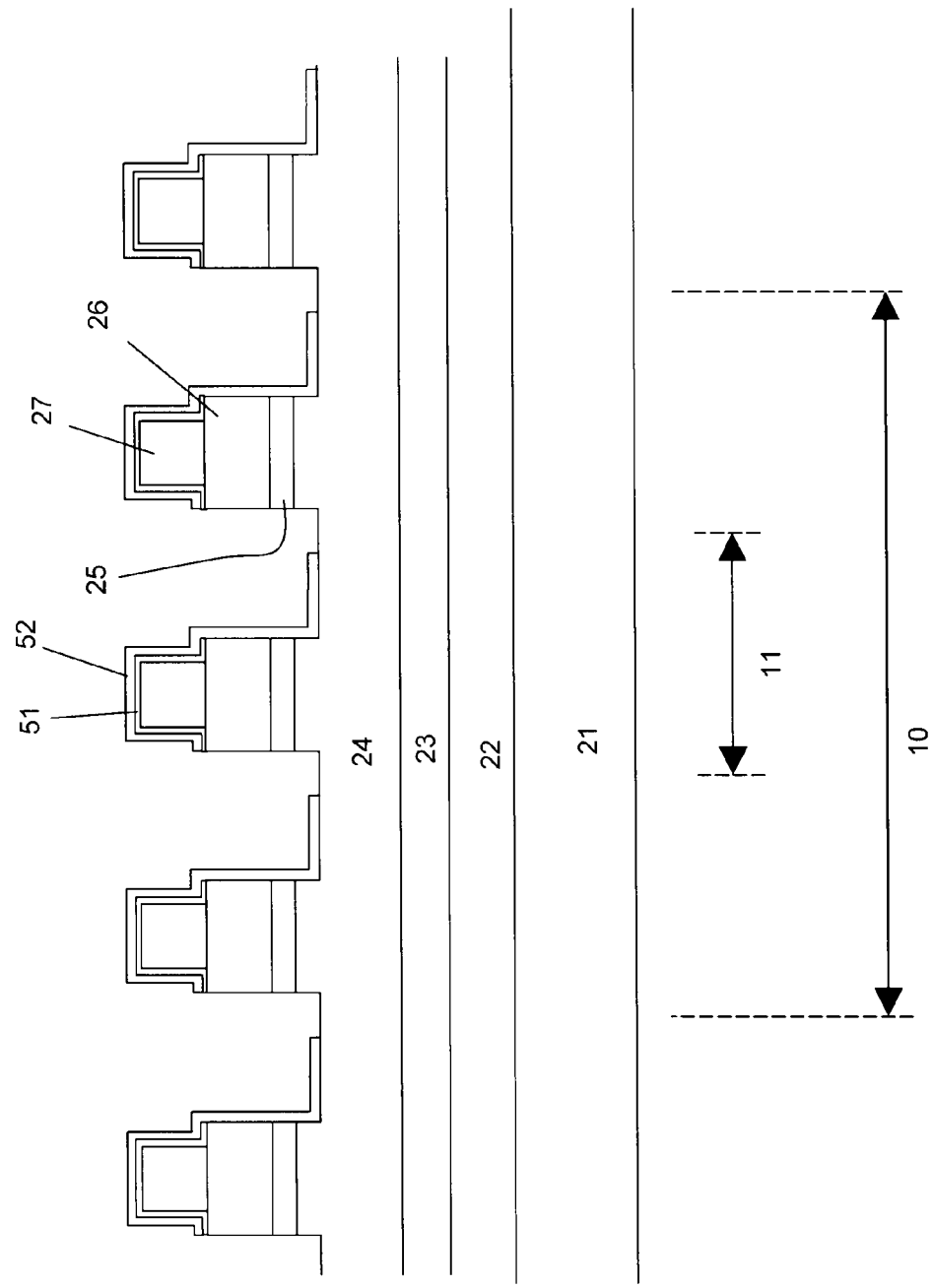
Figures 1, 4:
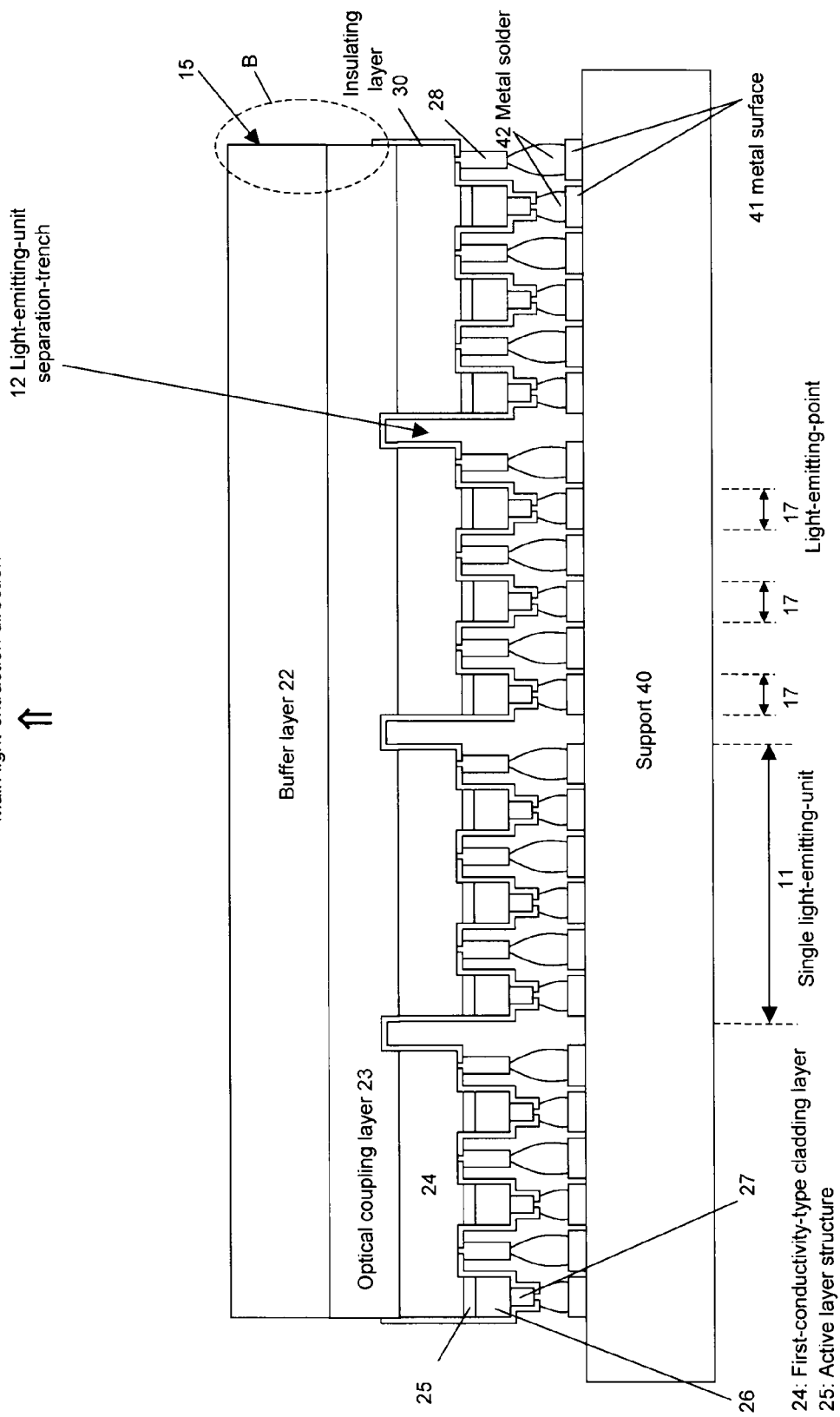
Figures 2, 4:
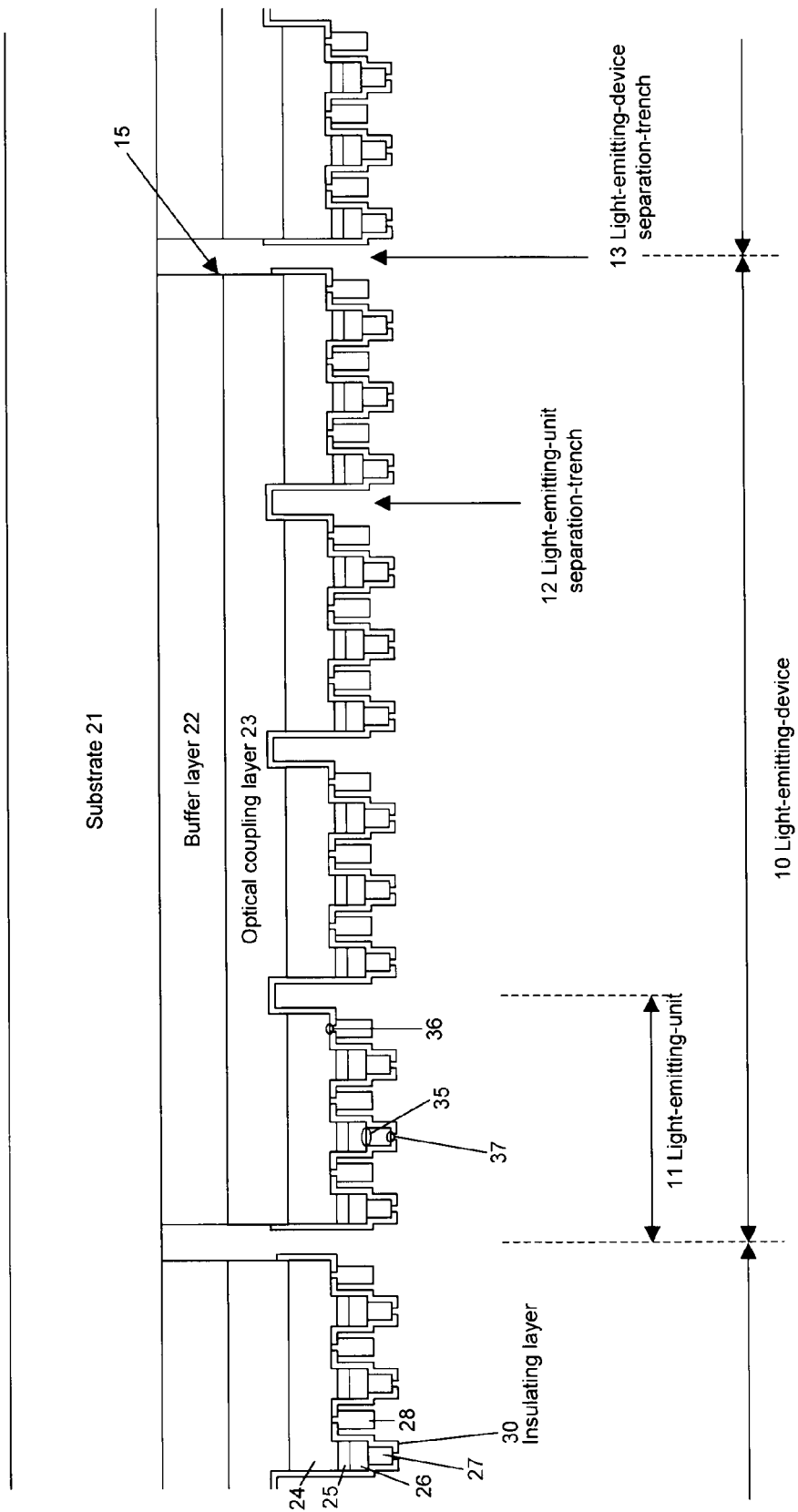
Figure 4:
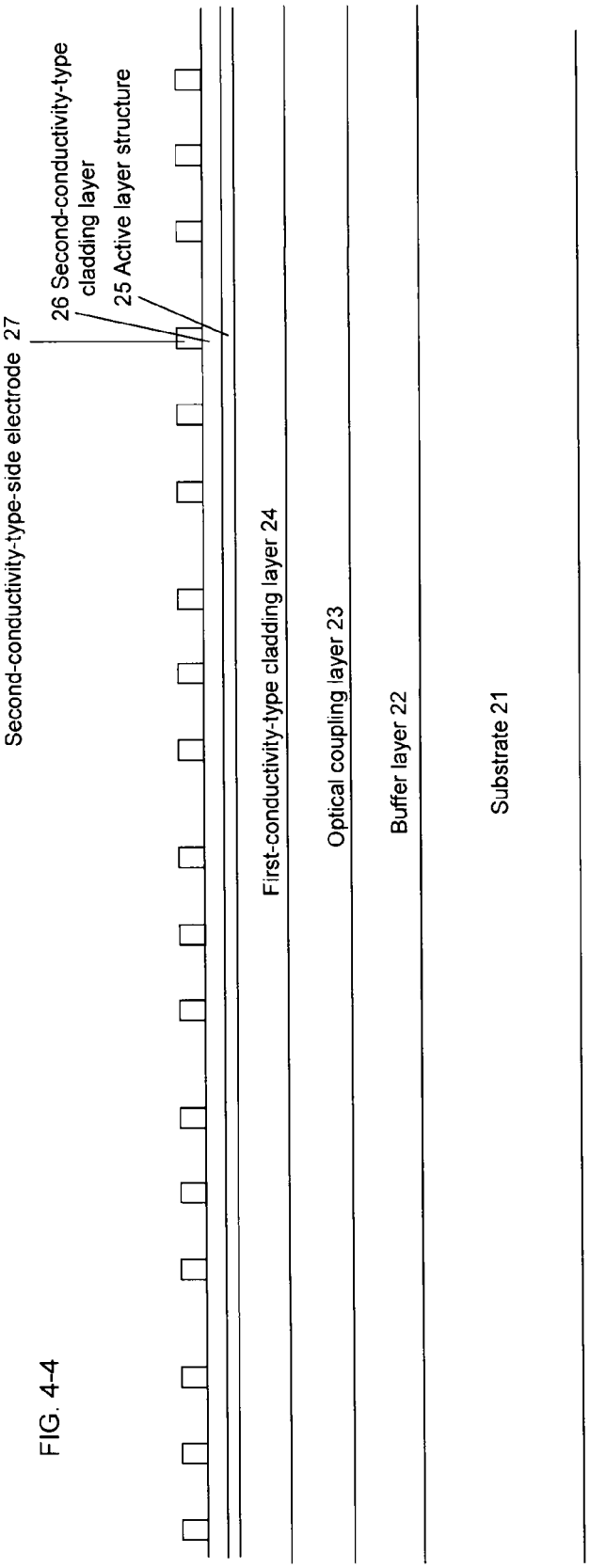
Figures 4, 5:
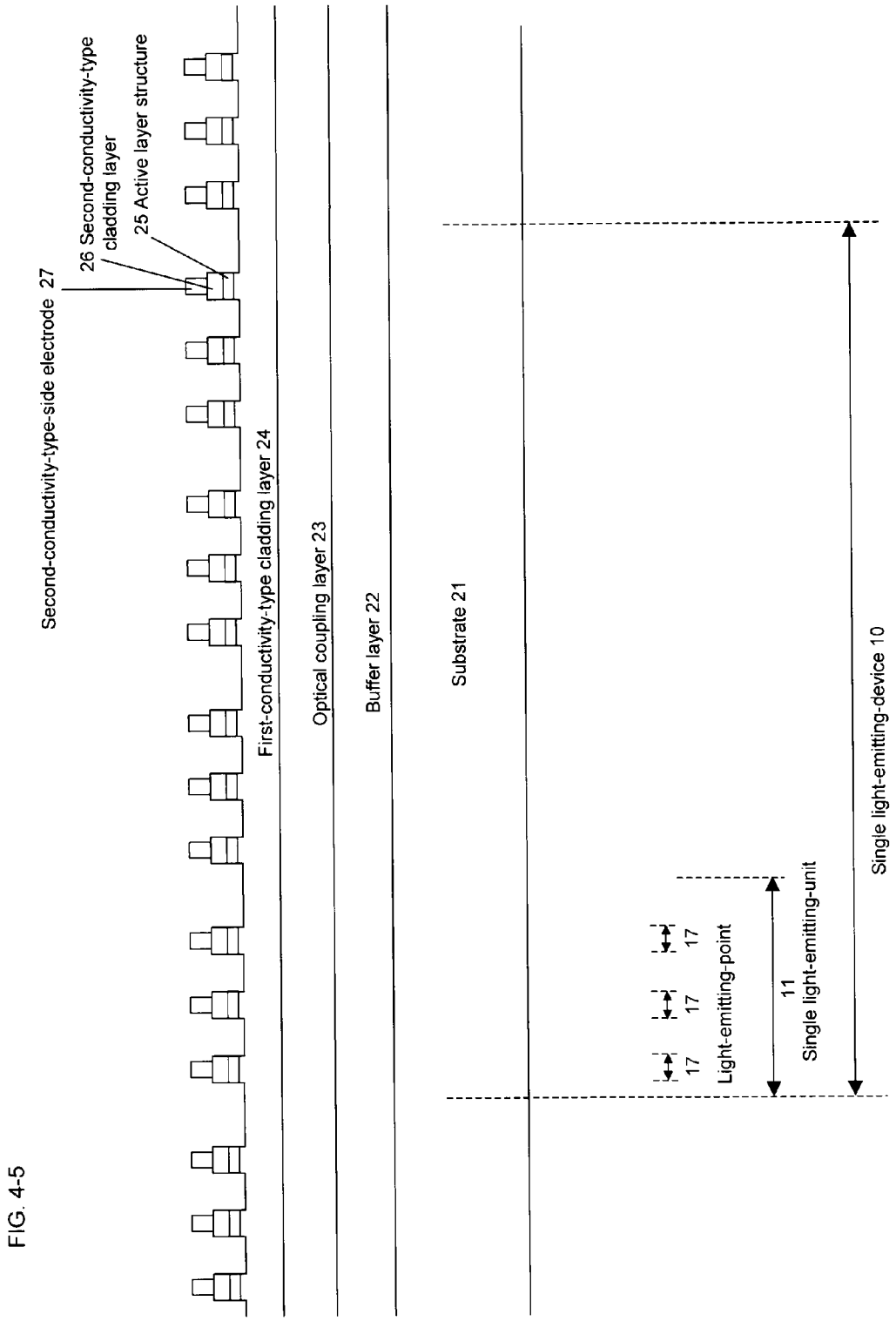
Figures 4, 5, 6:
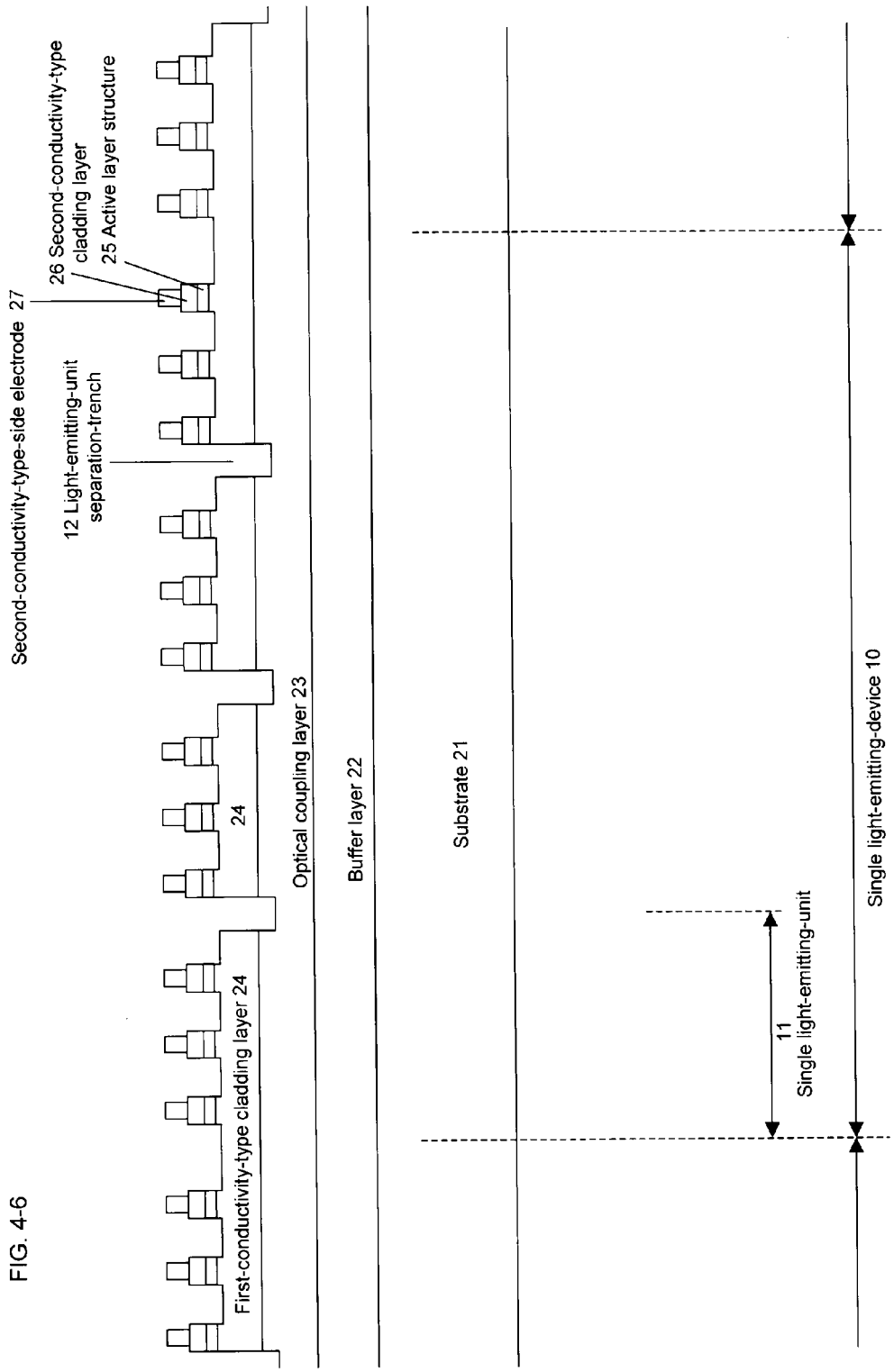
Figures 4, 5, 6, 7:
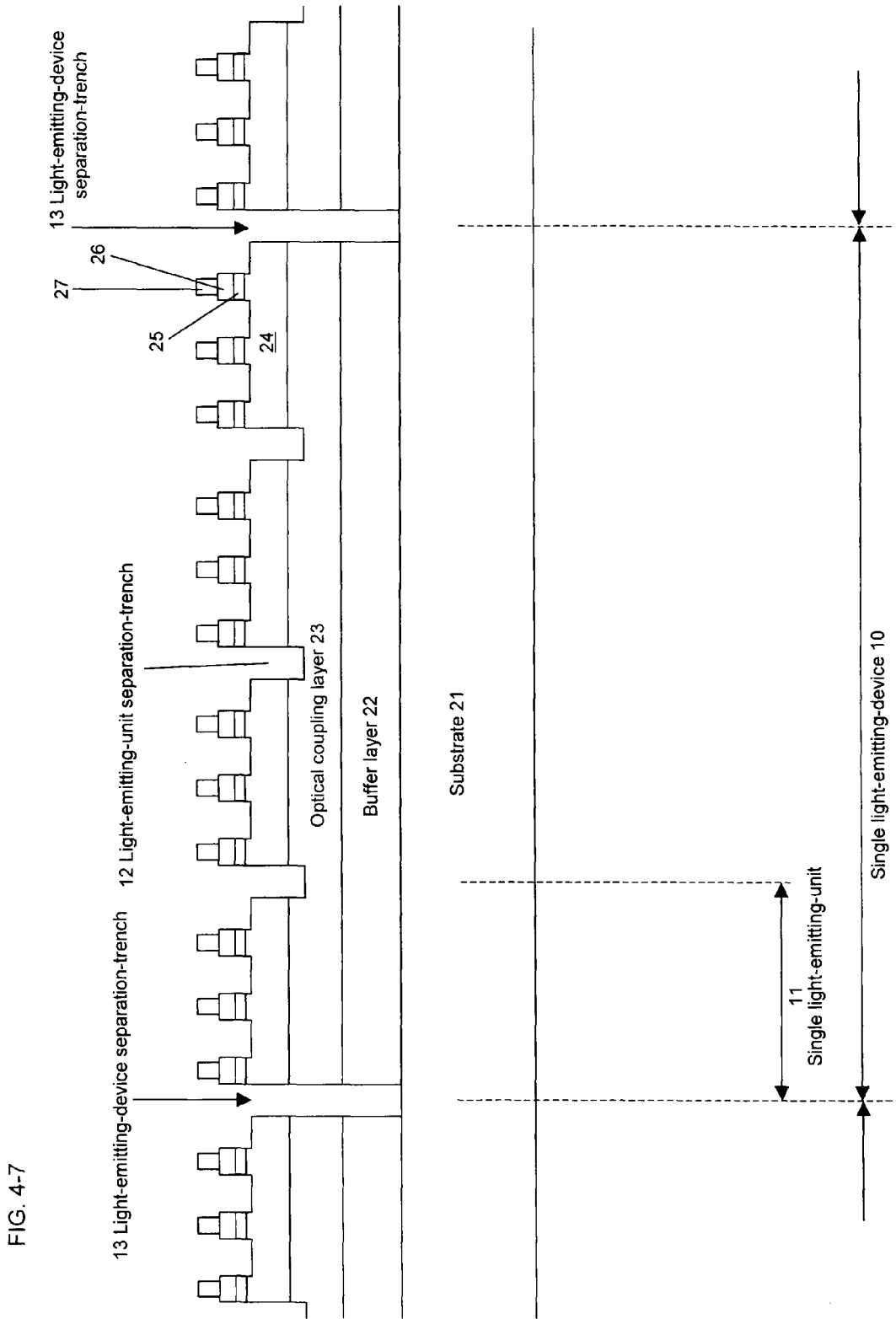
Figures 4, 5, 6, 7, 8:
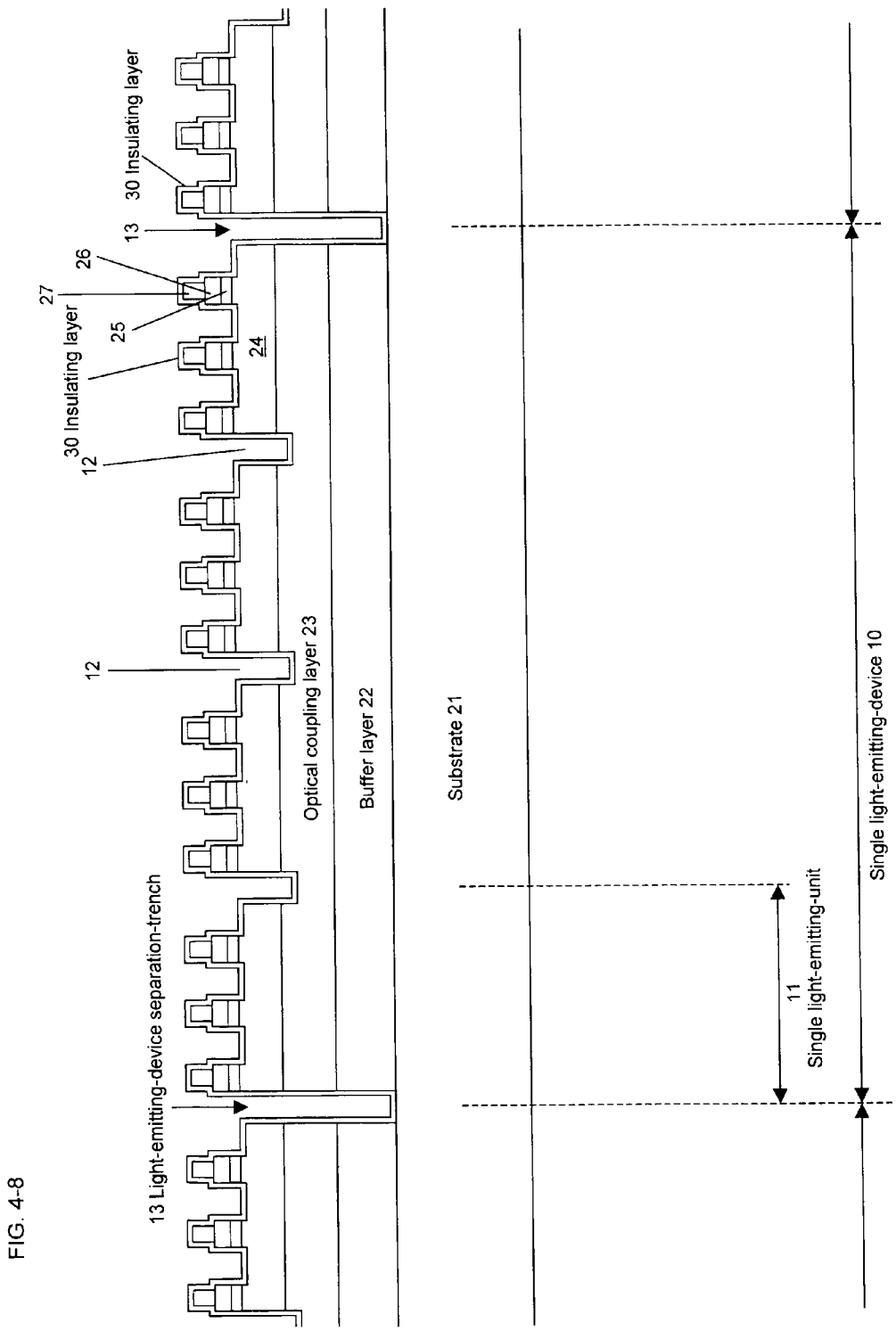
Figures 4, 5, 6, 7, 8, 9:
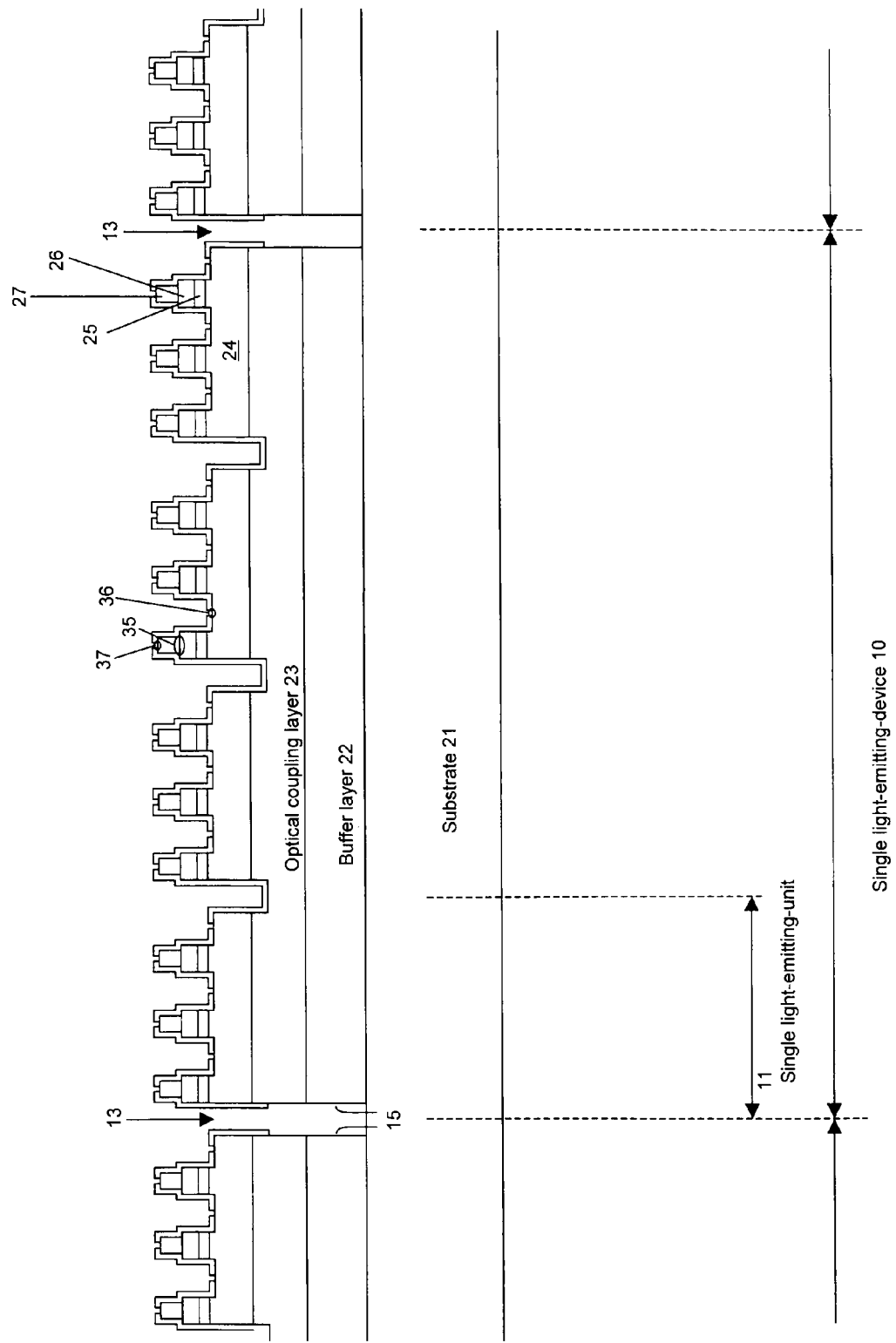
Figures 4, 5, 6, 7, 8, 9, 10, 11:
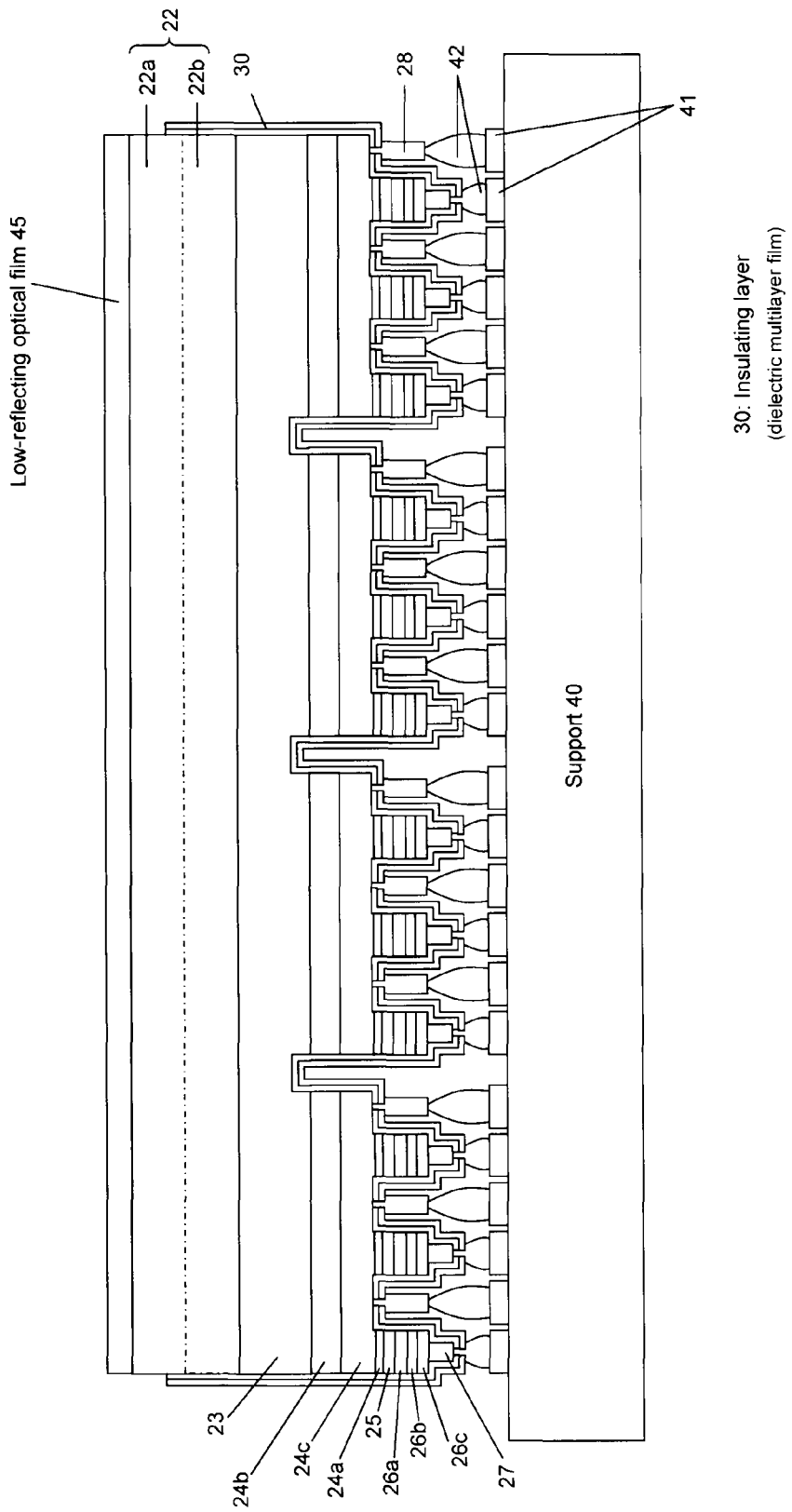
Figures 4, 5, 6, 7, 8, 9, 10, 11, 12:
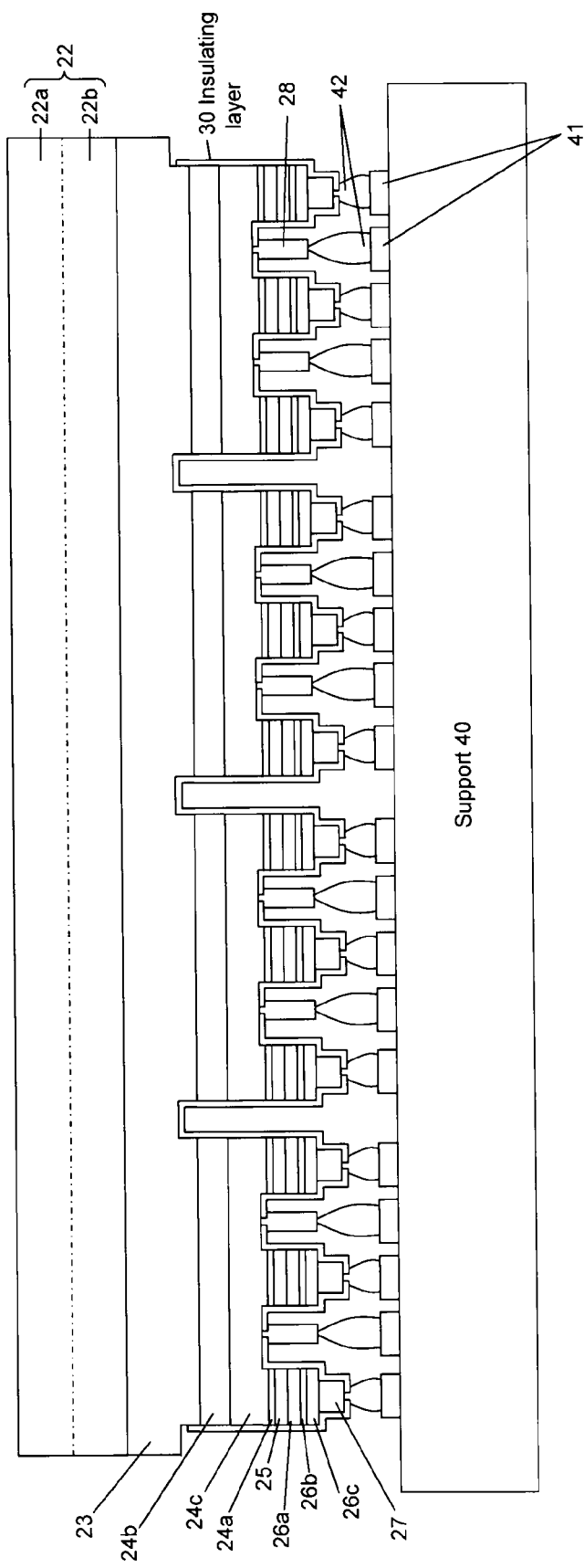
Figures 4, 5, 6, 7, 8, 9, 10, 11, 12, 13:
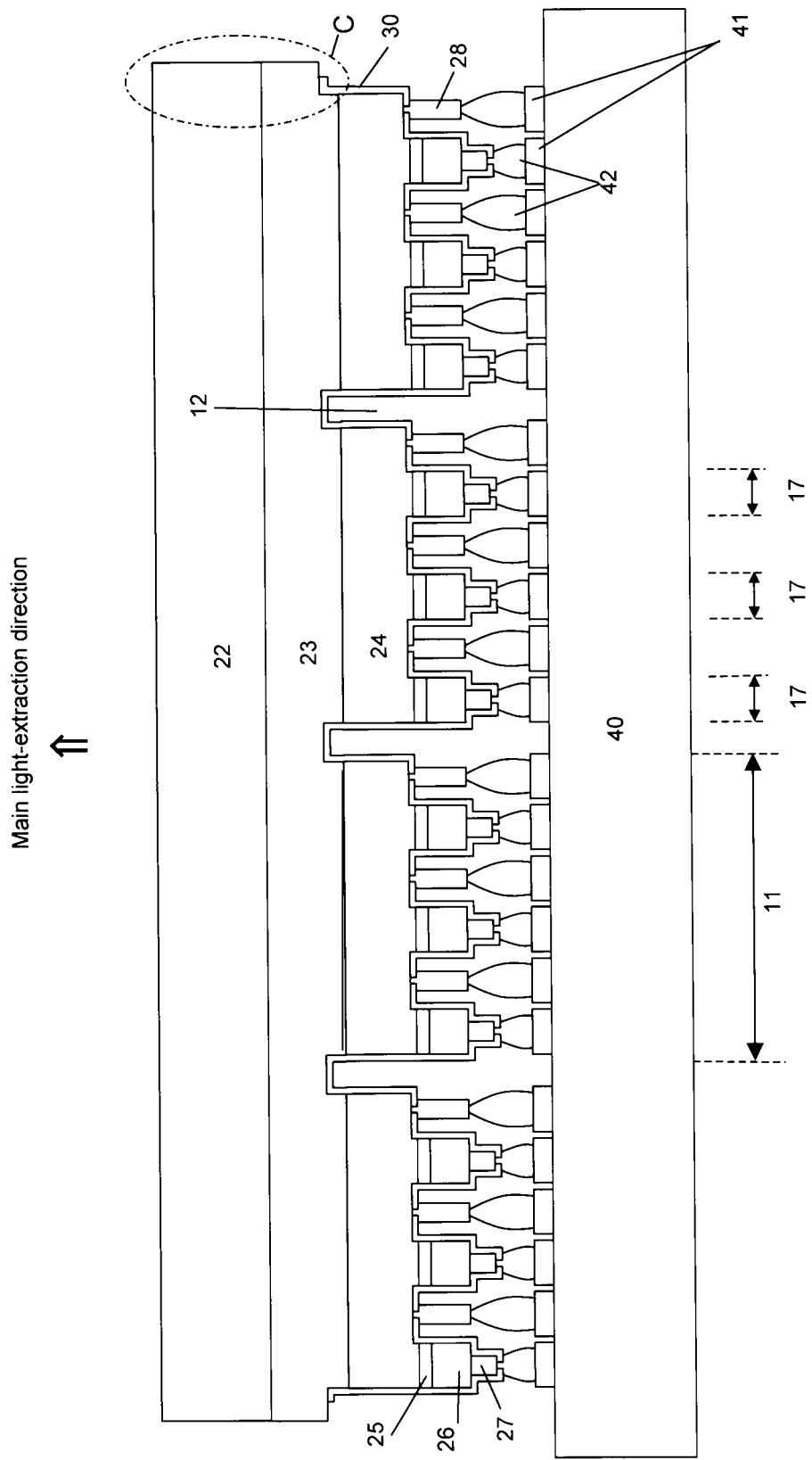
Figures 4, 5, 6, 7, 8, 9, 10, 11, 12, 13, 14:
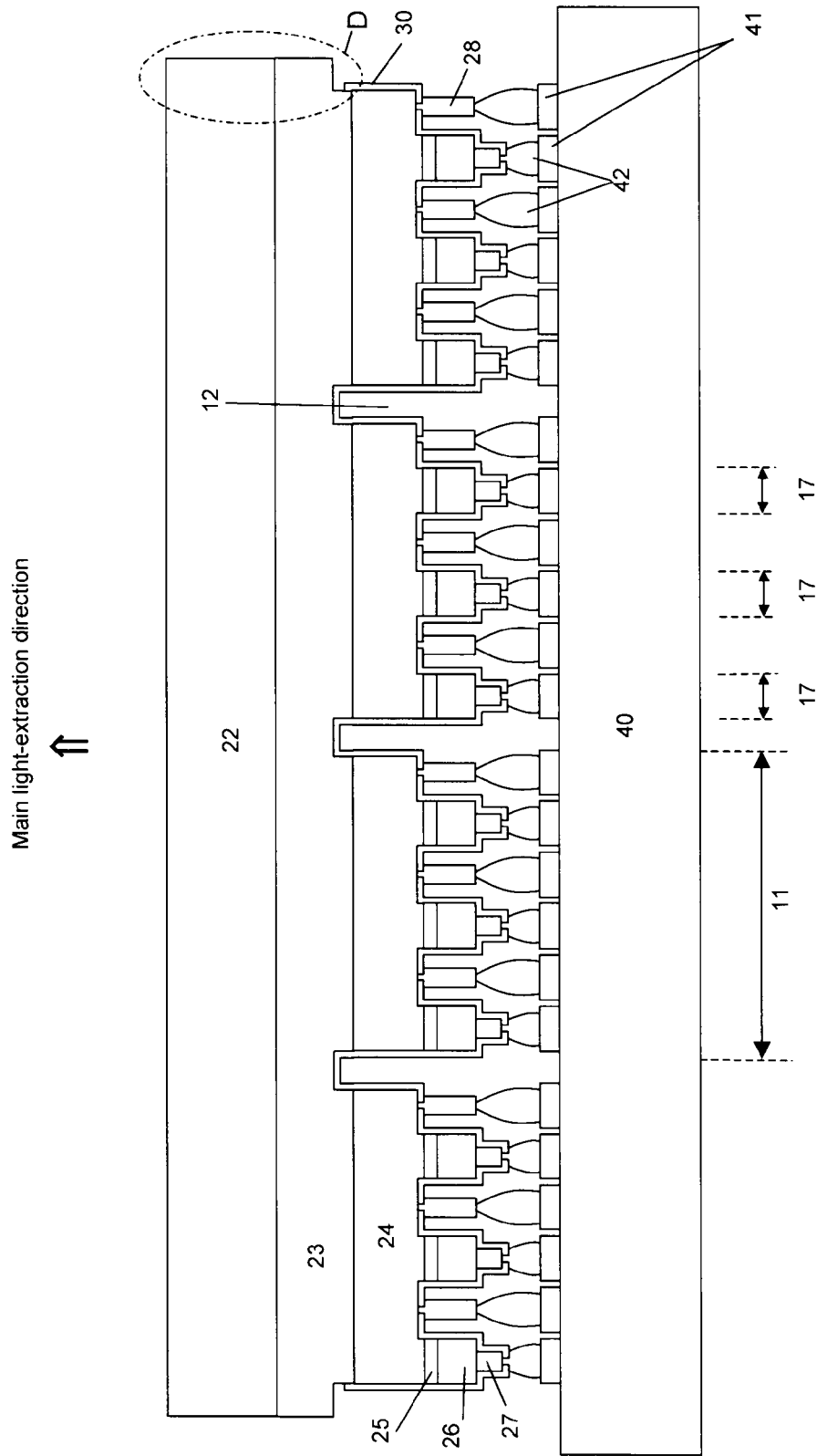
Figures 4, 5, 6, 7, 8, 9, 10, 11, 12, 13, 14, 15:
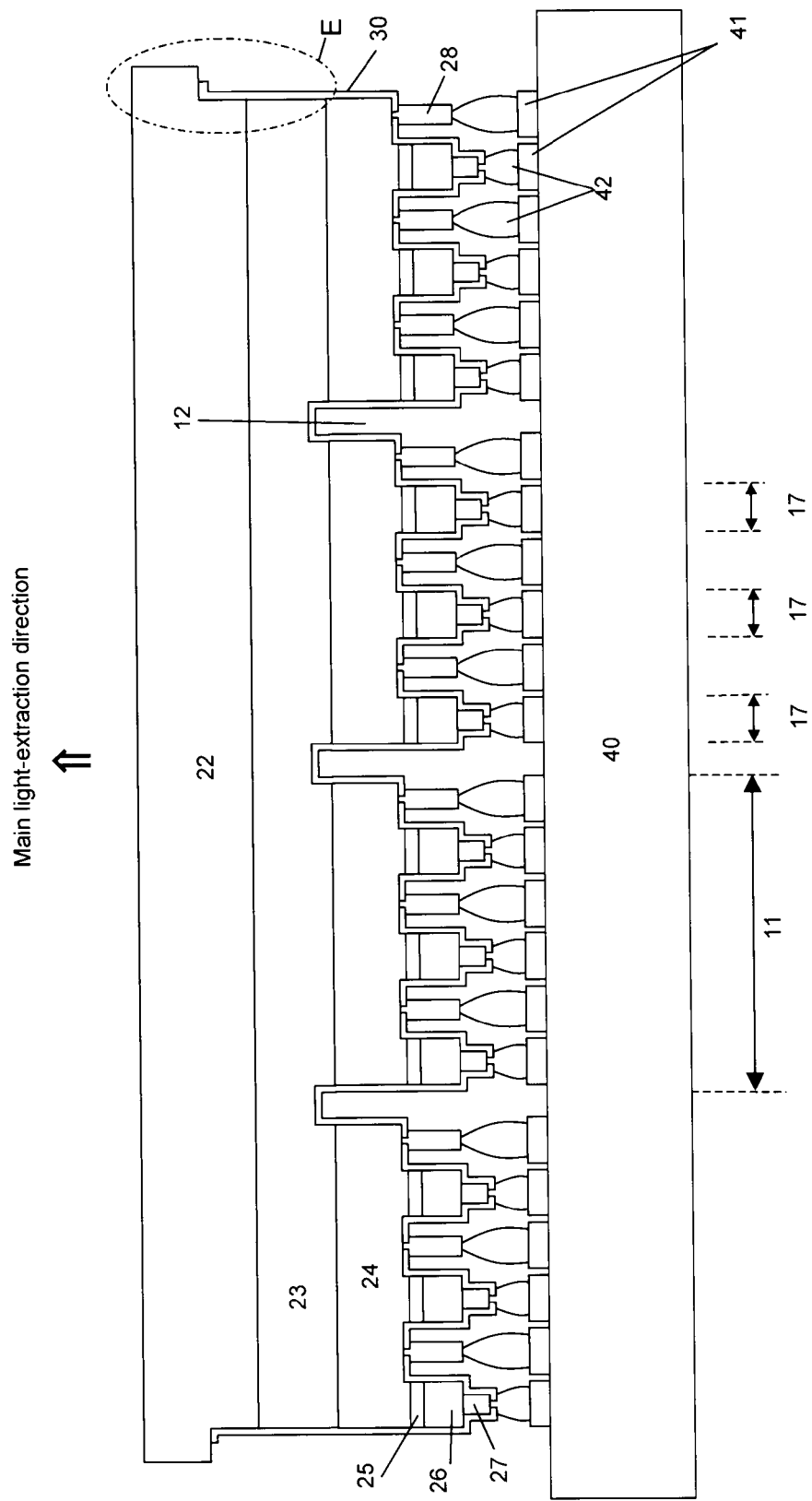
Figures 4, 5, 6, 7, 8, 9, 10, 11, 12, 13, 14, 15, 16:
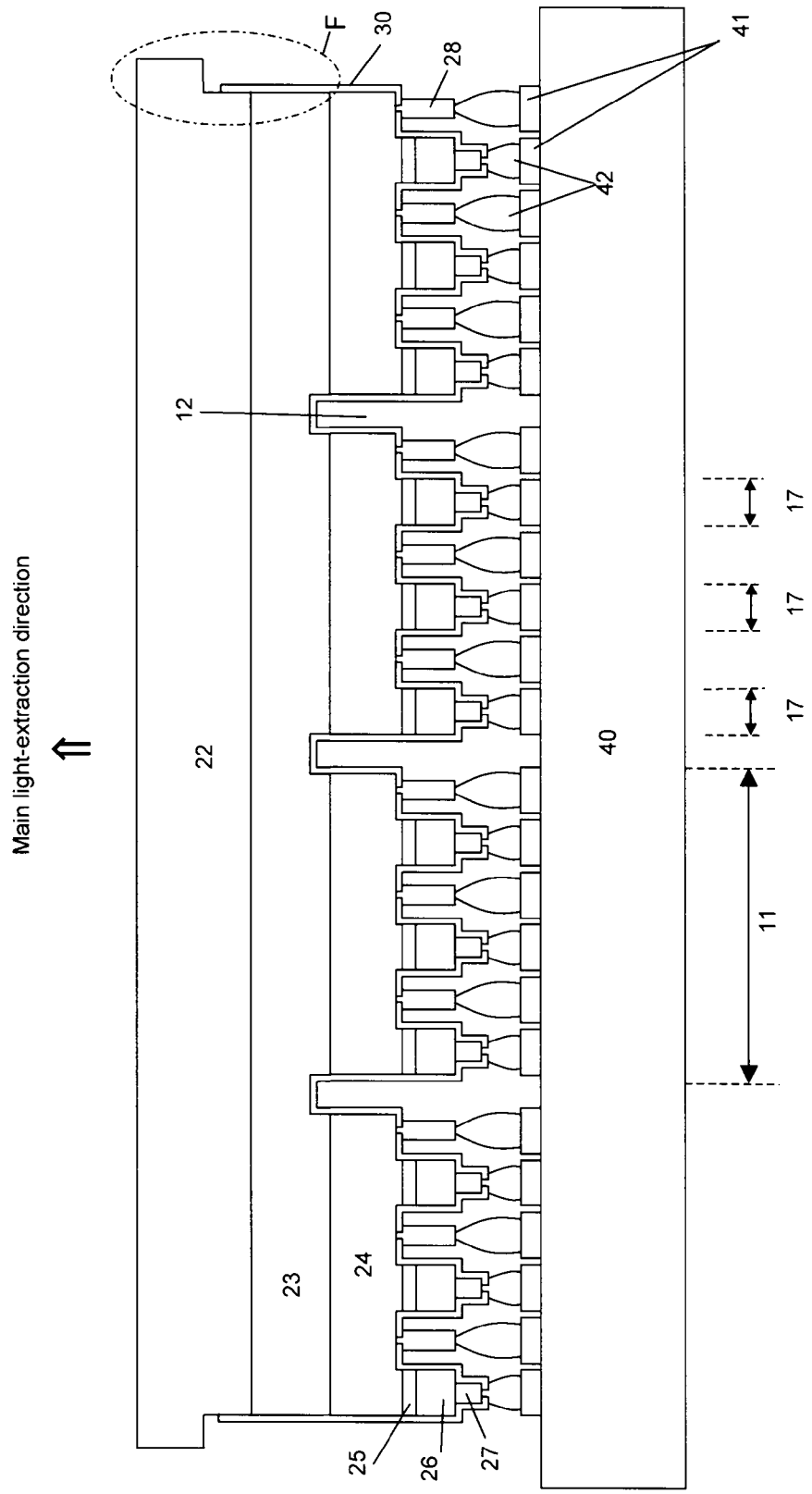
Figures 4, 5, 6, 7, 8, 9, 10, 11, 12, 13, 14, 15, 16, 17:
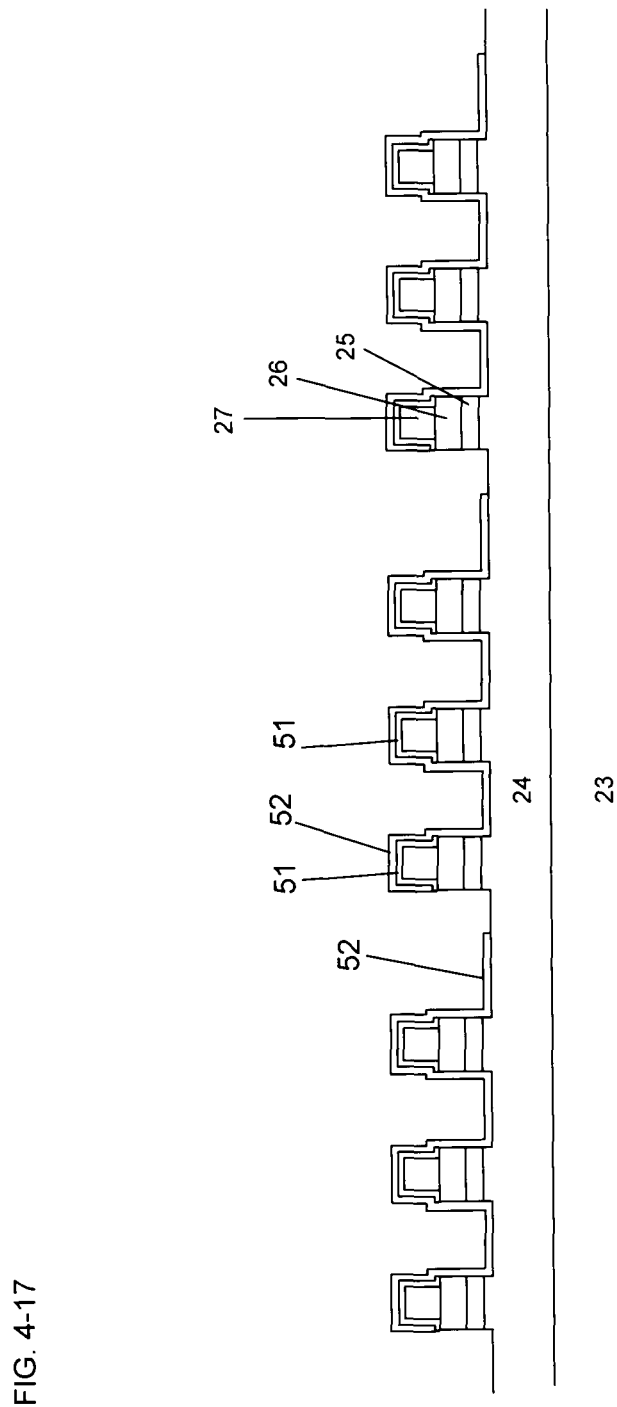

The light-emitting-device shown in FIG. 3-11 was manufactured by the following procedure. FIGS. 3-4 to 10 will be referred to as a related process drawing.

First was prepared a c+ plane sapphire substrate 21 with a thickness of 430 μm, on which an undoped GaN layer with a thickness of 10 nm was formed by growing at a low temperature by MOCVD as a first buffer layer 22a; and then an undoped GaN layer with a thickness of 0.5 μm and a Si-doped (Si concentration: $7\times10^{17}$ cm$^{-3}$) GaN layer with a thickness of 0.5 μm were deposited at 1040° C. as a second buffer layer 22b with a thickness of 1 μm. Subsequently, an undoped GaN layer with a thickness of 3.5 μm was formed at 1035° C. as an optical coupling layer 23.

Then, a Si-doped (Si concentration: $1\times10^{18}$ cm$^{-3}$) GaN layer was formed to 2 μm as a first-conductivity-type (n-type) second cladding layer 24b; a Si-doped (Si concentration: $3\times10^{18}$ cm$^{-3}$) GaN layer was formed to 0.5 μm as a first-conductivity-type (n-type) contact layer 24c; and then a Si-doped (Si concentration: $1.5\times10^{18}$ cm$^{-3}$) Al$_{0.15}$Ga$_{0.85}$N layer was formed to 0.1 μm as a first-conductivity-type (n-type) first cladding layer 24a. Then, an active layer structure 25 was formed by depositing alternately undoped GaN layer to a thickness of 13 nm at 850° C. as a barrier layer and undoped In$_{0.01}$Ga$_{0.9}$N layer to a thickness of 2 nm at 720° C. as a quantum well layer such that five quantum well layers were formed in total and both sides were the barrier layers. Then, after increasing a growth temperature to 1025° C., a Mg-doped (Mg concentration $5\times10^{19}$ cm$^{-3}$) Al$_{0.15}$Ga$_{0.85}$N layer was formed to 0.1 μm as a second-conductivity-type (p-type) first cladding layer 26a. Subsequently, a Mg-doped (Mg concentration: $5\times10^{19}$ cm$^{-3}$) GaN layer was formed to 0.07 μm as a second-conductivity-type (p-type) second cladding layer 26b. Finally, a Mg-doped (Mg concentration: $1\times10^{20}$ cm$^{-3}$) GaN layer was formed to 0.03 μm as a second-conductivity-type (p-type) contact layer 26c.

Then, after gradually lowering the temperature of the MOCVD growth furnace, the wafer was taken out and thus thin-film crystal growth was completed.

For forming a p-side electrode in the wafer after the thin-film crystal growth, photolithography was used to prepare for patterning a p-side electrode 27 by lift-off technique and a resist pattern was formed. Here, Ni (thickness: 20 nm)/Au (thickness: 500 nm) was deposited by vacuum evaporation as a p-side electrode, and an unnecessary part was removed in acetone by lift-off technique. Then, after heating, a p-side electrode was prepared. The structure manufactured so far substantially corresponds to FIG. 3-4. So far, there was not a step causing a damage such as a plasma process in the p-side current injection region just under the p-side electrode.

Next, for conducting the first etching step, an etching mask was formed. Here, by p-CVD, SiN$_x$ was deposited to 0.4 μm over the whole wafer surface at a substrate temperature of 400° C. Here, since Au was exposed in the p-side electrode surface, it was not deteriorated at all after the SiN$_x$ deposition process by p-CVD. Then, photolithography was again conducted for patterning the SiN$_x$ mask to prepare a SiN$_x$ etching mask. Here, the unnecessary part in the SiN$_x$ film was etched using SF$_6$ plasma by RIE, and the mask was left in a part where the thin-film crystal layer was not etched in the first etching step described later, while the SiN$_x$ film was removed in the part corresponding to the part of the thin-film crystal layer to be etched.

Next, as the first etching step, ICP plasma etching was conducted using Cl$_2$ gas for etching through the p-GaN contact layer 26c, the p-GaN second cladding layer 26b, the p-AlGaN first cladding layer 26a, the active layer structure 25 consisting of InGaN quantum well layers and GaN barrier layers and the n-AlGaN first cladding layer 24a to the intermediate portion of the n-GaN contact layer 24c, to expose the n-type contact layer 24c which was to be an injection part for n-type carriers.

After the ICP plasma etching, the SiN$_x$ mask was completely removed using buffered hydrofluoric acid. Again, since Au was exposed in the p-side electrode surface, the p-side electrode was not deteriorated at all after the SiN$_x$ deposition process by p-CVD. The structure manufactured so far substantially corresponds to FIG. 3-5.

Next, for conducting the second etching step of forming a light-emitting-unit separation-trench 12 in each light-emitting-device, a $SrF_2$ mask was formed over the whole wafer surface using vacuum evaporation. Then, the $SrF_2$ film in the region where a light-emitting-unit separation-trench was to be formed was removed to form a mask for forming a light-emitting-unit separation-trench on a thin-film crystal layer, that is, a $SrF_2$ mask for the second etching step.

Then, as the second etching step, were etched the thin-film crystal layers, including the p-GaN contact layer 26c, the p-GaN second cladding layer 26b, the p-AlGaN first cladding layer 26a, the active layer structure 25 consisting of the InGaN quantum well layers and the GaN barrier layers, the n-AlGaN first cladding layer 24a, the n-GaN contact layer 24c, the n-GaN second cladding layer 24b, and a portion of the undoped GaN optical coupling layer 23 in the part corresponding to the light-emitting-unit separation-trench by ICP etching using $Cl_2$ gas. During this second etching step, the $SrF_2$ mask was substantially not etched. The light-emitting-unit separation-trench 12 was formed to a width of 10 μm after this step.

After forming the light-emitting-unit separation-trench 12 by the second etching step, the used unnecessary $SrF_2$ mask was removed. Again, since Au was exposed in the p-side electrode surface, it was not deteriorated at all. The structure manufactured so far substantially corresponds to FIG. 3-6.

Next, for conducting the third etching step of forming a light-emitting-device separation-trench 13 between the compound semiconductor light-emitting-devices, a $SrF_2$ mask was formed over the whole wafer surface using vacuum evaporation. Then, the $SrF_2$ film in the region where a light-emitting-device separation-trench was to be formed was removed to form a mask for forming a light-emitting-device separation-trench on a thin-film crystal layer, that is, a $SrF_2$ mask for the third etching step.

Then, as the third etching step, were etched all the thin-film crystal layers, that is, the p-GaN contact layer 26c, the p-GaN second cladding layer 26b, the p-AlGaN first cladding layer 26a, the active layer structure 25 consisting of the InGaN quantum well layers and the GaN barrier layers, the n-AlGaN first cladding layer 24a, the n-GaN contact layer 24c, the n-GaN second cladding layer 24b, the undoped GaN optical coupling layer 23 and the buffer layer 22 (22a, 22b) in the part corresponding to the light-emitting-device separation-trench by ICP etching using $Cl_2$ gas. During this third etching step, the $SrF_2$ mask was substantially not etched. By this step, the light-emitting-device separation-trench having a width of 50 μm was formed.

After forming the light-emitting-device separation-trench 13 by the third etching step, the used unnecessary $SrF_2$ mask was removed. Again, since Au was exposed in the p-side electrode 27 surface, it was not deteriorated at all. The structure manufactured so far substantially corresponds to FIG. 3-7.

Next, over the whole wafer were sequentially formed $SiO_x$ and $SiN_x$ by p-CVD to form a dielectric multilayer film. Here, each of $SiN_x$ and $SiO_x$ was formed one by one to a thickness that is ¼ as an optical wavelength to an emission wavelength of the device, so that it had a relatively higher reflectance to the emission wavelength. The structure manufactured so far substantially corresponds to FIG. 3-8.

Then, a resist mask was formed using photolithography technique for simultaneously forming a p-side electrode exposed part on the p-side electrode 27 made of Ni—Au, forming an n-side current injection region (36) on the n-side contact layer 24c and removing portion of an insulating layer present near the substrate 21 on the sidewall of the undoped buffer layer within the light-emitting-device separation-trench. Next, a hydrofluoric acid containing etchant was used to remove the dielectric multilayer film (the insulating layer) which was not covered by the resist mask. Further, by the effect of side etching by hydrofluoric acid, the dielectric multilayer film (insulating layer) on the part of the sidewall of the undoped buffer layer 22 was also removed. Here, the periphery of the p-side electrode 27 was covered by the insulating layer consisting of $SiN_x$ and $SiO_x$ to 150 μm.

Subsequently, the used unnecessary resist mask was removed by acetone and by ashing with oxygen plasma by RIE. Again, since Au was exposed in the p-side electrode surface, it was not deteriorated at all after the $SiN_x$ deposition process by p-CVD. The structure manufactured so far substantially corresponds to FIG. 3-9.

Next, for forming an n-side electrode 28, photolithography was used to prepare for patterning an n-side electrode by lift-off technique and a resist pattern was formed. Here, Ti (thickness: 20 nm)/Al (thickness: 300 nm) was deposited over the whole wafer surface by vacuum evaporation as an n-side electrode, and an unnecessary part was removed in acetone by lift-off technique. Then, after heating, an n-side electrode was prepared. The n-side electrode was formed such that its periphery contacted the insulating layer by 30 μm for having an area larger than the n-side current injection region and such that it did not overlap the p-side electrode 27, considering facilitation of flip chip bonding using a metal solder and heat dissipating properties. In another manufacturing example, it was formed so as to contact by 10 μm, and a light-emitting-device exhibiting performance comparable to this example was manufactured. An Al electrode tends to be deteriorated during, for example, a plasma process and is etched by, for example, hydrofluoric acid, but since the n-side electrode was formed in the final step of the device manufacturing process, it was not damaged at all. The structure manufactured so far substantially corresponds to FIG. 3-10.

As preparation for delaminating the substrate, an Si substrate was prepared as a support 40, on the surface of which was formed a metal interconnection (a metal layer 41) having a stacked structure of Ni/Pt/Au. To the support was bonded the whole wafer (thin-film crystal layer, electrodes, insulating layer and the like on substrate 21) including so-far-manufactured light-emitting-device, using an AuSn solder. In the bonding, a wafer having support 40 and light-emitting-devices was heated at 300° C. to fusion-bond a p-side electrode and an n-side electrode to designed metal interconnections on the support, respectively, using an AuSn solder. Here, no defects such as unintended short circuit occurred in the device.

Then, for delaminating the substrate, an excimer laser (wavelength: 248 nm) was irradiated from the surface of the substrate 21 in which thin-film crystal growth had not been conducted, to delaminate the substrate (i.e. laser debonding). Then, Ga metal generated by decomposition of a part of the GaN buffer layer into nitrogen and metal Ga was removed by wet etching.

Next, a low-reflecting optical film 45 formed of alumina was formed by sputtering method on the buffer layer side of the very thin-film light-emitting-device bonded to the support 40 via metal solder 42. Here, alumina was deposited to ¼ of an optical film thickness of the emission wavelength, giving a low-reflecting coating to emission wavelength of the device.

Finally, for dividing individual light-emitting-devices, the device separation region within the support was cut using a dicing saw. Here, since, for example, a metal interconnection is not present in the device separation region within the support, no defects such as unintended interconnection peeling occurred. Thus, an integrated compound semiconductor light-emitting-device shown in FIG. 3-11 was provided.

Example C-2

The procedure in Example C-1 was repeated, except that after depositing the optical coupling layer 23, a thin-film crystal layer was deposited as described below. Specifically, an undoped GaN was formed at 1035° C. to a thickness of 3.5 μm as an optical coupling layer 23 as described in Example C-1, and then a Si-doped (Si concentration: 5×10$^{18}$ cm$^{-3}$) GaN layer was formed to 4 μm as a first-conductivity-type (n-type) second cladding layer 24b; a Si-doped (Si concentration: 8×10$^{18}$ cm$^{-3}$) GaN layer was formed to 0.5 μm as a first-conductivity-type (n-type) contact layer 24c; and then a Si-doped (Si concentration: 5.0×10$^{18}$ cm$^{-3}$) Al$_{0.10}$Ga$_{0.90}$N layer was formed to 0.1 μm as a first-conductivity-type (n-type) first cladding layer 24a. Then, an active layer structure 25 were formed by depositing alternately undoped GaN layer to a thickness of 13 nm at 850° C. as a barrier layer and undoped In$_{0.1}$Ga$_{0.9}$N layer to a thickness of 2 nm at 720° C. as a quantum well layer such that eight quantum well layers were formed in total and both sides were the barrier layers. Then, after increasing a growth temperature to 1025° C., a Mg-doped (Mg concentration 5×10$^{19}$ cm$^{-3}$) Al$_{0.10}$Ga$_{0.90}$N was formed to 0.1 μm as a second-conductivity-type (p-type) first cladding layer 26a. Subsequently, a Mg-doped (Mg concentration: 5×10$^{19}$ cm$^{-3}$) GaN was formed to 0.07 μm as a second-conductivity-type (p-type) second cladding layer 26b. Finally, a Mg-doped (Mg concentration: 1×10$^{20}$ cm$^{-3}$) GaN was formed to 0.03 μm as a second-conductivity-type (p-type) contact layer 26c. The subsequent process was conducted as described in Example C-1, to provide the light-emitting-device shown in FIG. 3-11. Here, no defects such as unintended short circuit occurred in the device.

In the processes in Examples C-1 and 2, the SiN$_x$ mask was removed after the first etching step, but the SiN$_x$ mask may not be removed and can be removed after the second etching step. Alternatively it can be removed after the third etching step, which is also preferable.

Furthermore, the light-emitting-device shown in FIG. 3-16 can be manufactured (wherein the insulating film is a multi-layer dielectric film) by stopping etching in the third etching step in the intermediate portion of the buffer layer. In this case, the light-emitting-device shown in FIG. 3-15 can be manufactured by providing an appropriate etching mask shape using photolithography suitable for a predetermined shape and the side etching is not conducted.

Furthermore, by stopping etching in the third etching step in the intermediate portion of the optical coupling layer, the light-emitting-device shown in FIG. 3-14 can be manufactured. In this case, the light-emitting-device shown in FIG. 3-13 can be manufactured by providing an appropriate etching mask shape using photolithography suitable for a predetermined shape and the side etching is not conducted.

Example C-3

The light-emitting-device shown in FIG. 3-12 was manufactured as follows.

First was prepared a c+ plane sapphire substrate 21 with a thickness of 430 μm, on which an undoped GaN layer with a thickness of 10 nm was formed by growing at a low temperature by MOCVD as a first buffer layer 22a and then an undoped GaN layer with a thickness of 1 μm was formed at 1040° C. as a second buffer layer 22b.

As the optical coupling layer 23, an undoped GaN layer was formed to 2 μm, which, in its center, includes a stacked structure consisting of ten undoped In$_{0.05}$Ga$_{0.95}$N layers each having a thickness of 3 nm and ten undoped GaN layers each having a thickness of 12 nm. Here, the undoped GaN layer and the undoped In$_{0.05}$Ga$_{0.95}$N layer were grown at 850° C. and 730° C., respectively.

Then, a Si-doped (Si concentration: 1×10$^{18}$ cm$^{-3}$) GaN layer was formed to 2 μm as a first-conductivity-type (n-type) second cladding layer 24b; a Si-doped (Si concentration: 2×10$^{18}$ cm$^{-3}$) GaN layer was formed to 0.5 μm as a first-conductivity-type (n-type) contact layer 24c; and then a Si-doped (Si concentration: 1.5×10$^{18}$ cm$^{-3}$) Al$_{0.15}$Ga$_{0.85}$N layer was formed to 0.1 μm as a first-conductivity-type (n-type) first cladding layer 24a.

Then, an active layer structure 25 was formed by depositing alternately undoped GaN layer to a thickness of 13 nm at 850° C. as a barrier layer and undoped In$_{0.13}$Ga$_{0.87}$N layer to a thickness of 2 nm at 715° C. as a quantum well layer such that three quantum well layers were formed in total and both sides were the barrier layers.

Then, after increasing a growth temperature to 1025° C., a Mg-doped (Mg concentration 5×10$^{19}$ cm$^{-3}$) Al$_{0.15}$Ga$_{0.85}$N layer was formed to 0.1 μm as a second-conductivity-type (p-type) first cladding layer 26a. Subsequently, a Mg-doped (Mg concentration: 5×10$^{19}$ cm$^{-3}$) GaN layer was formed to 0.05 μm as a second-conductivity-type (p-type) second cladding layer 26b. Finally, a Mg-doped (Mg concentration: 1×10$^{20}$ cm$^{-3}$) GaN layer was formed to 0.02 μm as a second-conductivity-type (p-type) contact layer 26c.

Then, after gradually lowering the temperature of the MOCVD growth furnace, the wafer was taken out and thus thin-film crystal growth was completed.

For forming a p-side electrode 27 in the wafer after the thin-film crystal growth, photolithography was used to prepare for patterning a p-side electrode by lift-off technique and a resist pattern was formed. Here, Pd (thickness: 20 nm)/Au (thickness: 1000 nm) was deposited by vacuum evaporation as a p-side electrode, and an unnecessary part was removed in acetone by lift-off technique. Then, after heating, a p-side electrode 27 was prepared. So far, there was not a step causing a damage such as a plasma process in the p-side current injection region just under the p-side electrode.

Next, for conducting a second etching step of forming an light-emitting-unit separation-trench and a third etching step of forming a light-emitting-device separation-trench simultaneously, a SrF$_2$ mask was formed over the whole wafer surface using vacuum evaporation. Then, the SrF$_2$ film in the region where a light-emitting-unit separation-trench and a light-emitting-device separation-trench were to be formed was removed to form a separation etching mask, that is, an etching mask for conducting the second etching step and the third etching step simultaneously.

Then, as the second etching step and the third etching step conducted simultaneously, were etched the thin-film crystal layers, including the p-GaN contact layer 26c, the p-GaN second cladding layer 26b, the p-AlGaN first cladding layer 26a, the active layer structure 25 consisting of the InGaN quantum well layer and the GaN barrier layer, the n-AlGaN first cladding layer 24a, the n-GaN contact layer 24c, the n-GaN second cladding layer 24b, and a portion of the undoped InGaN/GaN optical coupling layer 23 in the part corresponding to the light-emitting-unit separation-trench and the light-emitting-device separation-trench by ICP etching using Cl$_2$ gas. During the simultaneous second and third etching step, the SrF$_2$ mask was substantially not etched. The light-emitting-unit separation-trench was formed to a width of 6 μm after this step.

After forming the light-emitting-unit separation-trench and the light-emitting-device separation-trench by the simultaneous second and third etching step, the used unnecessary SrF$_2$ mask was removed. Again, since Au was exposed in the p-side electrode surface, it was not deteriorated at all.

Subsequently, a mask for etching was formed to conduct a first etching step for exposing the first-conductivity-type contact layer as preparation before forming a first-conductivity-type-side electrode. Here, SrF$_2$ was deposited over the whole wafer surface by vacuum evaporation. Then, a photolithography process was again conducted to obtain patterned SrF$_2$ etching mask to form a mask for the first etching step.

Next, as the first etching step, ICP plasma etching was conducted using Cl$_2$ gas for etching through the p-GaN contact layer 26c, the p-GaN second cladding layer 26b, the p-AlGaN first cladding layer 26a, the active layer structure 25 consisting of an InGaN quantum well layer and a GaN barrier layer and the n-AlGaN first cladding layer 24a to the intermediate portion of the n-GaN contact layer 24c, to expose the n-type contact layer which was to be an injection part for n-type carriers.

After the ICP plasma etching, the SrF$_2$ mask was completely removed. Again, since Au was exposed in the p-side electrode surface, it was not deteriorated at all after the process.

Then, SiN$_x$ was formed over the whole wafer surface to 125 nm thickness as an insulating layer 30 by p-CVD. Next, for simultaneously forming a p-side electrode exposed part on the p-side electrode 27 made of Pd—Au, forming an n-side current injection region on the n-side contact layer and removing portion of an insulating layer present in the light-emitting-device separation-trench, first, a resist mask was formed by photolithography, and then, the insulating layer in the part which was not covered by a resist mask was removed using RIE plasma of SF$_6$ gas, so that formation of a p-side electrode exposed part and an n-side current injection region and removal of a portion of an insulating layer present in the light-emitting-device separation-trench are conducted. Here, the periphery of the p-side electrode was covered by the SiN$_x$ insulating layer. Furthermore, for example, the sidewall of the thin-film crystal layer was covered by an insulating layer, except the n-side current injection region. Further, as described in Examples C-1 and 2, the light-emitting-device shown in FIG. 3-14 (FIG. 3-12 represents this configuration) can be manufactured by providing an appropriate etching mask shape using photolithography suitable for a predetermined shape and allowing side etching of the insulating layer to proceed. Also, the light-emitting-device shown in FIG. 3-13 can be manufactured by providing an appropriate etching mask shape using photolithography suitable for a predetermined shape and the side etching of the insulating layer is not conducted.

Subsequently, the unnecessary resist mask was removed by acetone and by ashing with oxygen plasma by RIE. Again, since Au was exposed in the p-side electrode surface, it was not deteriorated at all.

Next, for forming an n-side electrode 28, photolithography was used to prepare for patterning an n-side electrode by lift-off technique and a resist pattern was formed. Here, Ti (thickness: 20 nm)/Al (thickness: 1500 nm) was deposited over the whole wafer surface by vacuum evaporation as an n-side electrode, and an unnecessary part was removed in acetone by lift-off technique. Then, after heating, an n-side electrode was prepared. The n-side electrode was formed such that its area was larger than the n-side current injection region and such that it does not overlap the p-side electrode, considering facilitation of flip chip bonding using a metal solder and heat dissipating properties. An Al electrode tends to be deteriorated during, for example, a plasma process and is etched by, for example, hydrofluoric acid, but since the n-side electrode was formed in the final step of the device manufacturing process, it was not damaged at all.

As preparation for delaminating the substrate, an AlN substrate was prepared as a support 40, on the surface of which was formed a metal interconnection (a metal layer 41) having a stacked structure of Ti/Pt/Au. To the support was bonded the whole wafer (thin-film crystal layer, electrodes, insulating layer and the like on substrate 21) including so-far-manufactured light-emitting-device, using an AuSn solder. In the bonding, a wafer having support 40 and light-emitting-devices was heated at 300° C. to fusion-bond a p-side electrode and an n-side electrode to designed metal interconnections on the support, respectively, using an AuSn solder. Here, no defects such as unintended short circuit occurred in the device.

Then, for delaminating the substrate, an excimer laser (wavelength: 248 nm) was irradiated from the surface of the substrate 21 in which thin-film crystal growth had not been conducted, to delaminate the substrate (i.e. laser debonding). Then, Ga metal generated by decomposition of a part of the GaN buffer layer into nitrogen and metal Ga was removed by wet etching.

Finally, for dividing individual light-emitting-devices, the device separation region within the support, together with the buffer layer and the optical coupling layer in the bottom of the light-emitting-device separation-trench, was cut using a dicing saw. Here, since, for example, a metal interconnection is not present in the device separation region within the support, no defects such as unintended interconnection peeling occurred. Thus, an integrated compound semiconductor light-emitting-device shown in FIG. 3-12 was provided.

Examples of the Invention in Relation to Section D

Example D-1

The light-emitting-device shown in FIG. 4-11 was manufactured by the following procedure. FIGS. 4-4 to 10 will be referred to as a related process drawing.

First was prepared a c+ plane sapphire substrate 21 with a thickness of 430 μm, on which an undoped GaN layer with a thickness of 10 nm was formed by growing at a low temperature by MOCVD as a first buffer layer 22a; and then an undoped GaN layer with a thickness of 0.5 μm and a Si-doped (Si concentration: $7 \times 10^{17}$ cm$^{-3}$) GaN layer with a thickness of 0.5 μm were deposited at 1040° C. as a second buffer layer 22b with a thickness of 1 μm. Subsequently, an undoped GaN layer with a thickness of 3.5 μm was formed at 1035° C. as an optical coupling layer 23.

Then, a Si-doped (Si concentration: $1 \times 10^{18}$ cm$^{-3}$) GaN layer was formed to 2 μm as a first-conductivity-type (n-type) second cladding layer 24b; a Si-doped (Si concentration: $3 \times 10^{18}$ cm$^{-3}$) GaN layer was formed to 0.5 μm as a first-conductivity-type (n-type) contact layer 24c; and then a Si-doped (Si concentration: $1.5 \times 10^{18}$ cm$^{-3}$) Al$_{0.15}$Ga$_{0.85}$N layer was formed to 0.1 μm as a first-conductivity-type (n-type) first cladding layer 24a. Then, an active layer structure 25 was formed by depositing alternately undoped GaN layer to a thickness of 13 nm at 850° C. as a barrier layer and undoped In$_{0.1}$Ga$_{0.9}$N layer to a thickness of 2 nm at 720° C. as a quantum well layer such that five quantum well layers were formed in total and both sides were the barrier layers. Then, after increasing a growth temperature to 1025° C., a Mg-doped (Mg concentration $5\times10^{19}$ cm$^{-3}$) Al$_{0.15}$Ga$_{0.85}$N layer was formed to 0.1 µm as a second-conductivity-type (p-type) first cladding layer 26a. Subsequently, a Mg-doped (Mg concentration: $5\times10^{19}$ cm$^{-3}$) GaN layer was formed to 0.07 µm as a second-conductivity-type (p-type) second cladding layer 26b. Finally, a Mg-doped (Mg concentration: $1\times10^{20}$ cm$^{-3}$) GaN layer was formed to 0.03 µm as a second-conductivity-type (p-type) contact layer 26c.

Then, after gradually lowering the temperature of the MOCVD growth furnace, the wafer was taken out and thus thin-film crystal growth was completed.

For forming a p-side electrode in the wafer after the thin-film crystal growth, photolithography was used to prepare for patterning a p-side electrode 27 by lift-off technique and a resist pattern was formed. Here, Ni (thickness: 20 nm)/Au (thickness: 500 nm) was deposited by vacuum evaporation as a p-side electrode, and an unnecessary part was removed in acetone by lift-off technique. Then, after heating, a p-side electrode was prepared. The structure manufactured so far substantially corresponds to FIG. 4-4. So far, there was not a step causing a damage such as a plasma process in the p-side current injection region just under the p-side electrode.

Next, for conducting the first etching step, an etching mask was formed. Here, by p-CVD, SiN$_x$ was deposited to 0.4 µm over the whole wafer surface at a substrate temperature of 400° C. Here, since Au was exposed in the p-side electrode surface, it was not deteriorated at all after the SiN$_x$ deposition process by p-CVD. Then, photolithography was again conducted for patterning the SiN$_x$ mask to prepare a SiN$_x$ etching mask. Here, the unnecessary part in the SiN$_x$ film was etched using SF$_6$ plasma by RIE, and the mask was left in a part where the thin-film crystal layer was not etched in the first etching step described later, while the SiN$_x$ film was removed in the part corresponding to the part of the thin-film crystal layer to be etched.

Next, as the first etching step, ICP plasma etching was conducted using Cl$_2$ gas for etching through the p-GaN contact layer 26c, the p-GaN second cladding layer 26b, the p-AlGaN first cladding layer 26a, the active layer structure 25 consisting of InGaN quantum well layers and GaN barrier layers and the n-AlGaN first cladding layer 24a to the intermediate portion of the n-GaN contact layer 24c, to expose the n-type contact layer 24c which was to be an injection part for n-type carriers and simultaneously to form shape of a plurality of light-emitting-points.

After the ICP plasma etching, the SiN$_x$ mask was completely removed using buffered hydrofluoric acid. Again, since Au was exposed in the p-side electrode surface, the p-side electrode was not deteriorated at all after the SiN$_x$ deposition process by p-CVD. The structure manufactured so far substantially corresponds to FIG. 4-5.

Next, for conducting the second etching step of forming a light-emitting-unit separation-trench 12 in each light-emitting-device, a SrF$_2$ mask was formed over the whole wafer surface using vacuum evaporation. Then, the SrF$_2$ film in the region where a light-emitting-unit separation-trench was to be formed was removed to form a mask for forming a light-emitting-unit separation-trench on a thin-film crystal layer, that is, a SrF$_2$ mask for the second etching step.

Then, as the second etching step, were etched the thin-film crystal layers, including the p-GaN contact layer 26c, the p-GaN second cladding layer 26b, the p-AlGaN first cladding layer 26a, the active layer structure 25 consisting of the InGaN quantum well layers and the GaN barrier layers, the n-AlGaN first cladding layer 24a, the n-GaN contact layer 24c, the n-GaN second cladding layer 24b, and a portion of the undoped GaN optical coupling layer 23 in the part corresponding to the light-emitting-unit separation-trench by ICP etching using Cl$_2$ gas. During this second etching step, the SrF$_2$ mask was substantially not etched. The light-emitting-unit separation-trench 12 was formed to a width of 10 µm after this step.

After forming the light-emitting-unit separation-trench 12 by the second etching step, the used unnecessary SrF$_2$ mask was removed. Again, since Au was exposed in the p-side electrode surface, it was not deteriorated at all. The structure manufactured so far substantially corresponds to FIG. 4-6.

Next, for conducting the third etching step of forming a light-emitting-device separation-trench 13 between the compound semiconductor light-emitting-devices, a SrF$_2$ mask was formed over the whole wafer surface using vacuum evaporation. Then, the SrF$_2$ film in the region where a light-emitting-device separation-trench was to be formed was removed to form a mask for forming a light-emitting-device separation-trench on a thin-film crystal layer, that is, a SrF$_2$ mask for the third etching step.

Then, as the third etching step, were etched all the thin-film crystal layers, that is, the p-GaN contact layer 26c, the p-GaN second cladding layer 26b, the p-AlGaN first cladding layer 26a, the active layer structure 25 consisting of the InGaN quantum well layers and the GaN barrier layers, the n-AlGaN first cladding layer 24a, the n-GaN contact layer 24c, the n-GaN second cladding layer 24b, the undoped GaN optical coupling layer 23 and the buffer layer 22 (22a, 22b) in the part corresponding to the light-emitting-device separation-trench by ICP etching using Cl$_2$ gas. During this third etching step, the SrF$_2$ mask was substantially not etched. By this step, the light-emitting-device separation-trench having a width of 50 µm was formed.

After forming the light-emitting-device separation-trench 13 by the third etching step, the used unnecessary SrF$_2$ mask was removed. Again, since Au was exposed in the p-side electrode 27 surface, it was not deteriorated at all. The structure manufactured so far substantially corresponds to FIG. 4-7.

Next, over the whole wafer were sequentially formed SiO$_x$ and SiN$_x$ by p-CVD to form a dielectric multilayer film as an insulating layer. Here, each of SiN$_x$ and SiO$_x$ was formed one by one to a thickness that is ¼ as an optical wavelength to an emission wavelength of the device, so that it had a relatively higher reflectance to the emission wavelength. The structure manufactured so far substantially corresponds to FIG. 4-8.

Then, a resist mask was formed using photolithography technique for simultaneously forming a p-side electrode exposed part on the p-side electrode 27 made of Ni—Au, forming an n-side current injection region (36) on the n-side contact layer 24c and removing portion of an insulating layer present near the substrate 21 on the sidewall of the undoped buffer layer within the light-emitting-device separation-trench. Next, a hydrofluoric acid containing etchant was used to remove the dielectric multilayer film (the insulating layer) which was not covered by the resist mask. Further, by the effect of side etching by hydrofluoric acid, the dielectric multilayer film (insulating layer) on the part of the sidewall of the undoped buffer layer 22 was also removed. Here, the periphery of the p-side electrode 27 was covered by the insulating layer consisting of SiN$_x$ and SiO$_x$ to 150 µm.

Subsequently, the used unnecessary resist mask was removed by acetone and by ashing with oxygen plasma by RIE. Again, since Au was exposed in the p-side electrode surface, it was not deteriorated at all after the SiN$_x$ deposition process by p-CVD. The structure manufactured so far substantially corresponds to FIG. 4-9.

Next, for forming an n-side electrode 28, photolithography was used to prepare for patterning an n-side electrode by lift-off technique and a resist pattern was formed. Here, Ti (thickness: 20 nm)/Al (thickness: 300 nm) was deposited over the whole wafer surface by vacuum evaporation as an n-side electrode, and an unnecessary part was removed in acetone by lift-off technique. Then, after heating, an n-side electrode was prepared. The n-side electrode was formed such that its periphery contacted the insulating layer by 30 µm for having an area larger than the n-side current injection region and such that it did not overlap the p-side electrode 27, considering facilitation of flip chip bonding using a metal solder and heat dissipating properties. In another manufacturing example, it was formed so as to contact by 10 µm, and a light-emitting-device exhibiting performance comparable to this example was manufactured. An Al electrode tends to be deteriorated during, for example, a plasma process and is etched by, for example, hydrofluoric acid, but since the n-side electrode was formed in the final step of the device manufacturing process, it was not damaged at all. The structure manufactured so far substantially corresponds to FIG. 4-10.

As preparation for delaminating the substrate, an Si substrate was prepared as a support 40, on the surface of which was formed a metal interconnection (a metal layer 41) having a stacked structure of Ni/Pt/Au. To the support was bonded the whole wafer (thin-film crystal layer, electrodes, insulating layer and the like on substrate 21) including so-far-manufactured light-emitting-device, using an AuSn solder. In the bonding, a wafer having support 40 and light-emitting-devices was heated at 300° C. to fusion-bond a p-side electrode and an n-side electrode to designed metal interconnections on the support, respectively, using an AuSn solder. Here, no defects such as unintended short circuit occurred in the device.

Then, for delaminating the substrate, an excimer laser (wavelength: 248 nm) was irradiated from the surface of the substrate 21 in which thin-film crystal growth had not been conducted, to delaminate the substrate (i.e. laser debonding). Then, Ga metal generated by decomposition of a part of the GaN buffer layer into nitrogen and metal Ga was removed by wet etching.

Next, a low-reflecting optical film 45 formed of alumina was formed by sputtering method on the buffer layer side of the very thin-film light-emitting-device bonded to the support 40 via metal solder 42. Here, alumina was deposited to ¼ of an optical film thickness of the emission wavelength, giving a low-reflecting coating to emission wavelength of the device.

Finally, for dividing individual light-emitting-devices, the device separation region within the support was cut using a dicing saw. Here, since, for example, a metal interconnection is not present in the device separation region within the support, no defects such as unintended interconnection peeling occurred. Thus, an integrated compound semiconductor light-emitting-device shown in FIG. 4-11 was provided.

Example D-2

The procedure in Example D-1 was repeated, except that after depositing the optical coupling layer 23, a thin-film crystal layer was deposited as described below. Specifically, an undoped GaN was formed at 1035° C. to a thickness of 3.5 µm as an optical coupling layer 23 as described in Example D-1, and then a Si-doped (Si concentration: $5\times10^{18}$ cm$^{-3}$) GaN layer was formed to 4 µm as a first-conductivity-type (n-type) second cladding layer 24b; a Si-doped (Si concentration: $8\times10^{18}$ cm$^{-3}$) GaN layer was formed to 0.5 µm as a first-conductivity-type (n-type) contact layer 24c; and then a Si-doped (Si concentration: $5.0\times10^{18}$ cm$^{-3}$) Al$_{0.10}$Ga$_{0.90}$N layer was formed to 0.1 µm as a first-conductivity-type (n-type) first cladding layer 24a. Then, an active layer structure 25 were formed by depositing alternately undoped GaN layer to a thickness of 13 nm at 850° C. as a barrier layer and undoped In$_{0.1}$Ga$_{0.9}$N layer to a thickness of 2 nm at 720° C. as a quantum well layer such that eight quantum well layers were formed in total and both sides were the barrier layers. Then, after increasing a growth temperature to 1025° C., a Mg-doped (Mg concentration $5\times10^{19}$ cm$^{-3}$) Al$_{0.10}$Ga$_{0.90}$N was formed to 0.1 µm as a second-conductivity-type (p-type) first cladding layer 26a. Subsequently, a Mg-doped (Mg concentration: $5\times10^{19}$ cm$^{-3}$) GaN was formed to 0.07 µm as a second-conductivity-type (p-type) second cladding layer 26b. Finally, a Mg-doped (Mg concentration: $1\times10^{20}$ cm$^{-3}$) GaN was formed to 0.03 µm as a second-conductivity-type (p-type) contact layer 26c. The subsequent process was conducted as described in Example D-1, to provide the light-emitting-device shown in FIG. 4-11. Here, no defects such as unintended short circuit occurred in the device.

In the processes in Examples D-1 and 2, the SiN$_x$ mask was removed after the first etching step, but the SiN$_x$ mask may not be removed and can be removed after the second etching step. Alternatively it can be removed after the third etching step, which is also preferable.

Furthermore, the light-emitting-device shown in FIG. 4-16 can be manufactured (wherein the insulating film is a multi-layer dielectric film) by stopping etching in the third etching step in the intermediate portion of the buffer layer. In this case, the light-emitting-device shown in FIG. 4-15 can be manufactured by providing an appropriate etching mask shape using photolithography suitable for a predetermined shape and the side etching is not conducted.

Furthermore, by stopping etching in the third etching step in the intermediate portion of the optical coupling layer, the light-emitting-device shown in FIG. 4-14 can be manufactured. In this case, the light-emitting-device shown in FIG. 4-13 can be manufactured by providing an appropriate etching mask shape using photolithography suitable for a predetermined shape and the side etching is not conducted.

Example D-3

The light-emitting-device shown in FIG. 4-12 was manufactured as follows.

First was prepared a c+ plane sapphire substrate 21 with a thickness of 430 µm, on which an undoped GaN layer with a thickness of 10 nm was formed by growing at a low temperature by MOCVD as a first buffer layer 22a and then an undoped GaN layer with a thickness of 1 µm was formed at 1040° C. as a second buffer layer 22b.

As the optical coupling layer 23, an undoped GaN layer was formed to 2 µm, which, in its center, includes a stacked structure consisting of ten undoped In$_{0.05}$Ga$_{0.95}$N layers each having a thickness of 3 nm and ten undoped GaN layers each having a thickness of 12 nm. Here, the undoped GaN layer and the undoped In$_{0.05}$Ga$_{0.95}$N layer were grown at 850° C. and 730° C., respectively.

Then, a Si-doped (Si concentration: $1\times10^{18}$ cm$^{-3}$) GaN layer was formed to 2 µm as a first-conductivity-type (n-type) second cladding layer 24b; a Si-doped (Si concentration: $2\times10^{18}$ cm$^{-3}$) GaN layer was formed to 0.5 µm as a first-conductivity-type (n-type) contact layer 24c; and then a Si-doped (Si concentration: $1.5\times10^{18}$ cm$^{-3}$) Al$_{0.15}$Ga$_{0.85}$N layer was formed to 0.1 μm as a first-conductivity-type (n-type) first cladding layer 24a.

Then, an active layer structure 25 was formed by depositing alternately undoped GaN layer to a thickness of 13 nm at 850° C. as a barrier layer and undoped In$_{0.13}$Ga$_{0.87}$N layer to a thickness of 2 nm at 715° C. as a quantum well layer such that three quantum well layers were formed in total and both sides were the barrier layers.

Then, after increasing a growth temperature to 1025° C., a Mg-doped (Mg concentration $5\times10^{19}$ cm$^{-3}$) Al$_{0.15}$Ga$_{0.85}$N layer was formed to 0.1 μm as a second-conductivity-type (p-type) first cladding layer 26a. Subsequently, a Mg-doped (Mg concentration: $5\times10^{19}$ cm$^{-3}$) GaN layer was formed to 0.05 μm as a second-conductivity-type (p-type) second cladding layer 26b. Finally, a Mg-doped (Mg concentration: $1\times10^{20}$ cm$^{-3}$) GaN layer was formed to 0.02 μm as a second-conductivity-type (p-type) contact layer 26c.

Then, after gradually lowering the temperature of the MOCVD growth furnace, the wafer was taken out and thus thin-film crystal growth was completed.

For forming a p-side electrode 27 in the wafer after the thin-film crystal growth, photolithography was used to prepare for patterning a p-side electrode by lift-off technique and a resist pattern was formed. Here, Pd (thickness: 20 nm)/Au (thickness: 1000 nm) was deposited by vacuum evaporation as a p-side electrode, and an unnecessary part was removed in acetone by lift-off technique. Then, after heating, a p-side electrode 27 was prepared. So far, there was not a step causing a damage such as a plasma process in the p-side current injection region just under the p-side electrode.

Next, for conducting a second etching step of forming an light-emitting-unit separation-trench and a third etching step of forming a light-emitting-device separation-trench simultaneously, a SrF$_2$ mask was formed over the whole wafer surface using vacuum evaporation. Then, the SrF$_2$ film in the region where a light-emitting-unit separation-trench and a light-emitting-device separation-trench were to be formed was removed to form a separation etching mask, that is, an etching mask for conducting the second etching step and the third etching step simultaneously.

Then, as the second etching step and the third etching step conducted simultaneously, were etched the thin-film crystal layers, including the p-GaN contact layer 26c, the p-GaN second cladding layer 26b, the p-AlGaN first cladding layer 26a, the active layer structure 25 consisting of the InGaN quantum well layer and the GaN barrier layer, the n-AlGaN first cladding layer 24a, the n-GaN contact layer 24c, the n-GaN second cladding layer 24b, and a portion of the undoped InGaN/GaN optical coupling layer 23 in the part corresponding to the light-emitting-unit separation-trench and the light-emitting-device separation-trench by ICP etching using Cl$_2$ gas. During the simultaneous second and third etching step, the SrF$_2$ mask was substantially not etched. The light-emitting-unit separation-trench was formed to a width of 6 μm after this step.

After forming the light-emitting-unit separation-trench and the light-emitting-device separation-trench by the simultaneous second and third etching step, the used unnecessary SrF$_2$ mask was removed. Again, since Au was exposed in the p-side electrode surface, it was not deteriorated at all.

Subsequently, a mask for etching was formed to conduct a first etching step for exposing the first-conductivity-type contact layer as preparation before forming a first-conductivity-type-side electrode. Here, SrF$_2$ was deposited over the whole wafer surface by vacuum evaporation. Then, a photolithography process was again conducted to obtain patterned SrF$_2$ etching mask to form a mask for the first etching step.

Next, as the first etching step, ICP plasma etching was conducted using Cl$_2$ gas for etching through the p-GaN contact layer 26c, the p-GaN second cladding layer 26b, the p-AlGaN first cladding layer 26a, the active layer structure 25 consisting of an InGaN quantum well layer and a GaN barrier layer and the n-AlGaN first cladding layer 24a to the intermediate portion of the n-GaN contact layer 24c, to expose the n-type contact layer which was to be an injection part for n-type carriers and simultaneously to form shape of a plurality of light-emitting-points.

After the ICP plasma etching, the SrF$_2$ mask was completely removed. Again, since Au was exposed in the p-side electrode surface, it was not deteriorated at all after the process.

Then, SiN$_x$ was formed over the whole wafer surface to 125 nm thickness as an insulating layer 30 by p-CVD. Next, for simultaneously forming a p-side electrode exposed part on the p-side electrode 27 made of Pd—Au, forming an n-side current injection region on the n-side contact layer and removing portion of an insulating layer present in the light-emitting-device separation-trench, first, a resist mask was formed by photolithography, and then, the insulating layer in the part which was not covered by a resist mask was removed using RIE plasma of SF$_6$ gas, so that formation of a p-side electrode exposed part and an n-side current injection region and removal of a portion of an insulating layer present in the light-emitting-device separation-trench are conducted. Here, the periphery of the p-side electrode was covered by the SiN$_x$ insulating layer. Furthermore, for example, the sidewall of the thin-film crystal layer was covered by an insulating layer, except the n-side current injection region. Further, as described in Examples D-1 and 2, the light-emitting-device shown in FIG. 4-14 (FIG. 4-12 represents this configuration) can be manufactured by providing an appropriate etching mask shape using photolithography suitable for a predetermined shape and allowing side etching of the insulating layer to proceed. Also, the light-emitting-device shown in FIG. 4-13 can be manufactured by providing an appropriate etching mask shape using photolithography suitable for a predetermined shape and the side etching of the insulating layer is not conducted. In addition, the removal of the insulating layer was performed such that the number and area of the n-side current injection region were less and smaller than the number and area of the p-side current injection region, respectively in one light-emitting-unit.

Subsequently, the unnecessary resist mask was removed by acetone and by ashing with oxygen plasma by RIE. Again, since Au was exposed in the p-side electrode surface, it was not deteriorated at all.

Next, for forming an n-side electrode 28, photolithography was used to prepare for patterning an n-side electrode by lift-off technique and a resist pattern was formed. In this case, the patterning was performed such that the number and area of the n-side electrode are less and smaller than the number or area of the p-side electrode, respectively in one light-emitting-unit. Here, Ti (thickness: 20 nm)/Al (thickness: 1500 nm) was deposited over the whole wafer surface by vacuum evaporation as an n-side electrode, and an unnecessary part was removed in acetone by lift-off technique. Then, after heating, an n-side electrode was prepared. The n-side electrode was formed such that its area was larger than the n-side current injection region and such that it does not overlap the p-side electrode, considering facilitation of flip chip bonding using a metal solder and heat dissipating properties. An Al electrode tends to be deteriorated during, for example, a plasma process and is etched by, for example, hydrofluoric acid, but since the n-side electrode was formed in the final step of the device manufacturing process, it was not damaged at all.

As preparation for delaminating the substrate, an AlN substrate was prepared as a support 40, on the surface of which was formed a metal interconnection (a metal layer 41) having a stacked structure of Ti/Pt/Au. To the support was bonded the whole wafer (thin-film crystal layer, electrodes, insulating layer and the like on substrate 21) including so-far-manufactured light-emitting-device, using an AuSn solder. In the bonding, a wafer having support 40 and light-emitting-devices was heated at 300° C. to fusion-bond a p-side electrode and an n-side electrode to designed metal interconnections on the support, respectively, using an AuSn solder. Here, no defects such as unintended short circuit occurred in the device.

Then, for delaminating the substrate, an excimer laser (wavelength: 248 nm) was irradiated from the surface of the substrate 21 in which thin-film crystal growth had not been conducted, to delaminate the substrate (i.e. laser debonding). Then, Ga metal generated by decomposition of a part of the GaN buffer layer into nitrogen and metal Ga was removed by wet etching.

Finally, for dividing individual light-emitting-devices, the device separation region within the support, together with the buffer layer and the optical coupling layer in the bottom of the light-emitting-device separation-trench, was cut using a dicing saw. Here, since, for example, a metal interconnection is not present in the device separation region within the support, no defects such as unintended interconnection peeling occurred. Thus, an integrated compound semiconductor light-emitting-device shown in FIG. 4-12 was provided.

INDUSTRIAL APPLICABILITY

The light-emitting-device of the present invention is useful as a semiconductor light-emitting-device capable of emitting light as a large-area plane light source.

The invention claimed is:

1. A process for manufacturing a compound semiconductor light-emitting device including a first light-emitting-unit and a second light-emitting-unit, the process comprising:
preparing a semiconductor wafer which comprises a substrate, an optical coupling layer deposited on the substrate, and a thin-film crystal layer deposited on top of the optical coupling layer, the thin-film crystal layer having an n-type semiconductor layer containing an n-type cladding layer, one active layer structure, and a p-type semiconductor layer containing a p-type cladding layer;
forming a light-emitting-unit separation-trench by dry-etching between a first part and a second part of the thin-film crystal layer, where the first part is a part to be included in the first light-emitting-unit and the second part is a part to be included in the second light-emitting-unit, so that the first light-emitting-unit and the second light-emitting-unit are electrically separated from each other and are formed by separating the one active layer structure, but are optically coupled to each other by the optical coupling layer which is below the first light-emitting-unit and the second light-emitting-unit, wherein light emitted by the first light-emitting unit and the second light-emitting unit is propagated through the optical coupling layer, the first light-emitting unit and the second light-emitting unit have a same emission wavelength, and the optical coupling layer is sufficiently insulative to electrically separate the first light-emitting unit and the second light-emitting unit; and
eliminating the substrate from the optical coupling layer.

2. The process according to claim 1, wherein the semiconductor wafer has, in a part of the wafer to be included in the first light-emitting-unit, a first p-type side electrode connecting to the p-type semiconductor layer and a first n-type side electrode connecting to the n-type semiconductor layer, and has, in a part thereof to be included in the second light-emitting-unit, a second p-type side electrode connecting to the p-type semiconductor layer and a second n-type side electrode connecting to the n-type semiconductor layer.

3. The process according to claim 1, further comprising:
providing the semiconductor wafer, in a part thereof to be included in the first light-emitting-unit, a first p-type side electrode connecting to the p-type semiconductor layer and, in a part thereof to be included in the second light-emitting-unit, a second p-type side electrode connecting to the p-type semiconductor layer; and
providing the semiconductor wafer, in a part thereof to be included in the first light-emitting-unit, a first n-type side electrode connecting to the n-type semiconductor layer and, in a part thereof to be included in the second light-emitting-unit, a second n-type side electrode connecting to the n-type semiconductor layer.

4. The process according to claim 1, further comprising forming a light-emitting-device separation-trench by dry-etching.

5. The process according to claim 4, wherein the light-emitting-device separation-trench formation is performed:
(i) so as to remove a portion of the thin-film crystal layer,
(ii) so as to reach the optical coupling layer, or
(iii) so as to reach the substrate.

6. The process according to claim 4 or 5, wherein the light-emitting-device separation-trench formation is performed by dry etching process using gas selected from the group consisting of $Cl_2$, $BCl_3$, $SiCl_4$, $CCl_4$, and a combination of two or more of these.

7. The process according to claim 6, wherein a patterned metal-fluoride layer, or a metal-fluoride layer selected from the group consisting of $SrF_2$, $AlF_3$, $MgF_2$, $BaF_2$, $CaF_2$, and a combination of two or more of these, is used as an etching mask.

8. The process according to claim 1, wherein the light-emitting-unit separation-trench formation is performed by dry etching process using gas selected from the group consisting of $Cl_2$, $BCl_3$, $SiCl_4$, $CCl_4$, and a combination of two or more of these.

9. The process according to claim 8, wherein a patterned metal-fluoride layer, or a metal-fluoride layer selected from the group consisting of $SrF_2$, $AlF_3$, $MgF_2$, $BaF_2$, $CaF_2$, and a combination of two or more of these, is used as an etching mask.

10. The process according to claim 1, wherein the optical coupling layer has a specific resistance $\rho_{oc}(\Omega \cdot cm)$ of 0.5 ($\Omega \cdot cm$) or higher.

11. The processing according to claim 1, wherein the optical coupling layer comprises an undoped semiconductor layer as a layer adjacent to the n-type semiconductor layer.

* * * * *